United States Patent
Lee et al.

(10) Patent No.: US 11,659,765 B2
(45) Date of Patent: May 23, 2023

(54) COMPOSITION FOR ORGANIC OPTOELECTRONIC ELEMENT, ORGANIC OPTOELECTRONIC ELEMENT, AND DISPLAY DEVICE

(71) Applicant: SAMSUNG SDI CO., LTD., Yongin-si (KR)

(72) Inventors: Seungjae Lee, Suwon-si (KR); Hyung Sun Kim, Suwon-si (KR); Dong Wan Ryu, Suwon-si (KR); Juyeon Jung, Suwon-si (KR); Ho Kuk Jung, Suwon-si (KR); Changwoo Kim, Suwon-si (KR); Hyunjung Kim, Suwon-si (KR); Chang Ju Shin, Suwon-si (KR); Yongtak Yang, Suwon-si (KR); Sung-Hyun Jung, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 313 days.

(21) Appl. No.: 16/647,145

(22) PCT Filed: Oct. 10, 2018

(86) PCT No.: PCT/KR2018/011898
§ 371 (c)(1),
(2) Date: Mar. 13, 2020

(87) PCT Pub. No.: WO2019/078536
PCT Pub. Date: Apr. 25, 2019

(65) Prior Publication Data
US 2021/0050526 A1 Feb. 18, 2021

(30) Foreign Application Priority Data
Oct. 20, 2017 (KR) .................. 10-2017-0136649

(51) Int. Cl.
*H01L 51/50* (2006.01)
*H01L 51/00* (2006.01)

(52) U.S. Cl.
CPC ...... *H01L 51/0067* (2013.01); *H01L 51/0065* (2013.01); *H01L 51/0068* (2013.01);
(Continued)

(58) Field of Classification Search
None
See application file for complete search history.

(56) References Cited

U.S. PATENT DOCUMENTS

| 5,942,340 | A | 8/1999 | Hu et al. |
| 2004/0164292 | A1* | 8/2004 | Tung ................. G02F 1/133603 257/40 |

(Continued)

FOREIGN PATENT DOCUMENTS

| CN | 104277824 A | 1/2015 |
| CN | 106611822 | 5/2017 |

(Continued)

OTHER PUBLICATIONS

European Office action dated Jan. 25, 2022.
(Continued)

*Primary Examiner* — Gregory D Clark
(74) *Attorney, Agent, or Firm* — Lee IP Law, P.C.

(57) ABSTRACT

The present invention relates to a composition for an organic optoelectronic element, and an organic optoelectronic element and a display device utilizing same, wherein the composition includes a first compound for an organic optoelectronic element, the first compound being represented by a combination of specific chemical formulae; and a second compound for an organic optoelectronic element, the second compound being represented by a different specific chemical formula.

17 Claims, 1 Drawing Sheet

(52) U.S. Cl.
CPC ...... *H01L 51/0072* (2013.01); *H01L 51/0073* (2013.01); *H01L 51/0074* (2013.01)

(56) References Cited

U.S. PATENT DOCUMENTS

| | | | |
|---|---|---|---|
| 2015/0025239 A1* | 1/2015 | Ahn | C09B 57/00 544/333 |
| 2015/0225239 A1 | 1/2015 | Ahn et al. | |
| 2016/0293856 A1 | 10/2016 | Ji et al. | |
| 2017/0025618 A1* | 1/2017 | Zheng | H01L 51/0071 |
| 2017/0047527 A1 | 2/2017 | Lee et al. | |
| 2017/0271598 A1 | 9/2017 | Zeng et al. | |

FOREIGN PATENT DOCUMENTS

| | | |
|---|---|---|
| KR | 10-2015-0108330 A | 9/2015 |
| KR | 10-2015-0116776 A | 10/2015 |
| KR | 10-2016-0110078 | 9/2016 |
| KR | 10-2017-0086211 A | 7/2017 |
| KR | 10-2017-0101021 A | 9/2017 |
| WO | WO 2007/063796 A1 | 6/2007 |
| WO | WO 2017/115608 A1 | 7/2017 |

OTHER PUBLICATIONS

Extended European Search Report dated May 3, 2021.
Notice of Allowance dated Aug. 13, 2020, in connection with the corresponding Korean Patent Application No. 10-2017-0136649.
International Search Report dated Jan. 17, 2019 for PCT/KR2018/01898.
Zhang et al. "Design, synthesis and performance studies of high efficiency, etc.." China Excellence Masters, Information Tech. Edition, 20160215, Mar. 2015 *.
Chinese Office action and Search Report dated Feb. 22, 2023.

* cited by examiner

[Figure 1]
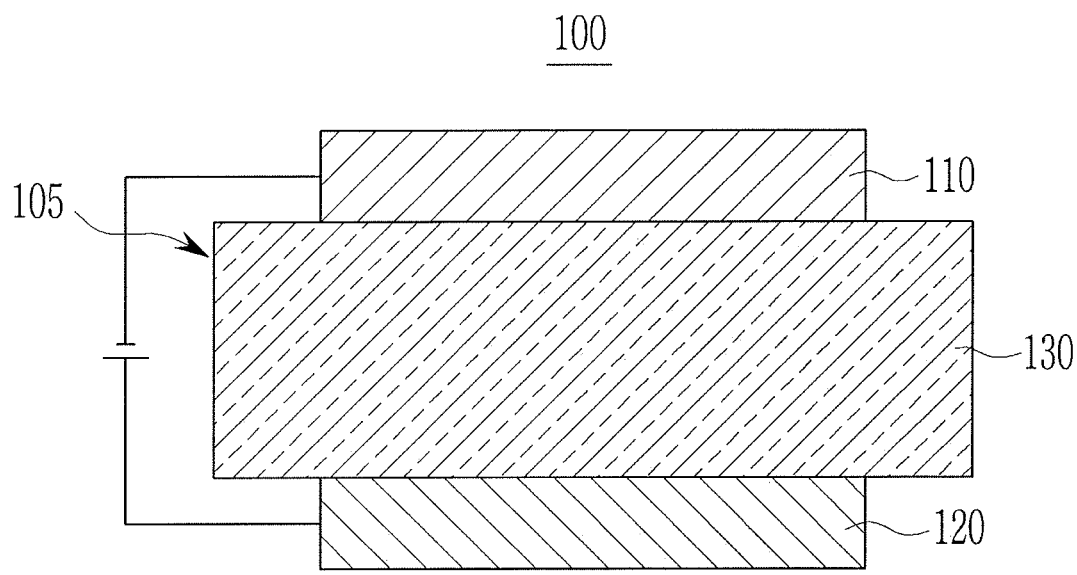
[Figure 2]
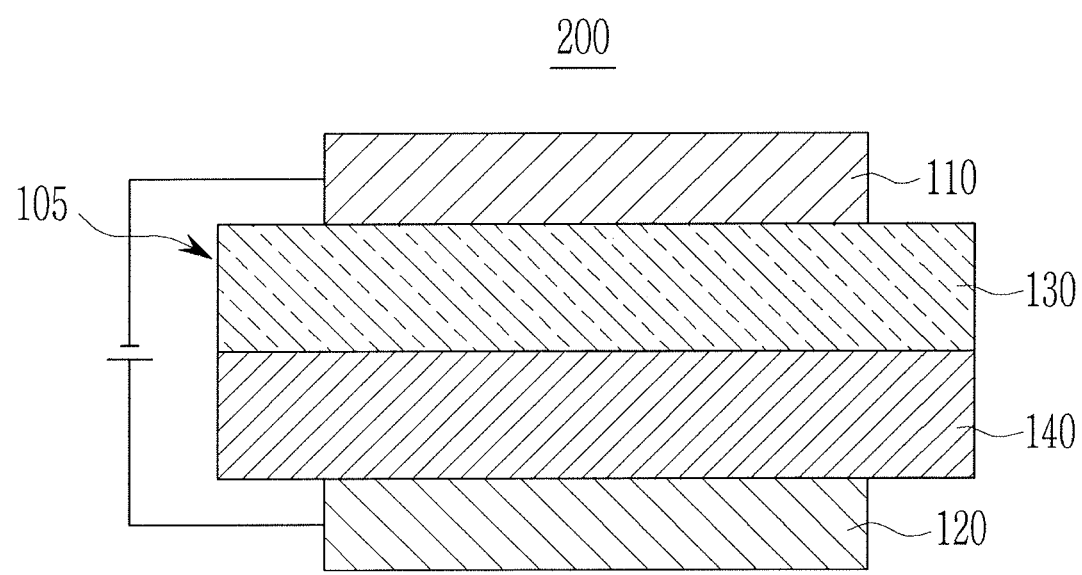

COMPOSITION FOR ORGANIC OPTOELECTRONIC ELEMENT, ORGANIC OPTOELECTRONIC ELEMENT, AND DISPLAY DEVICE

CROSS REFERENCE TO RELATED APPLICATIONS

This is the U.S. National Phase application based on PCT Application No. PCT/KR2018/011898, filed Oct. 10, 2018, which is based on Korean Patent Application No. 10-2017-0136649, filed Oct. 20, 2017, the entire contents of all of which are hereby incorporated by reference.

TECHNICAL FIELD

A composition for an organic optoelectronic element, an organic optoelectronic element, and a display device are disclosed.

BACKGROUND ART

An organic optoelectronic element is an element that converts electrical energy into photoenergy, and vice versa.

An organic optoelectronic element may be classified as follows in accordance with its driving principles. One is a photoelectric diode where excitons are generated by photoenergy, separated into electrons and holes, and are transferred to different electrodes to generate electrical energy, and the other is a light emitting diode where a voltage or a current is supplied to an electrode to generate photoenergy from electrical energy.

Examples of the organic optoelectronic element include an organic photoelectric diode, an organic light emitting diode, an organic solar cell, and an organic photo conductor drum.

Of these, an organic light emitting diode (OLED) has recently drawn attention due to an increase in demand for flat panel displays. The organic light emitting diode is a device converting electrical energy into light by applying current to an organic light emitting material, and has a structure in which an organic layer is disposed between an anode and a cathode. Herein, the organic layer may include an light emitting layer and optionally an auxiliary layer, and the auxiliary layer may include at least one layer selected from, for example, a hole injection layer, a hole transport layer, an electron blocking layer, an electron transport layer, an electron injection layer, and a hole blocking layer in order to improve efficiency and stability of an organic light emitting diode.

Performance of an organic light emitting diode may be affected by characteristics of the organic layer, and among them, may be mainly affected by characteristics of an organic material of the organic layer.

Particularly, development for an organic material capable of increasing hole and electron mobility and simultaneously increasing electrochemical stability is needed so that the organic light emitting diode may be applied to a large-sized flat panel display.

DISCLOSURE

Technical Problem

An embodiment provides a composition for an organic optoelectronic element capable of implementing an organic optoelectronic element having high efficiency and a long life-span.

Another embodiment provides an organic optoelectronic element including the composition.

Another embodiment provides a display device including the organic optoelectronic element.

Technical Solution

According to an embodiment, a composition for an organic optoelectronic element includes a first compound for an organic optoelectronic element represented by a combination of Chemical Formula 1 and Chemical Formula 2; and a second compound for an organic optoelectronic element represented by Chemical Formula 3.

[Chemical Formula 1]

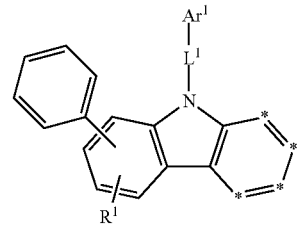

[Chemical Formula 2]

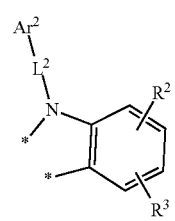

[Chemical Formula 3]

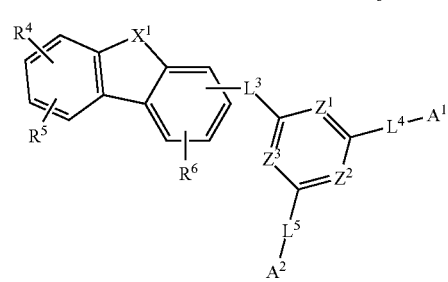

In Chemical Formula 1 to Chemical Formula 3, $Ar^1$ and $Ar^2$ are independently a substituted or unsubstituted $C_6$ to $C_{30}$ aryl group, $R^1$ to $R^3$ are independently hydrogen, deuterium, or a cyano group, adjacent two *'s of Chemical Formula 1 are linked with *'s of Chemical Formula 2,

*'s in Chemical Formula 1 which are not linked with *'s of Chemical Formula 2 are independently $CR^a$, $Z^1$ to $Z^3$ are independently N or $CR^b$, at least two of $Z^1$ to $Z^3$ are N, $R^a$, $R^b$, and $R^4$ to $R^6$ are independently hydrogen, deuterium, a cyano group, a substituted or unsubstituted $C_1$ to $C_{10}$ alkyl group, a substituted or unsubstituted $C_6$ to $C_{20}$ aryl group, or a substituted or unsubstituted $C_2$ to $C_{30}$ heterocyclic group, $L^1$ to $L^5$ are independently a single bond or a substituted or unsubstituted $C_6$ to $C_{30}$ arylene group, $X^1$ is O or S, and $A^1$ and $A^2$ are independently a substituted or unsubstituted $C_6$ to $C_{20}$ aryl group, or a substituted or unsubstituted $C_2$ to $C_{30}$ heterocyclic group.

According to another embodiment, an organic optoelectronic element includes an anode and a cathode facing each other and at least one organic layer disposed between the anode and the cathode, wherein the organic layer includes the aforementioned composition for the organic optoelectronic element.

According to another embodiment, a display device including the organic optoelectronic element is provided.

Advantageous Effects

An organic optoelectronic element having high efficiency and a long life-span may be realized.

DESCRIPTION OF THE DRAWINGS

FIGS. 1 and 2 are cross-sectional views showing organic light emitting diodes according to embodiments.

MODE FOR INVENTION

Hereinafter, embodiments of the present invention are described in detail. However, these embodiments are exemplary, the present invention is not limited thereto and the present invention is defined by the scope of claims.

In the present specification, when a definition is not otherwise provided, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof.

In one example of the present invention, the "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, or a C2 to C30 heteroaryl group. In addition, in a specific example of the present invention, the "substituted" refers to replacement of at least one hydrogen of a substituent or a compound by deuterium, a C1 to C20 alkyl group, a C6 to C30 aryl group, or a C2 to C30 heteroaryl group. In addition, in a specific example of the present invention, the "substituted" refers to replacement of at least one hydrogen of a substituent or a compound by deuterium, a C1 to C5 alkyl group, a C6 to C18 aryl group, a dibenzofuranyl group, or a dibenzothiophenyl group. In addition, in a specific example of the present invention, the "substituted" refers to replacement of at least one hydrogen of a substituent or a compound by deuterium, a methyl group, an ethyl group, a propanyl group, a butyl group, a phenyl group, a biphenyl group, a terphenyl group, a naphthyl group, a triphenyl group, a fluorenyl group, a dibenzofuranyl group, or a dibenzothiophenyl group.

In the present specification when a definition is not otherwise provided, "hetero" refers to one including one to three heteroatoms selected from N, O, S, P, and Si, and remaining carbons in one functional group.

In the present specification when a definition is not otherwise provided, "alkyl group" may refer to an aliphatic hydrocarbon group. The alkyl group may be "a saturated alkyl group" without any double bond or triple bond.

The alkyl group may be a C1 to C30 alkyl group. More specifically, the alkyl group may be a C1 to C20 alkyl group or a C1 to C10 alkyl group. For example, a C1 to C4 alkyl group may have one to four carbon atoms in the alkyl chain, and may be selected from methyl, ethyl, propyl, iso-propyl, n-butyl, iso-butyl, sec-butyl, and t-butyl.

Specific examples of the alkyl group may be a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

In the present specification, "aryl group" refers to a group including at least one hydrocarbon aromatic moiety, and all the elements of the hydrocarbon aromatic moiety have p-orbitals which form conjugation, for example a phenyl group, a naphthyl group, and the like, two or more hydrocarbon aromatic moieties may be linked by a sigma bond and may be, for example a biphenyl group, a terphenyl group, a quaterphenyl group, and the like, or two or more hydrocarbon aromatic moieties are fused directly or indirectly to provide a non-aromatic fused ring. For example, it may include a fluorenyl group, and the like.

The aryl group may include a monocyclic, polycyclic or fused ring polycyclic (i.e., rings sharing adjacent pairs of carbon atoms) functional group.

In the present specification, "heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "heteroaryl group" refers to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

Specific examples of the heterocyclic group may include a pyridinyl group, a pyrimidinyl group, a pyrazinyl group, a pyridazinyl group, a triazinyl group, a quinolinyl group, an isoquinolinyl group, a quinazolinyl group, and the like.

More specifically, the substituted or unsubstituted C6 to C30 aryl group and/or the substituted or unsubstituted C2 to C30 heterocyclic group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted benzoquinolinyl group, a substituted or unsubstituted benzoisoquinolinyl group, a substituted or unsubstituted benzoquinazolinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, or a substituted or unsubstituted dibenzothiophenyl group, or a combination thereof, but are not limited thereto.

In the present specification, hole characteristics refer to an ability to donate an electron to form a hole when an electric field is applied and that a hole formed in the anode may be easily injected into the light emitting layer and transported in the light emitting layer due to conductive characteristics according to a highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to a lowest unoccupied molecular orbital (LUMO) level.

Hereinafter, a composition for an organic optoelectronic element according to an embodiment is described.

The composition for an organic optoelectronic element according to an embodiment includes a first compound for an organic optoelectronic element having relatively strong hole characteristics and a second compound for an organic optoelectronic element having a relatively strong electronic characteristics, thereby suitably adjusting the charge balance to provide an organic light emitting diode having long life-span and high efficiency.

The first compound for the organic optoelectronic element has an asymmetric structure in which a phenyl group is present in one side direction of a phenyl moiety in an indolocarbazole core, which increases asymmetry and dipole moment compared with a structure in which the indolocarbazole core is not substituted at all in the side phenyl direction or a symmetric structure in which the indolocarbazole core is substituted equally in the both side direction of phenyl moieties, and thus do not cause crystallization and provide a uniform film to have a good effect on life-span.

In particular, in the case where the substituent of one side direction of a phenyl moiety in the indolocarbazole core is a single phenyl group as compared with the structure in which two or more phenyl groups are linked or fused, a HOMO electron cloud is not distributed and does not affect hole movement. However, when the substituent becomes bulky, the HOMO electron cloud is distributed, it is involved in hole movement, and the inter-molecular hole hopping distance increases, which in turn hinders the smooth hole movement. This effect causes the driving to be delayed.

The compound for the second organic optoelectronic element includes a structure in which dibenzofuran (or dibenzothiophene) is bound to a triazine or pyrimidine moiety, thereby increasing injection rates of holes and electrons through expansion of LUMO and planar expansion of ET moiety.

The first compound for the organic optoelectronic element may be represented by a combination of Chemical Formula 1 and Chemical Formula 2.

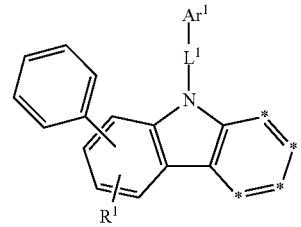

[Chemical Formula 1]

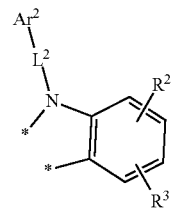

[Chemical Formula 2]

In Chemical Formula 1 and Chemical Formula 2, $Ar^1$ and $Ar^2$ are independently a substituted or unsubstituted C6 to C30 aryl group, $R^1$ to $R^3$ are independently hydrogen, deuterium, or a cyano group, adjacent two *'s of Chemical Formula 1 are linked with *'s of Chemical Formula 2,

*'s in Chemical Formula 1 which are not linked with *'s of Chemical Formula 2 are independently $CR^a$, and $L^1$ and $L^2$ are independently a single bond or a substituted or unsubstituted C6 to C30 arylene group.

The "substituted" of Chemical Formulae 1 and 2 refers to replacement of at least one hydrogen by deuterium, a C1 to C10 alkyl group, or a C6 to C18 aryl group.

In one example of the present invention, the "substituted" refers to replacement of at least one hydrogen by deuterium, a C1 to C4 alkyl group, or a C6 to C12 aryl group. Specifically, it refers to replacement of at least one hydrogen by a C1 to C4 alkyl group, a phenyl group, a biphenyl group, a naphthyl group, a terphenyl group, or an anthracenyl group, for example a phenyl group, a biphenyl group, a naphthyl group, or a terphenyl group.

The first compound for the organic optoelectronic element may be represented by one of Chemical Formula 1A, Chemical Formula 1B, Chemical Formula 1C, Chemical Formula 1D, Chemical Formula 1E, and Chemical Formula 1F, depending on a fusion position of Chemical Formula 1 and Chemical Formula 2.

[Chemical Formula 1A]

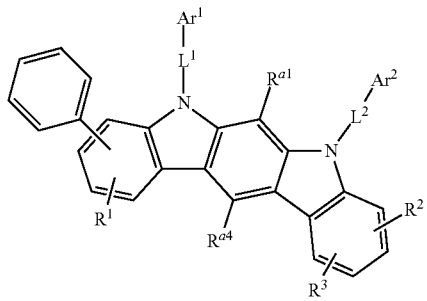

[Chemical Formula 1B]

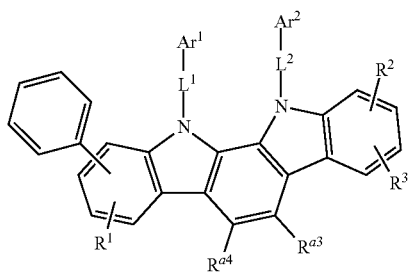

[Chemical Formula 1C]

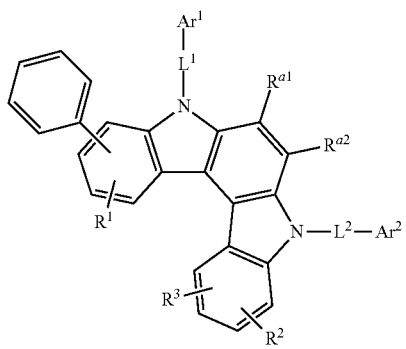

[Chemical Formula 1D]

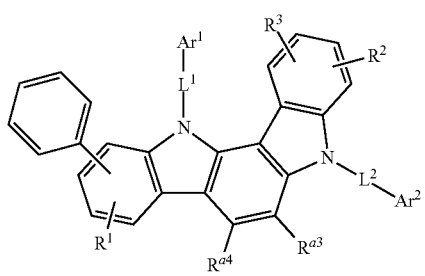

[Chemical Formula 1E]

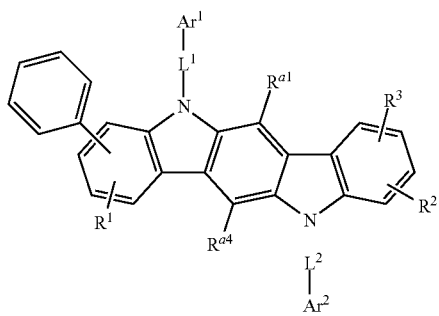

[Chemical Formula 1F]

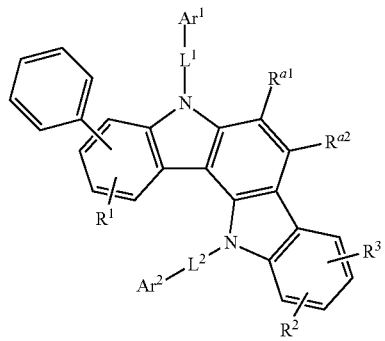

In Chemical Formula 1A, Chemical Formula 1B, Chemical Formula 1C, Chemical Formula 1 D, Chemical Formula 1E, and Chemical Formula 1F, $Ar^1$, $Ar^2$, $R^1$ to $R^3$, $L^1$, and $L^2$ are the same as described above, and $R^{a1}$ to $R^{a4}$ are independently hydrogen, deuterium, a cyano group, a substituted or unsubstituted C1 to C10 alkyl group, a substituted or unsubstituted C6 to C20 aryl group, or a substituted or unsubstituted C2 to C30 heterocyclic group.

In one example embodiment of the present invention, the first compound for the organic optoelectronic element may be represented by Chemical Formula 1C.

On the other hand, Chemical Formula 1C may be represented by one of Chemical Formula 1C-1, Chemical Formula 1C-2, Chemical Formula 1C-3, and Chemical Formula 1C-4, according to a specific substitution position of the side phenyl group substituted in the indolocarbazole core.

[Chemical Formula 1C-1]

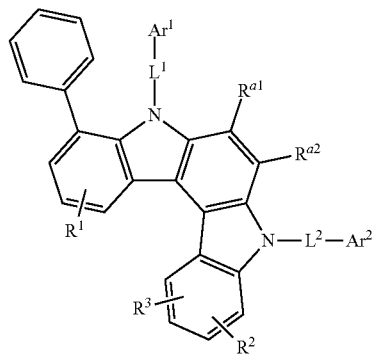

[Chemical Formula 1C-2]

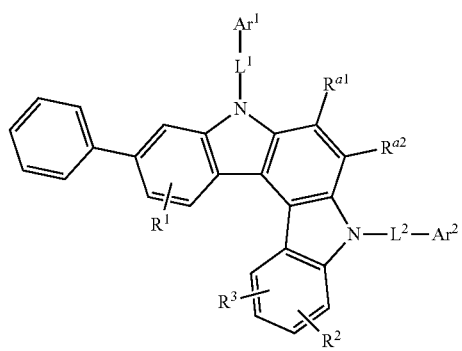

[Chemical Formula 1C-3]

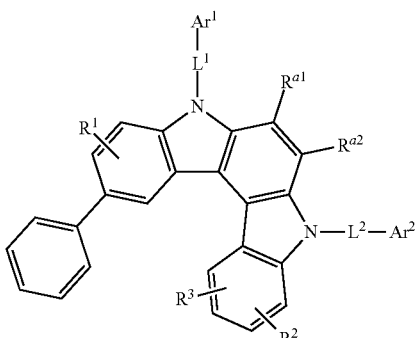

[Chemical Formula 1C-4]

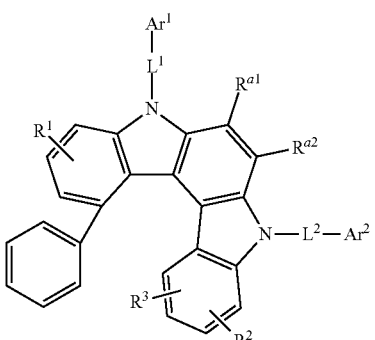

In Chemical Formula 1C-1, Chemical Formula 1C-2, Chemical Formula 1C-3, and Chemical Formula 1C-4, $Ar^1$, $Ar^2$, $R^1$ to $R^3$, $L^1$, $L^2$, $R^{a1}$, and $R^{a2}$ are the same as described above.

In a specific example embodiment of the present invention, the first compound for the organic optoelectronic element may be represented by Chemical Formula 1C-2 or Chemical Formula 1C-3.

In a more specific example embodiment of the present invention, $Ar^1$ and $Ar^2$ of Chemical Formula 1 and Chemical Formula 2 may independently be a substituted or unsubstituted phenyl group, a substituted or unsubstituted biphenyl group, a substituted or unsubstituted terphenyl group, or a substituted or unsubstituted naphthyl group, desirably $Ar^1$ and $Ar^2$ may independently be a substituted or unsubstituted phenyl group, a substituted or unsubstituted biphenyl group, or a substituted or unsubstituted terphenyl group, and $Ar^1$ and $Ar^2$ may more desirably be selected from substituents of Group I.

[Group I]

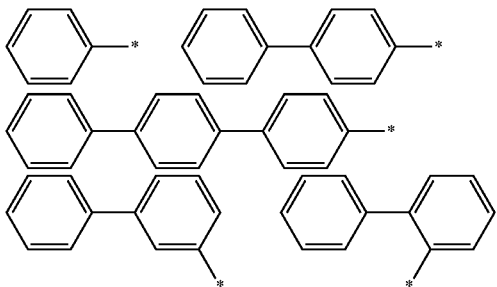

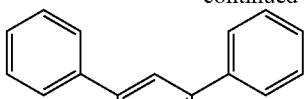
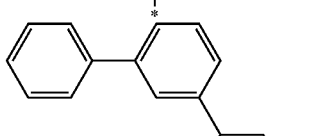
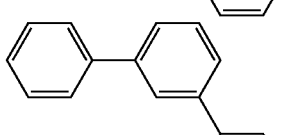
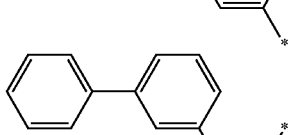
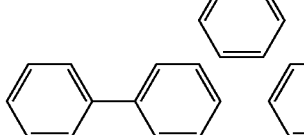
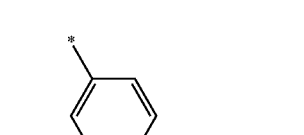
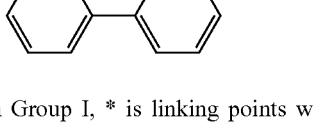
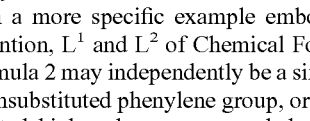
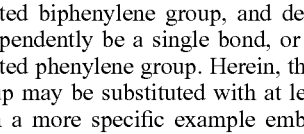

In Group I, * is linking points with $L^1$ and $L^2$, respectively.

In a more specific example embodiment of the present invention, $L^1$ and $L^2$ of Chemical Formula 1 and Chemical Formula 2 may independently be a single bond, a substituted or unsubstituted phenylene group, or a substituted or unsubstituted biphenylene group, and desirably $L^1$ and $L^2$ may independently be a single bond, or a substituted or unsubstituted phenylene group. Herein, the substituted phenylene group may be substituted with at least one phenyl group.

In a more specific example embodiment of the present invention, $R^1$ to $R^3$ of Chemical Formula 1 and Chemical Formula 2 may independently be hydrogen or a cyano group, and desirably $R^1$ to $R^3$ may be all hydrogen.

In addition, in a more specific example embodiment of the present invention, $R^{a1}$ to $R^{a4}$ of Chemical Formula 1A to Chemical Formula 1 D may independently be hydrogen, deuterium, a cyano group, a substituted or unsubstituted C1 to C10 alkyl group, or a substituted or unsubstituted C6 to C20 aryl group, for example hydrogen, deuterium, a cyano group, or a substituted or unsubstituted C6 to C20 aryl group, desirably $R^{a1}$ to $R^{a4}$ may independently be hydrogen, a cyano group, a phenyl group, a biphenyl group, or a naphthyl group and more desirably Rai to $R^{a4}$ may be all hydrogen.

The first compound for the organic optoelectronic element may be, for example represented by the chemical formulae of Group 1, but is not limited thereto.

[Group 1]

[A-1]

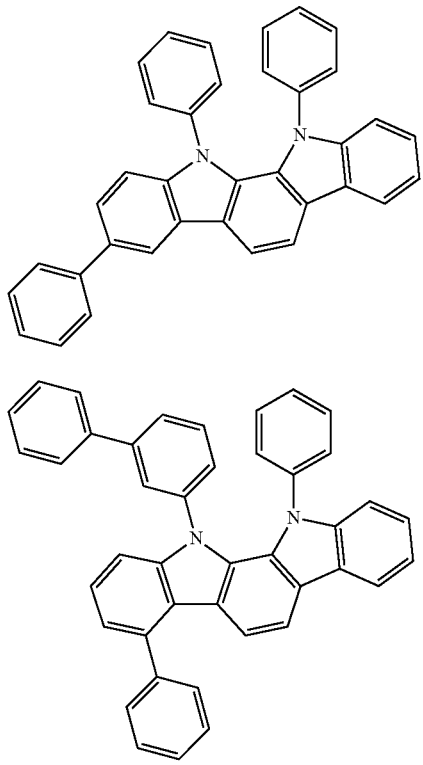

[A-2]

[A-3]

[A-4]

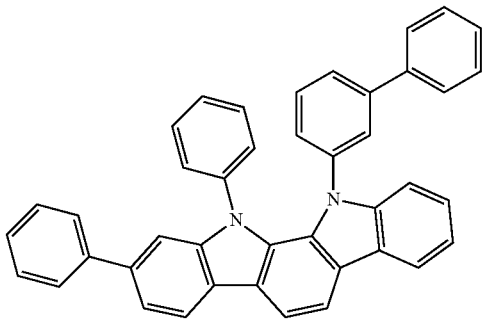

[A-5]

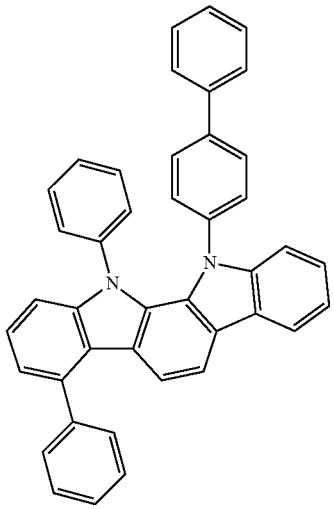

[A-6]

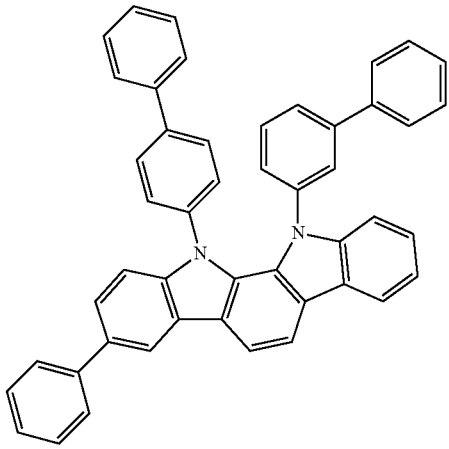

[A-7]
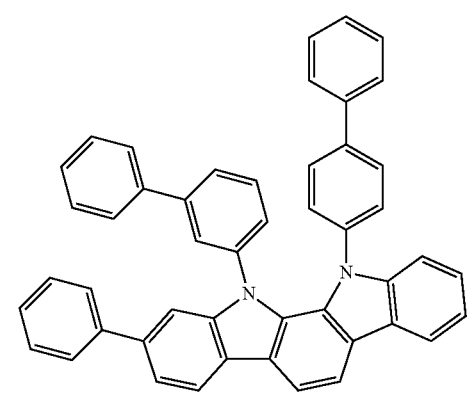
[A-8]
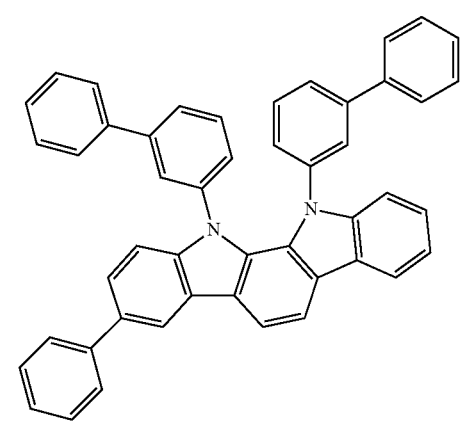
[A-9]
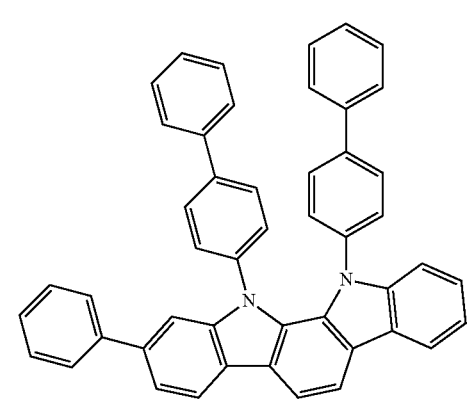
[A-10]
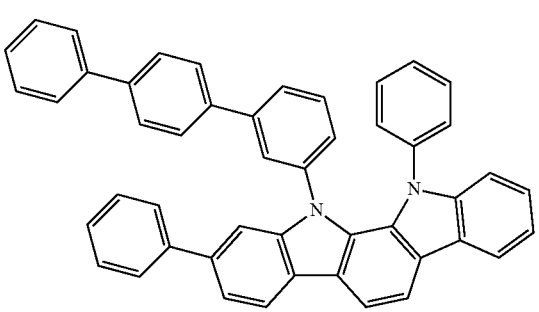
[A-11]
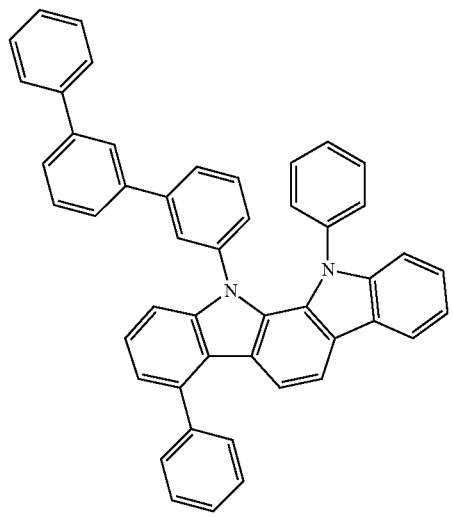
[A-12]
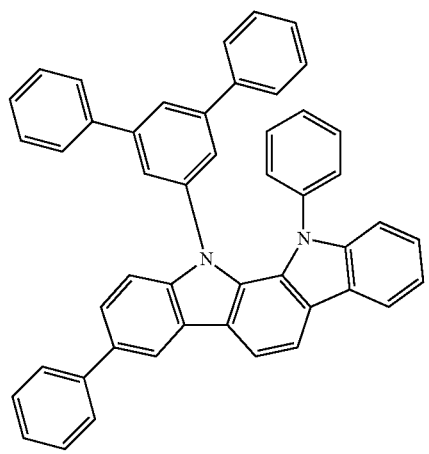
[A-13]
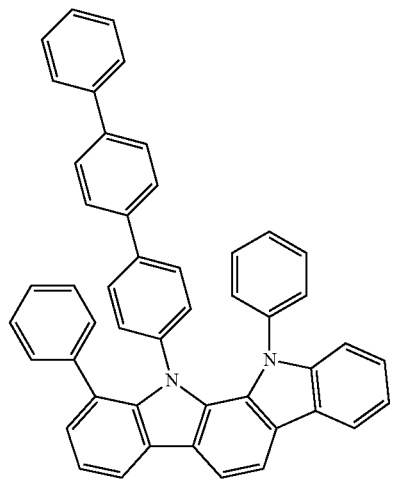

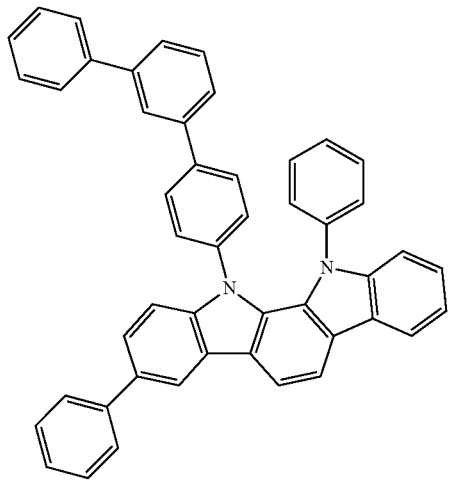
[A-14]
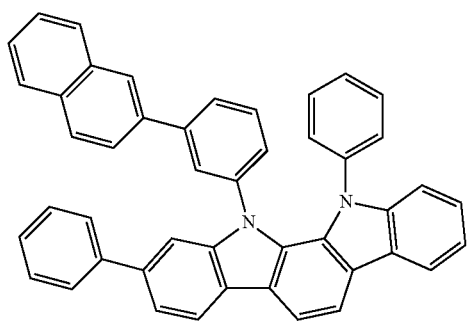
[A-15]
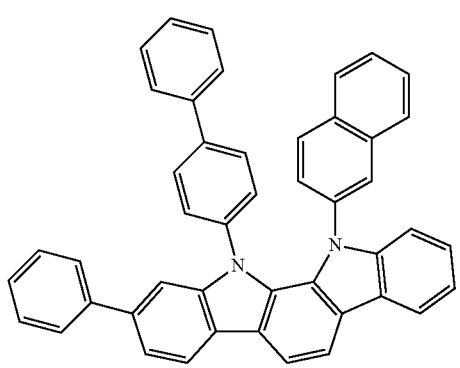
[A-16]
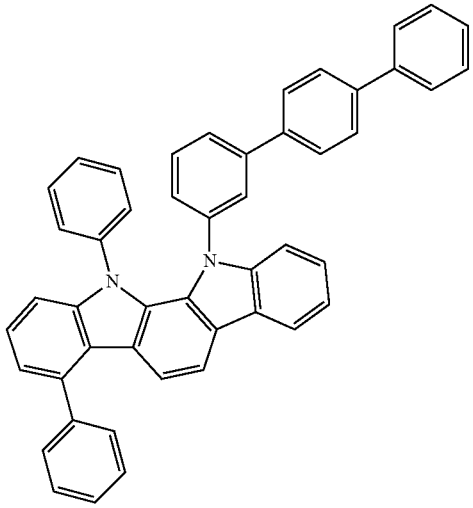
[A-17]
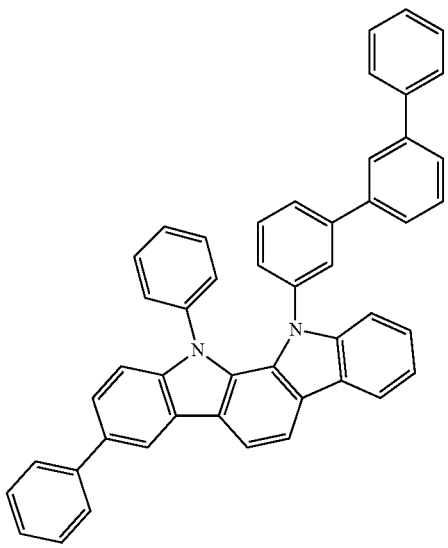
[A-18]
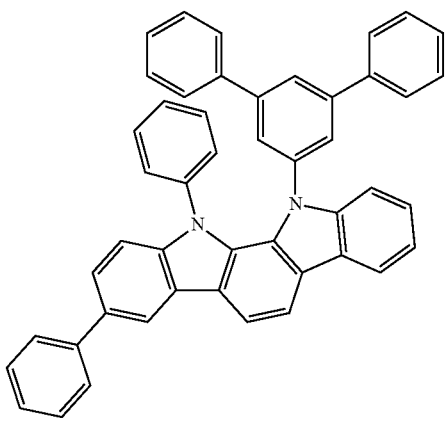
[A-19]

[A-20]
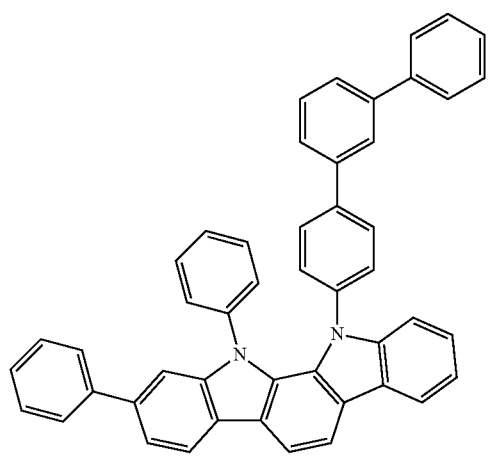
[A-21]
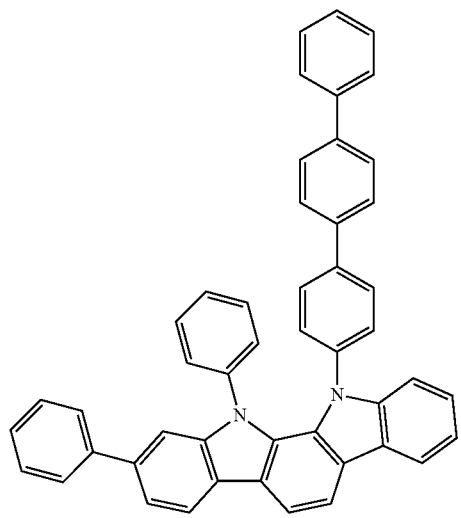
[A-22]
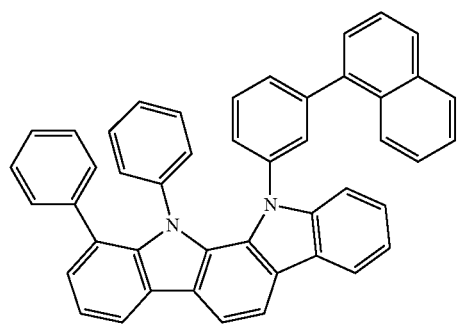
[A-23]
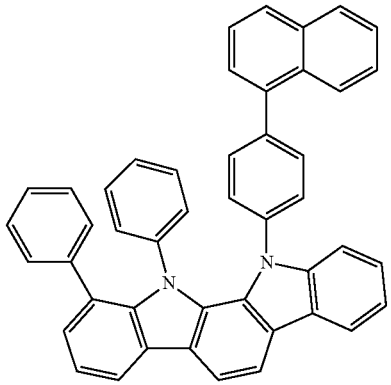
[A-24]
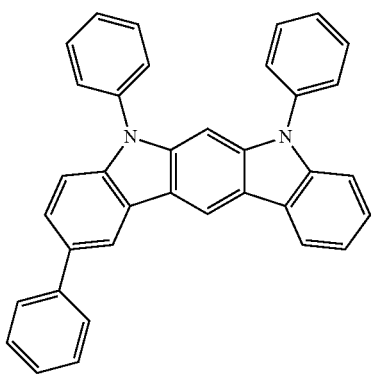
[A-25]
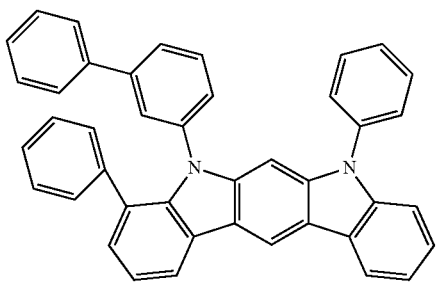
[A-26]
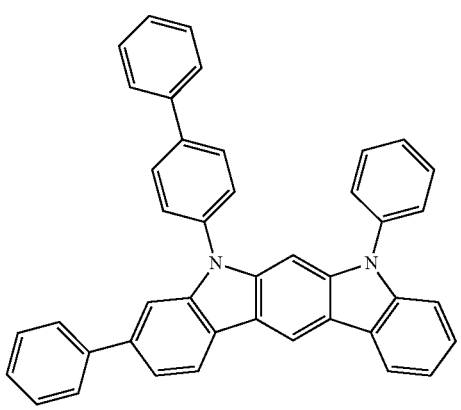

[A-27]
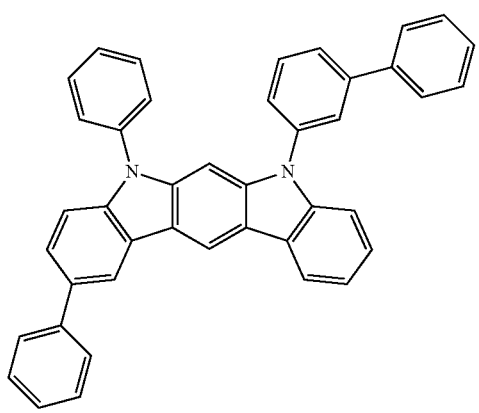
[A-30]
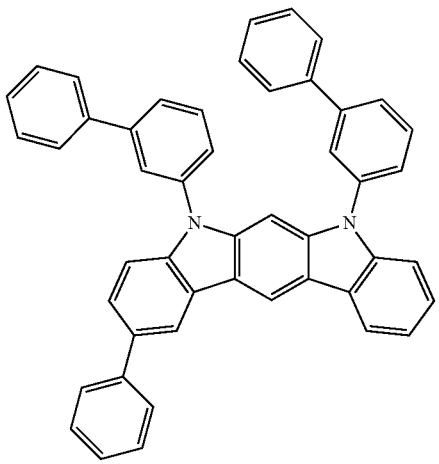
[A-28]
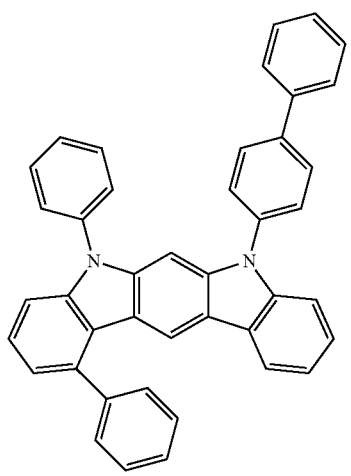
[A-31]
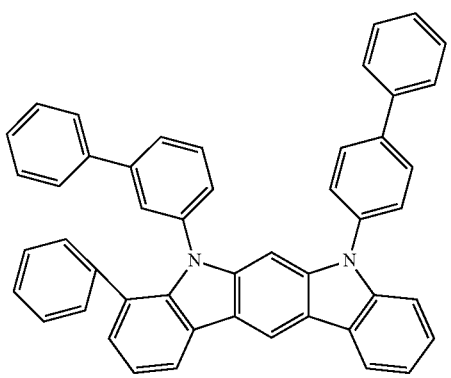
[A-29]
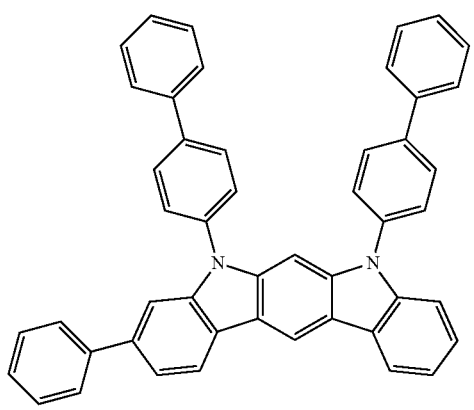
[A-32]
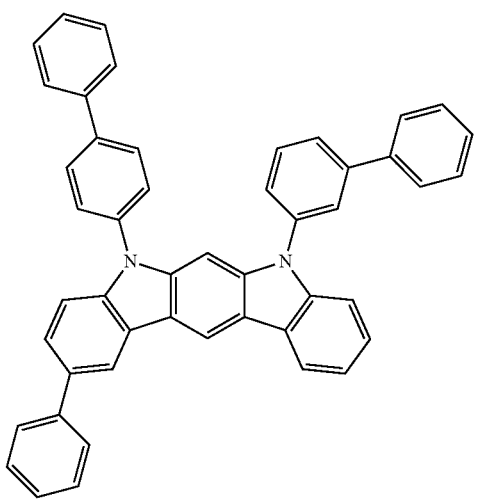

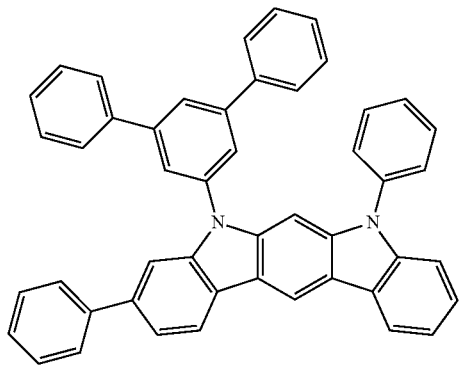
[A-33]
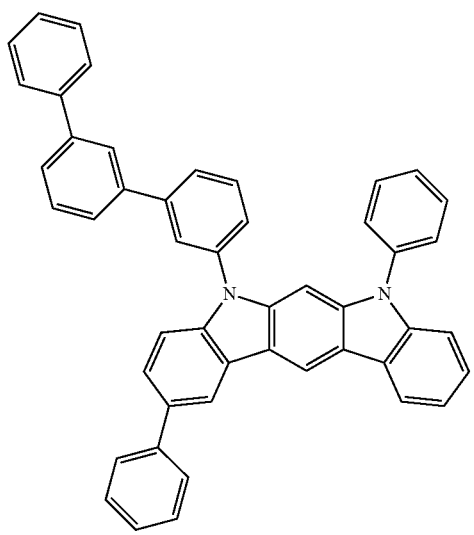
[A-34]
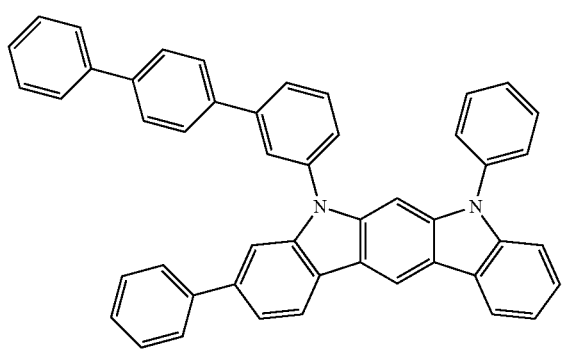
[A-35]
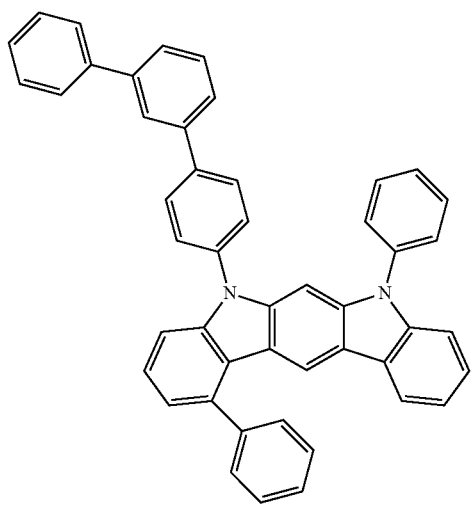
[A-36]
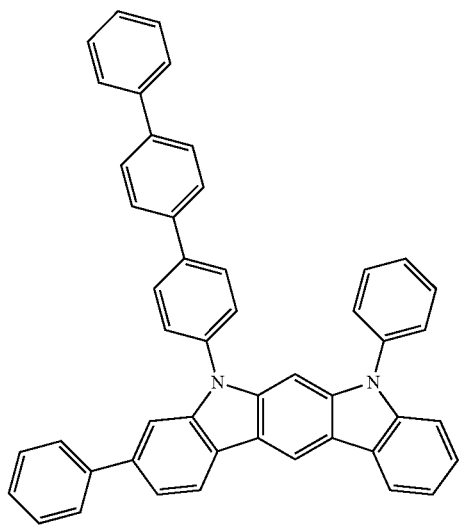
[A-37]
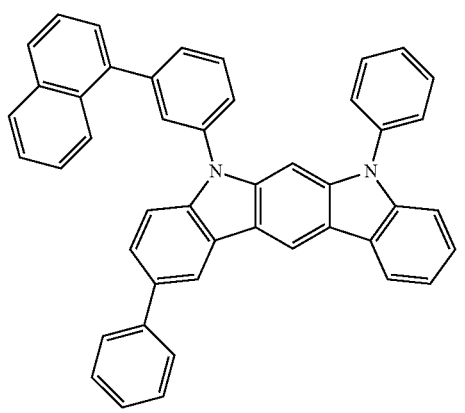
[A-38]

-continued
[A-39]
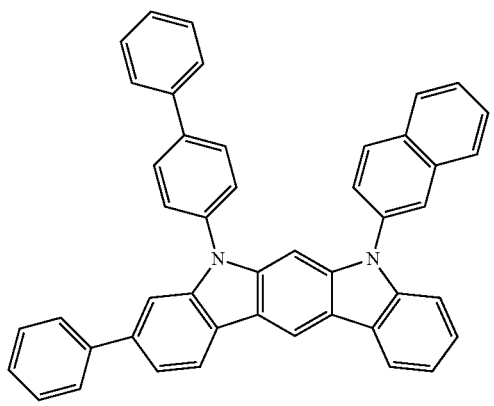
[A-40]
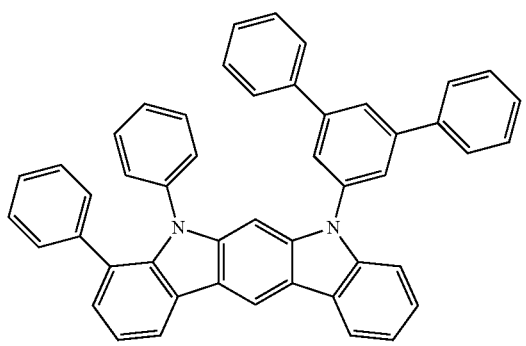
[A-41]
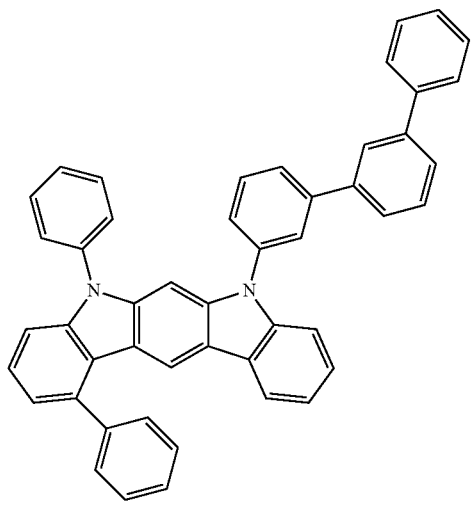
[A-42]
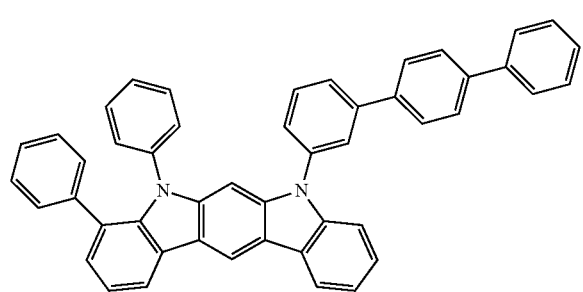
[A-43]
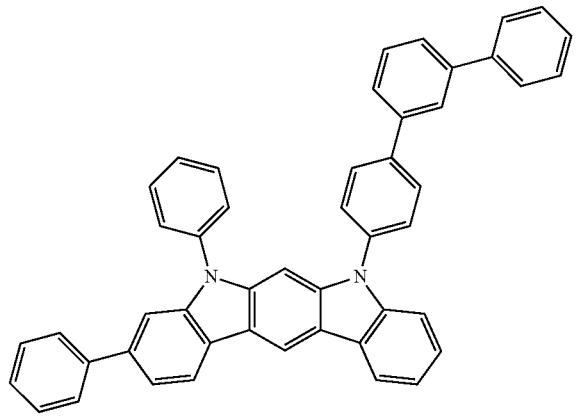
[A-44]
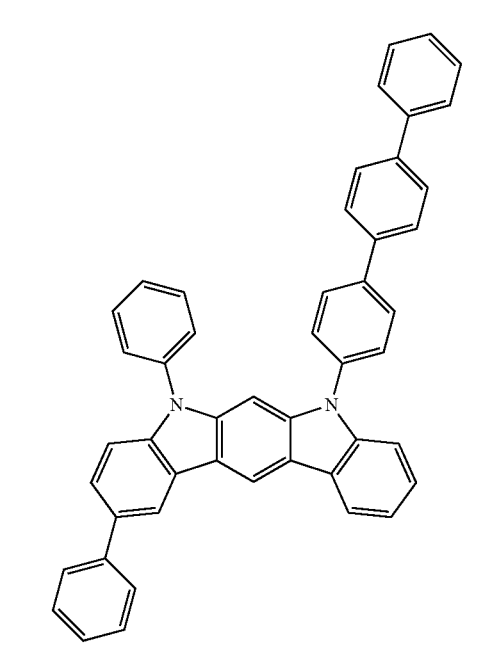
[A-45]
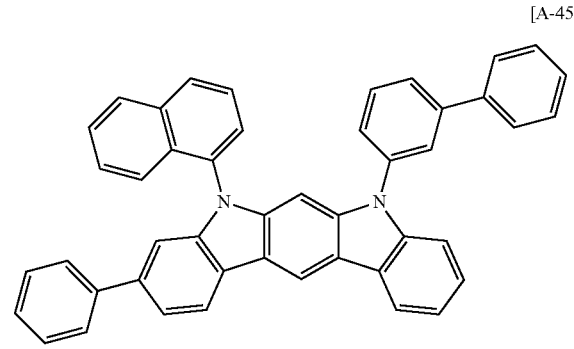

-continued
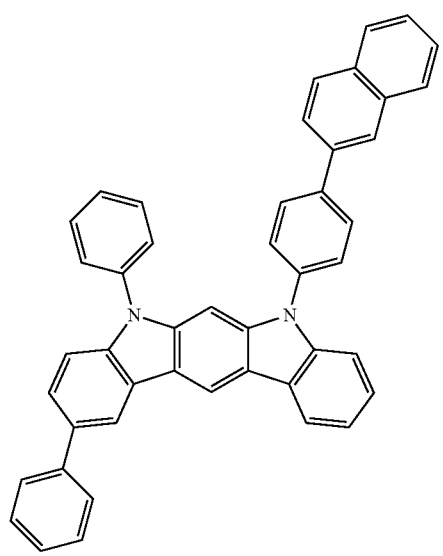
[A-46]
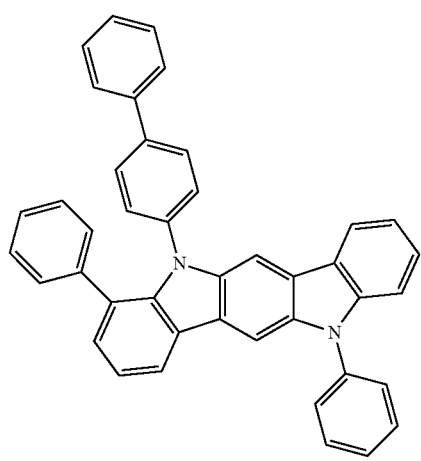
[A-49]
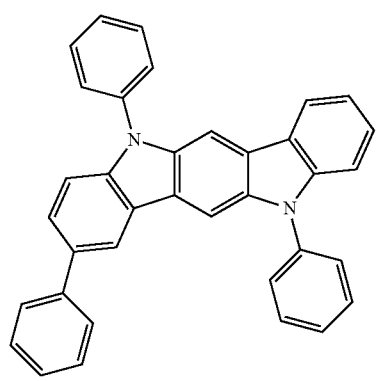
[A-47]
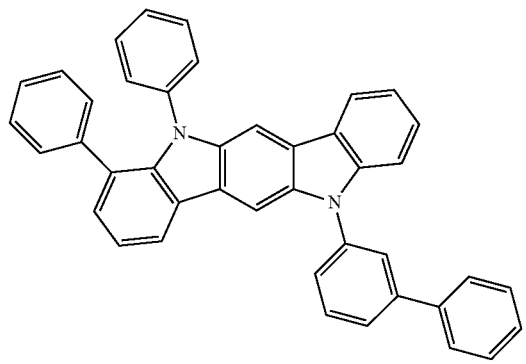
[A-50]
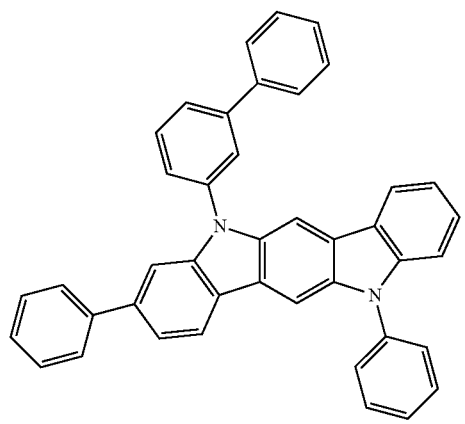
[A-48]
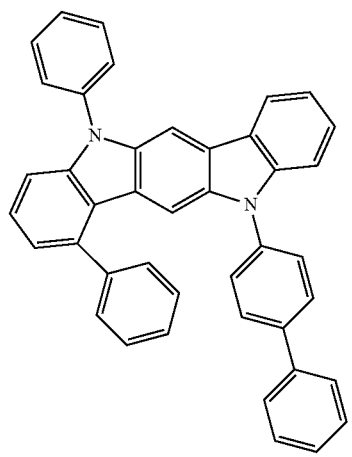
[A-51]

[A-52]
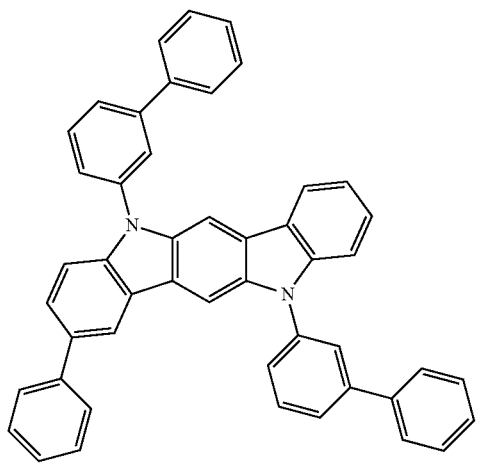
[A-53]
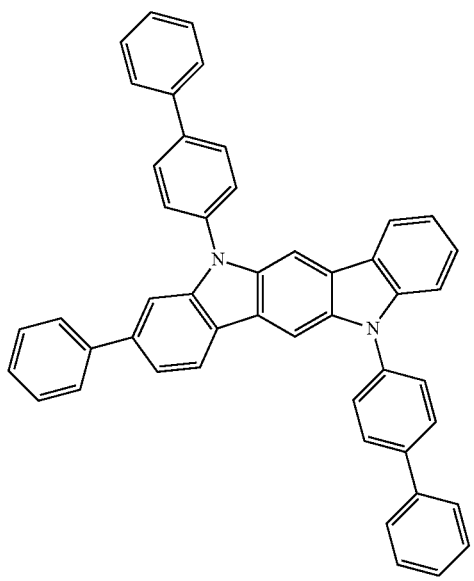
[A-54]
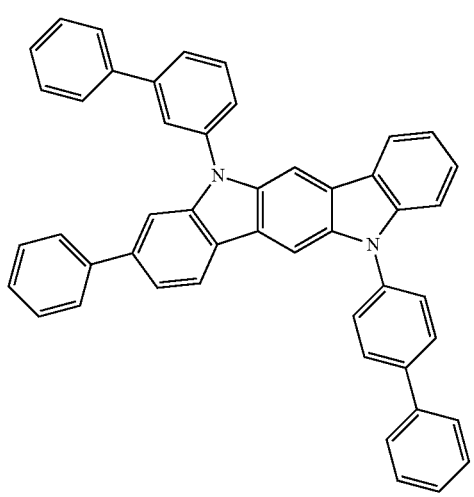
[A-55]
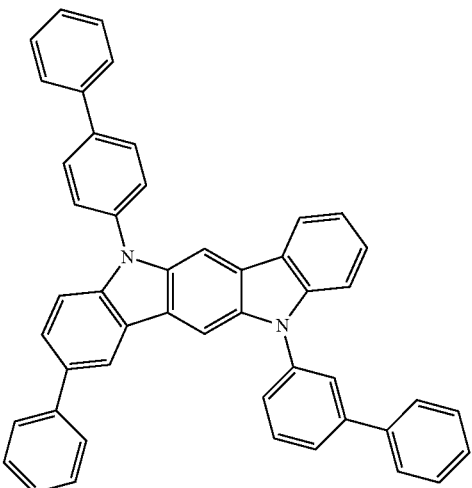
[A-56]
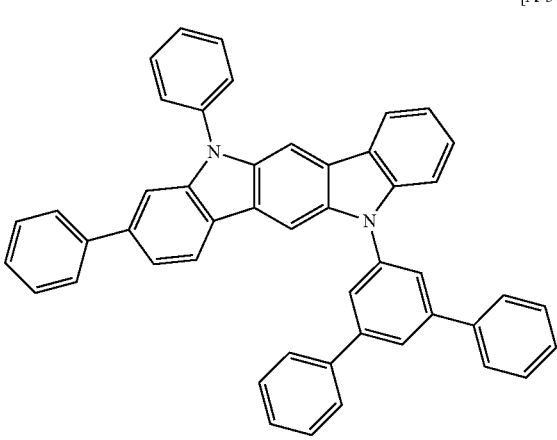
[A-57]
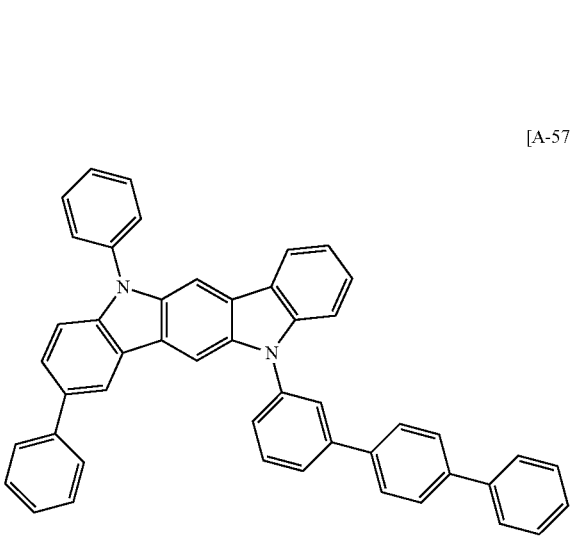

[A-58]
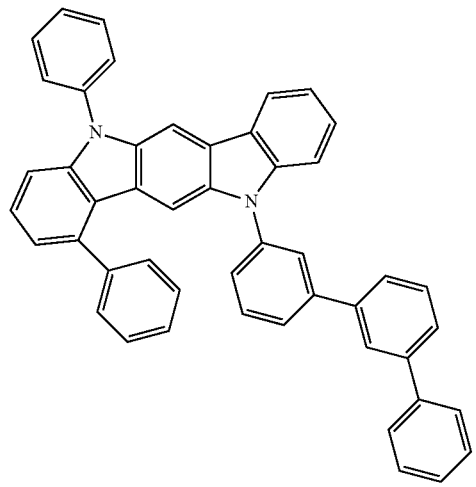
[A-59]
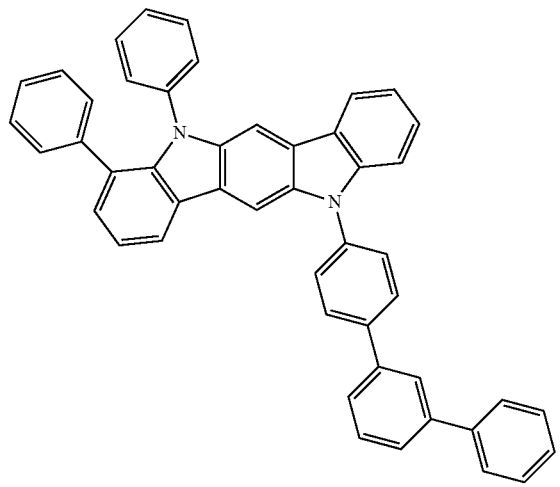
[A-60]
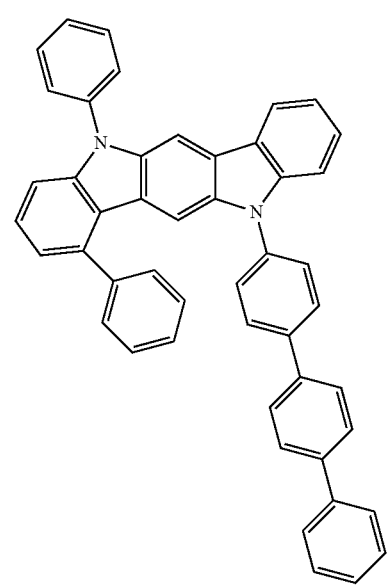
[A-61]
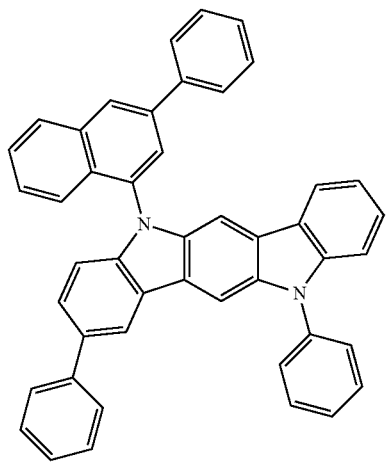
[A-62]
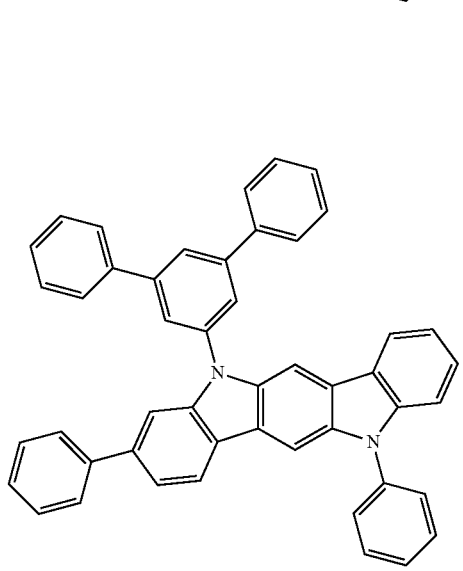
[A-63]

[A-64]
[A-65]
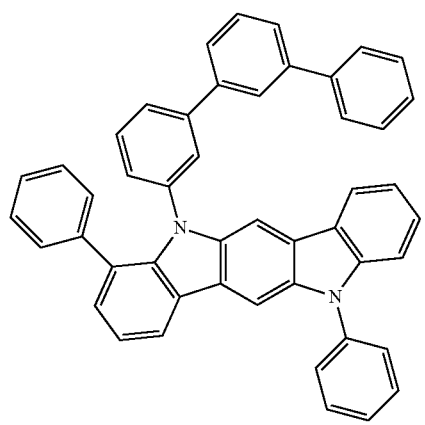
[A-66]
[A-67]
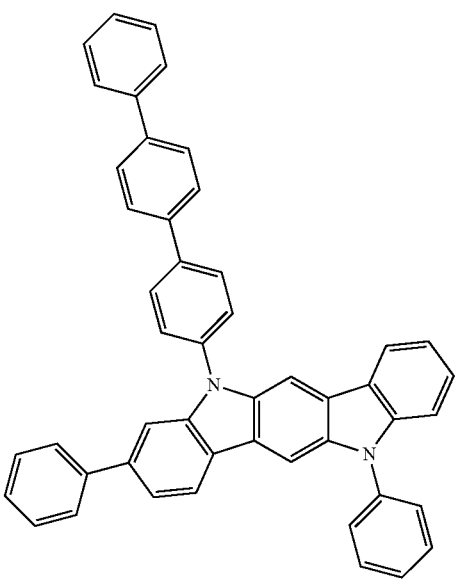
[A-68]
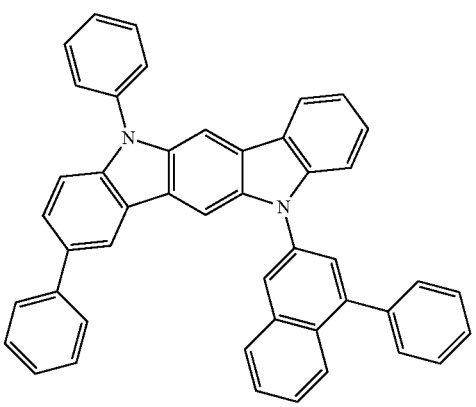
[A-69]
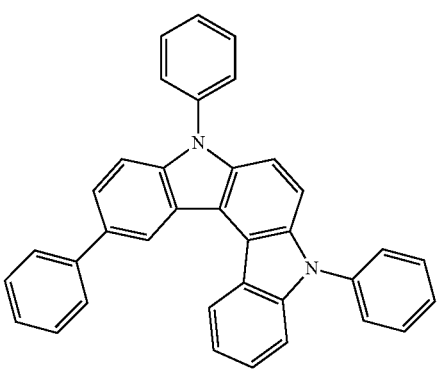

[A-70]
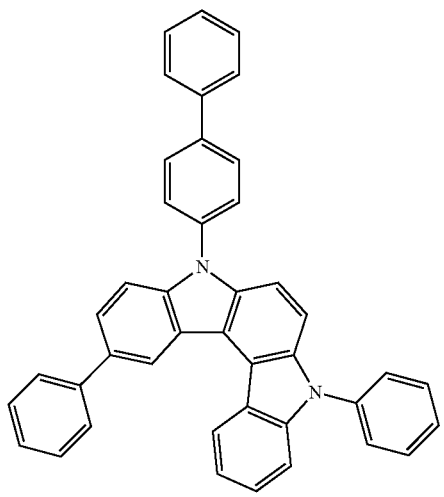
[A-71]
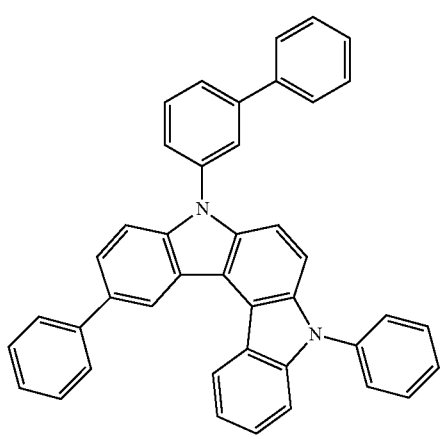
[A-72]
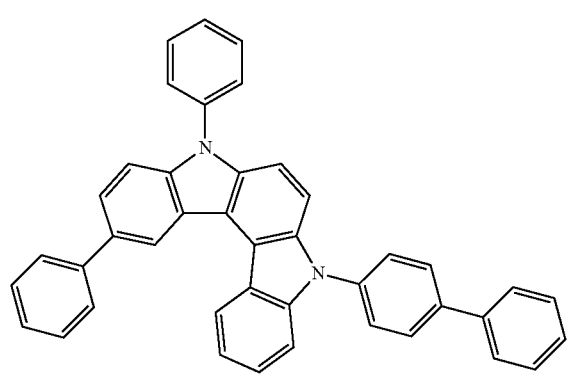
[A-73]
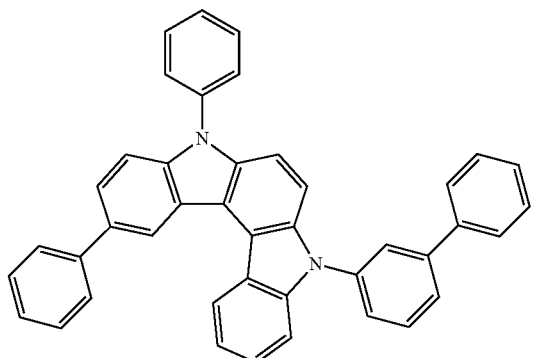
[A-74]
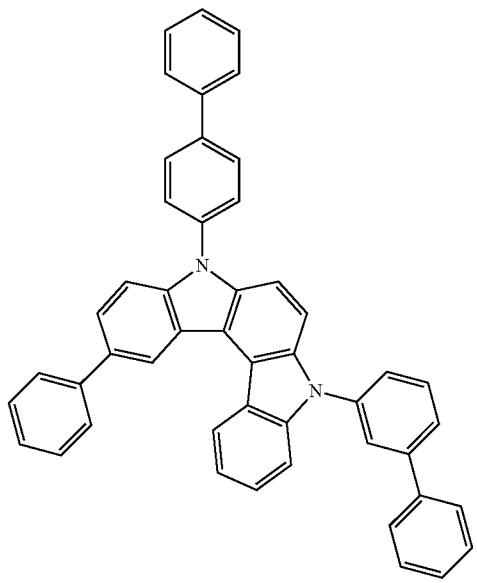
[A-75]
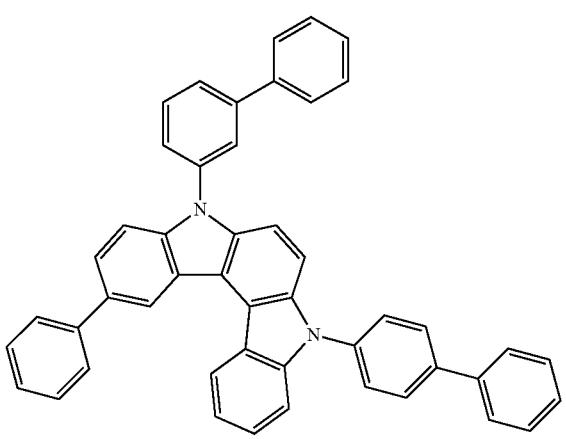

[A-76]
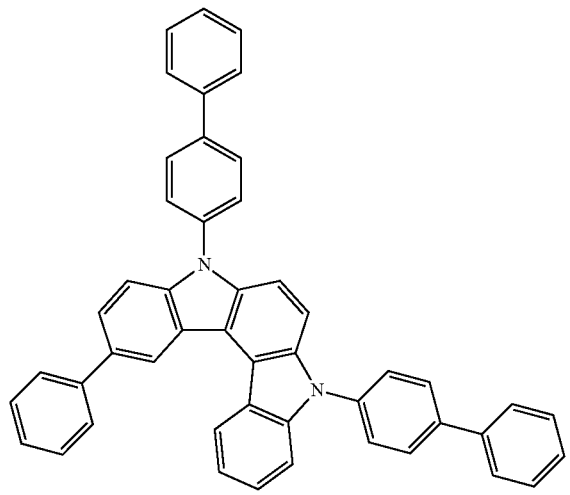
[A-77]
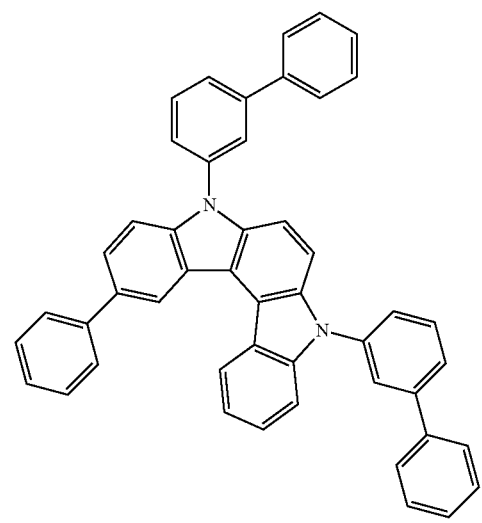
[A-78]
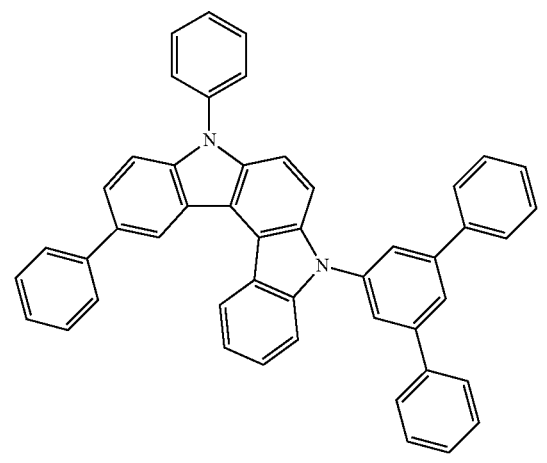
[A-79]
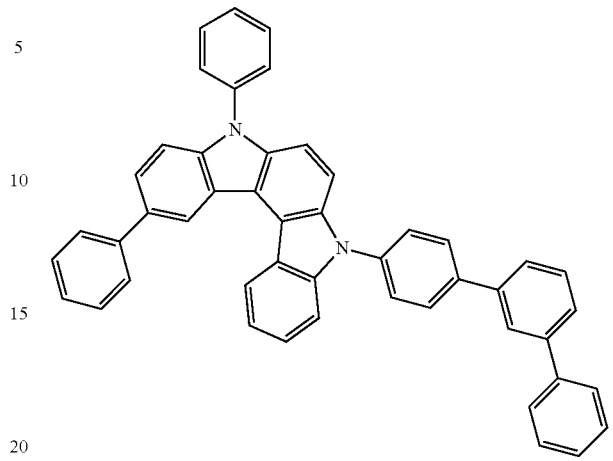
[A-80]
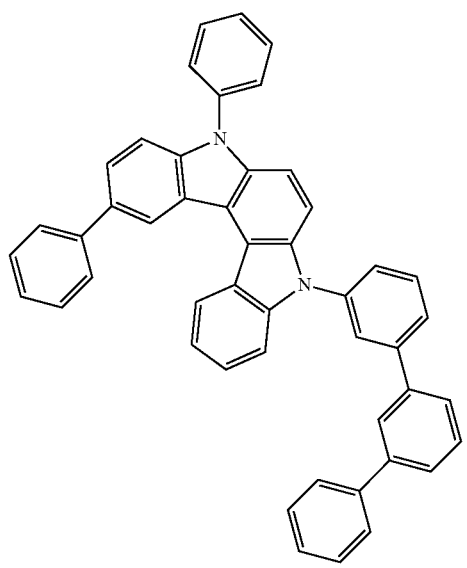
[A-81]
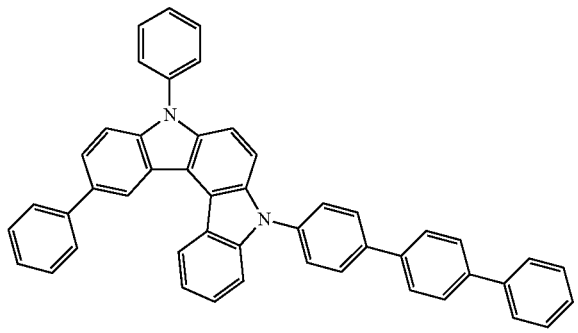

[A-82]
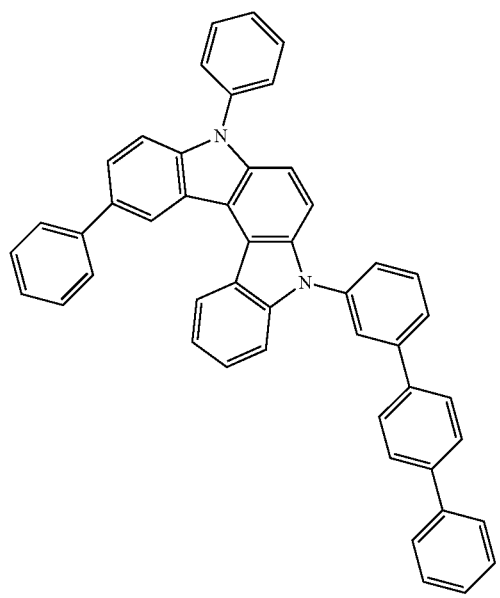
[A-83]
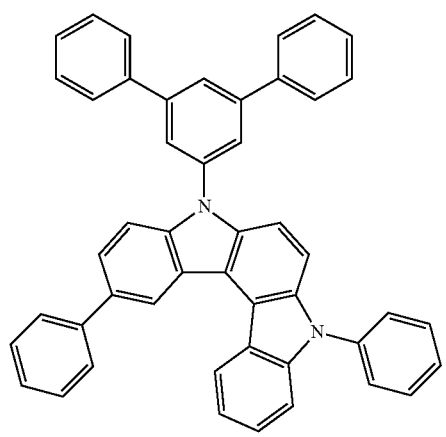
[A-84]
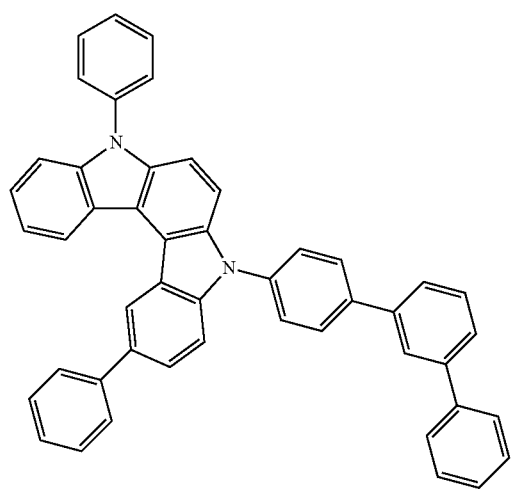
[A-85]
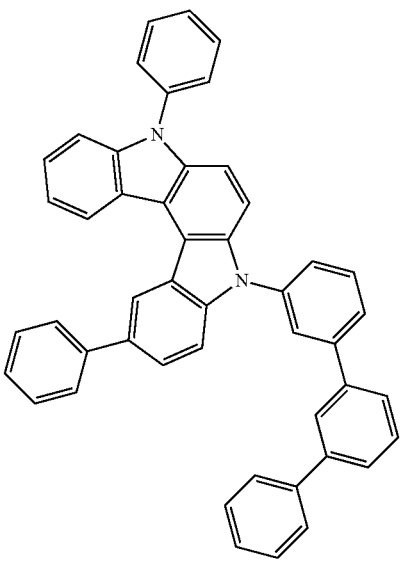
[A-86]
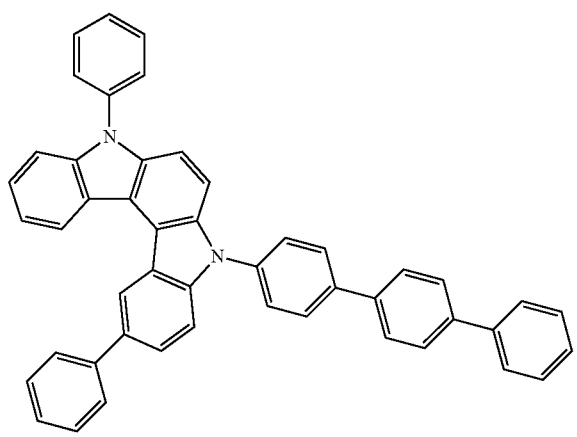
[A-87]
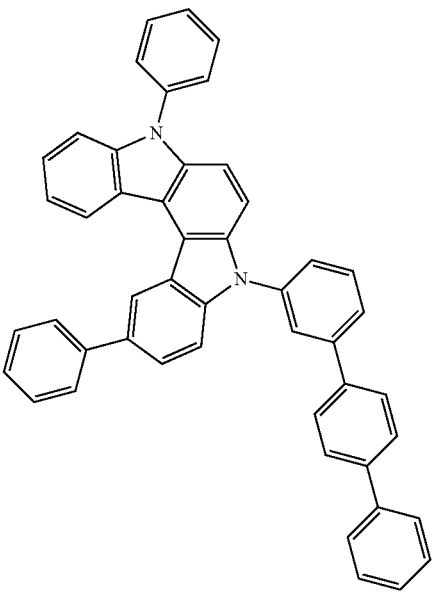

[A-88]
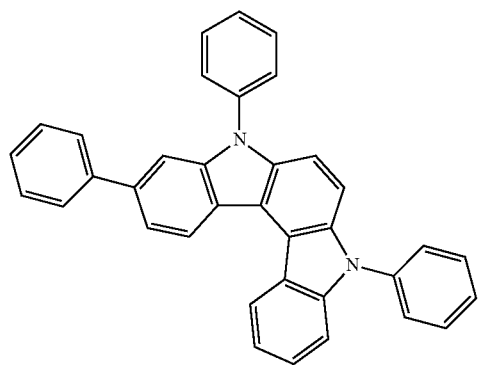
[A-89]
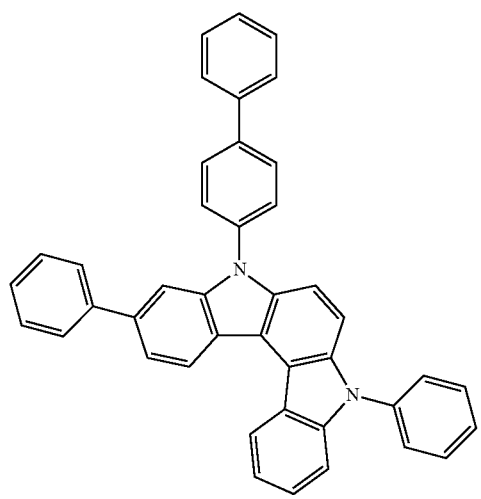
[A-90]
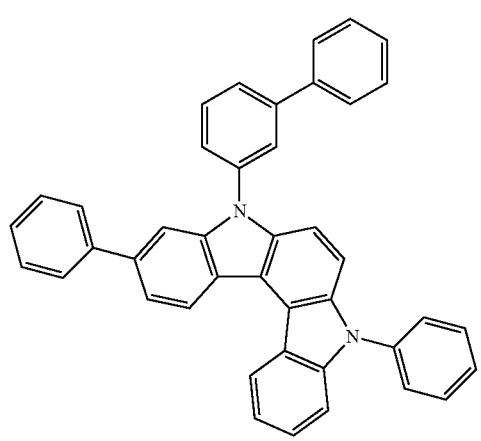
[A-91]
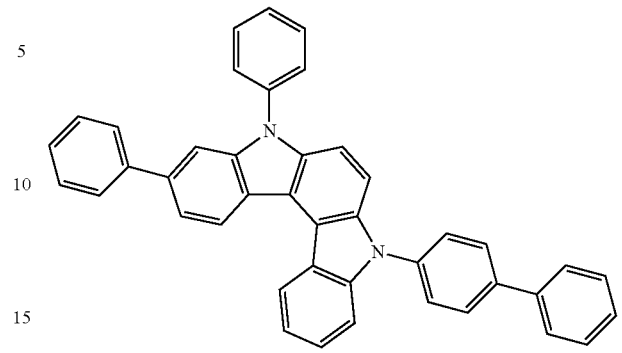
[A-92]
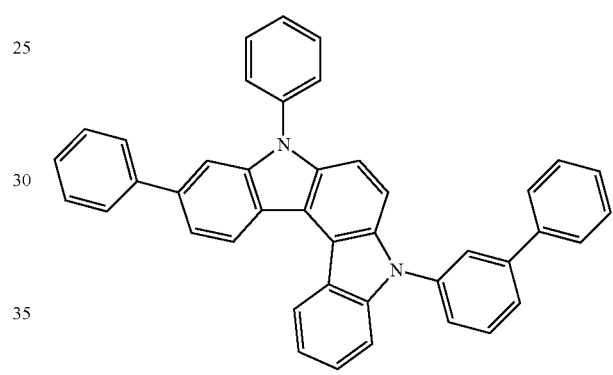
[A-93]
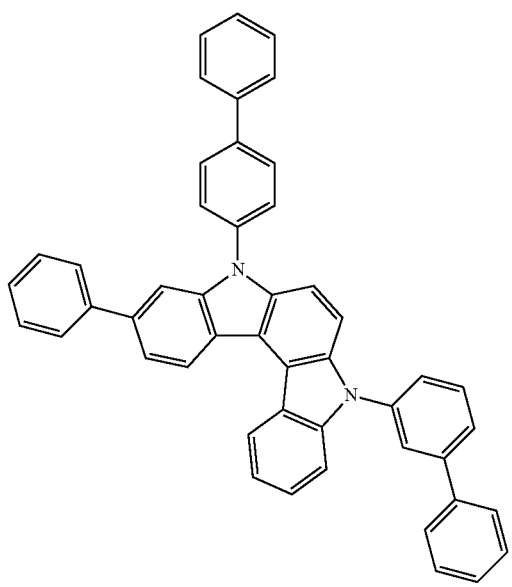

-continued
[A-94]
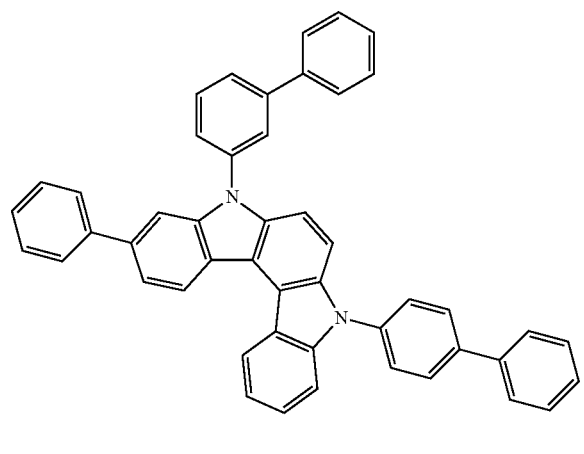
[A-95]
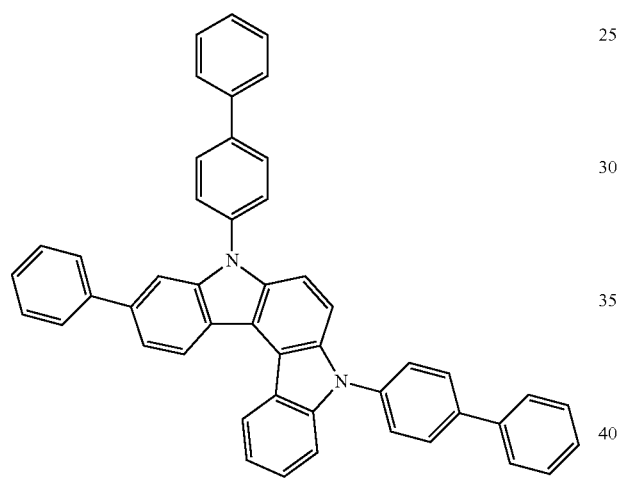
[A-96]
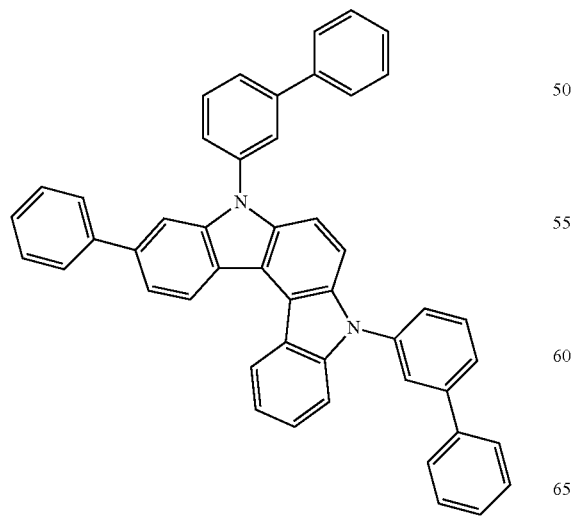
[A-97]
[A-98]
[A-99]
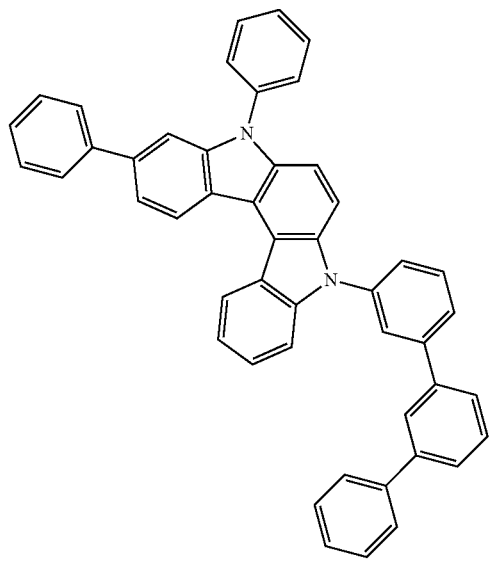

[A-100]
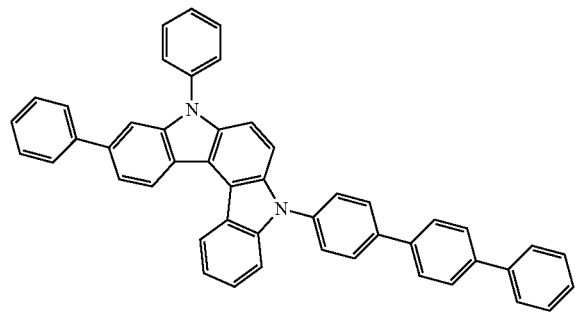
[A-101]
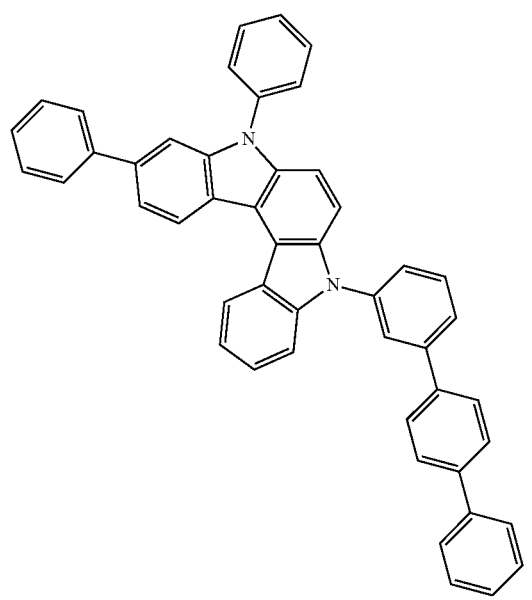
[A-102]
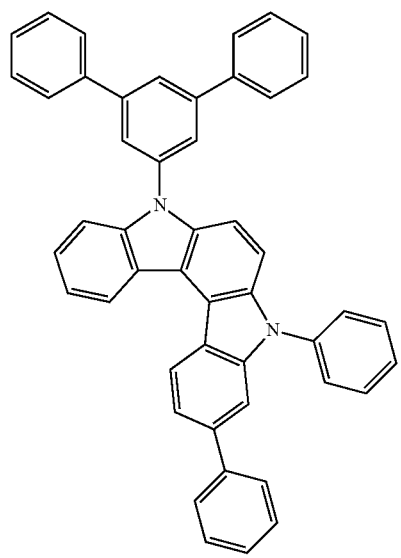
[A-103]
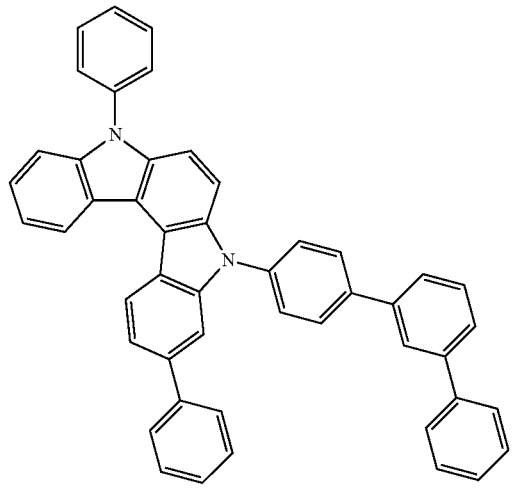
[A-104]
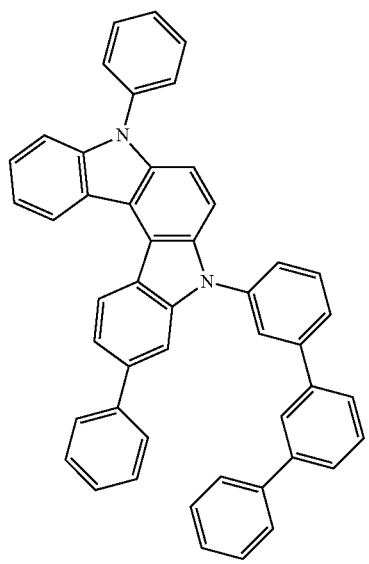
[A-105]
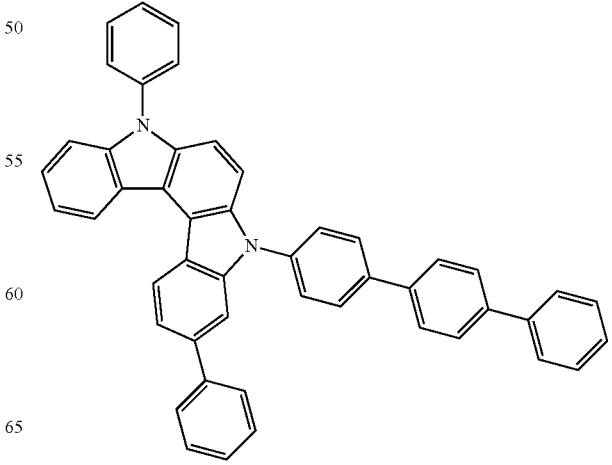

[A-106]
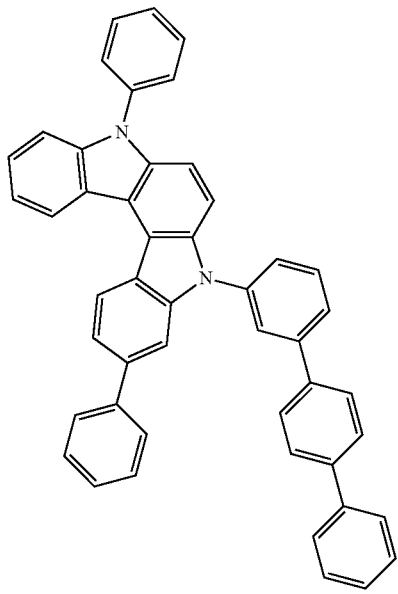
[A-107]
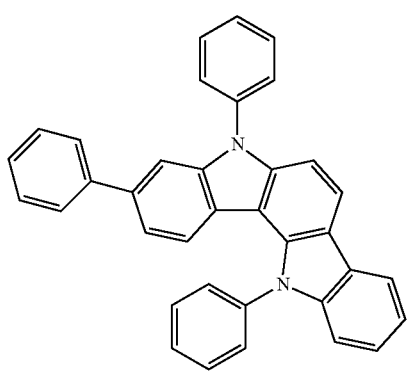
[A-108]
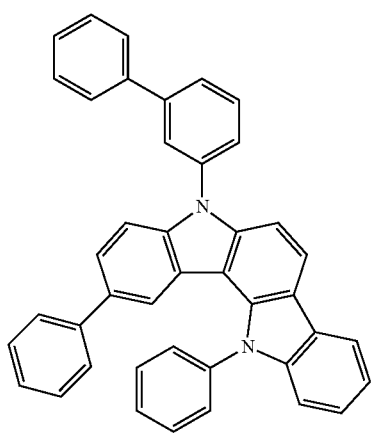
[A-109]
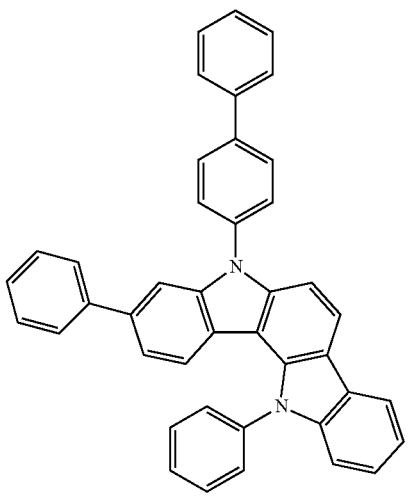
[A-110]
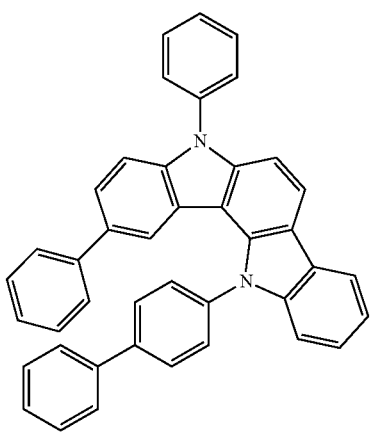
[A-111]
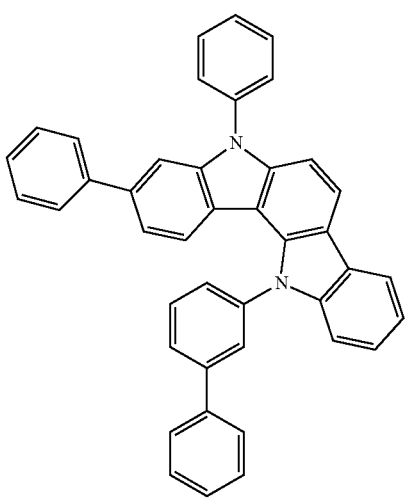

[A-112]
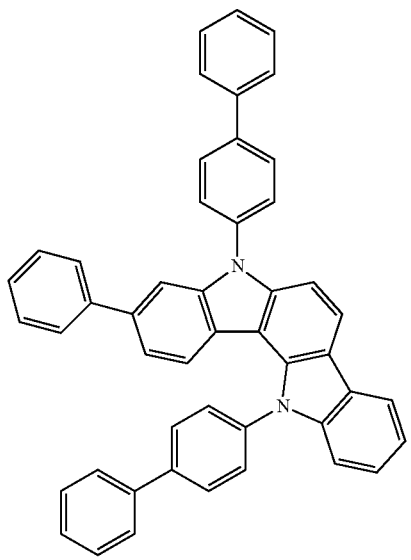
[A-113]
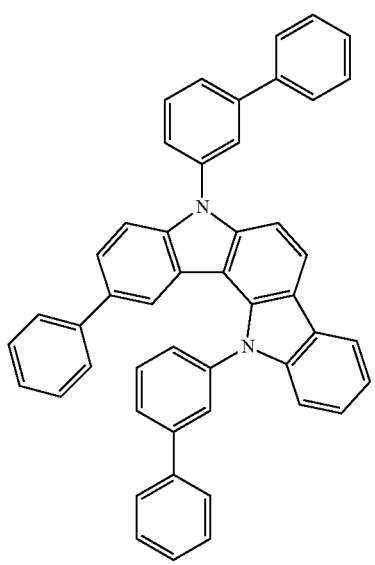
[A-114]
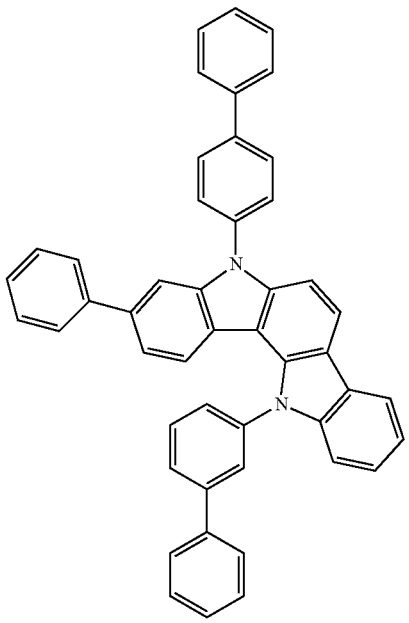
[A-115]
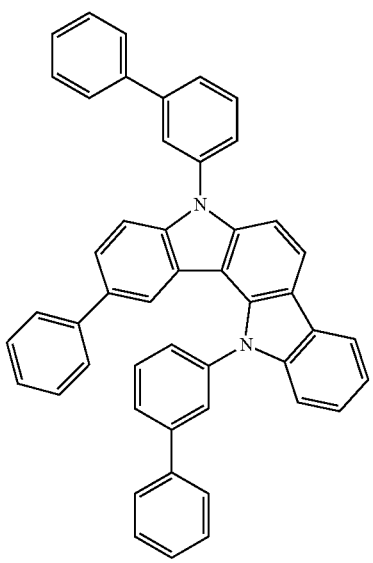
[A-116]
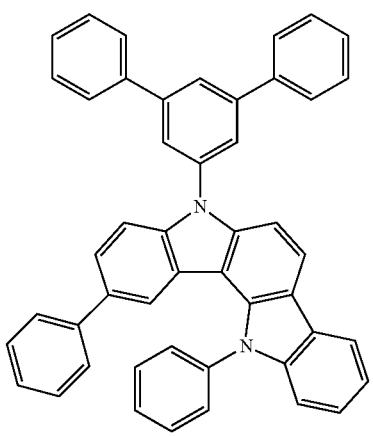

[A-117]
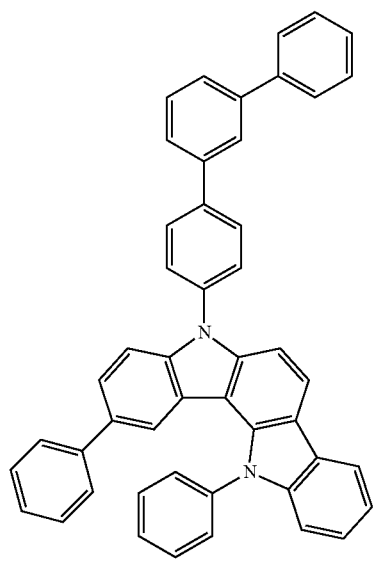
[A-118]
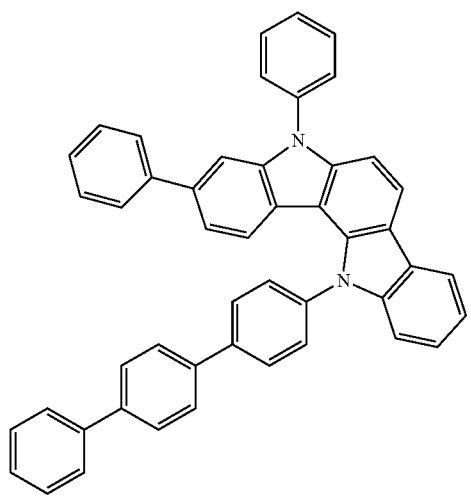
[A-119]
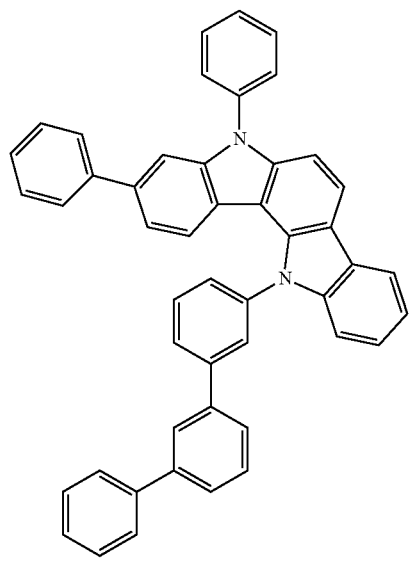
[A-120]
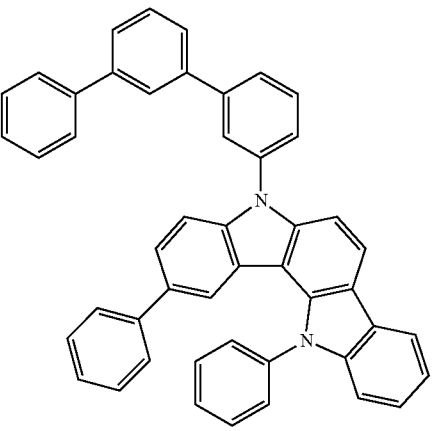
[A-121]
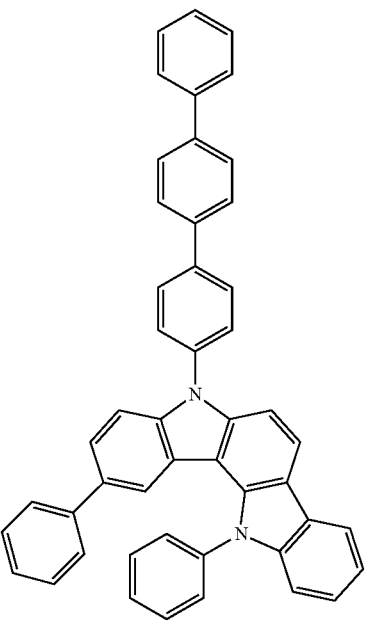
[A-122]
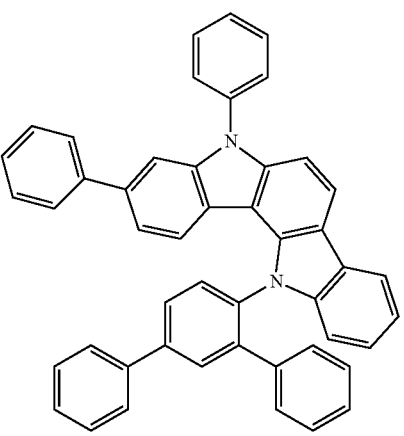

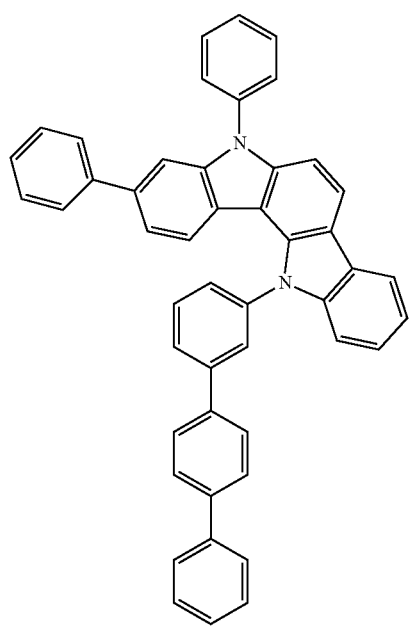
[A-123]
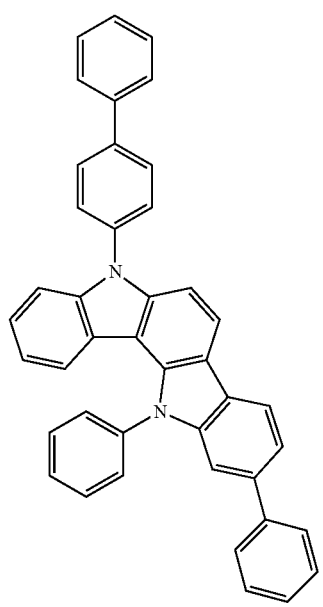
[A-126]
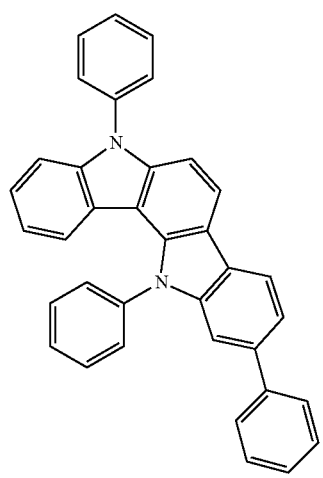
[A-124]
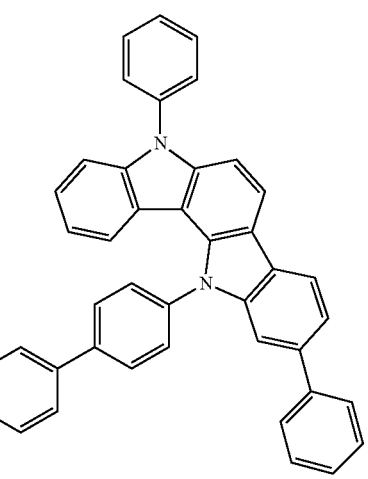
[A-127]
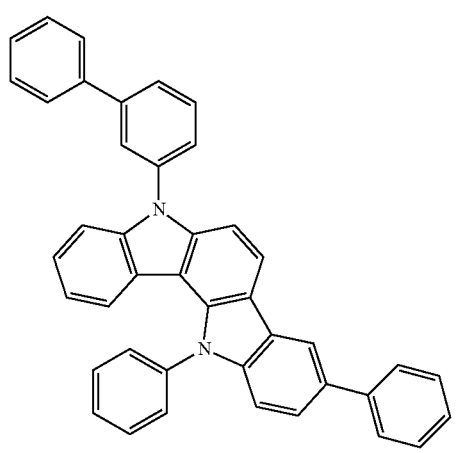
[A-125]
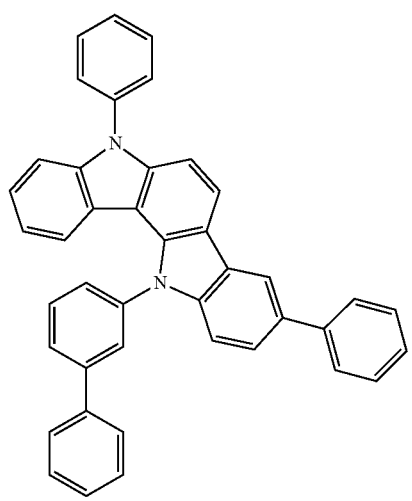
[A-128]

[A-129]
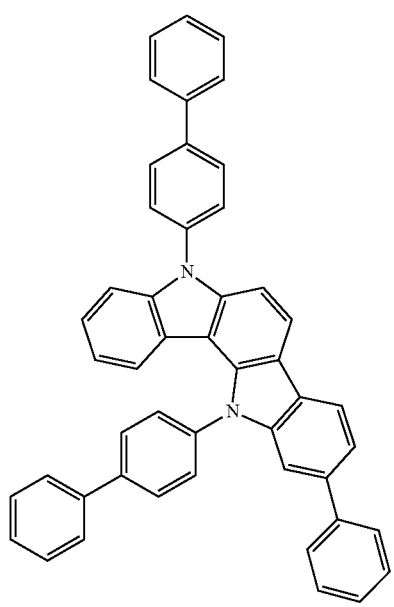
[A-131]
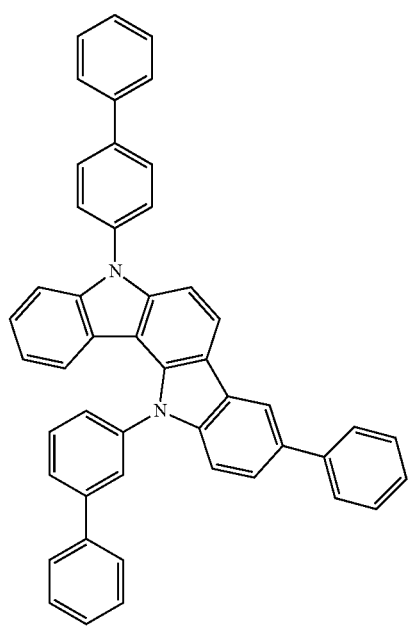
[A-130]
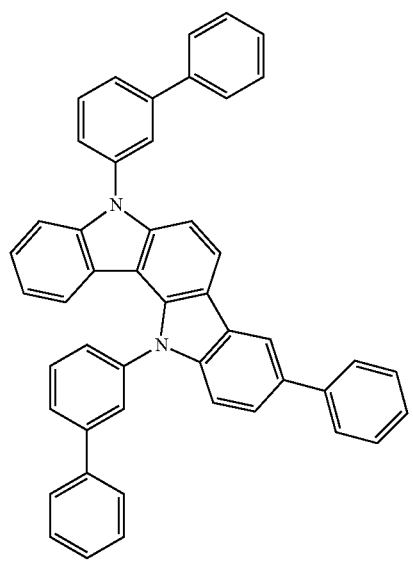
[A-132]
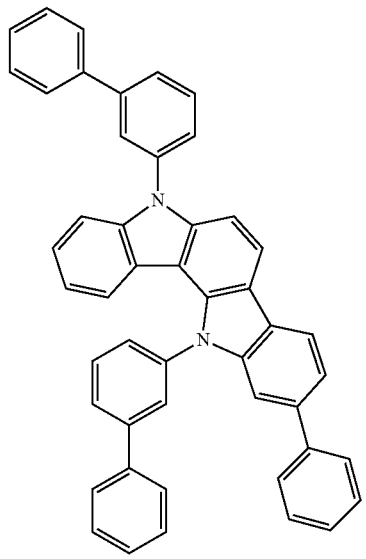

[A-133]
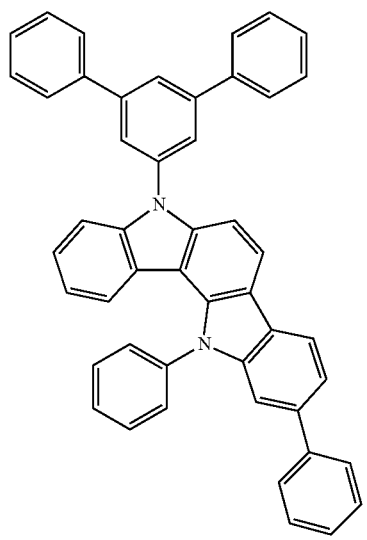
[A-134]
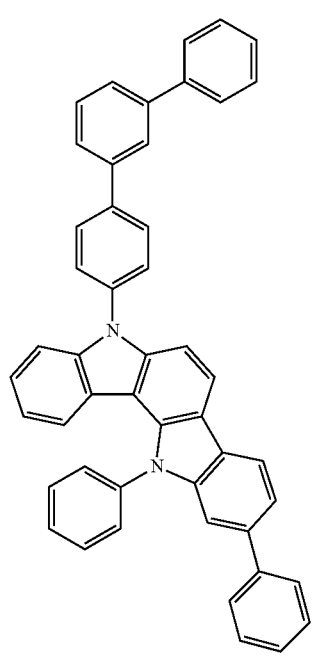
[A-135]
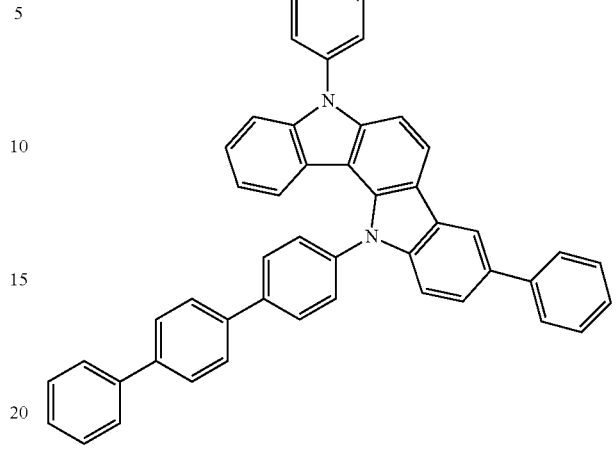
[A-136]
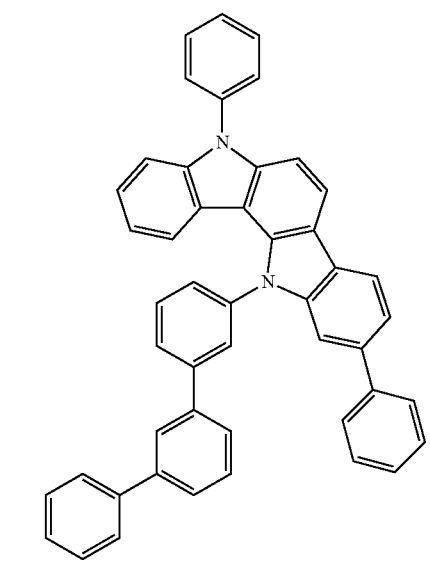
[A-137]
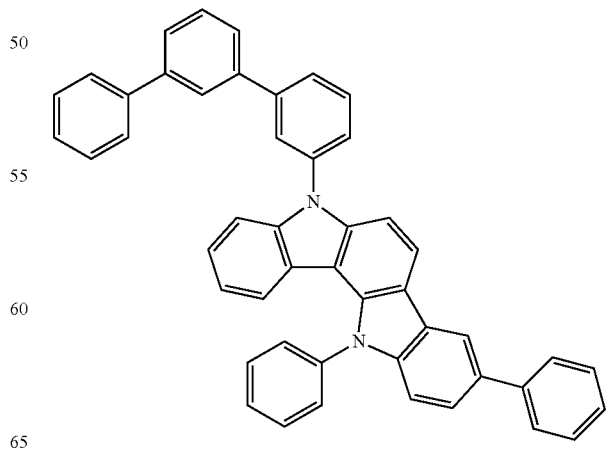

[A-138]
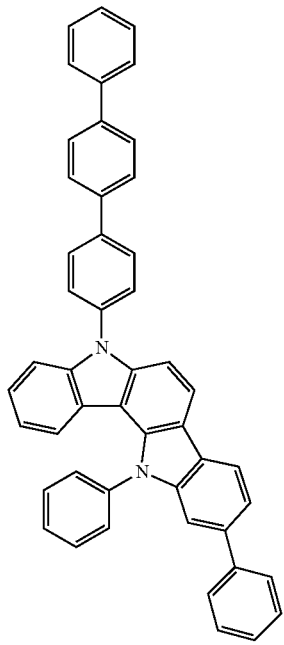
[A-139]
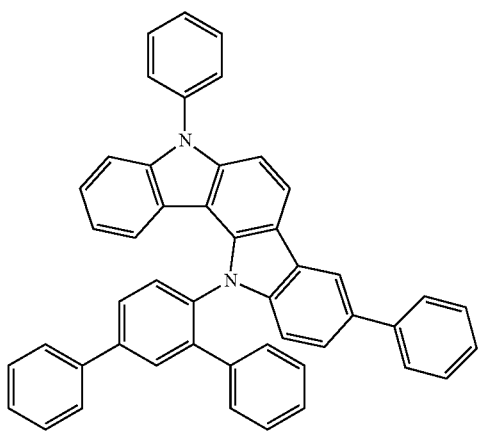
[A-140]
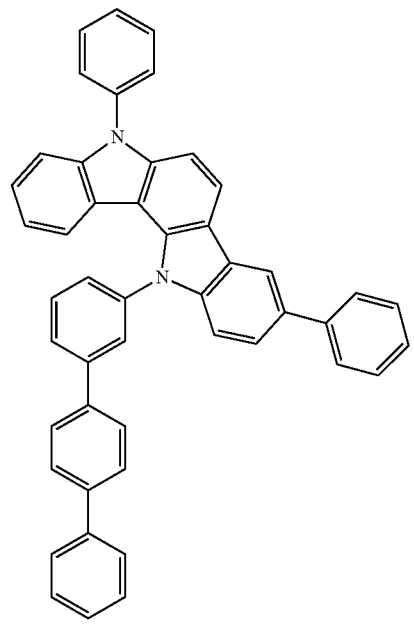
[A-141]
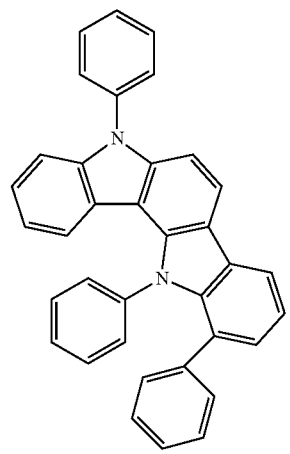
[A-142]
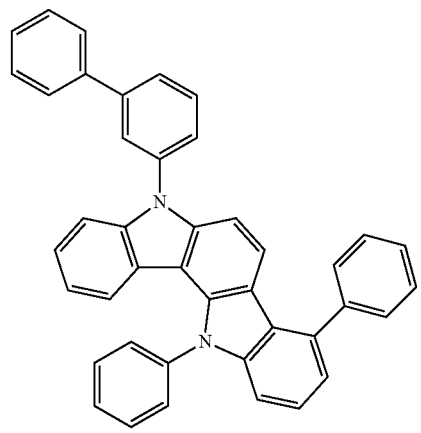

[A-143]
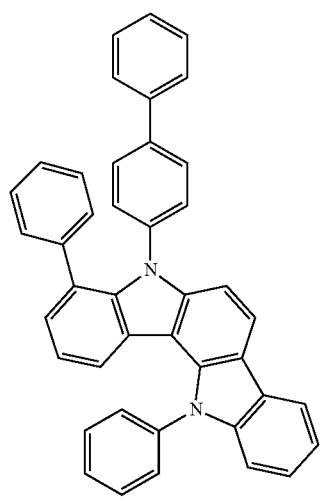
[A-144]
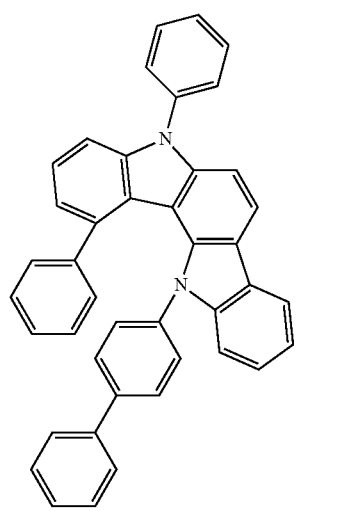
[A-145]
[A-146]
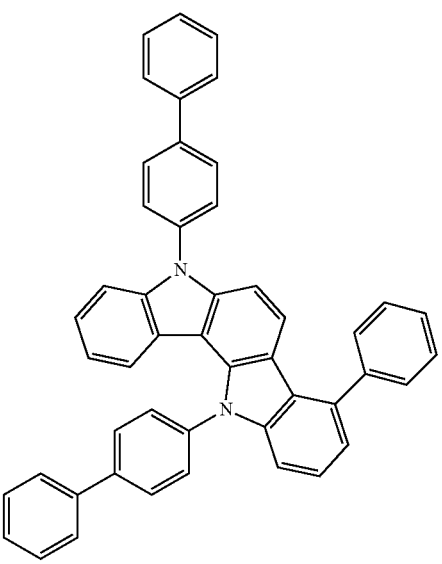
[A-147]
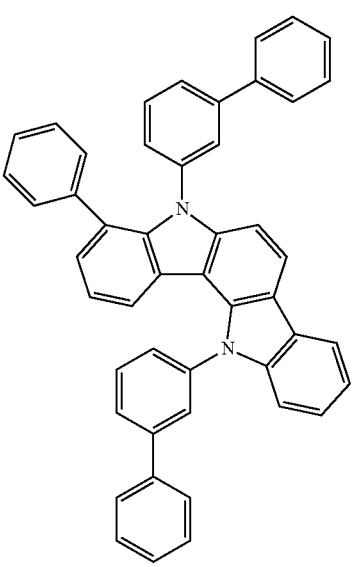

[A-148]
[A-149]
[A-150]
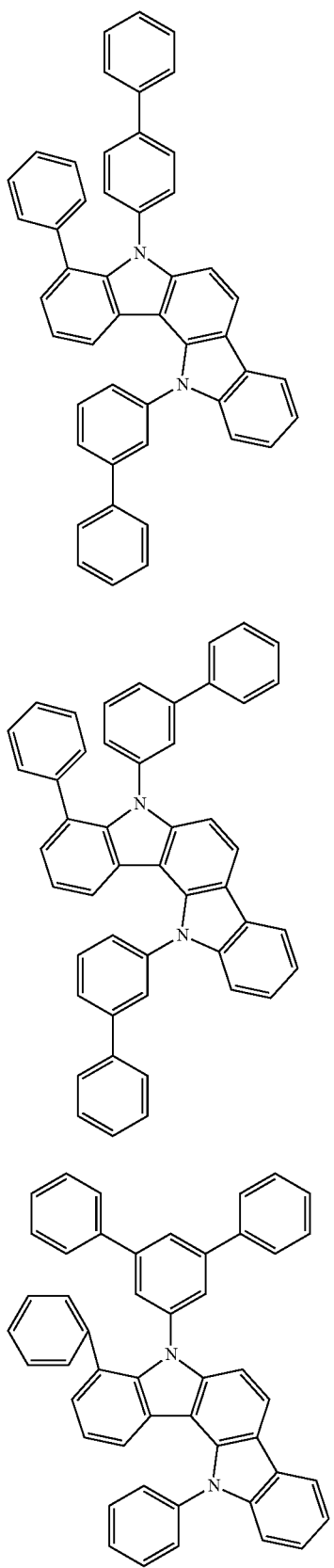
[A-151]
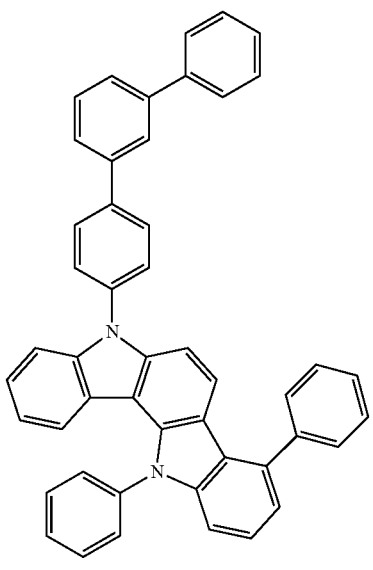
[A-152]
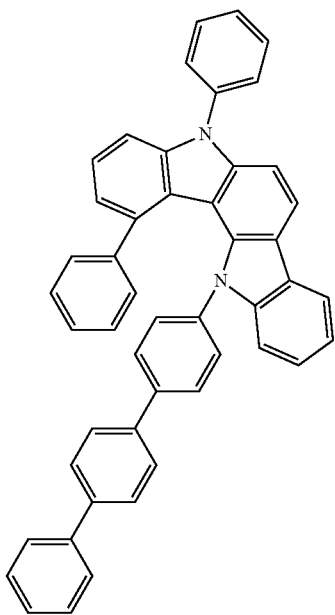

[A-153]
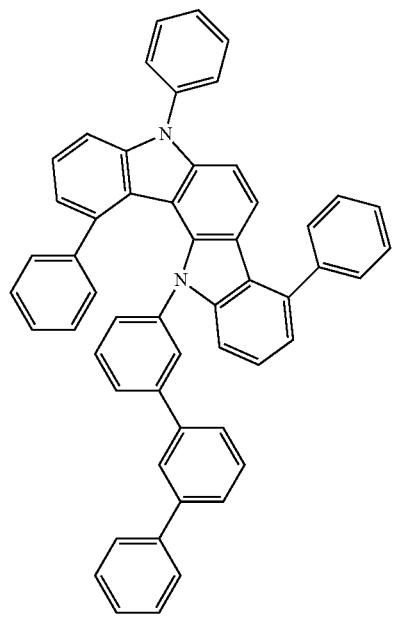
[A-155]
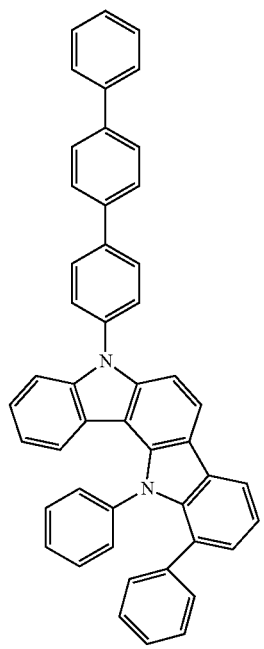
[A-154]
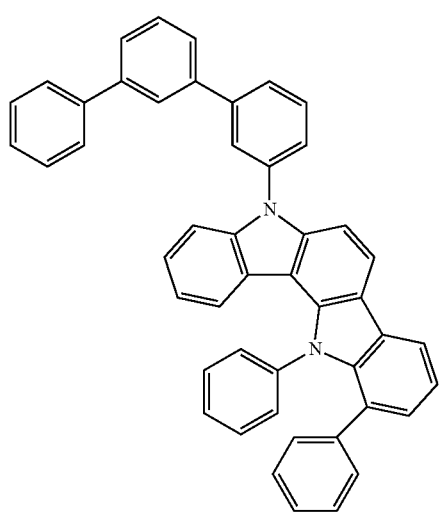
[A-156]
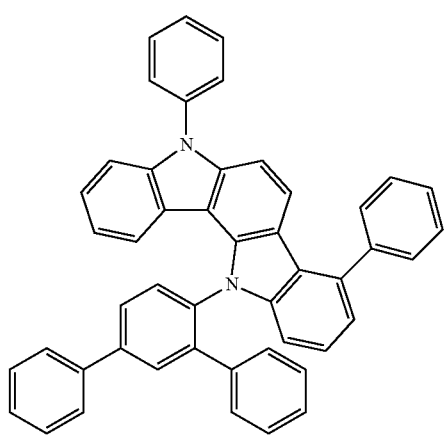

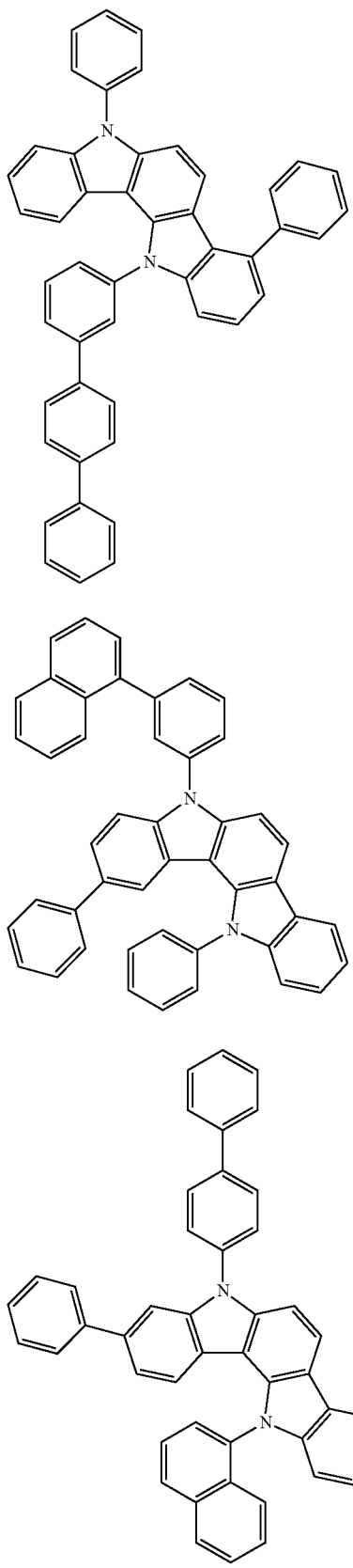
[A-157]
[A-158]
[A-159]
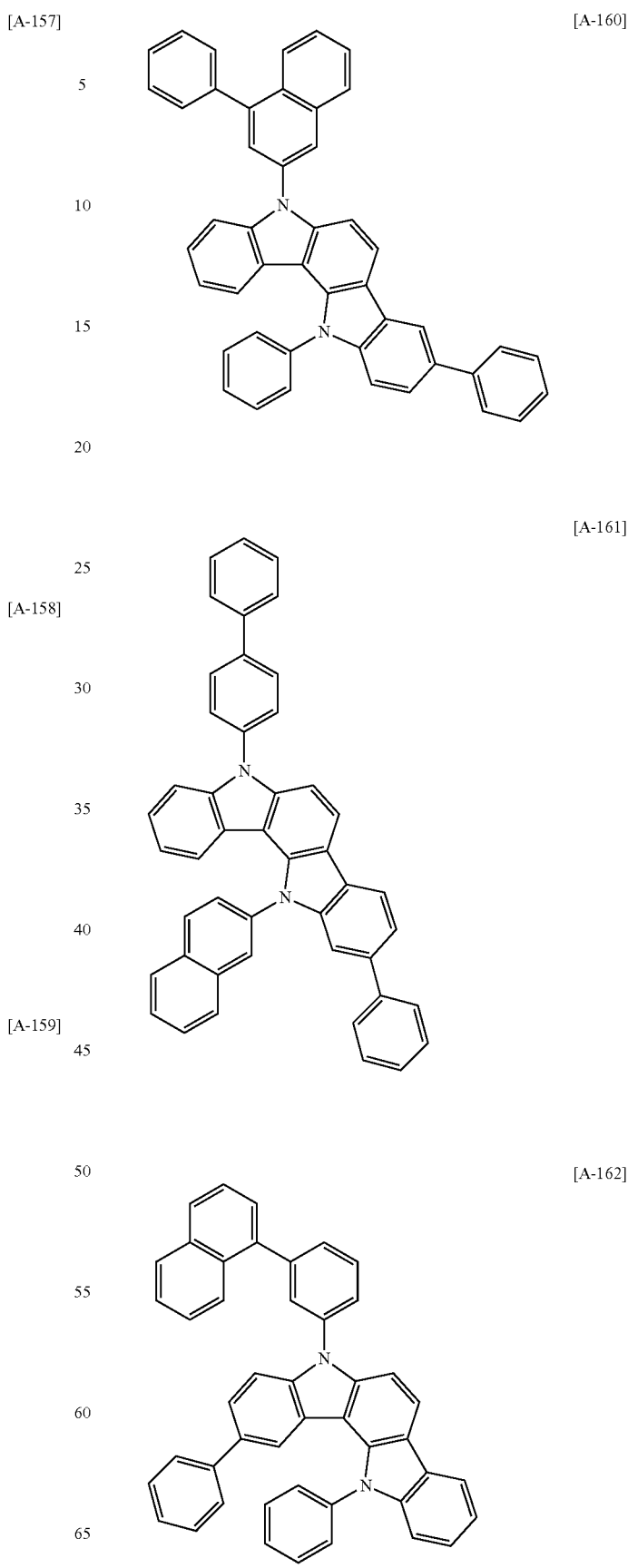
[A-160]
[A-161]
[A-162]

[A-163]

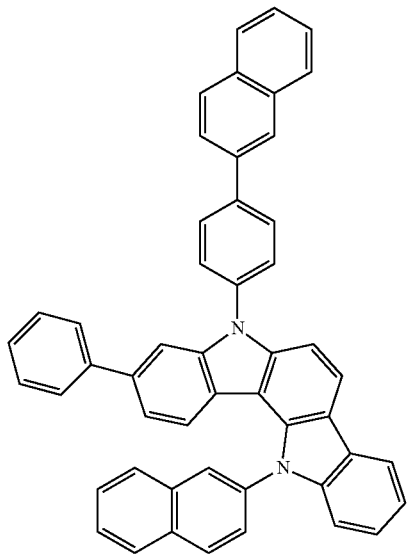

[A-164]

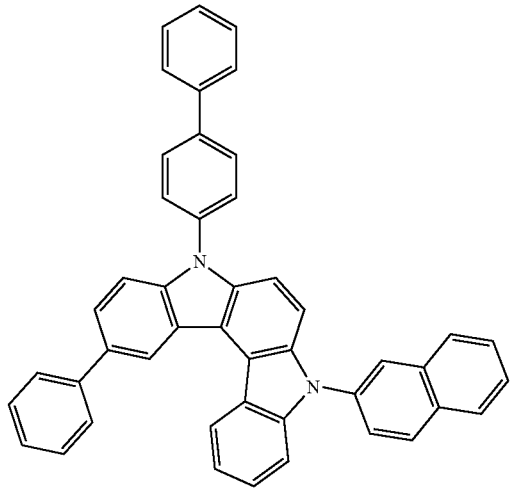

[A-165]

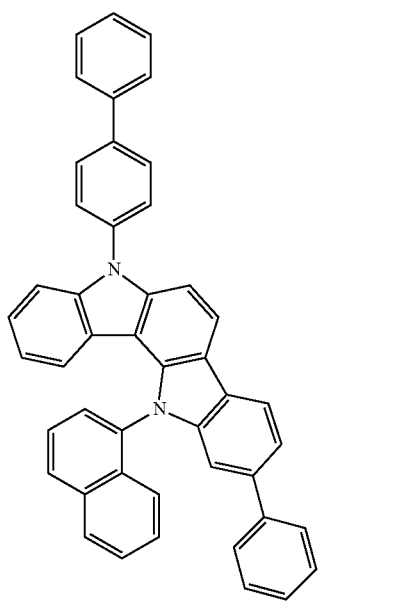

[A-166]

The second compound for the organic optoelectronic element may be represented by Chemical Formula 3.

[Chemical Formula 3]

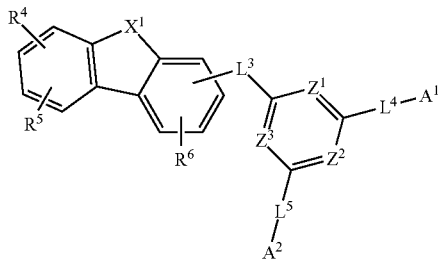

In Chemical Formula 3, $Z^1$ to $Z^3$ are independently N or $CR^b$, at least two of $Z^1$ to $Z^3$ are N, $R^b$ and $R^4$ to $R^6$ are independently hydrogen, deuterium, a cyano group, a substituted or unsubstituted C1 to C10 alkyl group, a substituted or unsubstituted C6 to C20 aryl group, or a substituted or unsubstituted C2 to C30 heterocyclic group, $L^3$ to $L^5$ are independently a single bond or a substituted or unsubstituted C6 to C30 arylene group, $X^1$ is O or S, and $A^1$ and $A^2$ are independently a substituted or unsubstituted C6 to C20 aryl group, or a substituted or unsubstituted C2 to C30 heterocyclic group.

The "substituted" of Chemical Formula 3 refers to replacement of at least one hydrogen by deuterium, a C1 to C10 alkyl group, or a C6 to C18 aryl group.

In one example of the present invention, the "substituted" refers to replacement of at least one hydrogen by deuterium, a C1 to C4 alkyl group, or a C6 to C12 aryl group. Specifically, at least one hydrogen may be replaced by a C1 to C4 alkyl group, a phenyl group, a biphenyl group, a naphthyl group, a terphenyl group, or an anthracenyl group, and at least one hydrogen may be for example replaced by a phenyl group, a biphenyl group, a naphthyl group, or a terphenyl group.

In an example embodiment of the present invention, $Z^4$ to $Z^3$ may be all N.

In an example embodiment of the present invention, $R^4$ to $R^6$ may independently be hydrogen or a phenyl group.

For example, the second compound for the organic optoelectronic element may be represented by one of Chemical Formula 3-a to Chemical Formula 3-d.

[Chemical Formula 3-a]

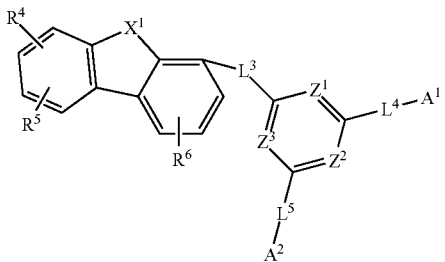

[Chemical Formula 3-b]

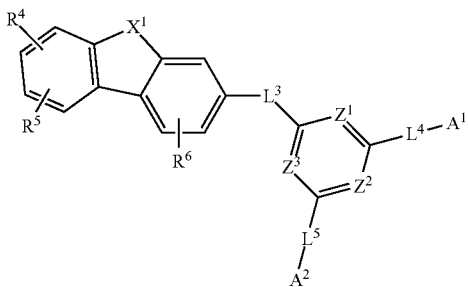

[Chemical Formula 3-c]

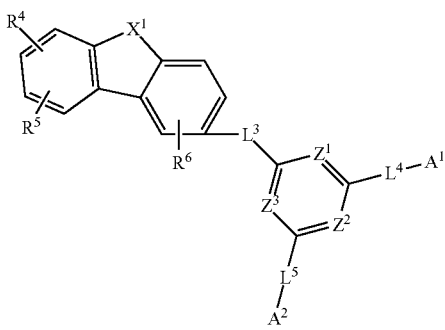

[Chemical Formula 3-d]

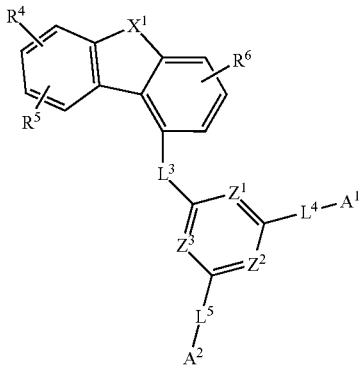

In Chemical Formula 3-a to Chemical Formula 3-d,
$Z^1$ to $Z^3$ are independently N or $CR^b$,
at least two of $Z^1$ to $Z^3$ are N,
$R^b$ and $R^4$ to $R^6$ are independently hydrogen, deuterium, a cyano group, a substituted or unsubstituted C1 to C10 alkyl group, a substituted or unsubstituted C6 to C20 aryl group, or a substituted or unsubstituted C2 to C30 heterocyclic group,
$L^3$ to $L^5$ are independently a single bond or a substituted or unsubstituted C6 to C30 arylene group,
$X^1$ is O or S, and
$A^1$ and $A^2$ are independently a substituted or unsubstituted C6 to C20 aryl group, or a substituted or unsubstituted C2 to C30 heterocyclic group.

In an example embodiment of the present invention, $A^1$ and $A^2$ of Chemical Formula 3 may independently be a substituted or unsubstituted C6 to C30 aryl group, or a substituted or unsubstituted C2 to C30 heterocyclic group, and one of $A^1$ and $A^2$ may be a substituted or unsubstituted C6 to C30 aryl group.

In a specific example embodiment of the present invention, $A^1$ may be a substituted or unsubstituted C6 to C30 aryl group and $A^2$ may be a substituted or unsubstituted C6 to C30 aryl group, or a substituted or unsubstituted C2 to C30 heterocyclic group.

In a more specific example embodiment of the present invention, $A^1$ may be a substituted or unsubstituted C6 to C20 aryl group, $A^1$ may be for example a substituted or unsubstituted phenyl group, a substituted or unsubstituted biphenyl group, a substituted or unsubstituted terphenyl group, a substituted or unsubstituted quaterphenyl group, or a substituted or unsubstituted naphthyl group, and Chemical Formula 3 may be represented by Chemical Formula 3-I.

[Chemical Formula 3-I]

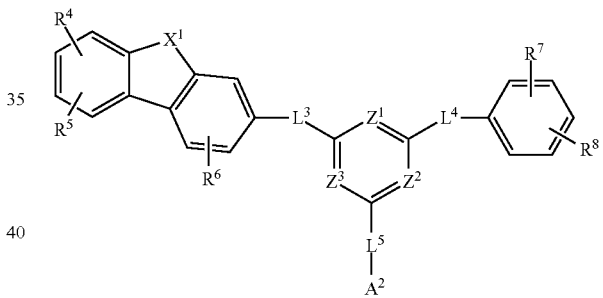

In Chemical Formula 3-I, $Z^1$ to $Z^3$, $R^4$ to $R^6$, $L^3$ to $L^5$, $X^1$, and $A^2$ are the same as described above and definitions of $R^7$ and $R^8$ are the same as definitions of $R^4$ to $R^6$.

$A^1$ of Chemical Formula 3 may be selected from, for example, the substituents of Group E.

[Group II]

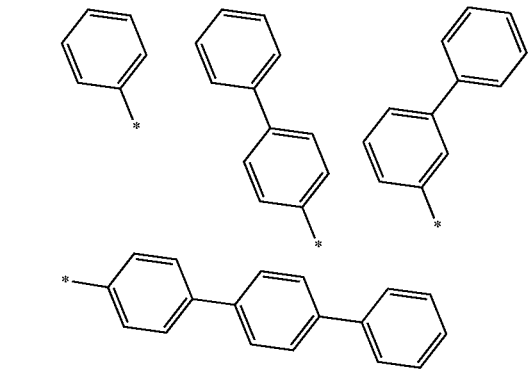

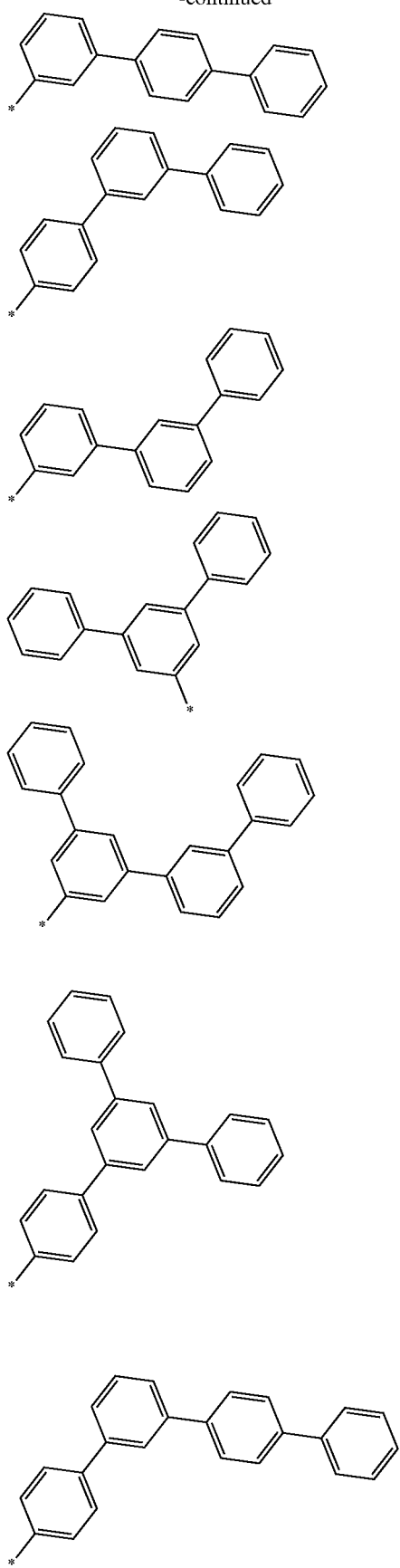
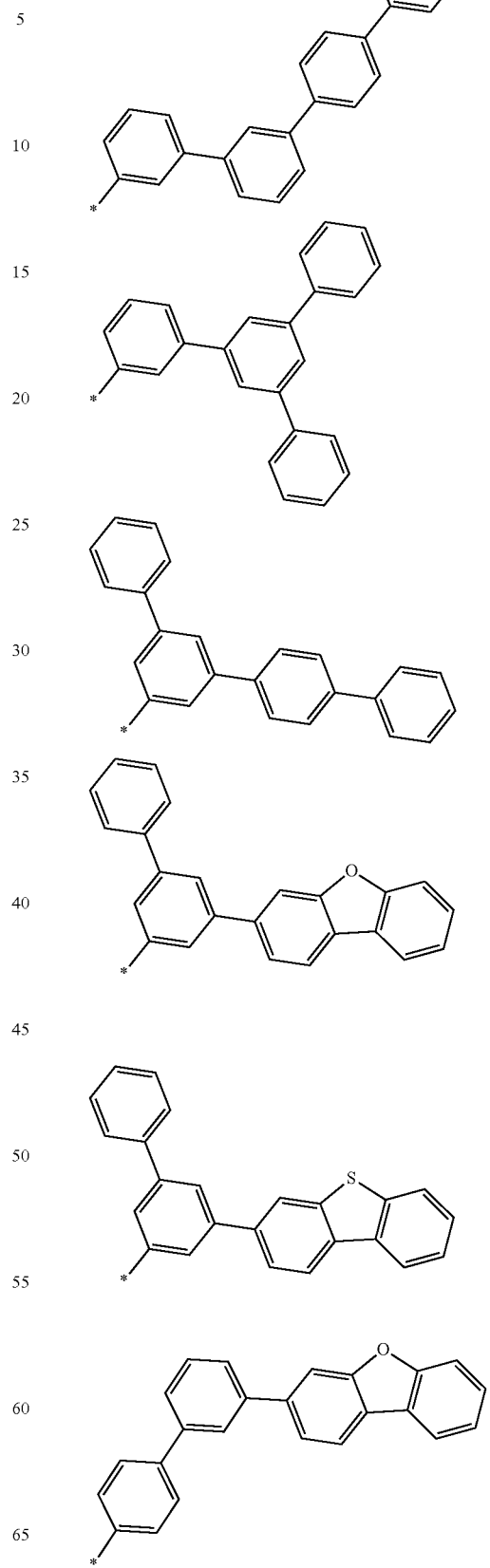

-continued
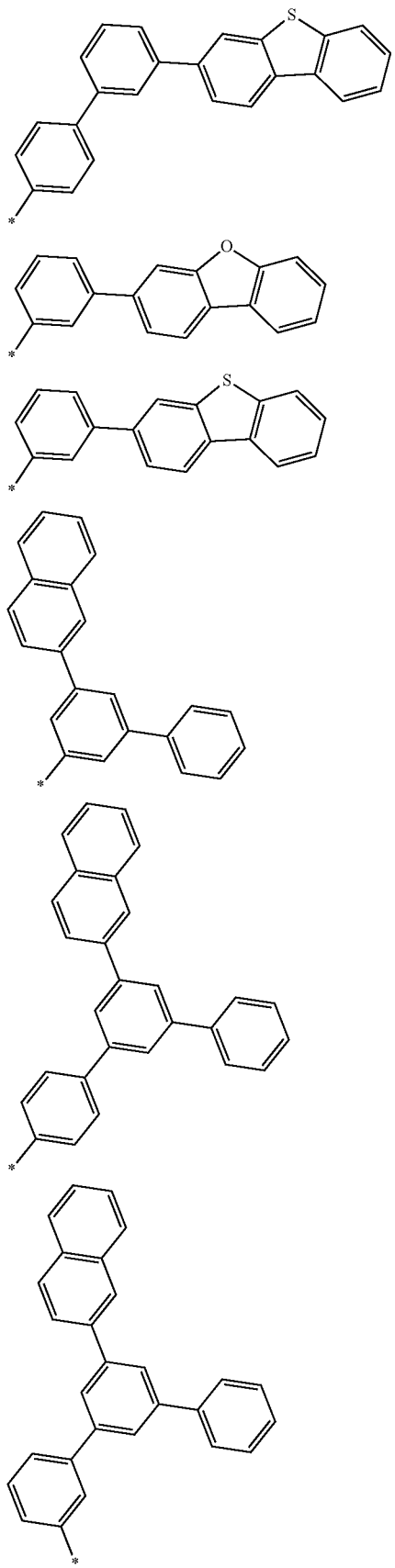
-continued
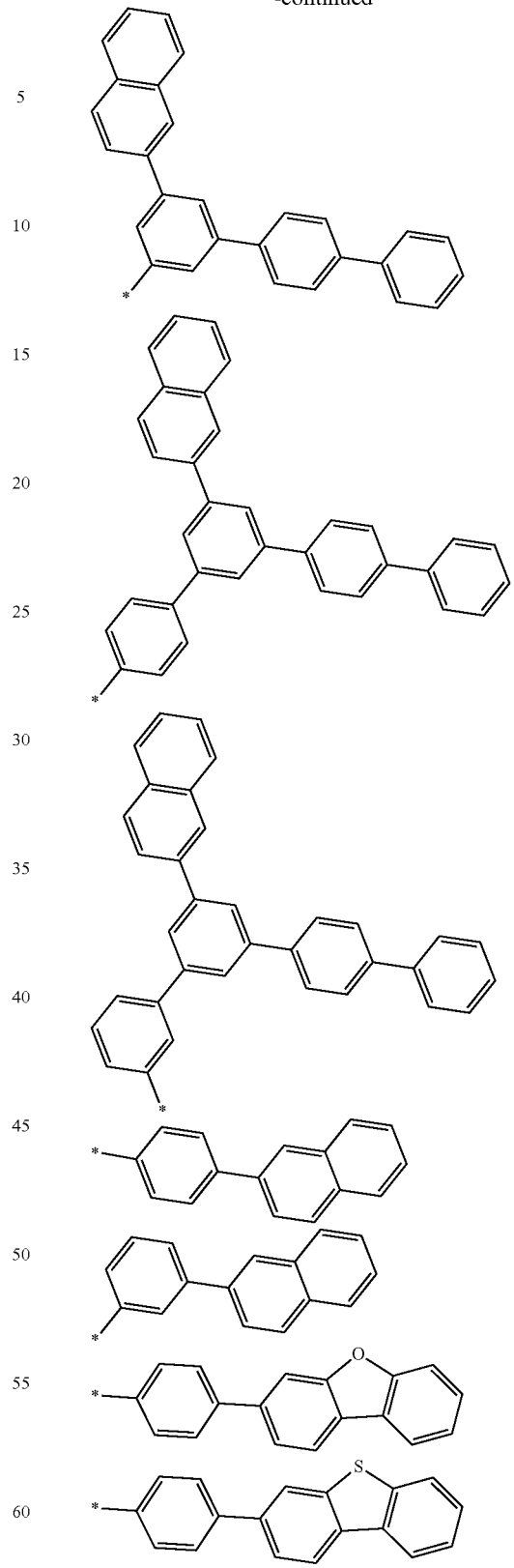
In Group II, * is a linking point with $L^4$.
On the other hand, $A^2$ may be a substituted or unsubstituted phenyl group, a substituted or unsubstituted biphenyl group, a substituted or unsubstituted naphthyl group, a substituted or unsubstituted terphenyl group, a substituted or unsubstituted quaterphenyl group, a substituted or unsubstituted dibenzofuranyl group, a substituted or unsubstituted dibenzothiophenyl group, a substituted or unsubstituted pyrimidinyl group, or a substituted or unsubstituted triazinyl group, and particularly, the second compound for the organic optoelectronic element may be represented by one of Chemical Formula 3-I-1 to Chemical Formula 3-I-3 according to a specific type of $A^2$.

[Chemical Formula 3-I-1]

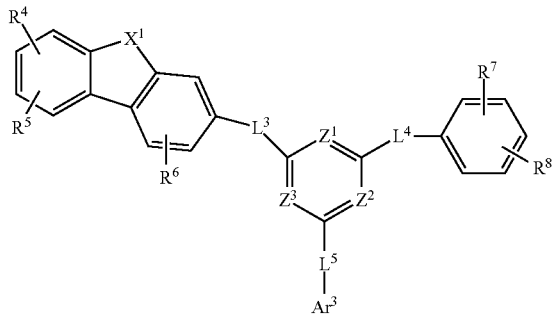

[Chemical Formula 3-I-2]

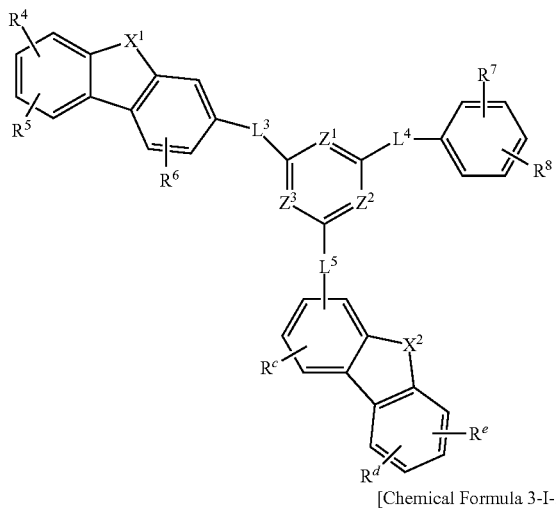

[Chemical Formula 3-I-3]

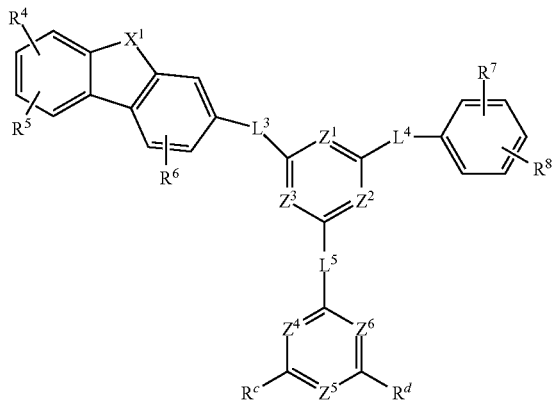

In Chemical Formula 3-I-1 to Chemical Formula 3-I-3, $Ar^3$, $Z^1$ to $Z^3$, $R^4$ to $R^8$ are the same as described above, $X^2$ is the same as the definition of $X^1$, $Z^4$ to $Z^6$ are the same as the definitions of $Z^1$ to $Z^3$, and $R^c$, $R^d$, and $R^e$ are the same as the definitions of $R^4$ to $R^8$.

In addition, $Ar^3$ of Chemical Formula 3-I-1 may be a substituted or unsubstituted C6 to C20 aryl group, specifically a substituted or unsubstituted phenyl group, a substituted or unsubstituted biphenyl group, a substituted or unsubstituted naphthyl group, a substituted or unsubstituted terphenyl group, or a substituted or unsubstituted quaterphenyl group, wherein the additional substituent may be a deuterium, a cyano group, a phenyl group, or a naphthyl group.

In a specific example embodiment of the present invention, $R^e$ and $R^d$ of Chemical Formula 3-I-3 may independently be a substituted or unsubstituted C6 to C20 aryl group, and more specifically a phenyl group, a biphenyl group, a naphthyl group, or a terphenyl group.

$A^2$ of Chemical Formula 3 may be selected from, for example, the substituents of Group III.

[Group III]

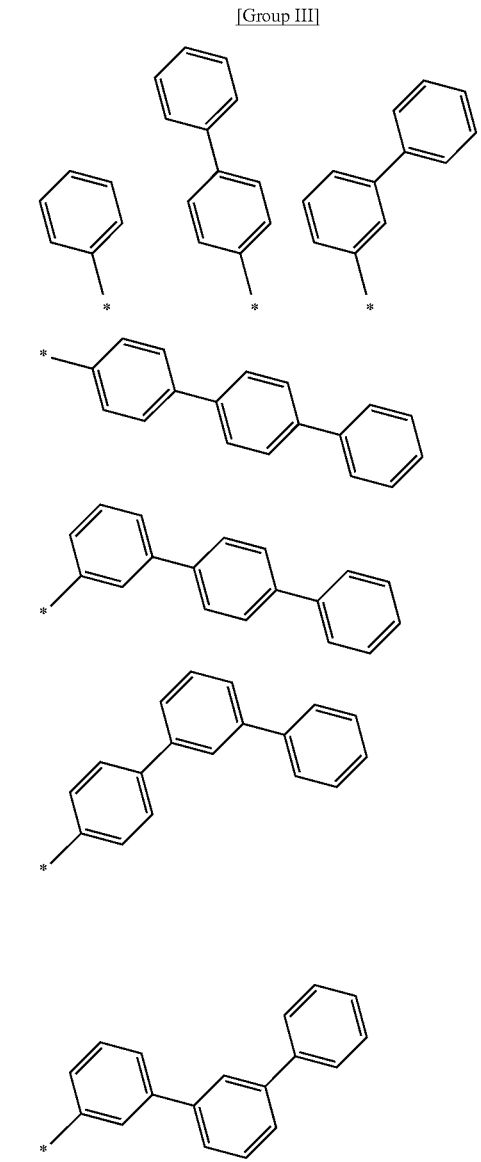

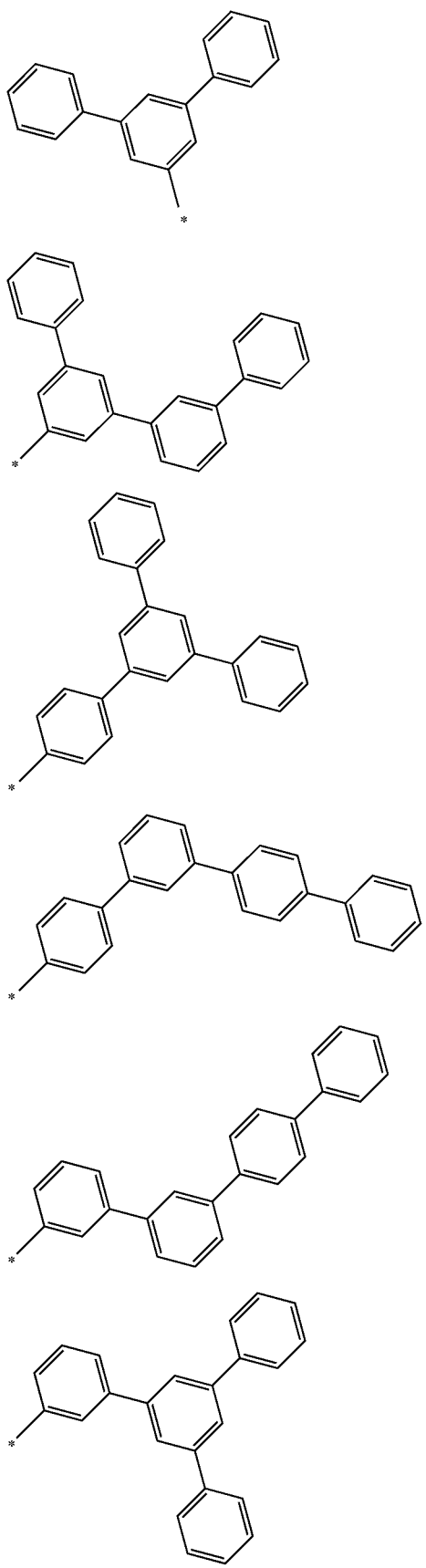
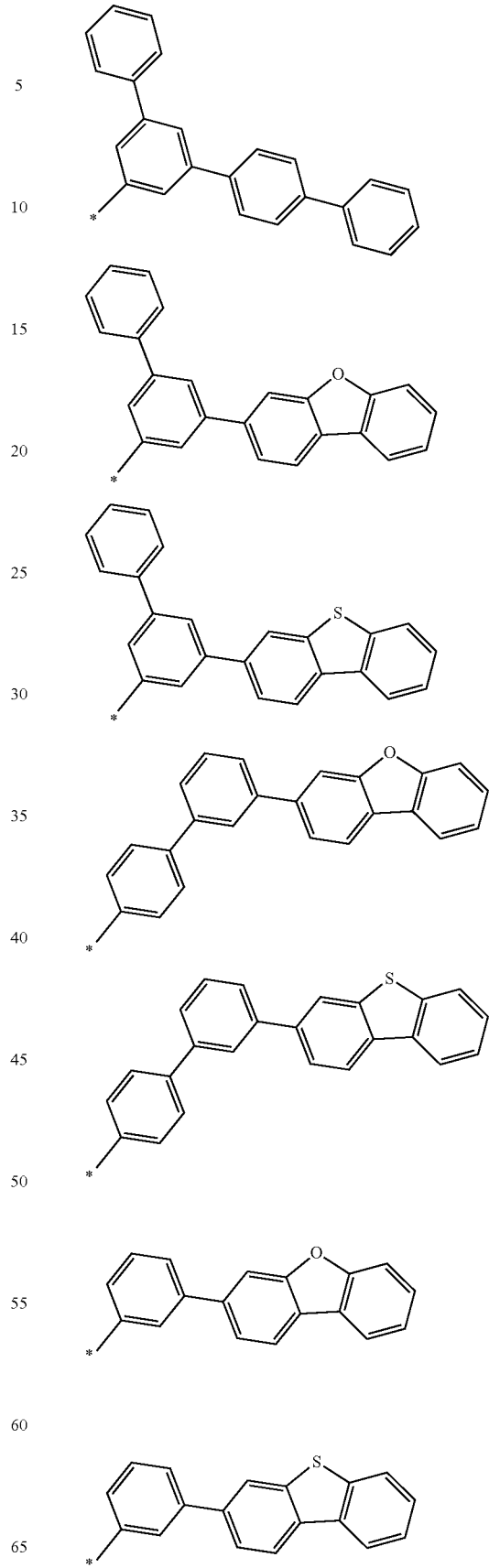

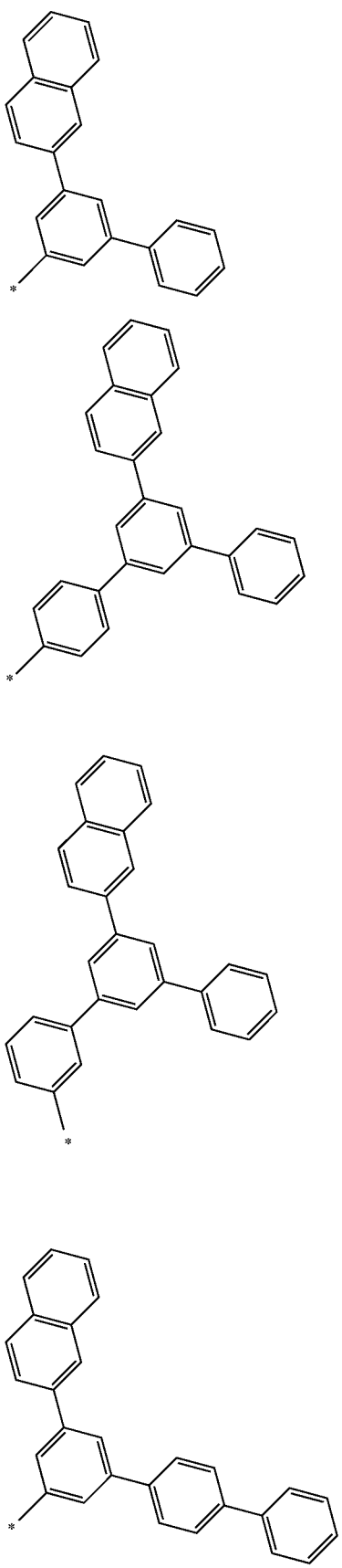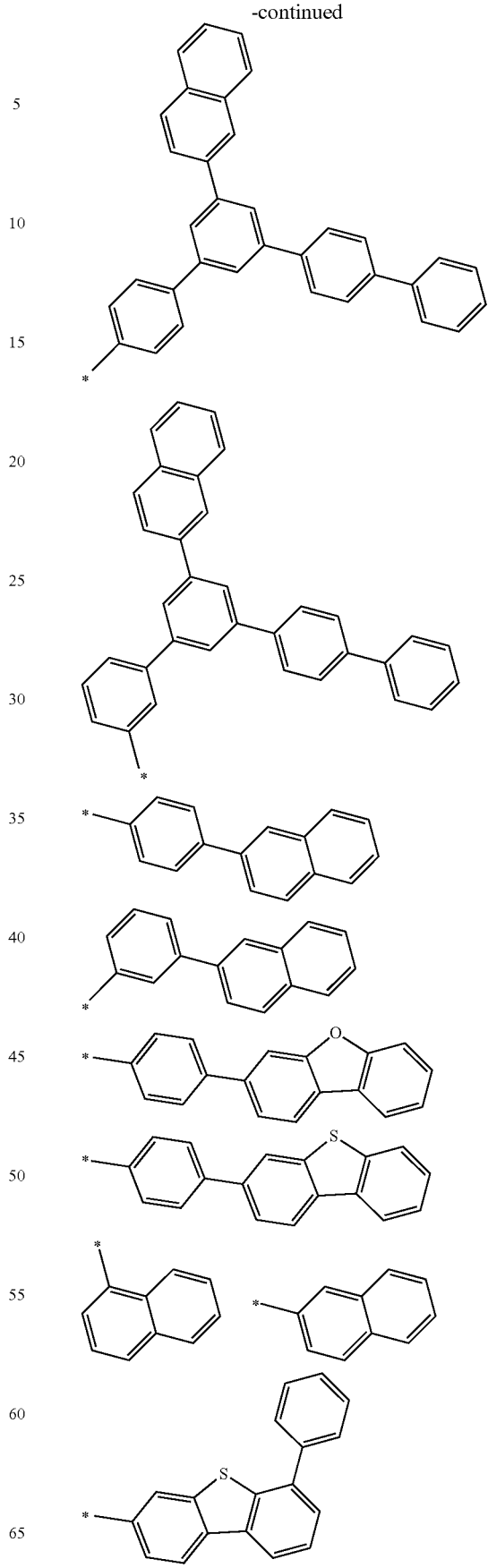

-continued
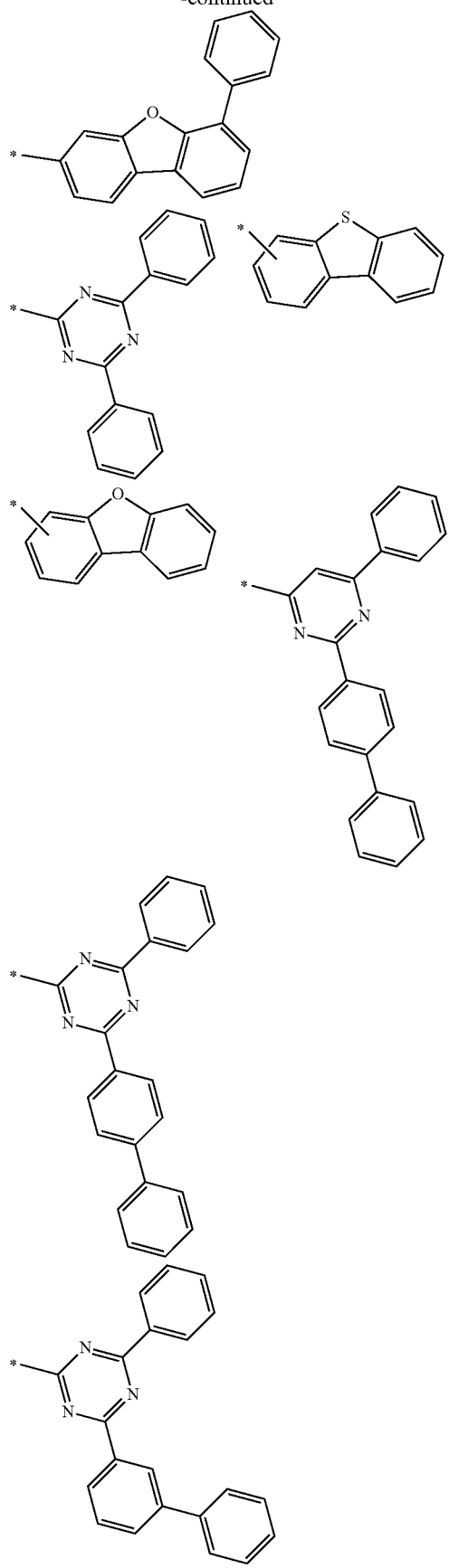
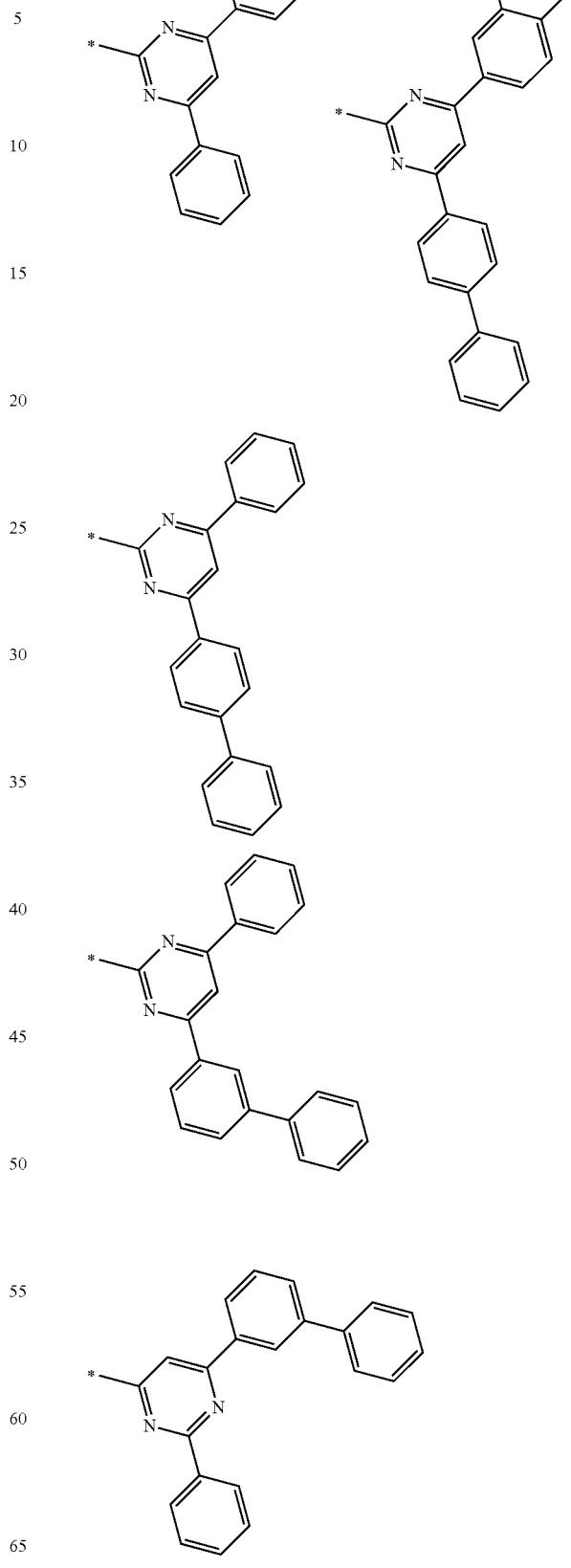

-continued
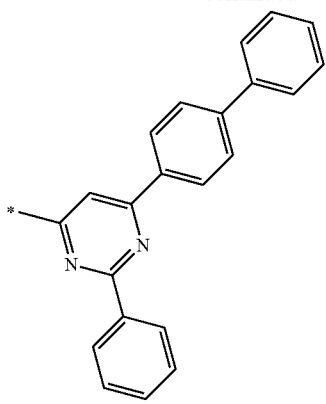
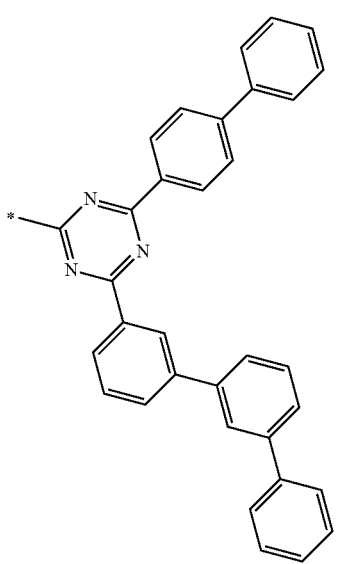
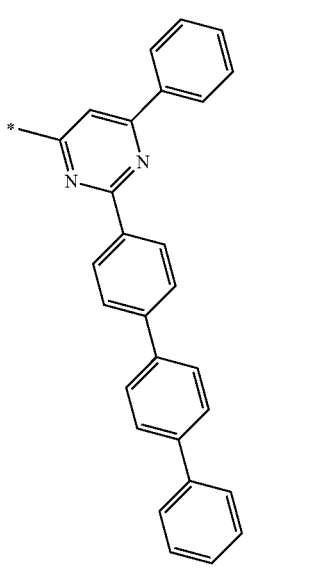
-continued
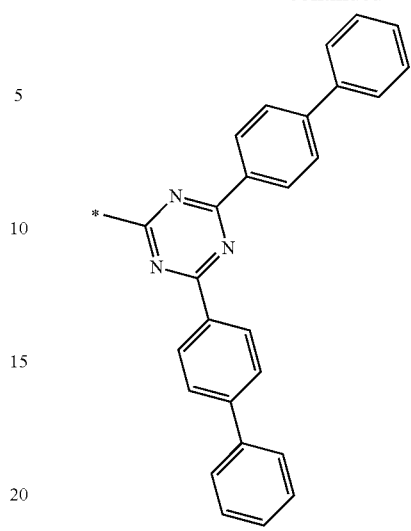
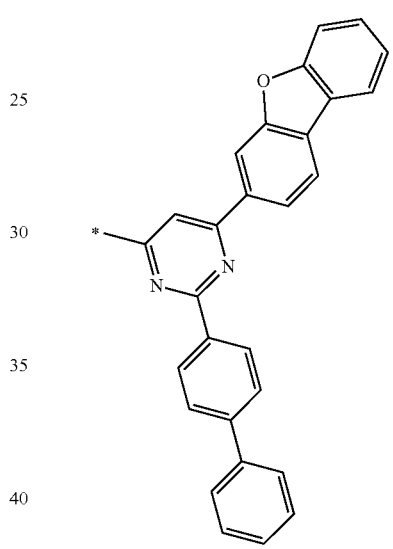
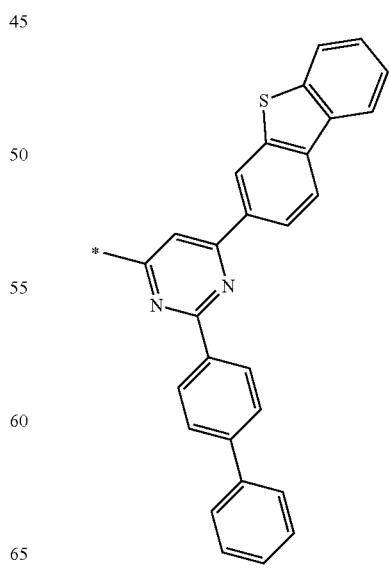

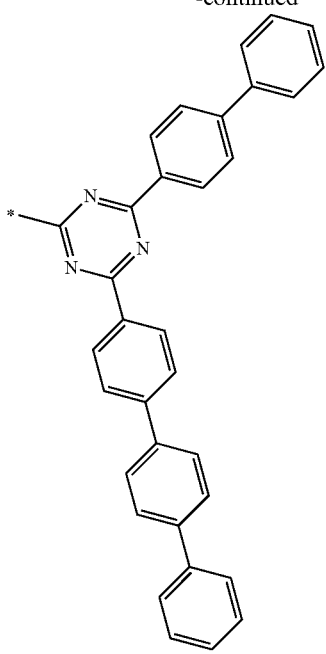
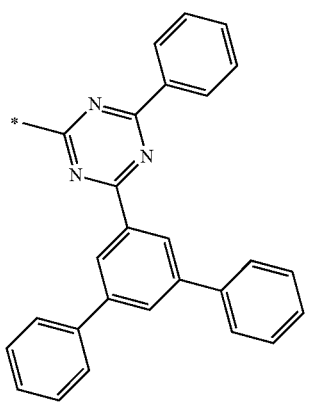
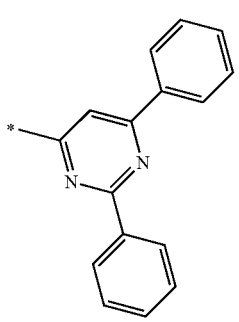
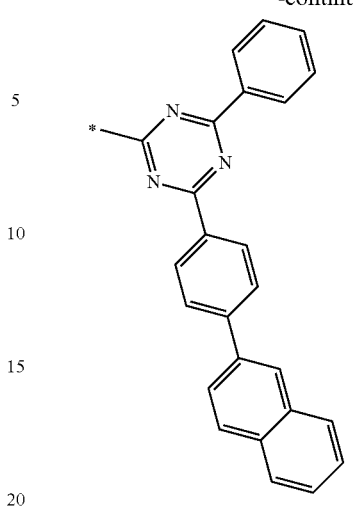
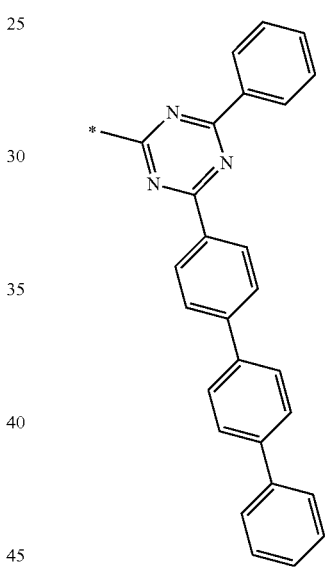
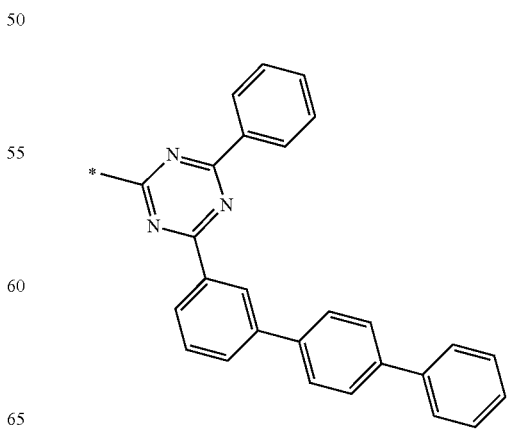

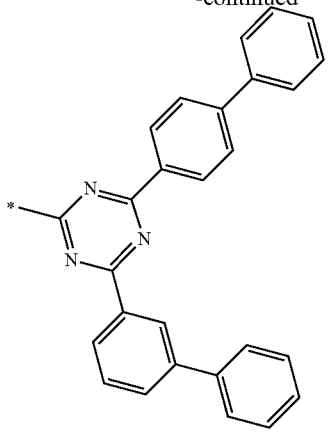

In Group III, * is a linking point with $L^5$.

In the most specific example embodiment of the present invention, the second compound for the organic optoelectronic element may be represented by Chemical Formula 3-I-1 or Chemical Formula 3-I-2, wherein for example $R^7$ and $R^8$ may independently be hydrogen, deuterium, a cyano group, a phenyl group, or a biphenyl group, $Ar^3$ of Chemical Formula 3-I-1 may be for example a substituted or unsubstituted phenyl group, a substituted or unsubstituted biphenyl group, or a substituted or unsubstituted terphenyl group, and $X^2$ of Chemical Formula 3-I-2 may be O or S, and $R^c$, $R^d$, and $R^e$ may independently be hydrogen, deuterium, a cyano group, or a phenyl group.

In the most specific example embodiment of the present invention, $L^3$ to $L^5$ may independently be a single bond or a substituted or unsubstituted phenylene group, a substituted or unsubstituted biphenylene group, a substituted or unsubstituted terphenylene group, or a substituted or unsubstituted naphthylenylene group, and may be for example selected from linking groups of Group IV.

[Group IV]

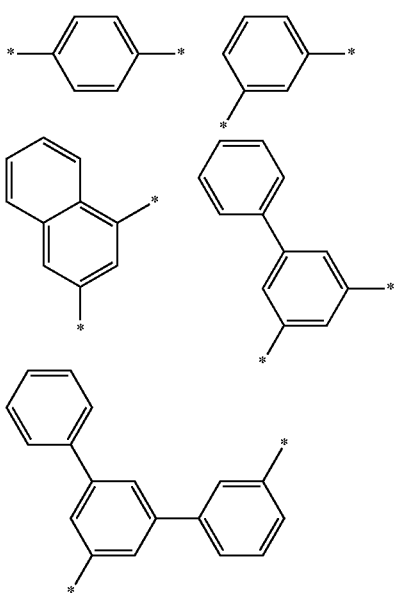

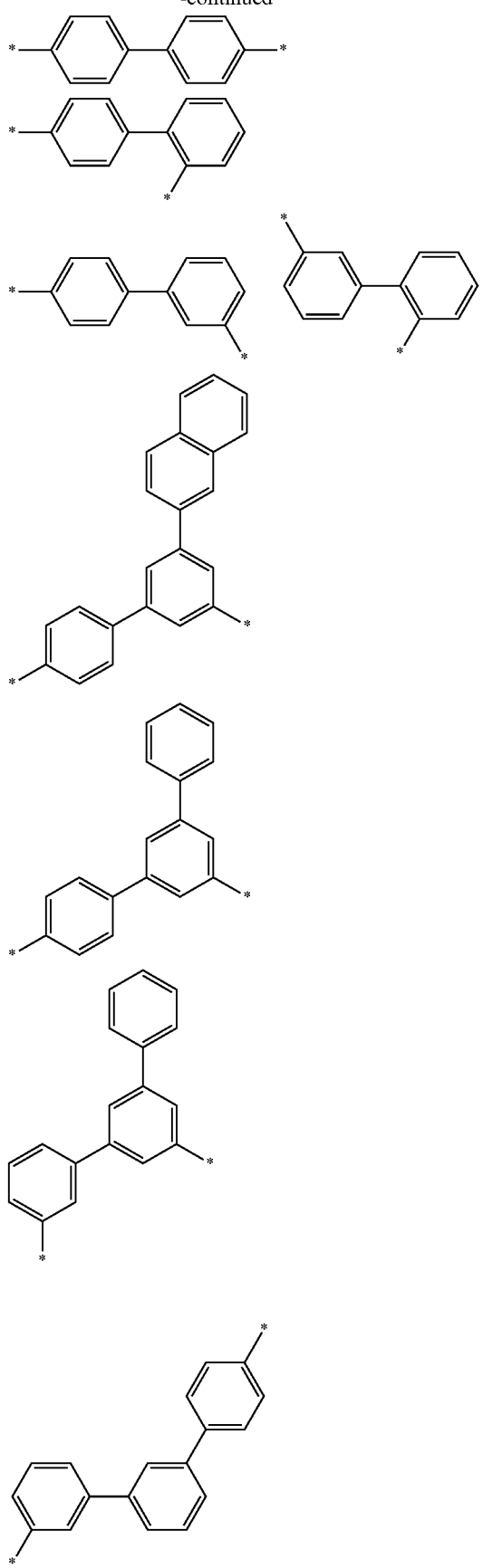

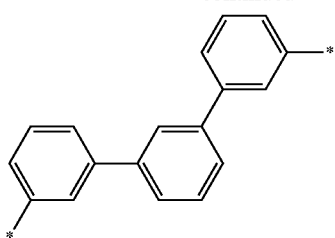

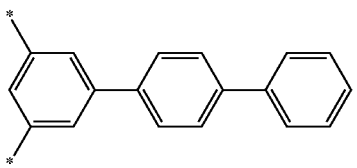

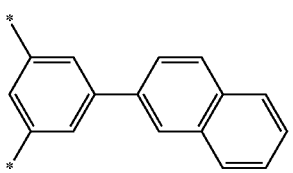

In Group IV, * is a linking point.

In a more specific example embodiment, $L^3$ to $L^5$ may independently be a single bond or an unsubstituted phenylene group. More specifically, $L^3$ may be a single bond or an unsubstituted phenylene group, and more desirably a single bond. In addition, in a more specific example embodiment of the present invention, Chemical Formula 3-I-1 may be represented by Chemical Formula 3-I-1a or Chemical Formula 3-I-1b,

[Chemical Formula 3-I-1a]

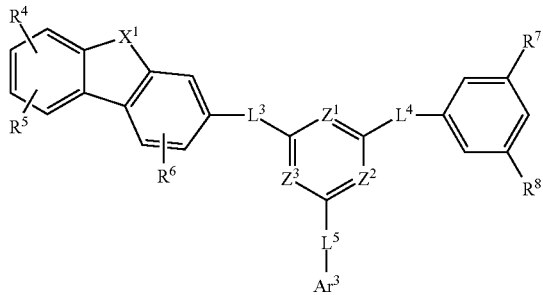

[Chemical Formula 3-I-1b]

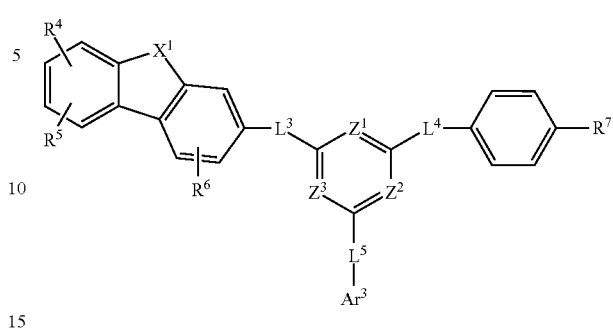

Chemical Formula 3-I-2 may be represented by Chemical Formula 3-I-2a, and

[Chemical Formula 3-I-2a]

Chemical Formula 3-I-3 may be represented by one of Chemical Formula 3-I-3a, Chemical Formula 3-I-3b, Chemical Formula 3-I-3c, Chemical Formula 3-I-3d, Chemical Formula 3-I-3e, and Chemical Formula 3-I-3f.

[Chemical Formula 3-I-3a]

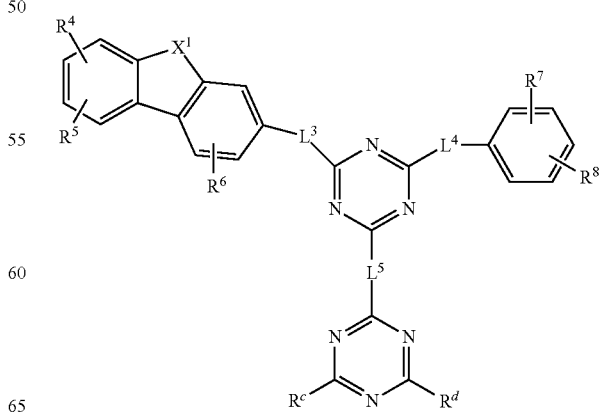

[Chemical Formula 3-I-3b]

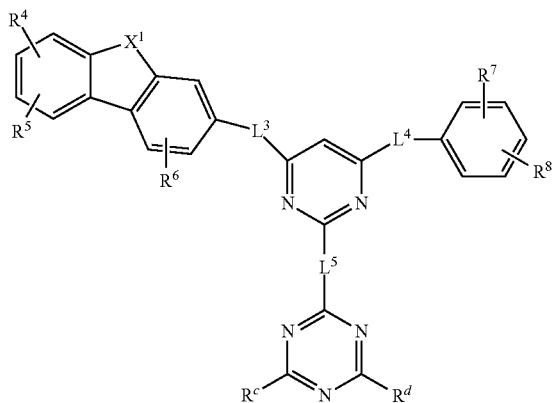

[Chemical Formula 3-I-3c]

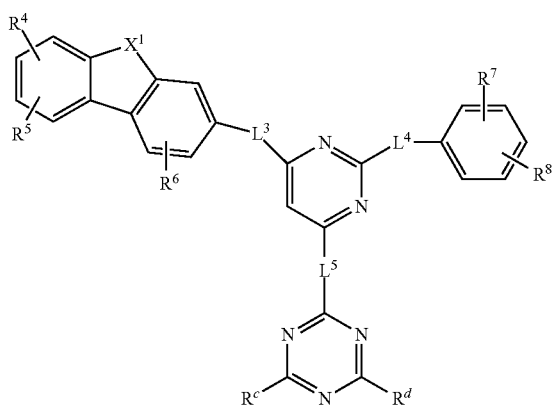

[Chemical Formula 3-I-3d]

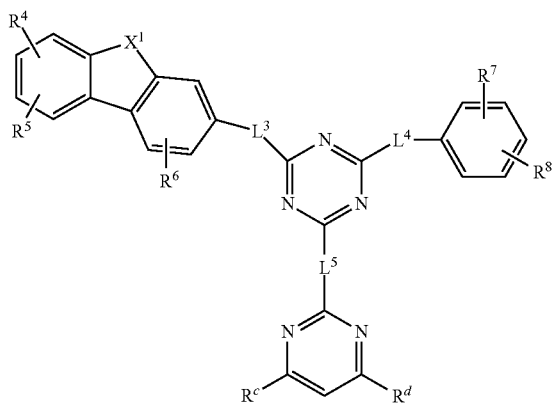

[Chemical Formula 3-I-3e]

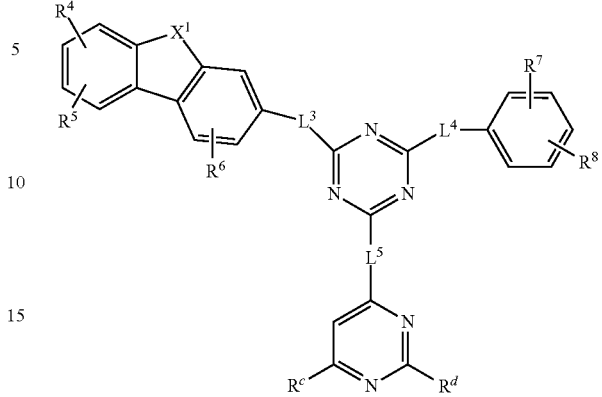

[Chemical Formula 3-I-3f]

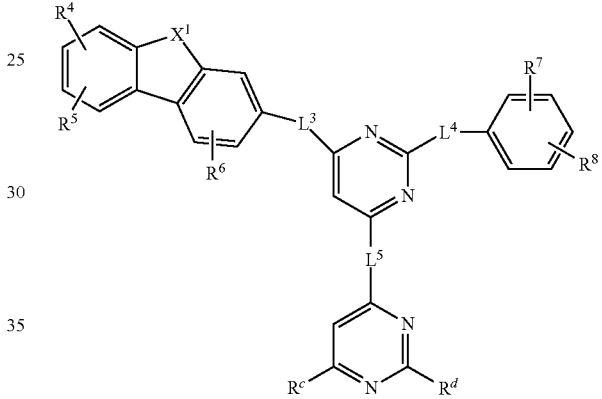

In Chemical Formula 3-I-1a, Chemical Formula 3-I-1b, Chemical Formula 3-I-2a, and Chemical Formula 3-I-3a to Chemical Formula 3-I-3f, $X^1$, $L^3$ to $L^5$, $R^c$, $R^d$, $R^e$, and $R^4$ to $R^8$ are the same as described above.

For example, $R^4$ to $R^6$ of Chemical Formula 3-I-1a, Chemical Formula 3-I-1b, Chemical Formula 3-I-2a, and Chemical Formula 3-I-3a to Chemical Formula 3-I-3f may independently be hydrogen, deuterium, a phenyl group, or a biphenyl group, $R^7$ and $R^8$ may independently be hydrogen, deuterium, phenyl group, a biphenyl group, or a terphenyl group, and more desirably $R^4$ to $R^6$ may be all hydrogen and $R^7$ and $R^8$ may independently be hydrogen, a phenyl group, or a biphenyl group.

In addition, the nitrogen-containing six-membered ring consisting of $Z^1$ to $Z^3$ of Chemical Formula 3 may be a pyrimidinyl group or a triazinyl group, and more desirably, a triazinyl group.

In a specific example embodiment of the present invention, the second compound for the organic optoelectronic element may be for example represented by Chemical Formula 3-I-1 or Chemical Formula 3-I-2, and may be more desirably represented by Chemical Formula 3-I-1a, Chemical Formula 3-I-1b, and Chemical Formula 3-I-2a.

The second compound for the organic optoelectronic element may be, for example, a compound selected from Group 2, but is not limited thereto.

[Group 2]
[B-1]
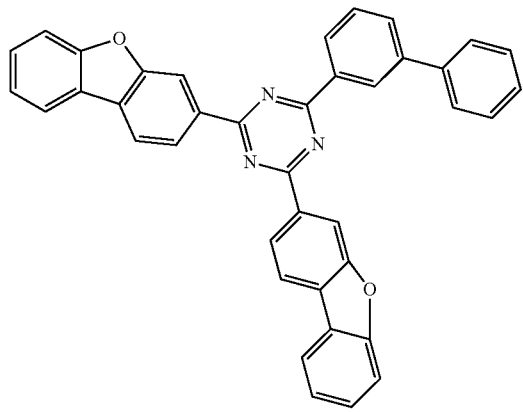
[B-2]
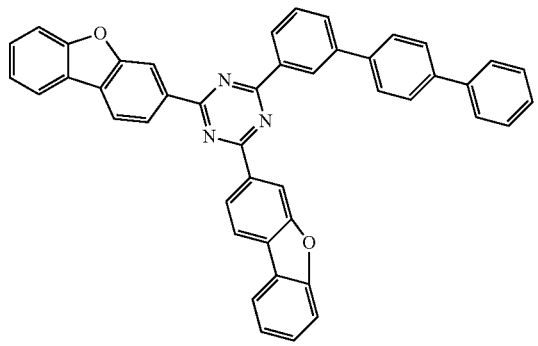
[B-3]
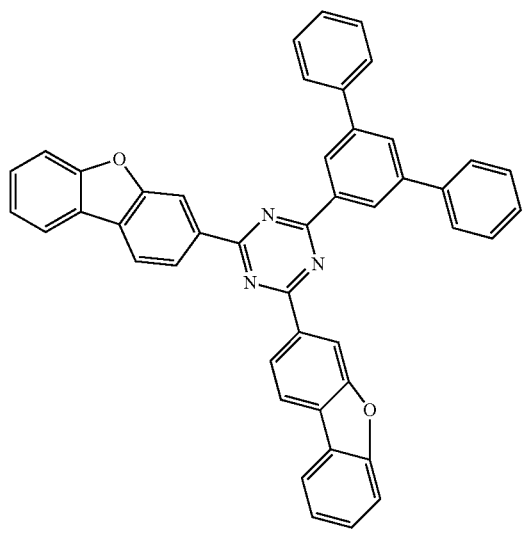
[B-4]
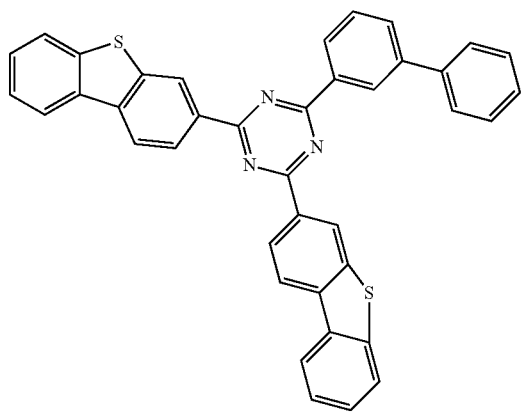
[B-5]
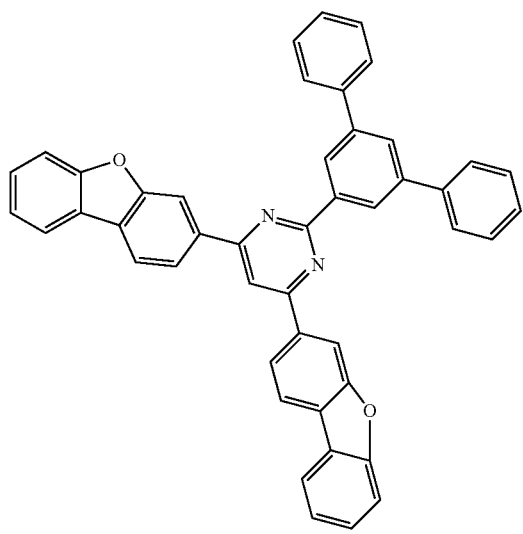
[B-6]
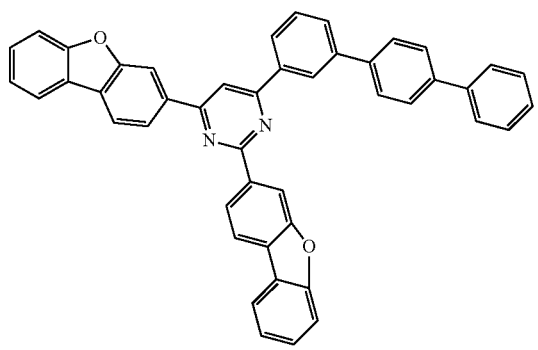

-continued
[B-7]
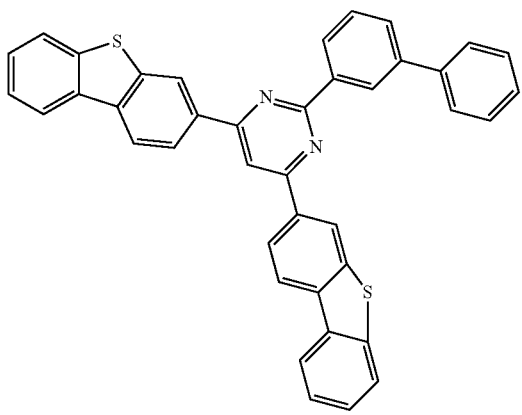
[B-8]
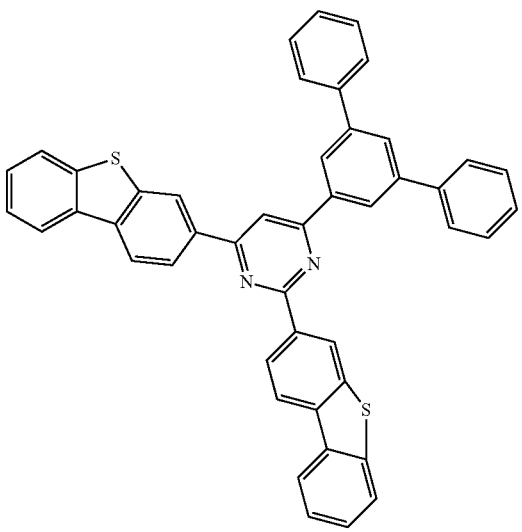
[B-9]
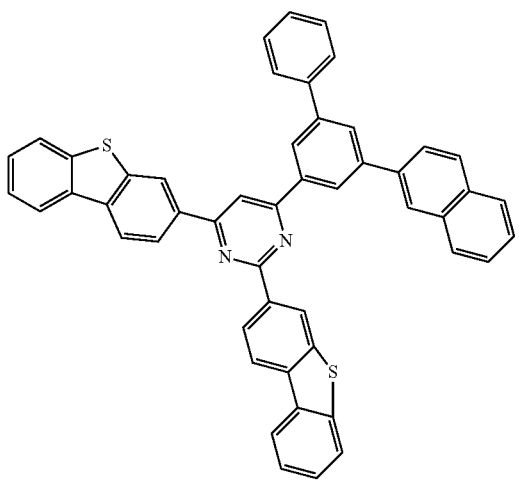
[B-10]
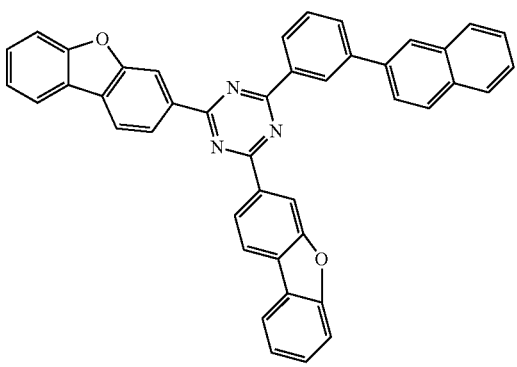
[B-11]
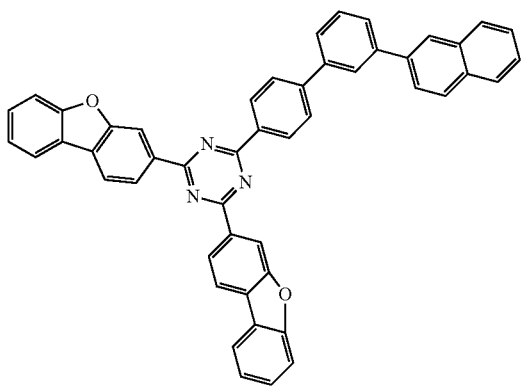
[B-12]
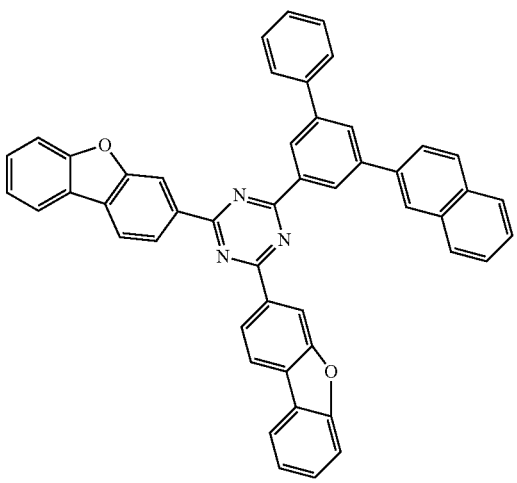

-continued
[B-13]
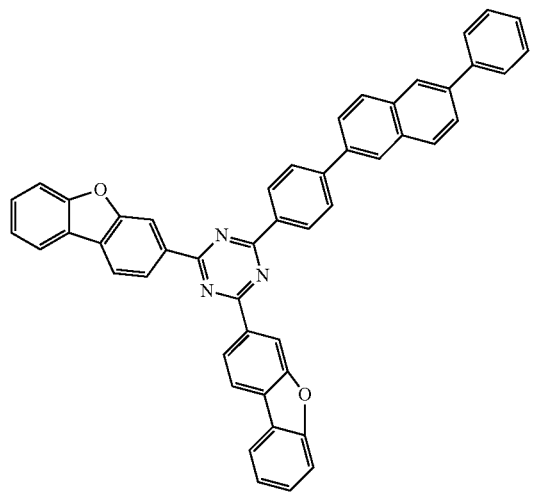
[B-14]
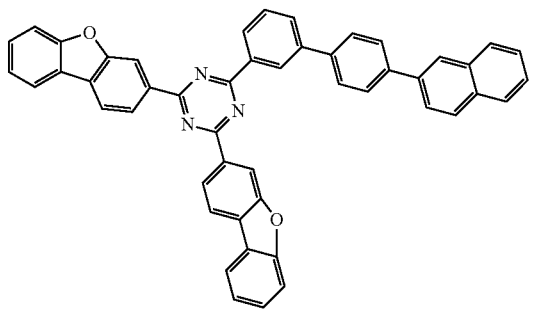
[B-15]
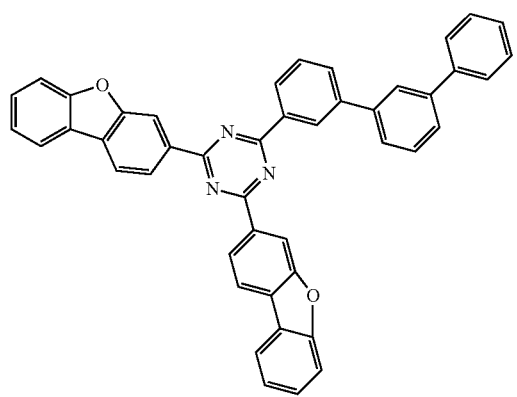
[B-16]
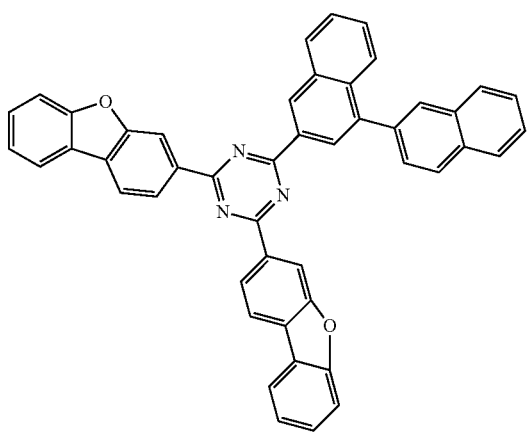
[B-17]
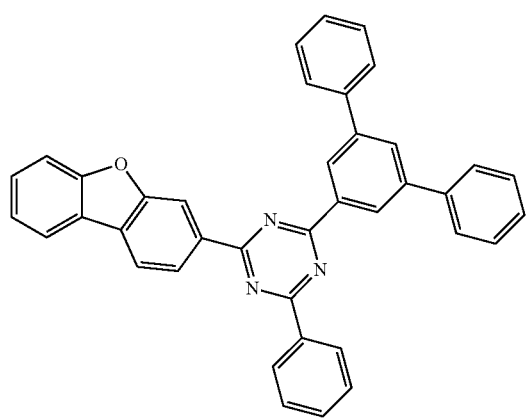
[B-18]
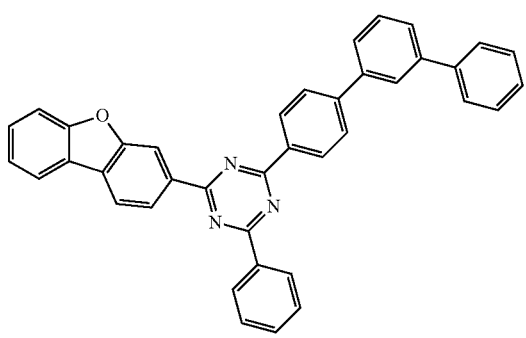

-continued
[B-19]
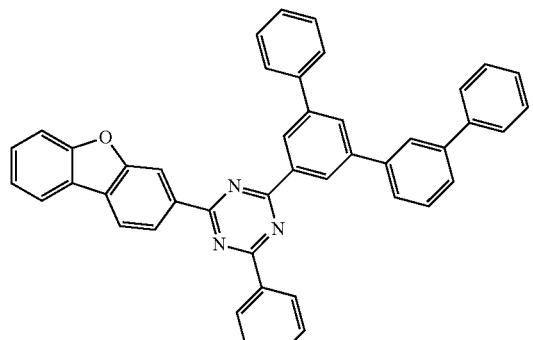
[B-20]
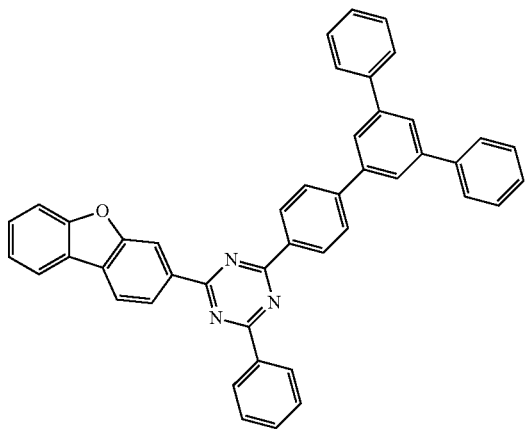
[B-21]
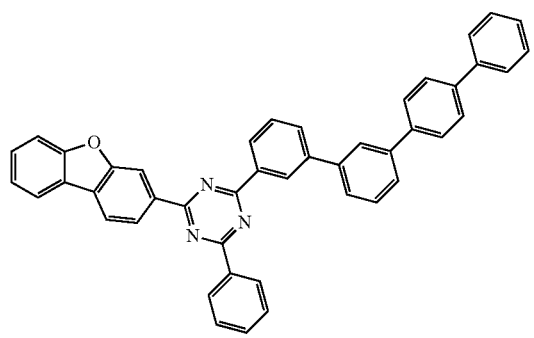
[B-22]
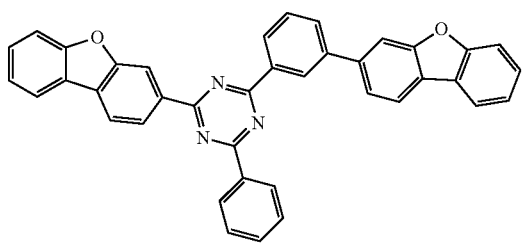
[B-23]
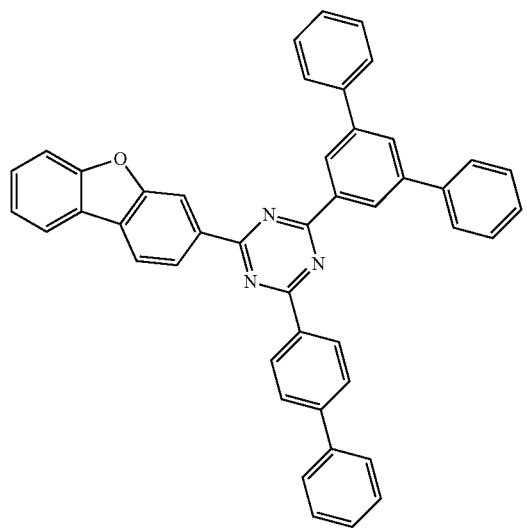
[B-24]
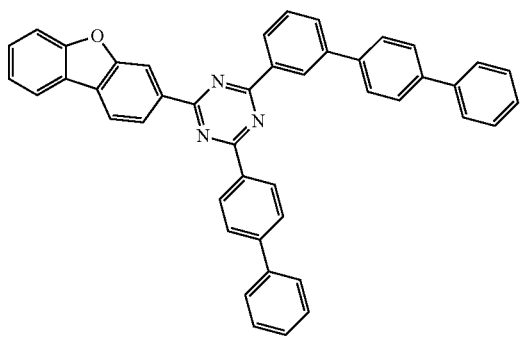

-continued
[B-25]
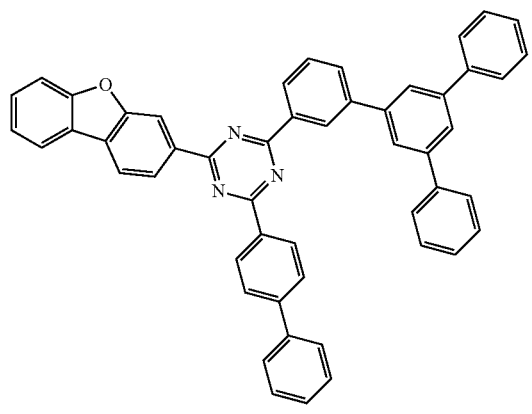
[B-26]
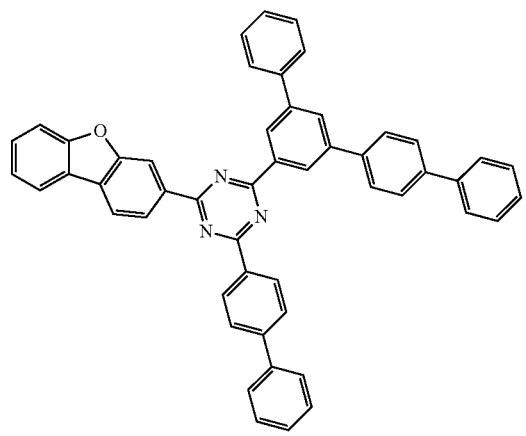
[B-27]
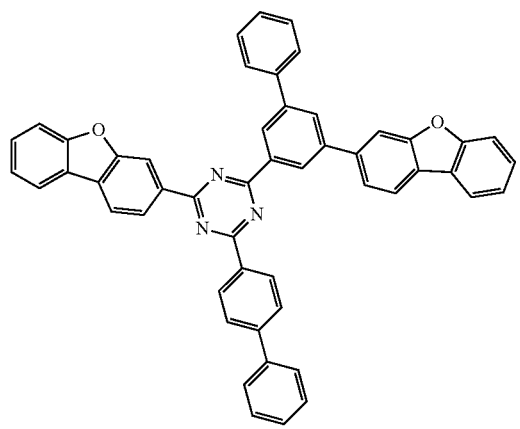
[B-28]
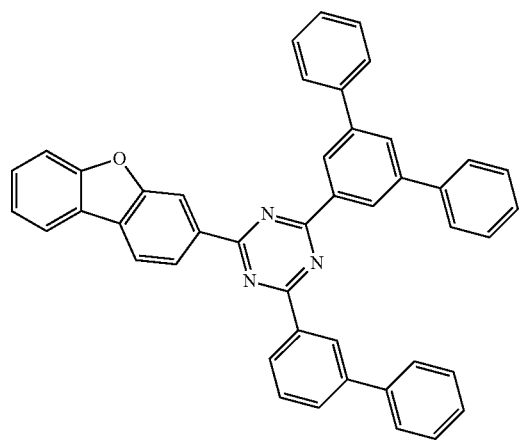
[B-29]
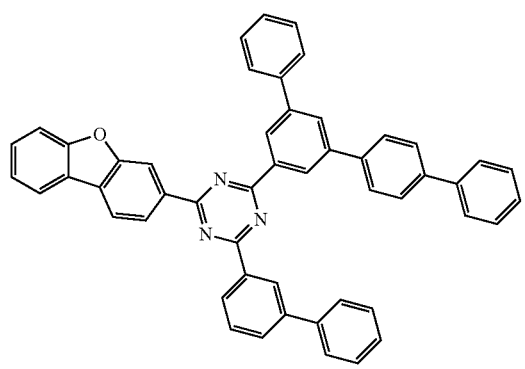
[B-30]
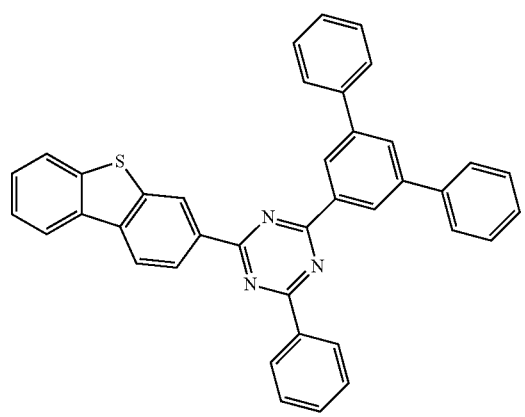

-continued
[B-31]
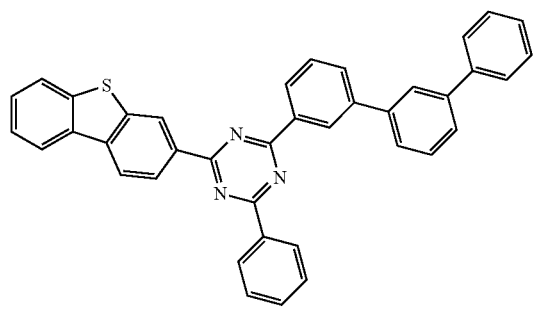
[B-32]
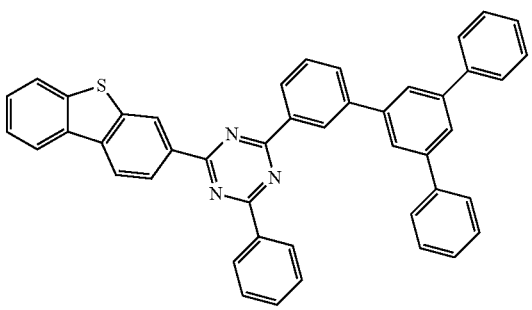
[B-33]
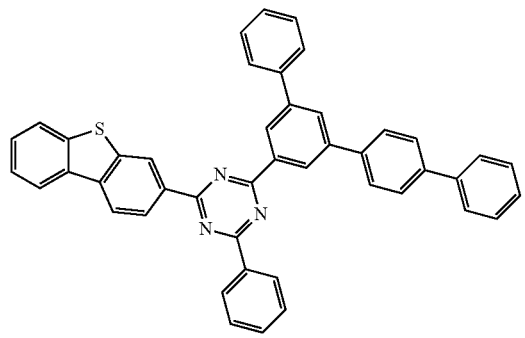
[B-34]
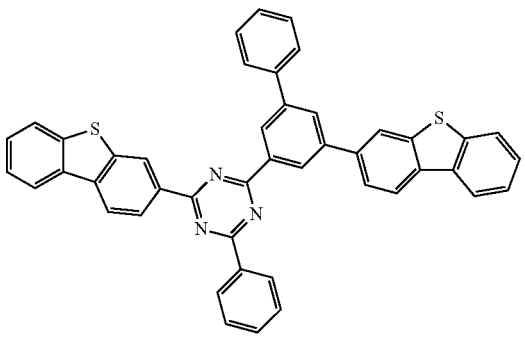
[B-35]
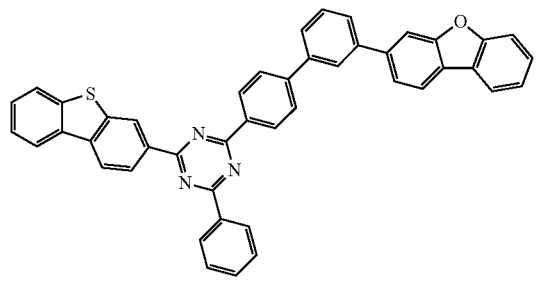
[B-36]
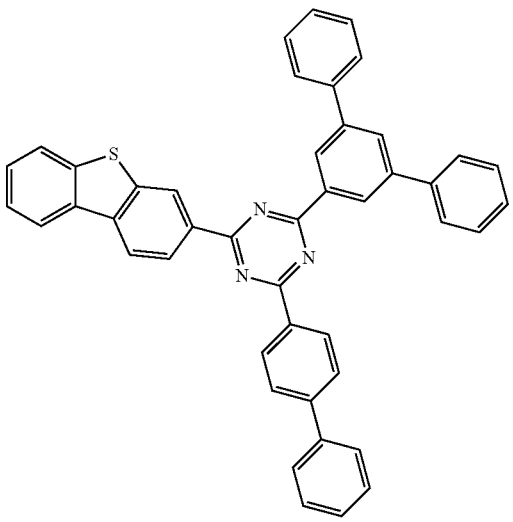

-continued
[B-37]
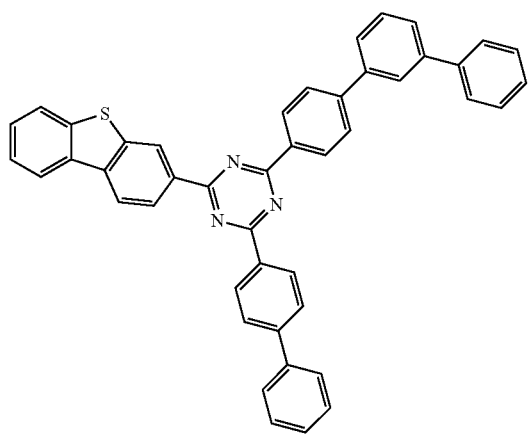
[B-38]
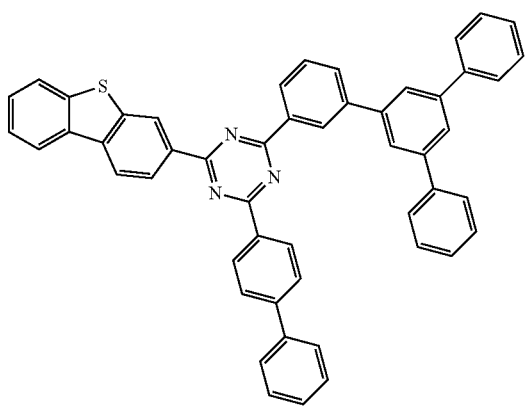
[B-39]
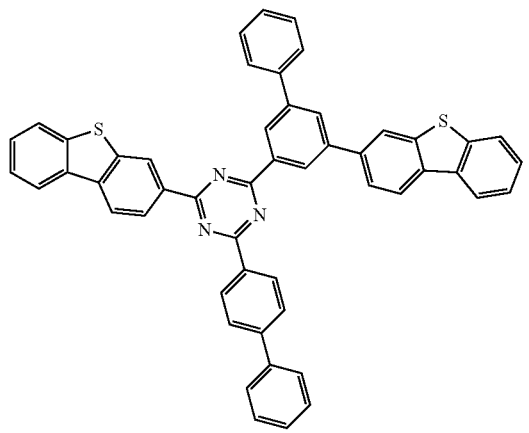
[B-40]
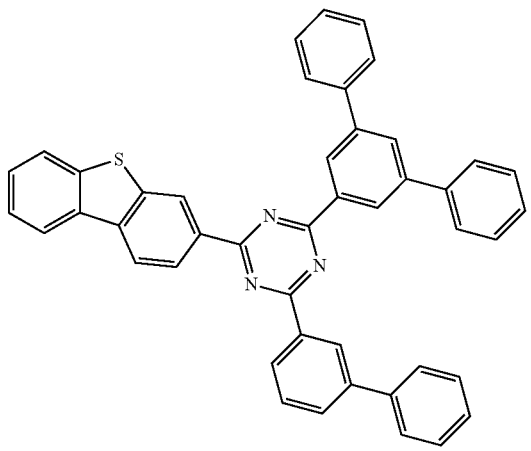
[B-41]
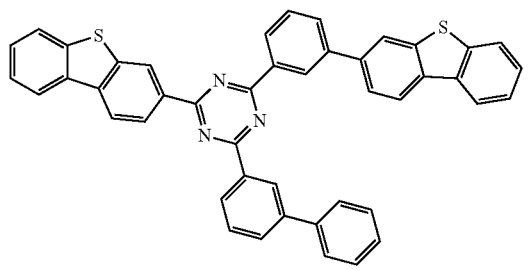
[B-42]
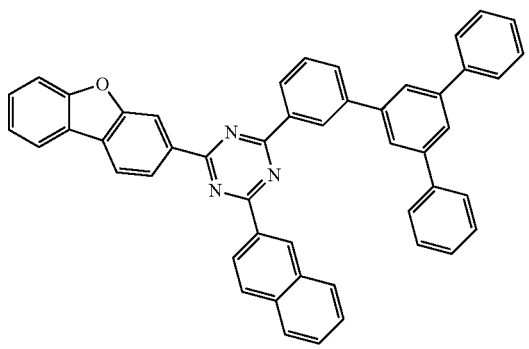

-continued
[B-43]
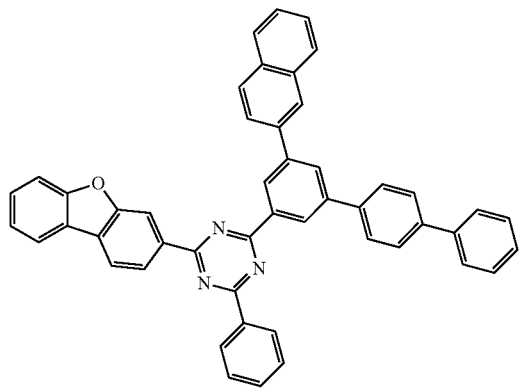
[B-44]
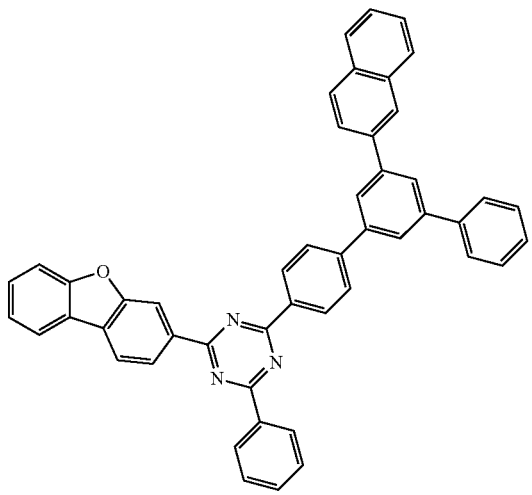
[B-45]
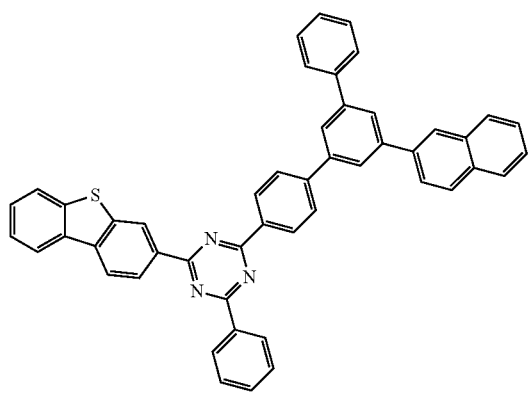
[B-46]
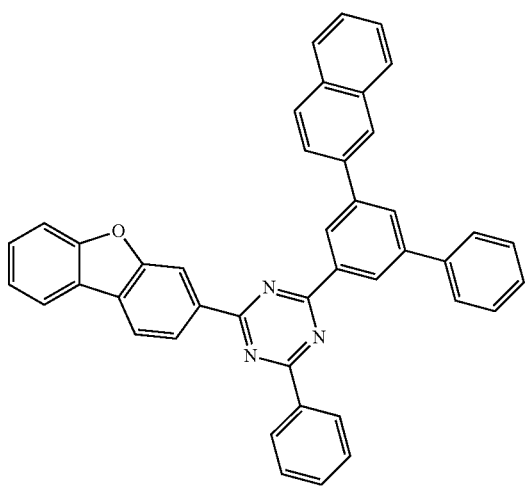
[B-47]
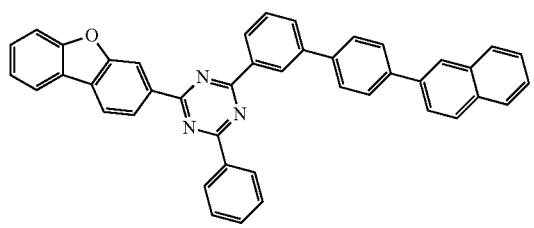
[B-48]
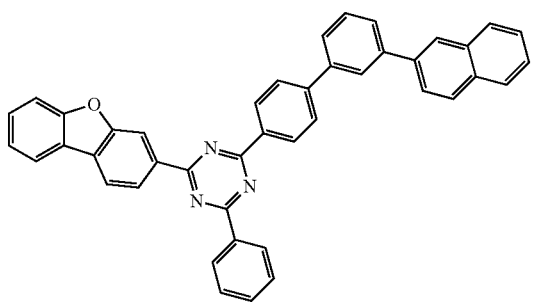

-continued
[B-49]
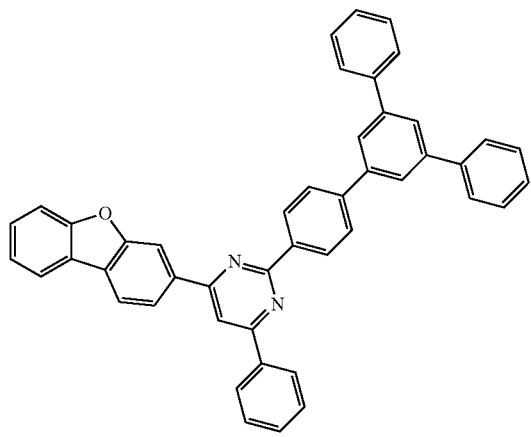
[B-50]
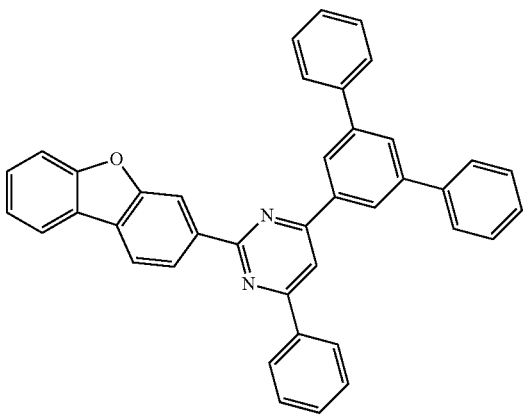
[B-51]
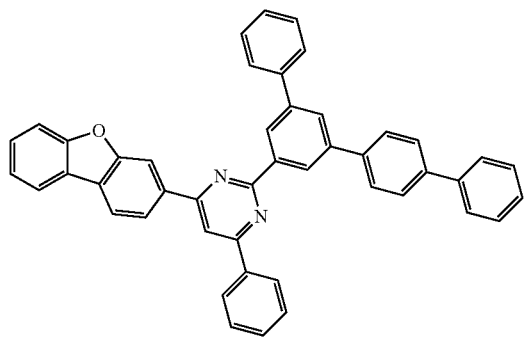
[B-52]
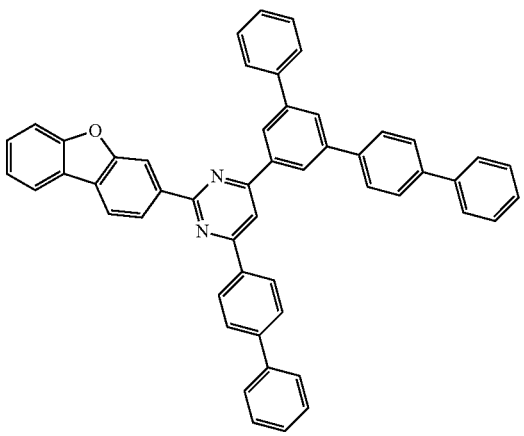
[B-53]
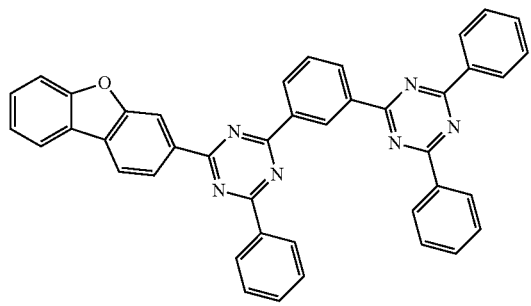
[B-54]
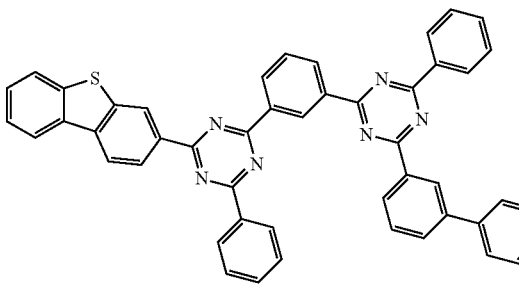
[B-55]
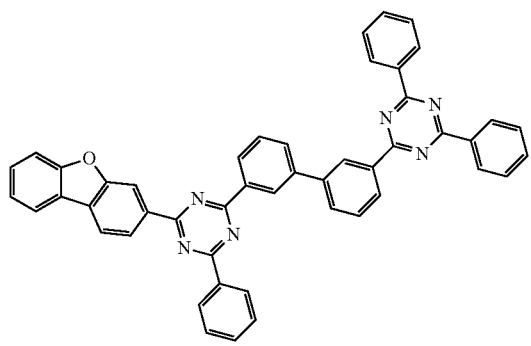
[B-56]
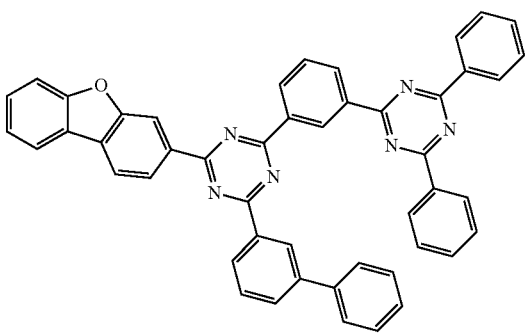

-continued
[B-57]
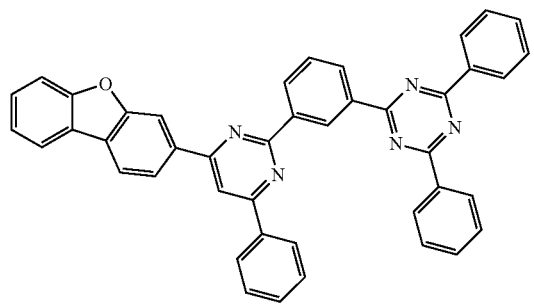
[B-58]
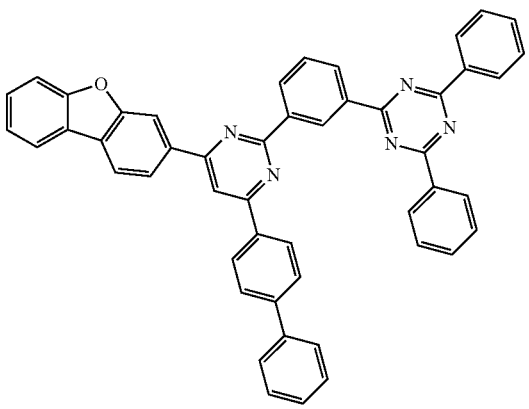
[B-59]
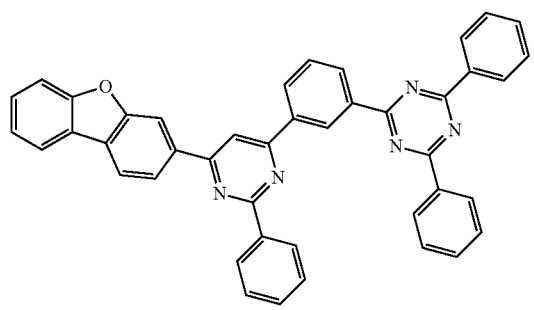
[B-60]
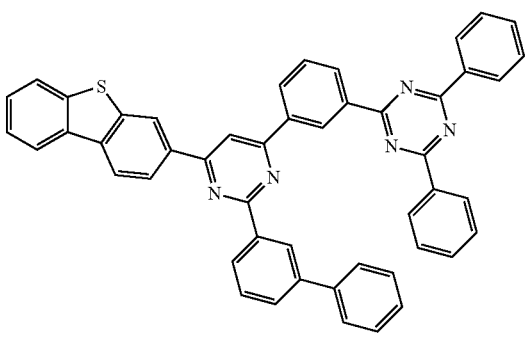
[B-61]
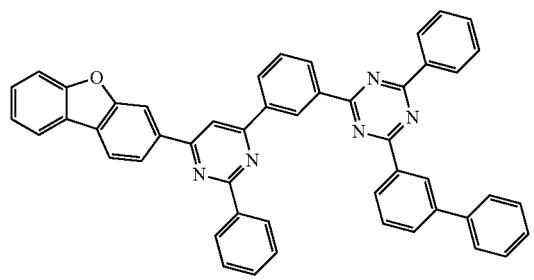
[B-62]
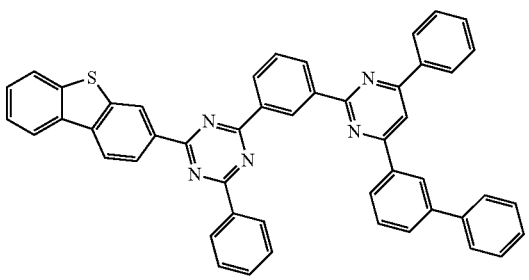
[B-63]
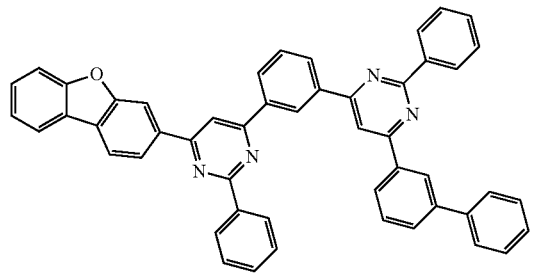
[B-64]
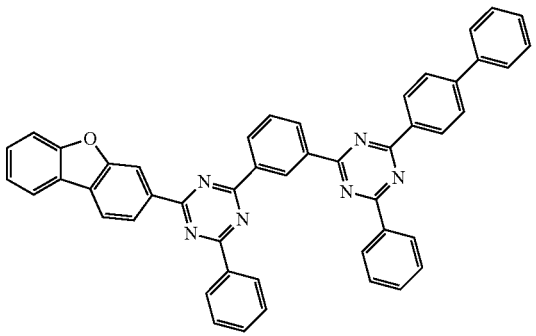

[B-65]
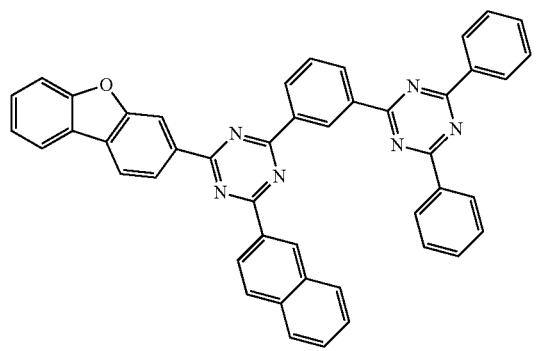
[B-66]
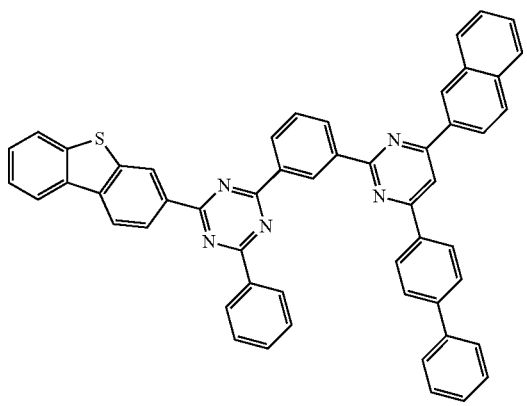
[B-67]
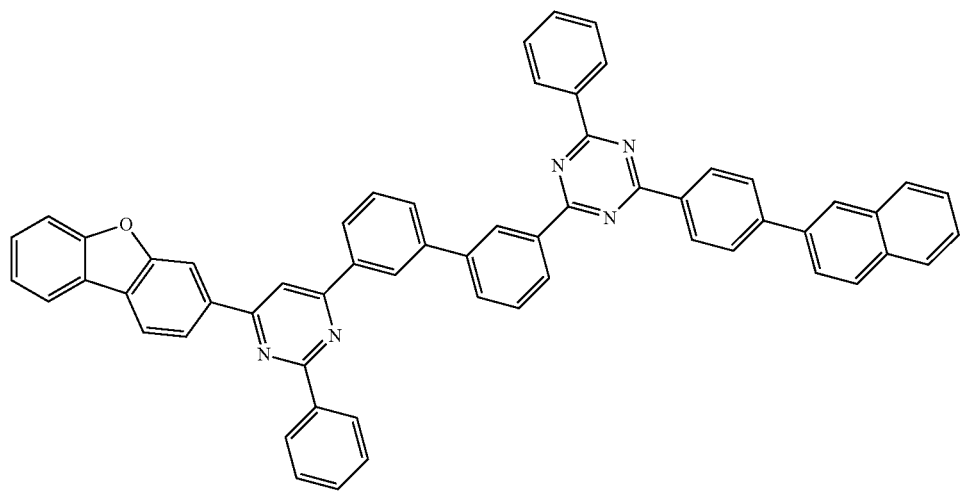
[B-68]
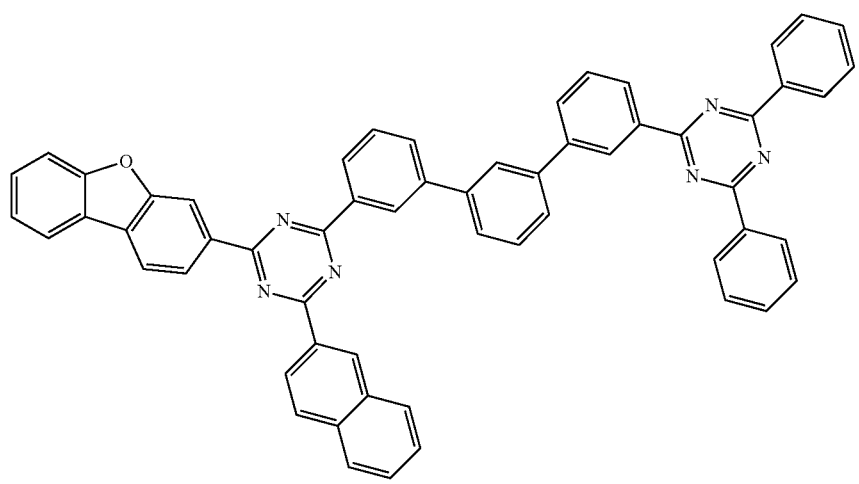

-continued
[B-69]
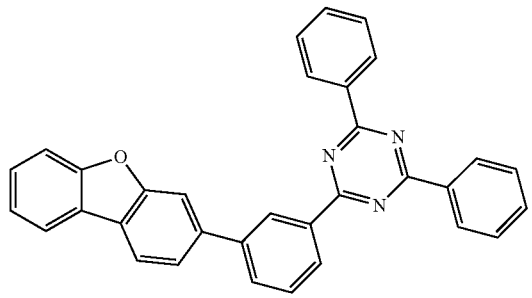
[B-70]
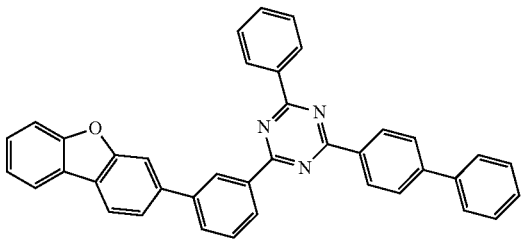
[B-71]
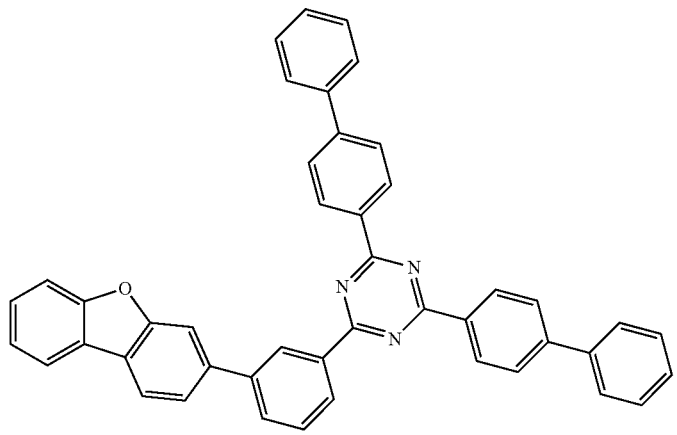
[B-72]
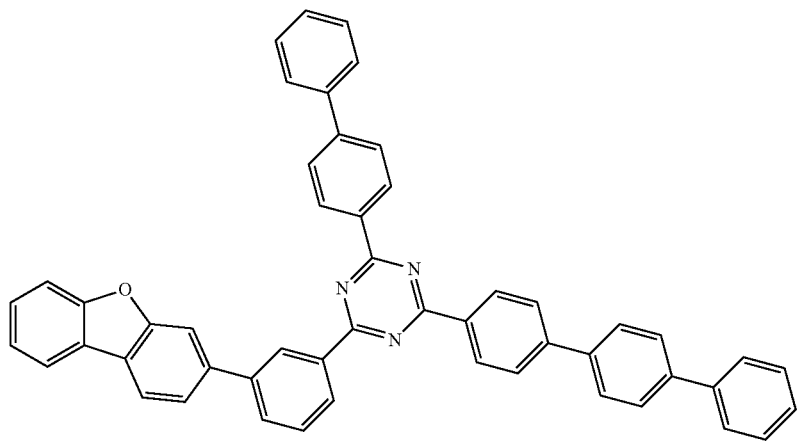
[B-73]
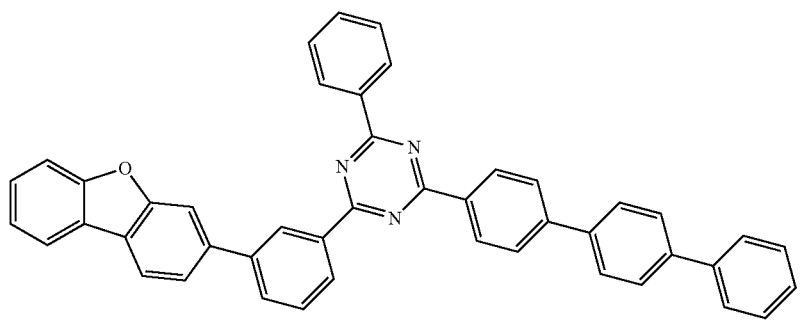

-continued
[B-74]
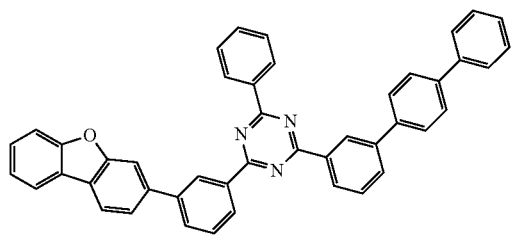
[B-75]
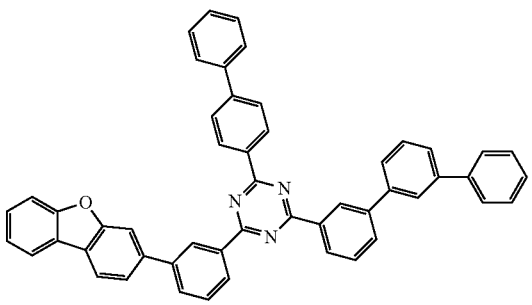
[B-76]
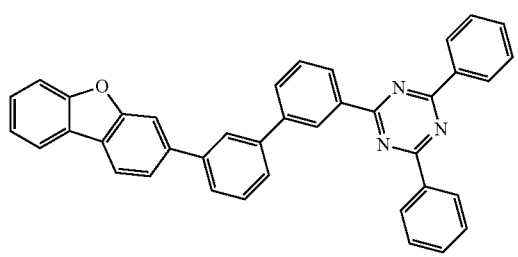
[B-77]
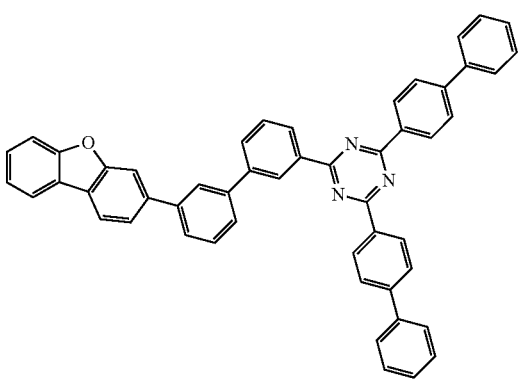
[B-78]
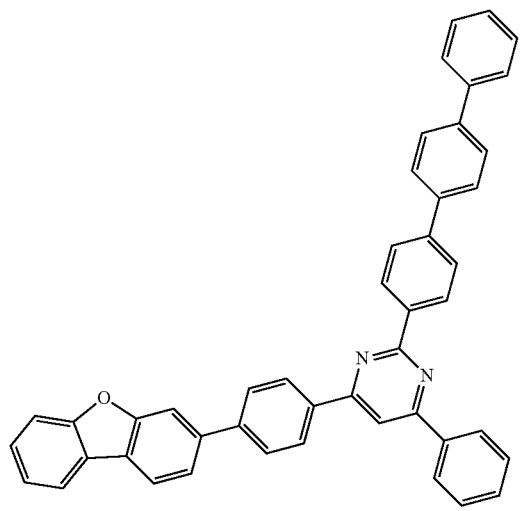
[B-79]
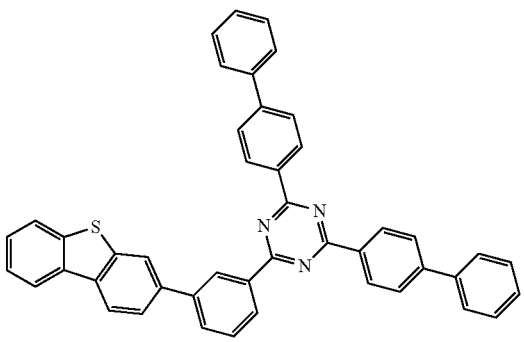
[B-80]
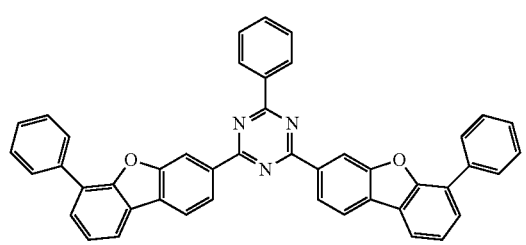
[B-81]
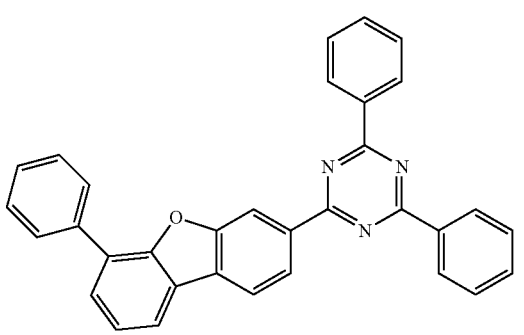

-continued
[B-82]
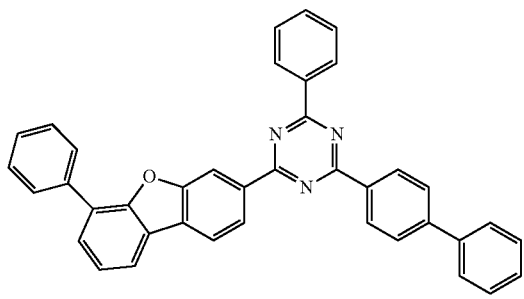
[B-83]
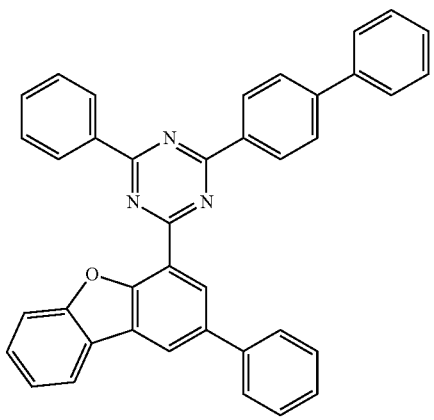
[B-84]
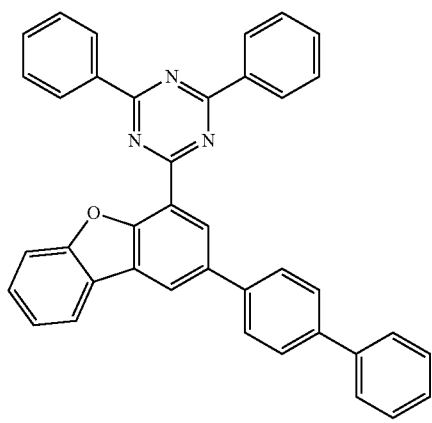
[B-85]
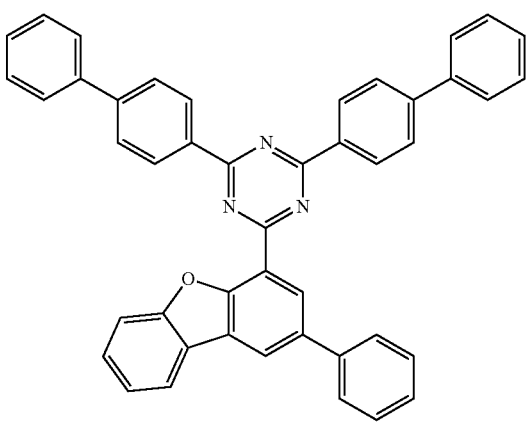
[B-86]
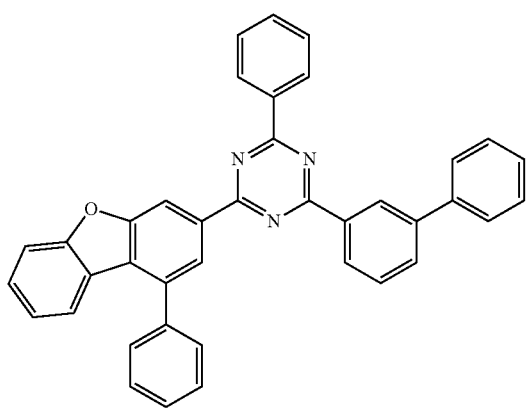
[B-87]
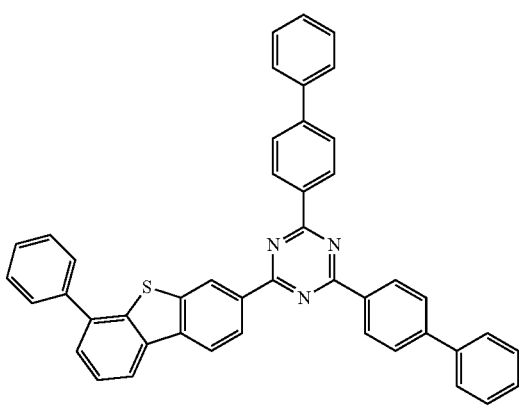

-continued
[B-88]
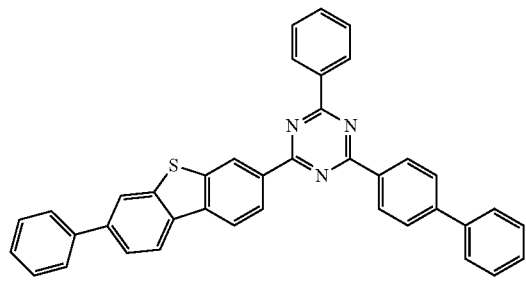
[B-89]
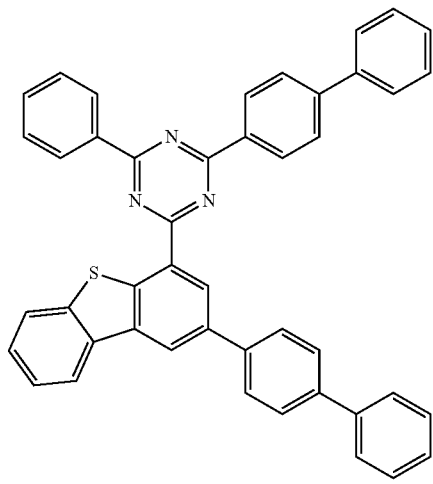
[B-90]
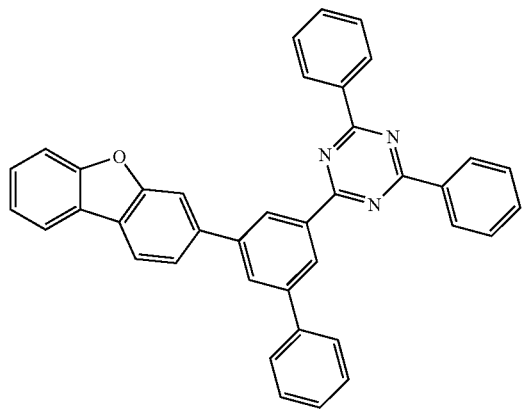
[B-91]
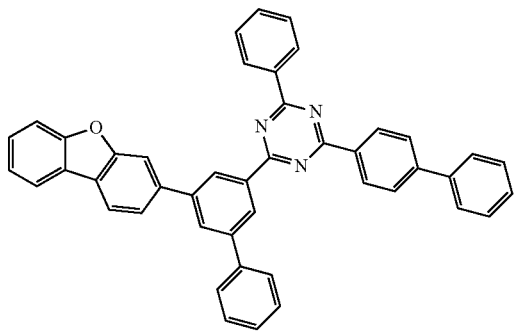
[B-92]
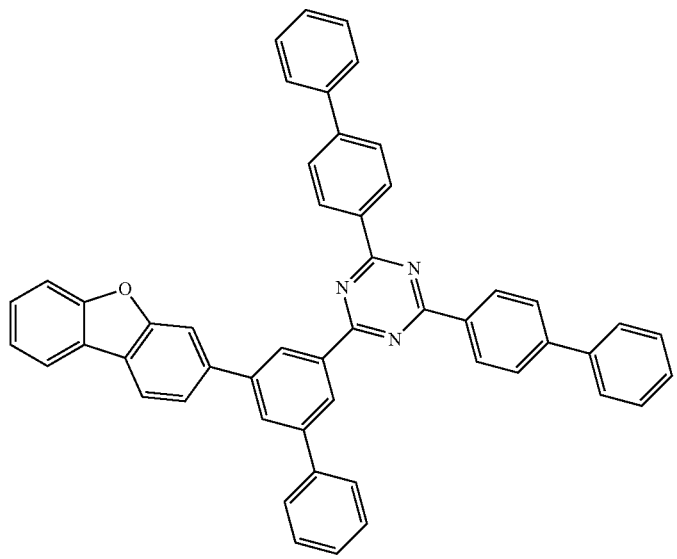

[B-93]
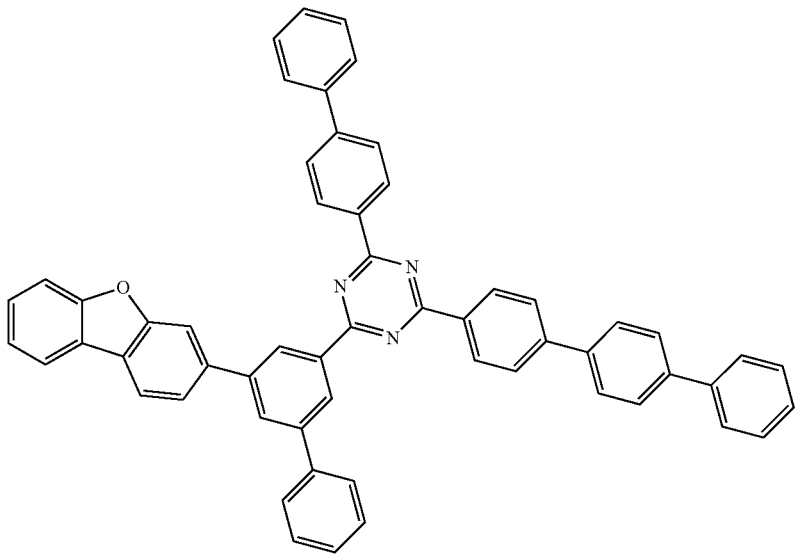
[B-94]
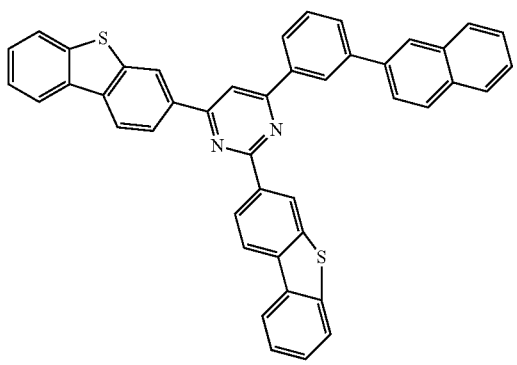
[B-95]
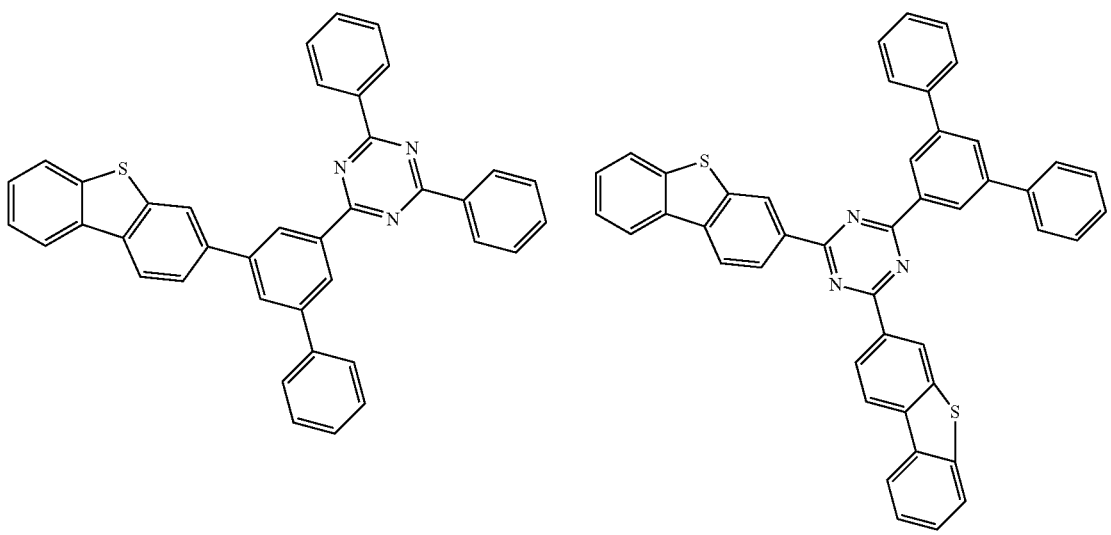
[B-96]
[B-97]
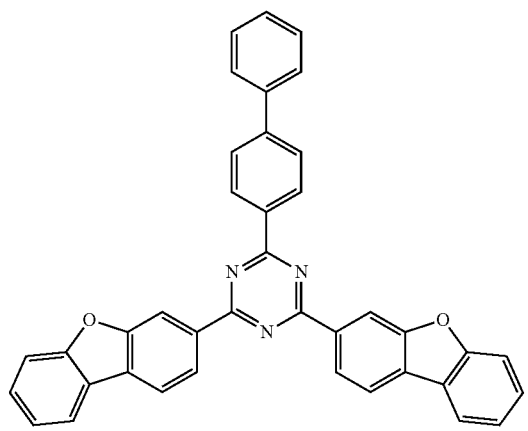

-continued
[B-98]
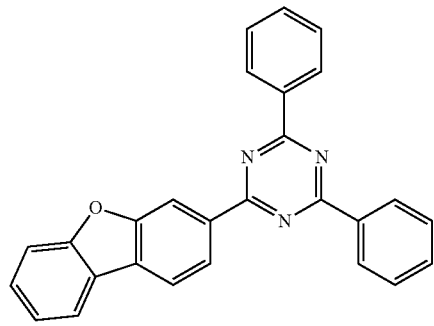
[B-99]
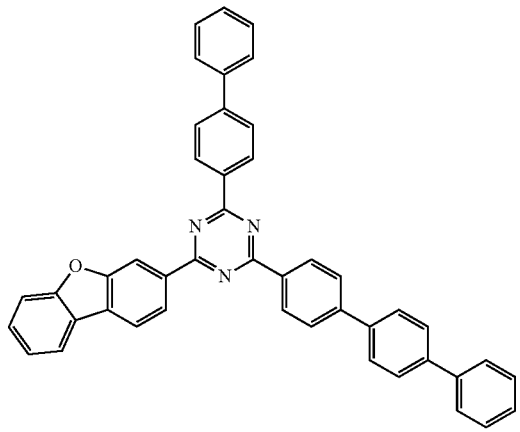
[B-100]
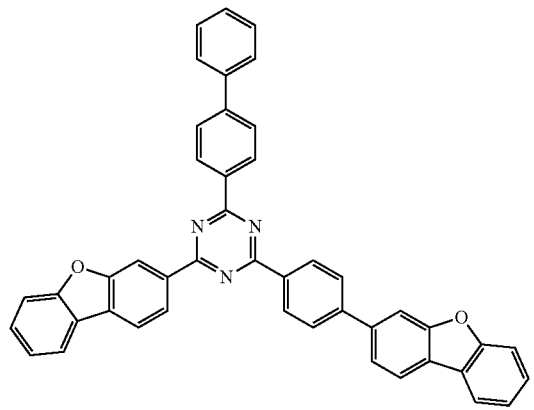
[B-101]
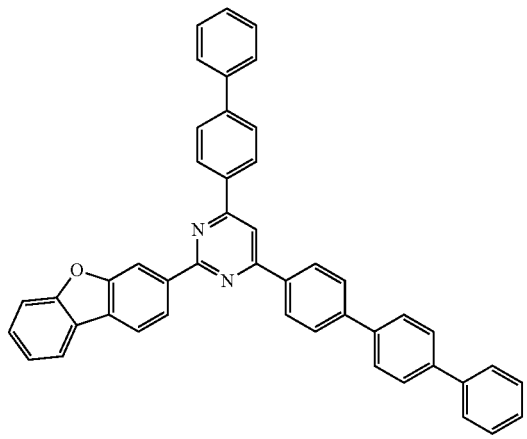
[B-102]
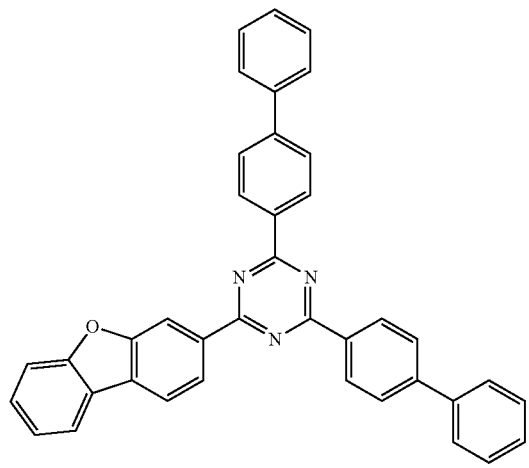
[B-103]
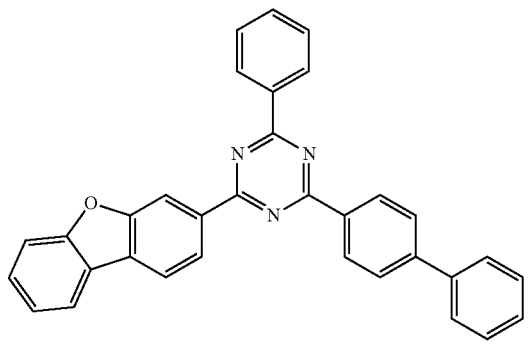

-continued
[B-104]
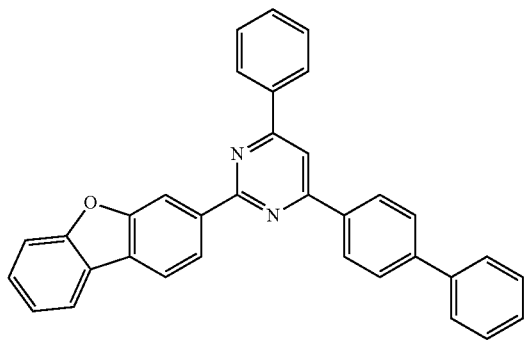
[B-105]
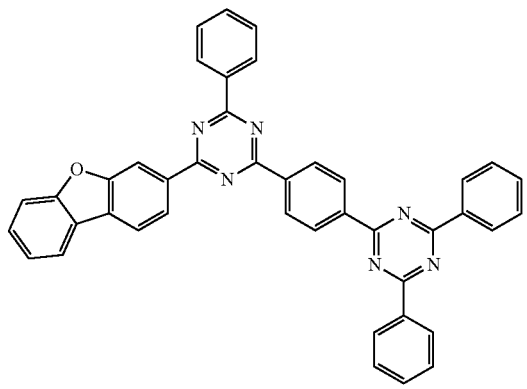
[B-106]
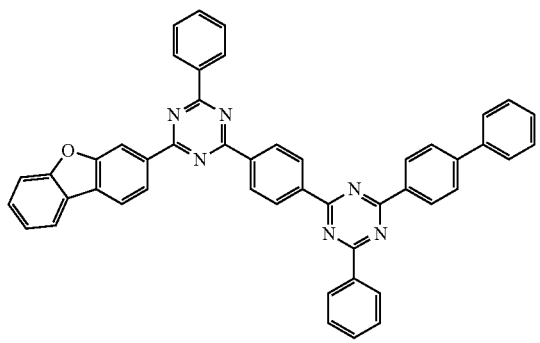
[B-107]
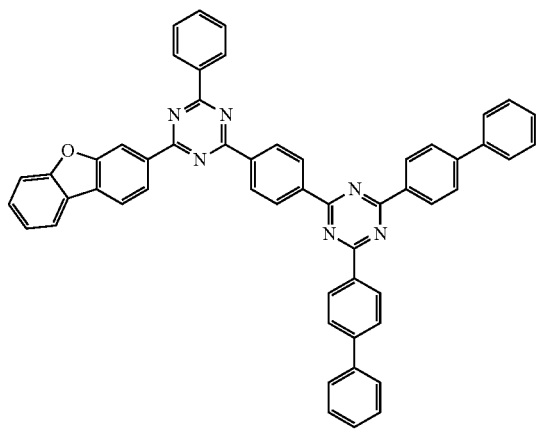
[B-108]
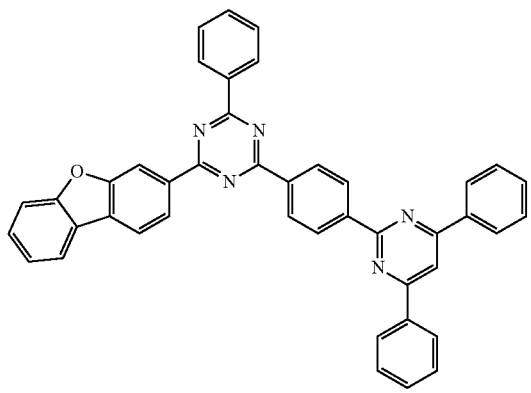
[B-109]
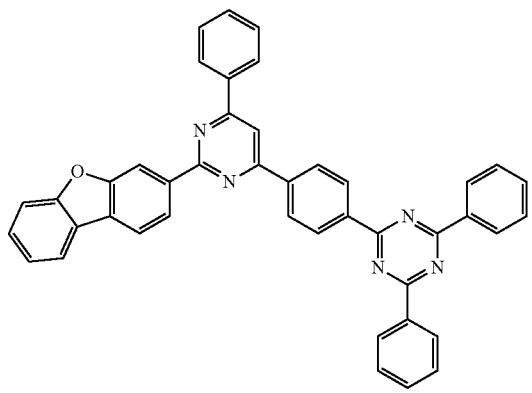

-continued
[B-110]
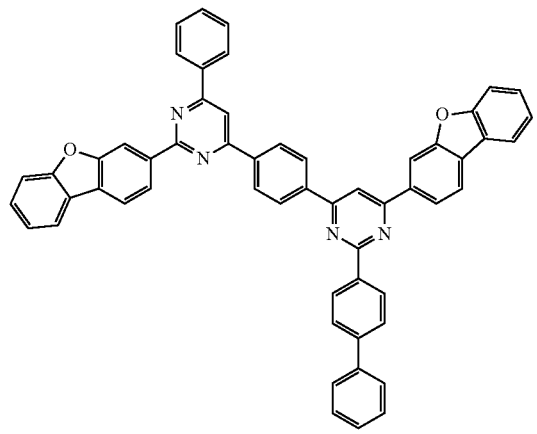
[B-111]
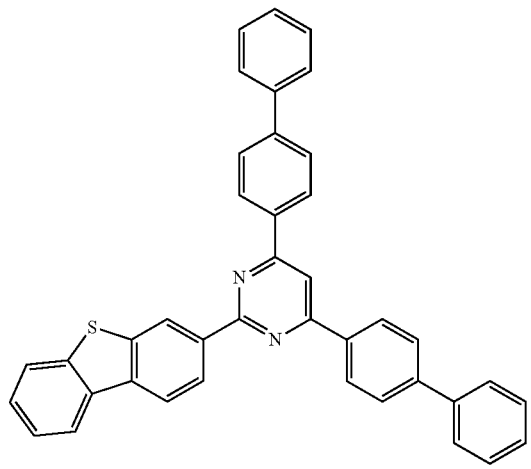
[B-112]
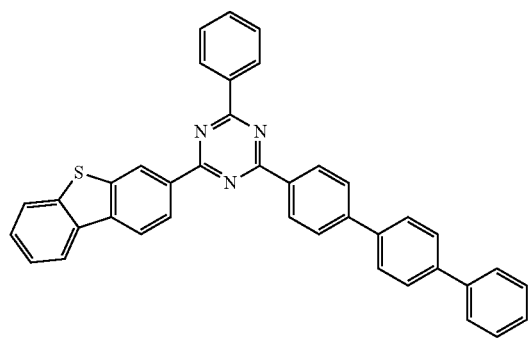
[B-113]
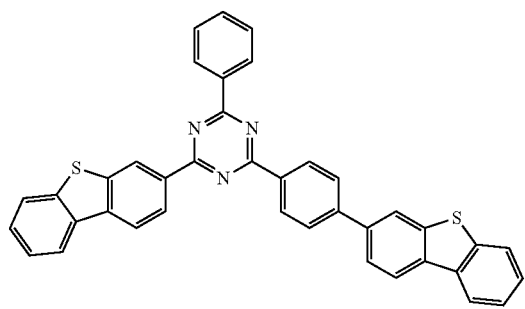
[B-114]
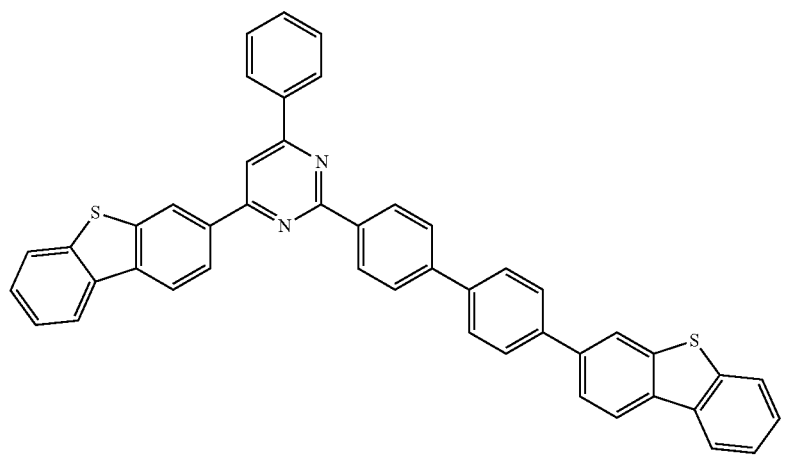

-continued
[B-115]
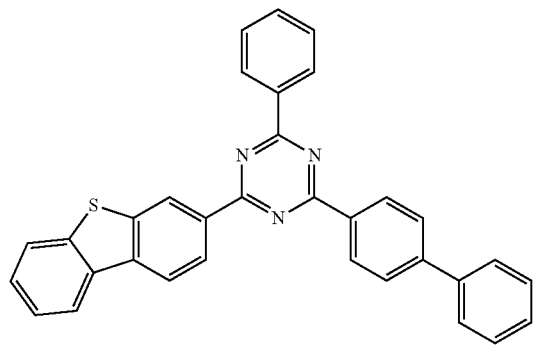
[B-116]
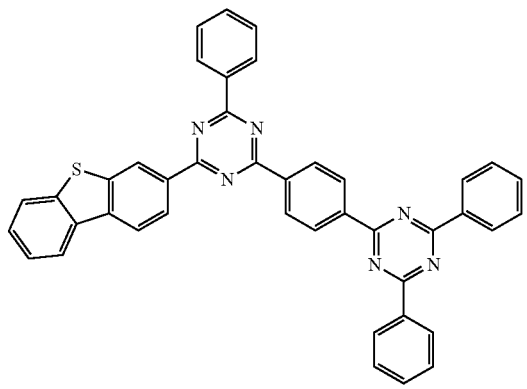
[B-117]
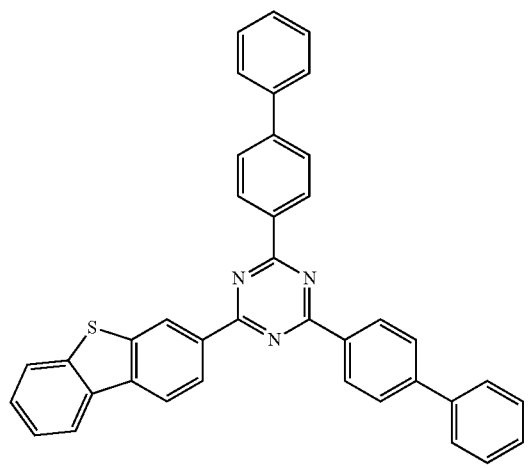
[B-118]
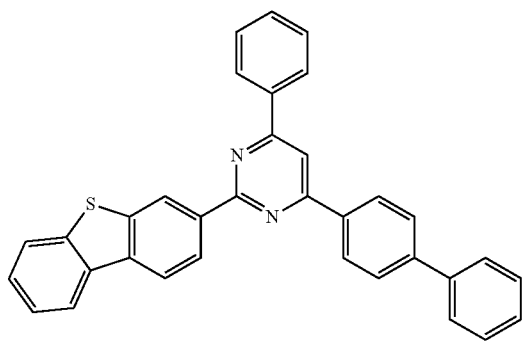
[B-119]
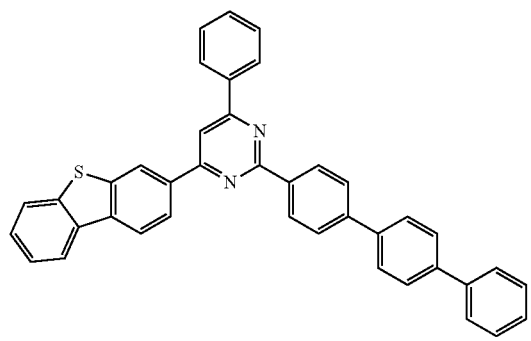
[B-120]
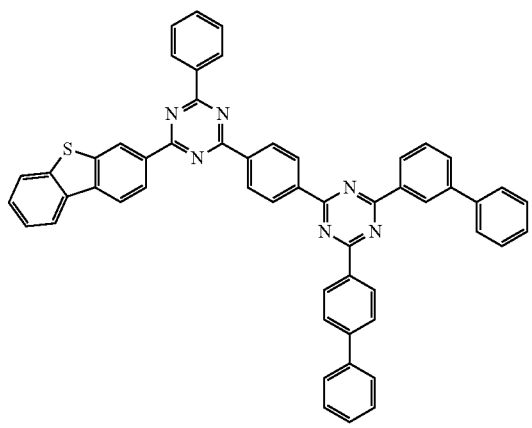

-continued
[B-121]
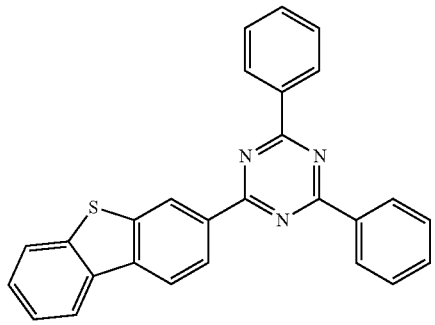
[B-122]
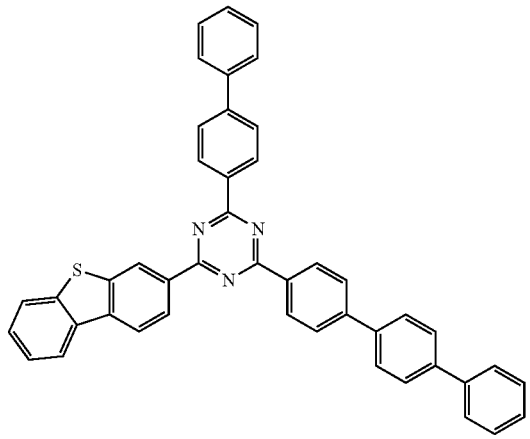
[B-123]
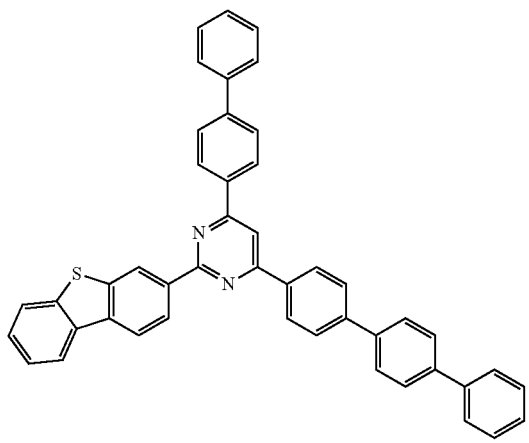
[B-124]
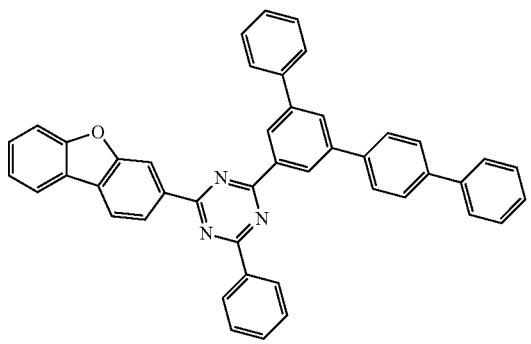
[B-125]
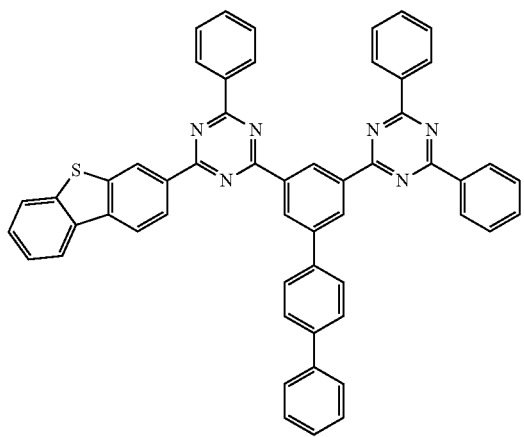
[B-126]
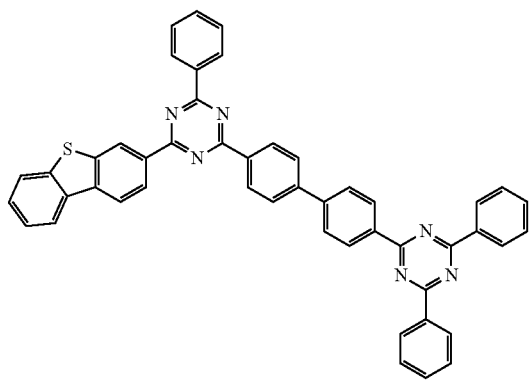

-continued
[B-127]
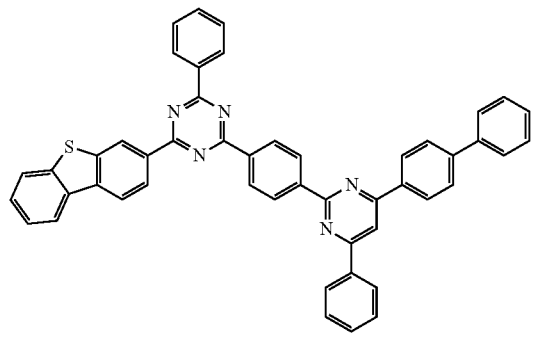
[B-128]
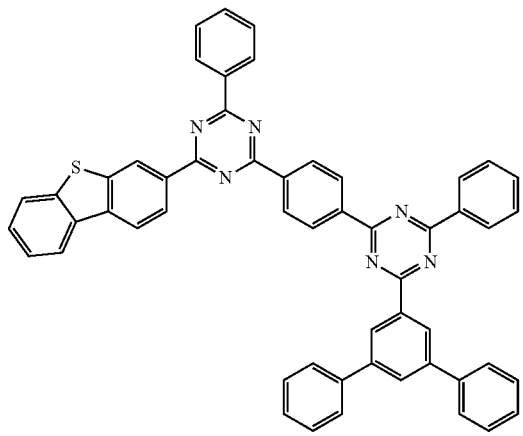
[B-129]
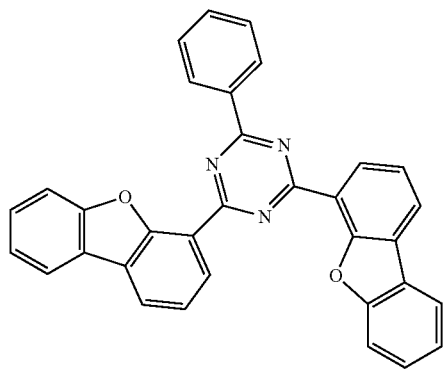
[B-130]
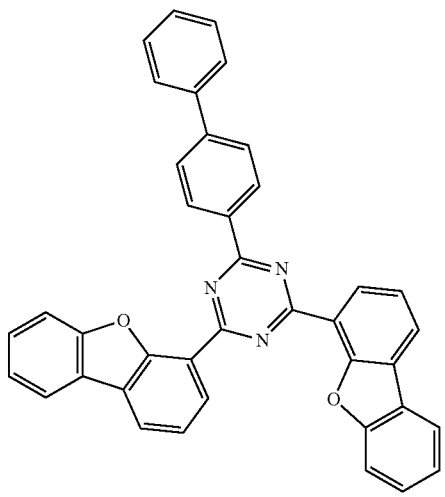
[B-131]
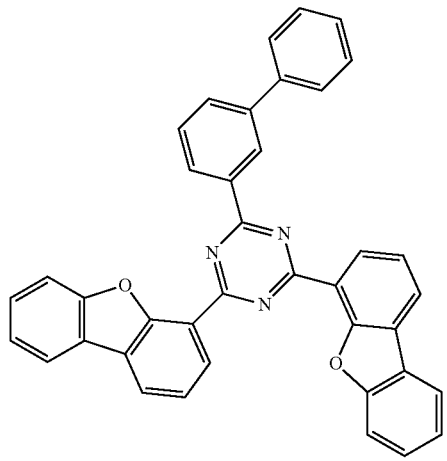
[B-132]
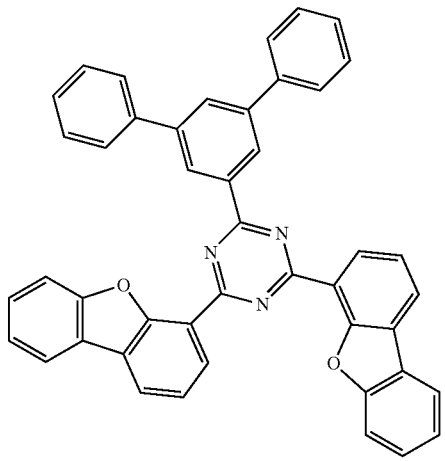

-continued
[B-133]
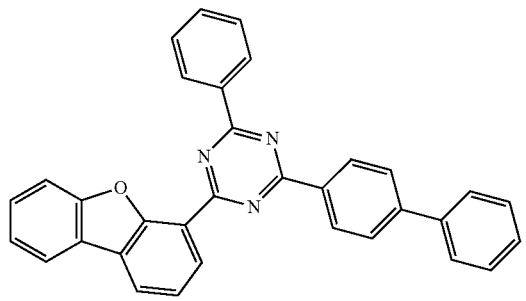
[B-134]
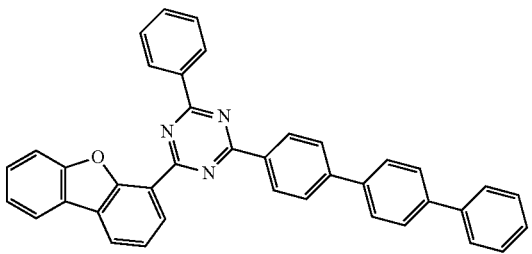
[B-135]
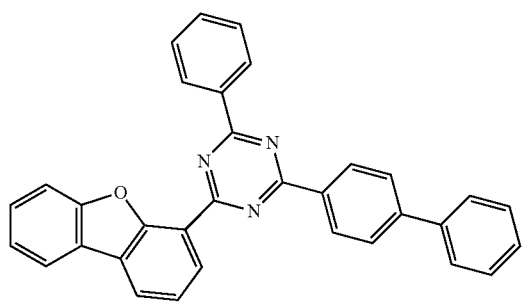
[B-136]
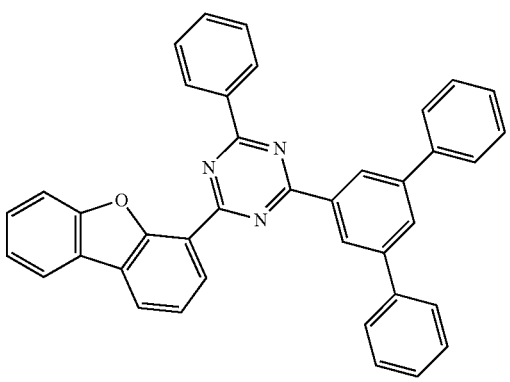
[B-137]
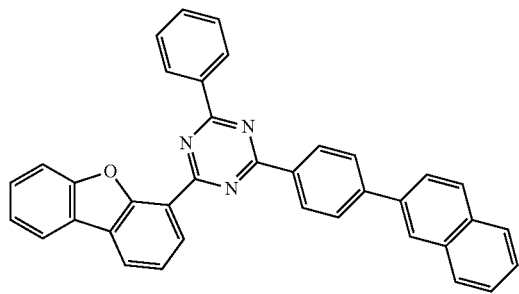
[B-138]
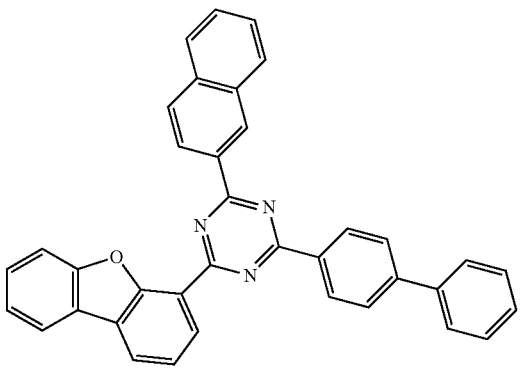
[B-139]
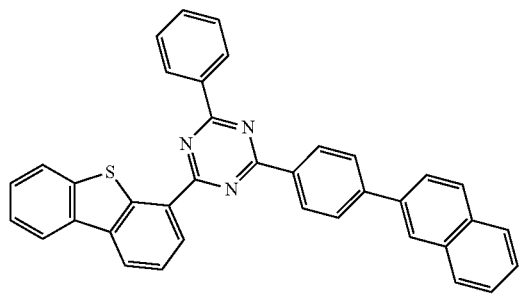
[B-140]
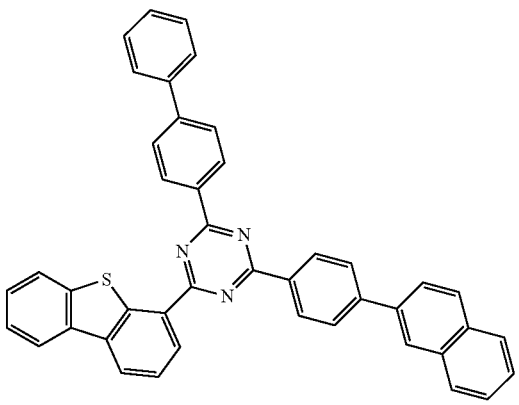

-continued
[B-141]
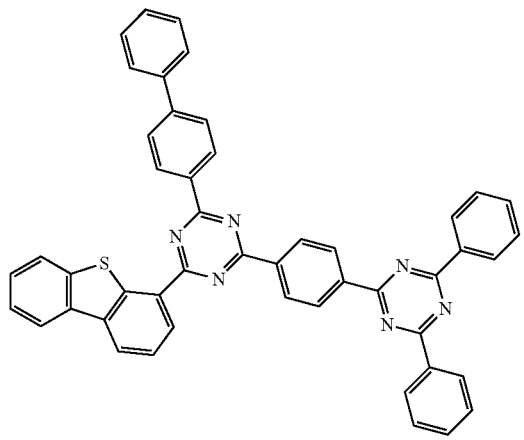
[B-142]
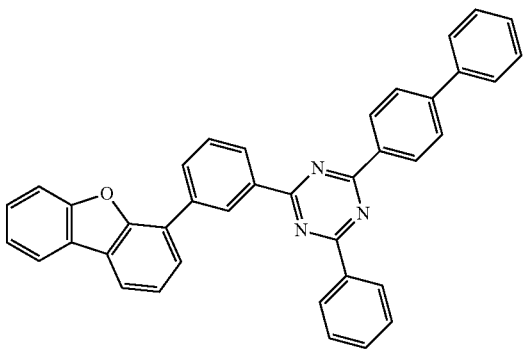
[B-143]
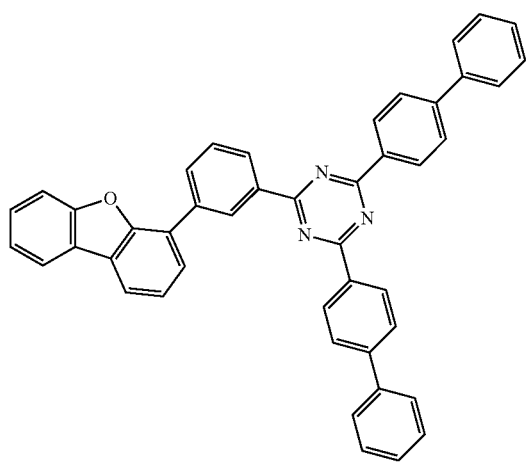
[B-144]
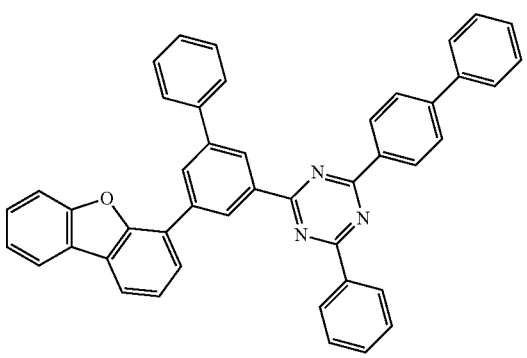
[B-145]
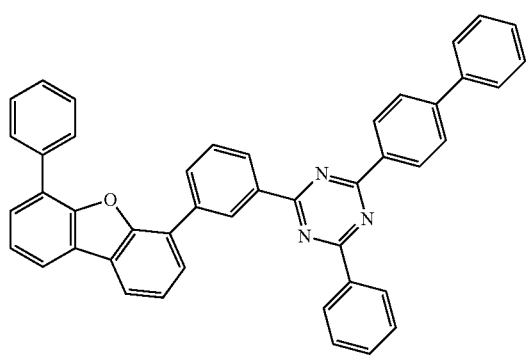
[B-146]
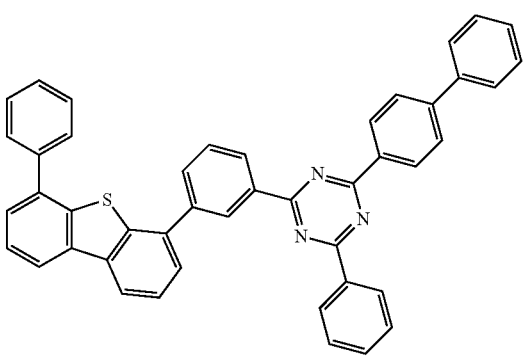

-continued
[B-147]
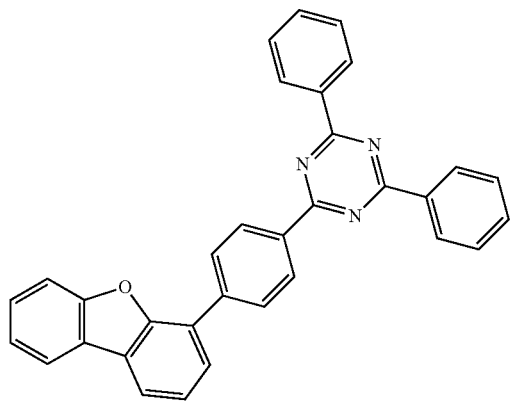
[B-148]
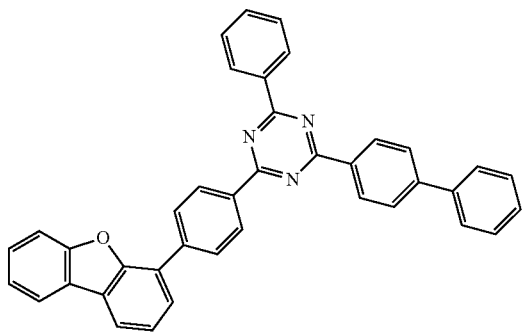
[B-149]
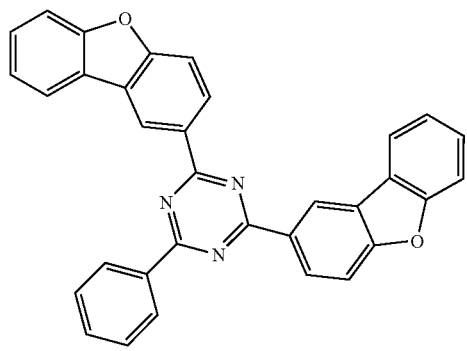
[B-150]
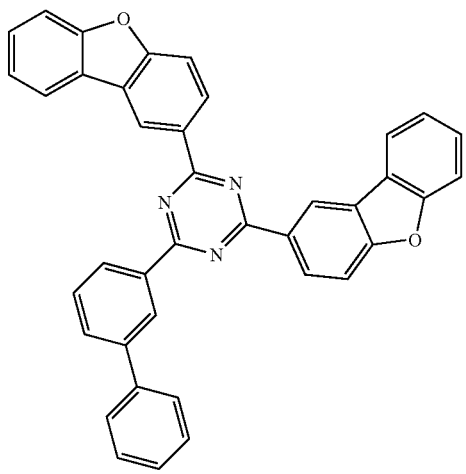
[B-151]
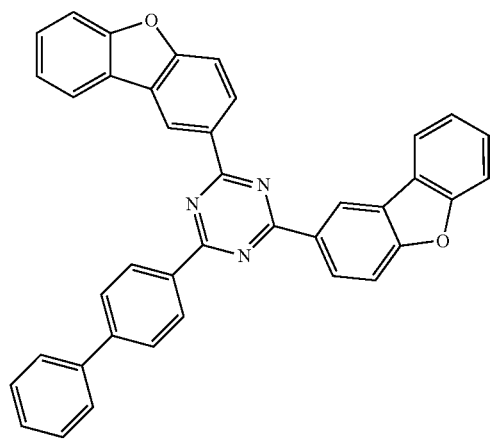
[B-152]
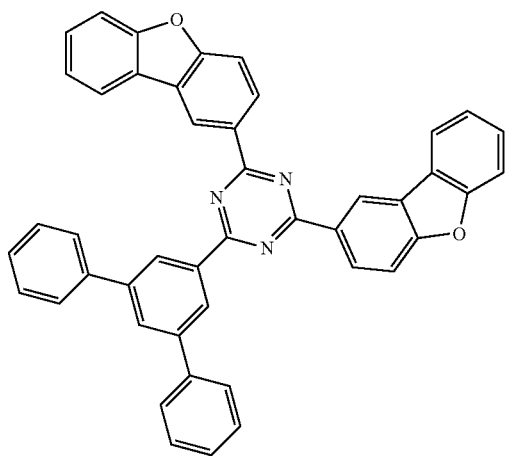

-continued
[B-153]
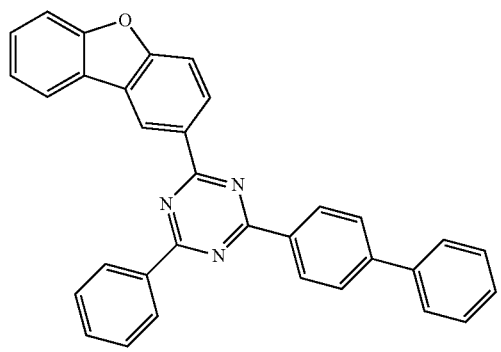
[B-154]
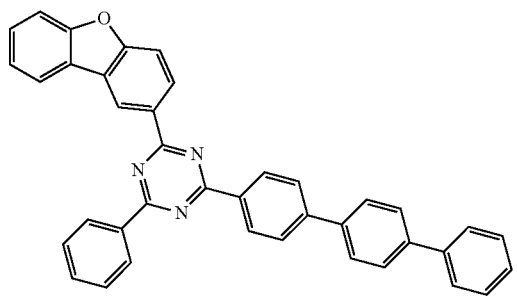
[B-155]
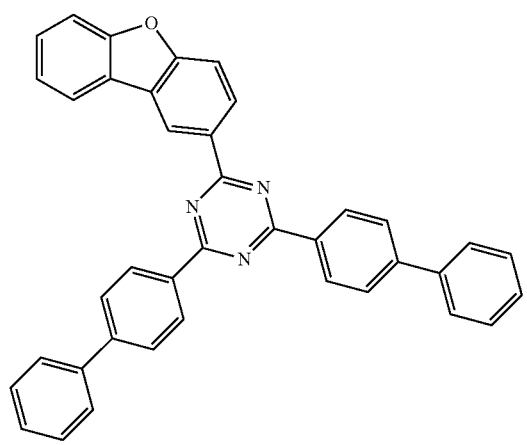
[B-156]
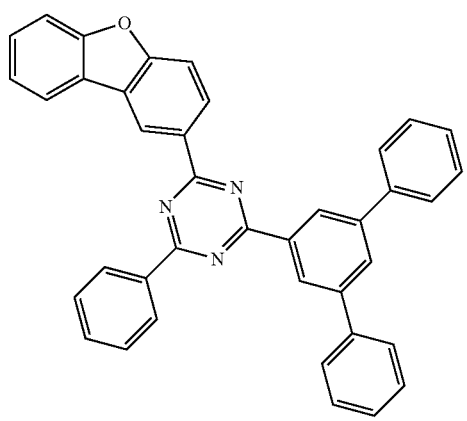
[B-157]
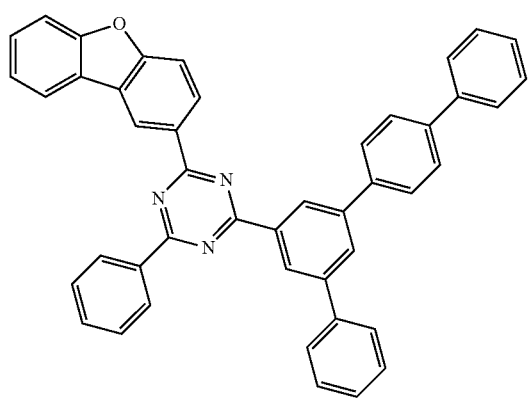
[B-158]
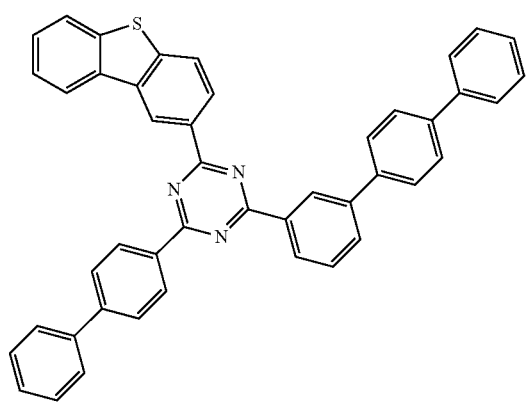

-continued
[B-159]
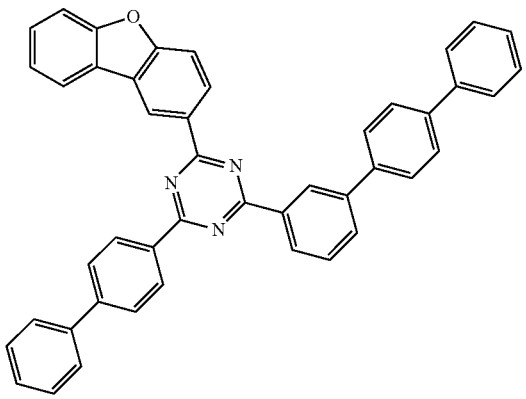
[B-160]
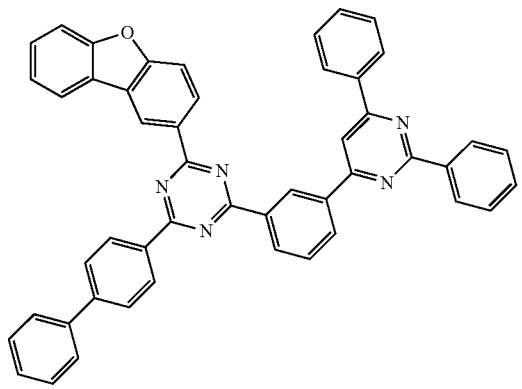
[B-161]
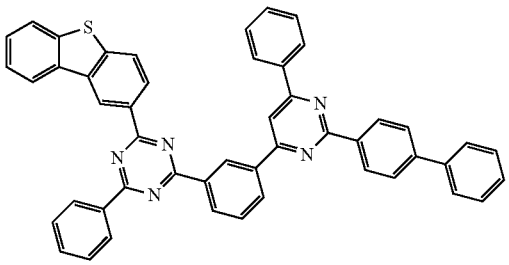
[B-162]
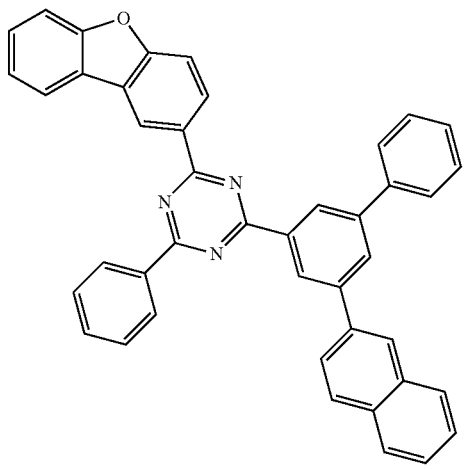
[B-163]
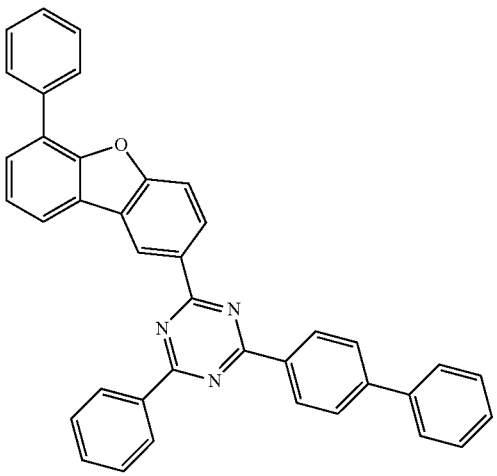
[B-164]
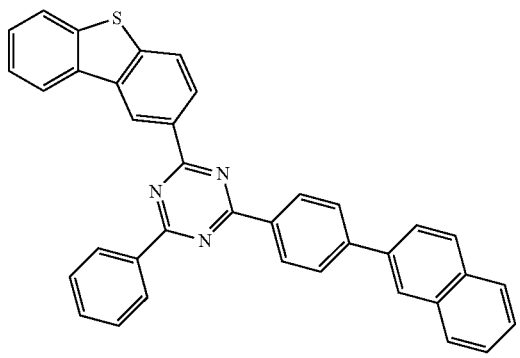

-continued
[B-165]
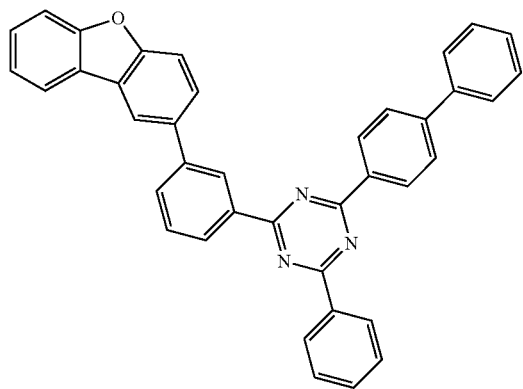
[B-166]
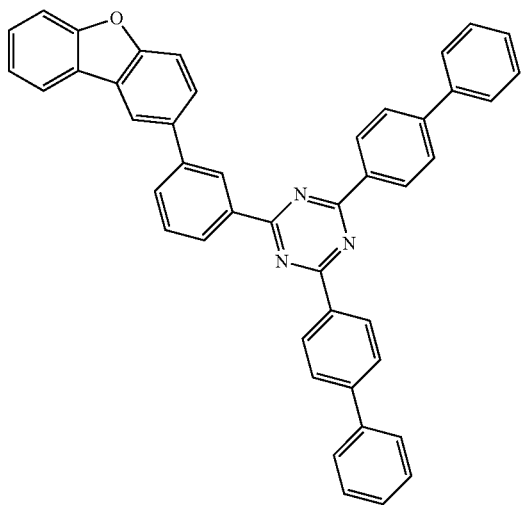
[B-167]
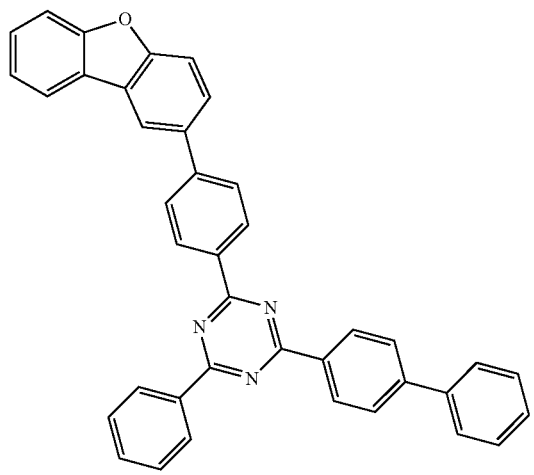
[B-168]
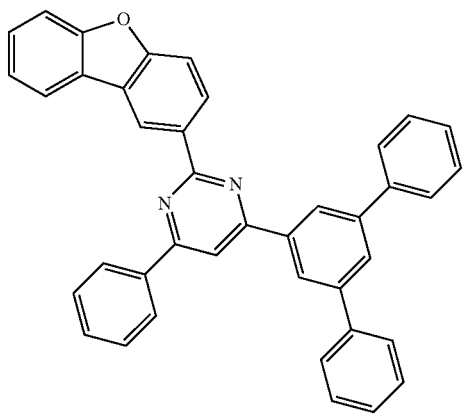
[B-169]
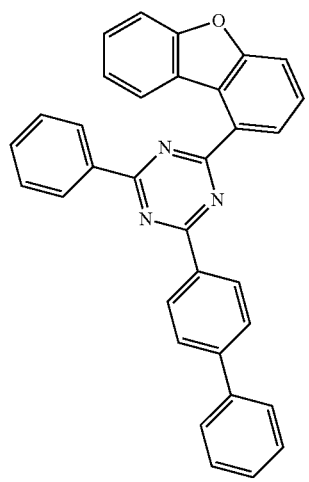
[B-170]
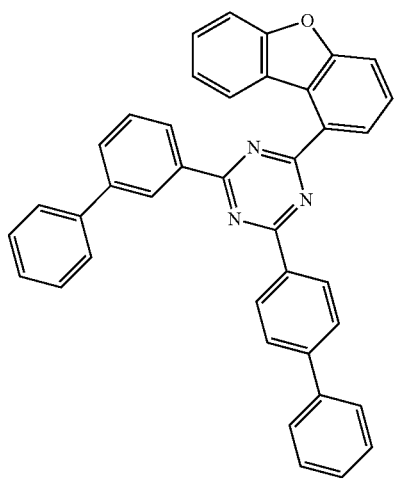

-continued
[B-171]
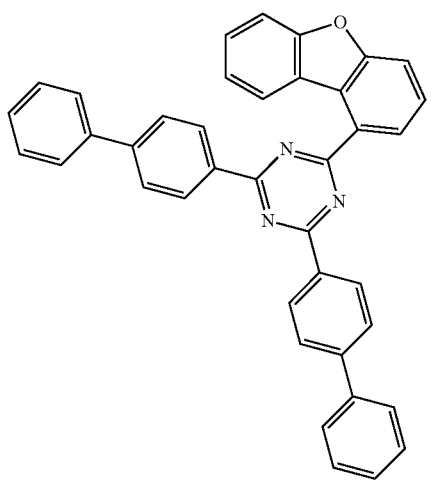
[B-172]
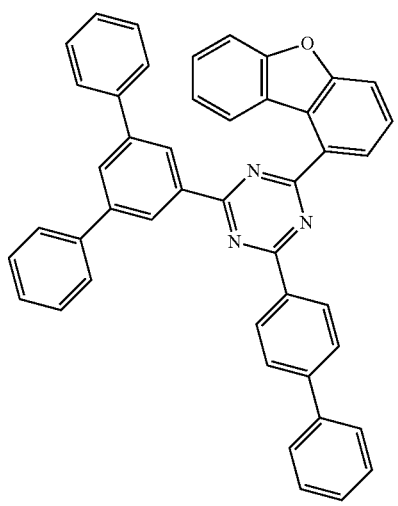
[B-173]
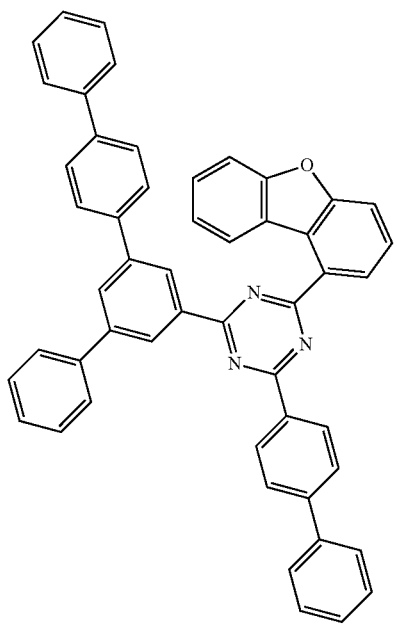
[B-174]
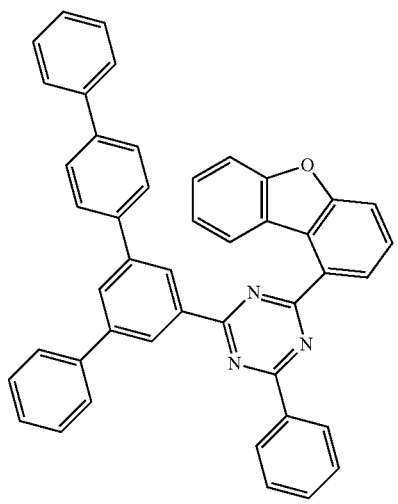
[B-175]
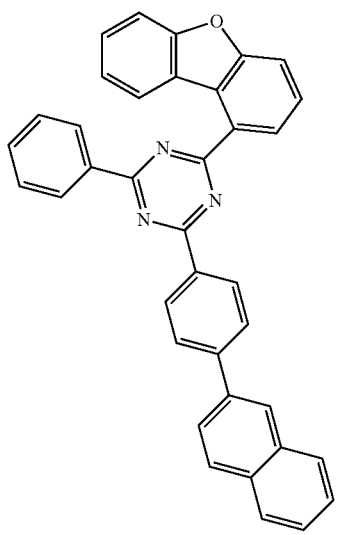
[B-176]
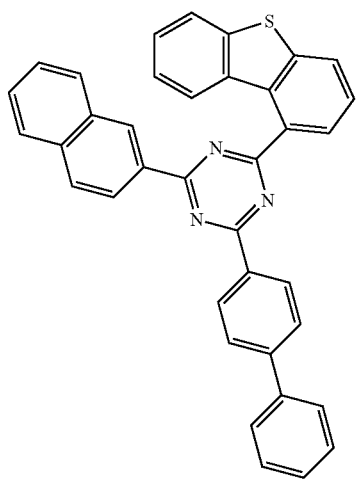

[B-177]
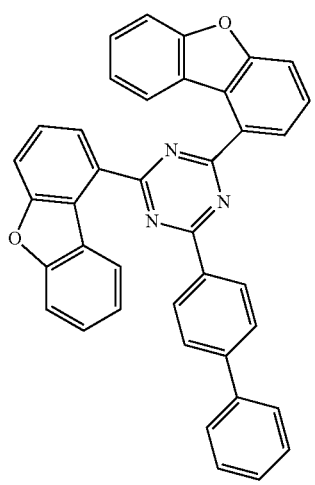
[B-178]
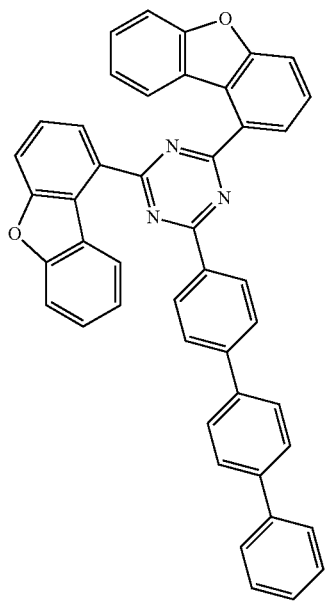
[B-179]
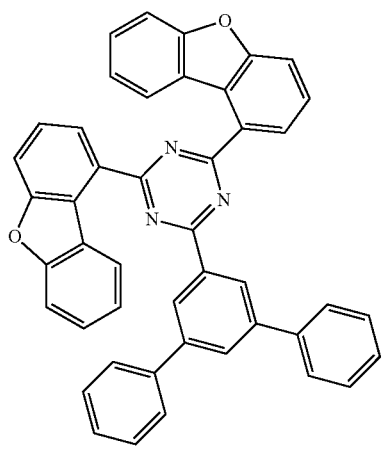
[B-180]
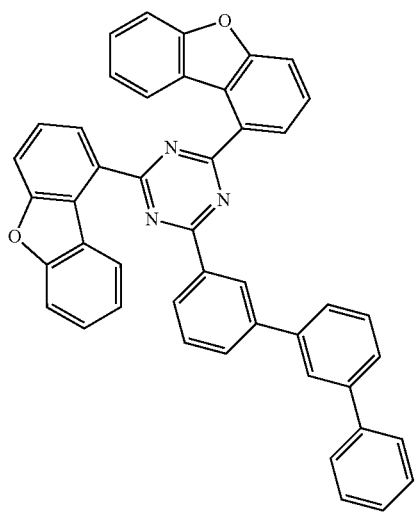

-continued
[B-181]
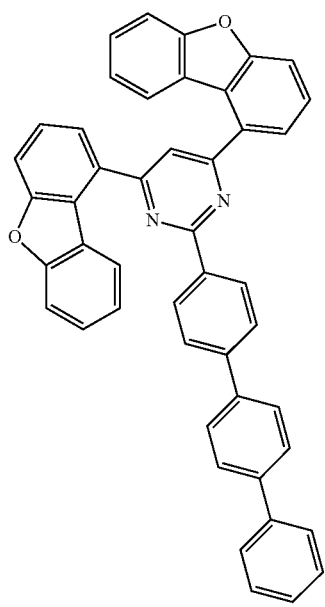
[B-182]
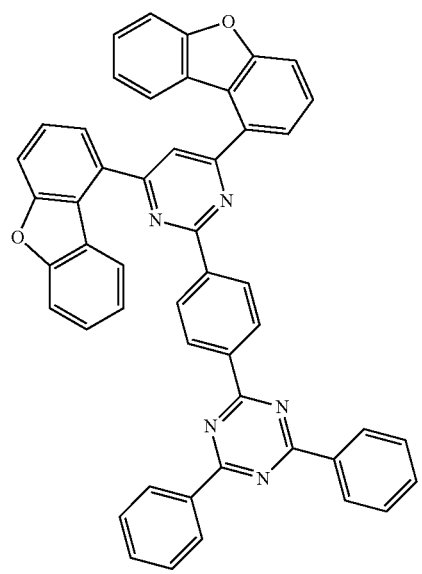
[B-183]
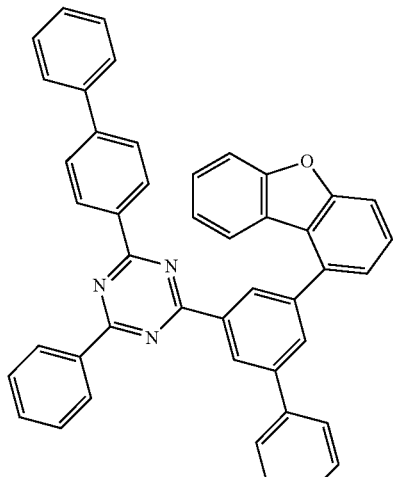
[B-184]
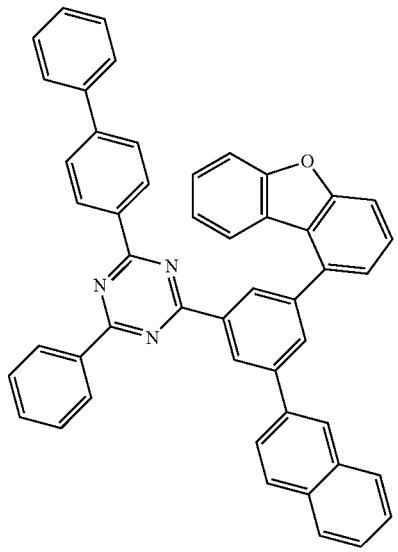

-continued
[B-185]
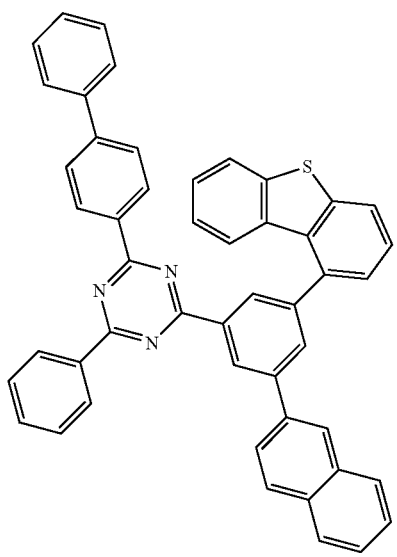
[B-186]
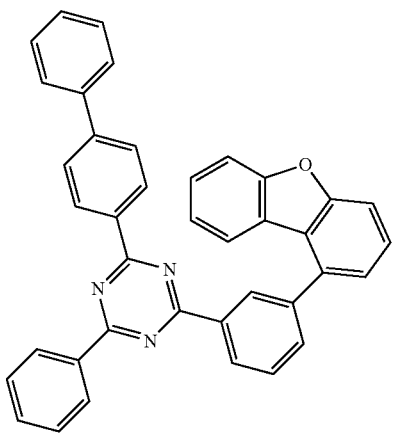
[B-187]
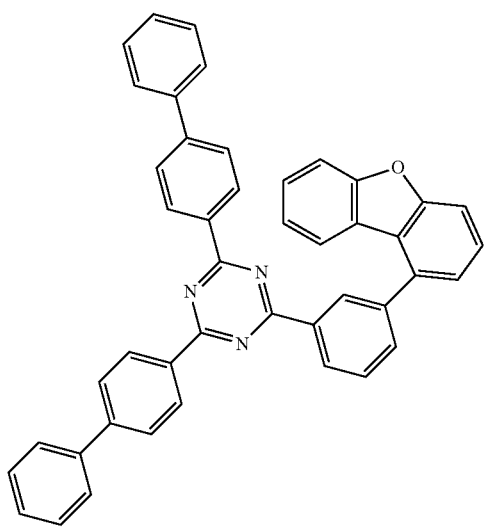
[B-188]
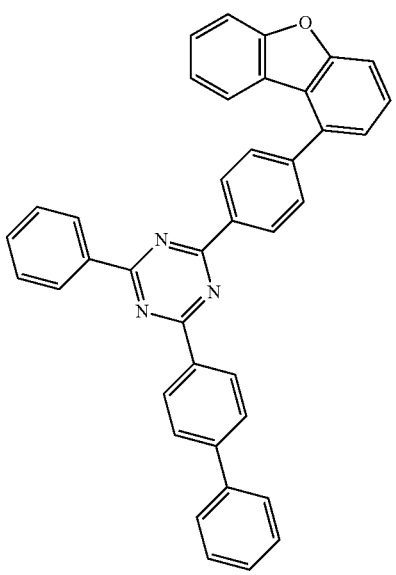

-continued

[B-189]
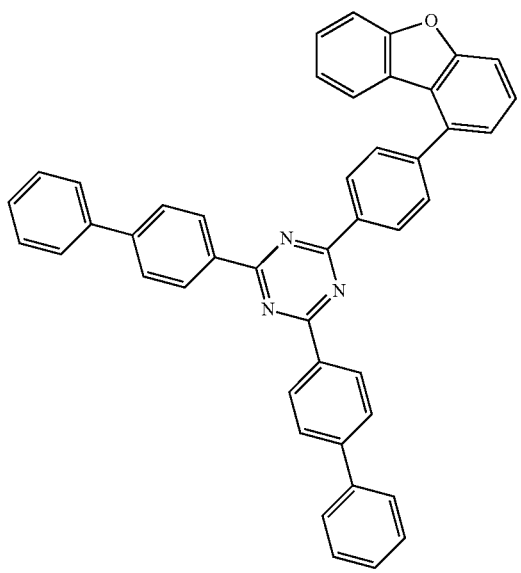

[B-190]
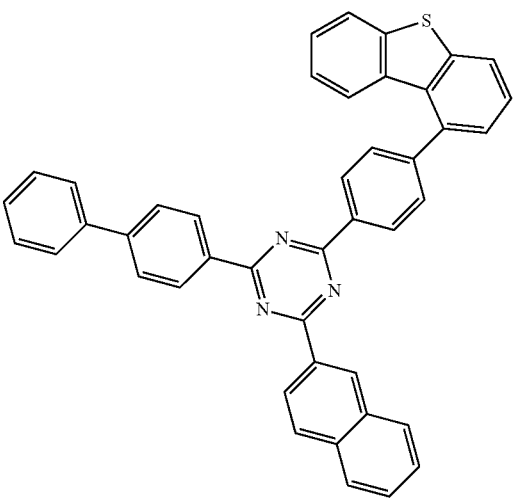

[B-191]
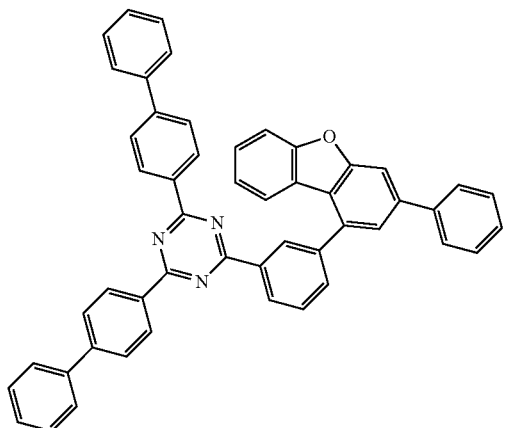

[B-192]
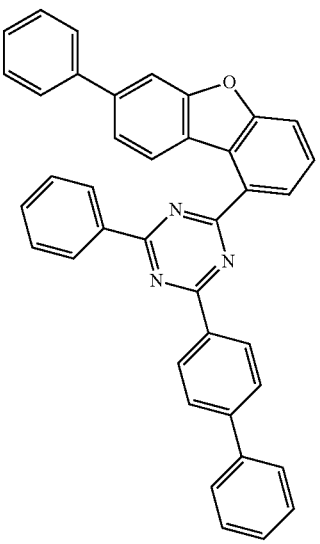

The aforementioned first compound for the organic optoelectronic element and second compound for the organic optoelectronic element may be prepared in various combinations to provide various compositions.

The second compound for the organic optoelectronic element may be used along with the first compound for the organic optoelectronic element to increase charge mobility and stability and thus to improve a driving voltage, luminous efficiency, and life-span characteristics.

A composition including the first compound for the organic optoelectronic element and the second compound for the organic optoelectronic element may further include a dopant.

The dopant may be a red, green, or blue dopant, for example a red or green phosphorescent dopant.

The dopant is mixed in a small amount to cause light emission, and may be generally a material such as a metal complex that emits light by multiple excitation into a triplet or more. The dopant may be, for example an inorganic, organic, or organic/inorganic compound, and one or more types thereof may be used.

Examples of the phosphorescent dopant include organometal compounds including Ir, Pt, Os, Ti, Zr, Hf, Eu, Tb, Tm, Fe, Co, Ni, Ru, Rh, Pd, or combination thereof, and for example a compound represented by Chemical Formula Z may be used, but is not limited thereto.

$$L^2MX \qquad \text{[Chemical Formula Z]}$$

In Chemical Formula Z, M is a metal, and L and X are the same or different, and are a ligand to form a complex compound with M.

The M may be for example Ir, Pt, Os, Ti, Zr, Hf, Eu, Tb, Tm, Fe, Co, Ni, Ru, Rh, Pd, or a combination thereof and the L and X may be for example a bidendate ligand.

More specifically, the phosphorescent dopant may be an organometal compound including one of Ir, Pt, Os, Ti, Zr, Hf, Eu, Tb, Tm, Fe, Co, Ni, Ru, Rh, Pd, or a combination thereof, and in an example embodiment, the phosphorescent dopant may be an organometal compound represented by Chemical Formula 401.

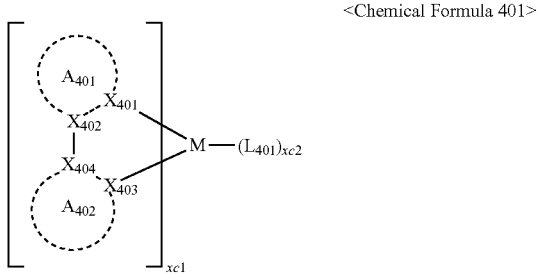

<Chemical Formula 401>

In Chemical Formula 401, M is selected from Ir, Pt, Os, Ti, Zr, Hf, Eu, Tb, and Tm; $X_{401}$ to $X_{404}$ are independently, nitrogen or carbon; $A^{401}$ and $A^{402}$ rings are independently a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzooxazole, a substituted or unsubstituted isobenzooxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene; wherein "substituted" refers to replacement of at least one hydrogen of a substituent or a compound by deuterium, a halogen, a hydroxyl group, a cyano group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heterocyclic group, a C1 to C20 alkoxy group, a C1 to C10 trifluoroalkyl group, or a combination thereof; $L^{401}$ is an organic ligand; xc1 is 1, 2, or 3; and xc2 is 0, 1, 2, or 3.

$L^{401}$ may be a monovalent, divalent, or trivalent organic ligand. For example, $L^{401}$ may be selected from a halogen ligand (e.g., Cl or F), a diketone ligand (e.g., acetylacetonate, 1,3-diphenyl-1,3-propanedionate, 2,2,6, 6-tetramethyl-3,5-heptanedionate, or hexafluoroacetonate), carboxylic acid ligands (e.g., picolinate, dimethyl-3-pyrazolecarboxylate, benzoate), a carbon mono oxide ligand, an isonitrile ligand, a cyano ligand, and a phosphorus ligand (e.g., phosphine or phosphite), but are not limited thereto.

$Q_{401}$ to $Q_{407}$, $Q_{411}$ to $Q_{417}$, and $Q_{421}$ to $Q_{427}$ may independently be selected from hydrogen, a C1 to C60 alkyl group, a C2 to C60 alkenyl group, a C6 to C60 aryl group, and a C2 to C60 heteroaryl group.

When $A_{401}$ of Chemical Formula 401 has two or more substituents, they may be combined with two or more substituents of $A_{401}$ to form a saturated or unsaturated ring.

When $A_{402}$ of Chemical Formula 401 has two or more substituents, they may be combined with two or more substituents of $A_{402}$ to form a saturated or unsaturated ring.

When xc1 of Chemical Formula 401 is two or more, a plurality of ligands of Chemical Formula 401 may be the same or different. When xc1 of Chemical Formula 401 is two or more, $A_{401}$ and $A_{402}$ may be independently linked with $A_{401}$ and $A_{402}$ of adjacent other ligand directly or by a linking group (for example, a C1 to C5 alkylene group, —N(R')— (wherein, R' is a C1 to C10 alkyl group or a C6 to C20 aryl group), or —C(=O)—).

For example, the phosphorescent dopant may be a red or green phosphorescent dopant, and may be selected from the following compounds PD1 to PD75, but is not limited thereto:

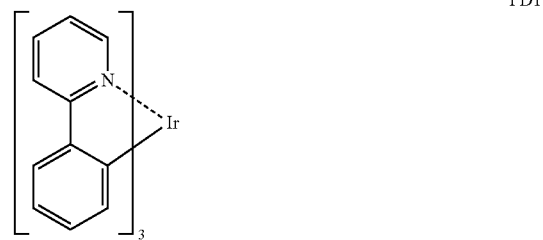

PD1

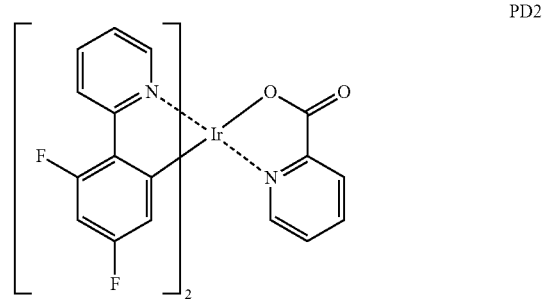

PD2

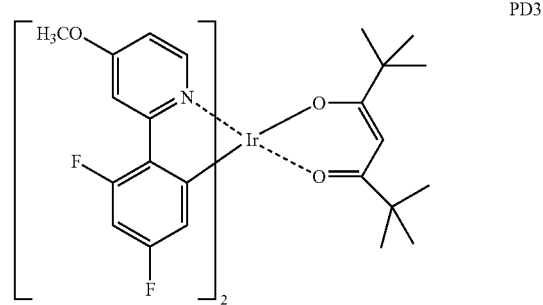

PD3

PD4 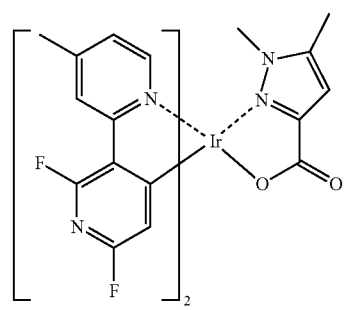
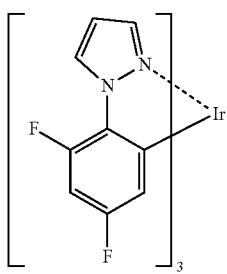
PD5 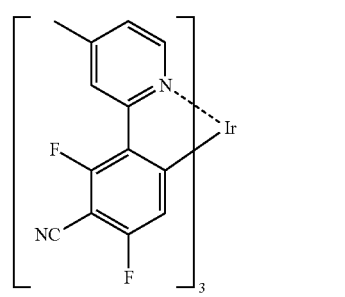 PD10
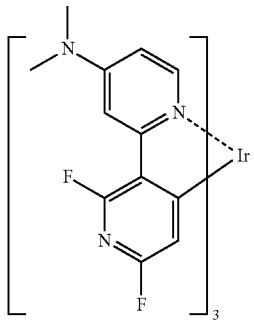
PD6 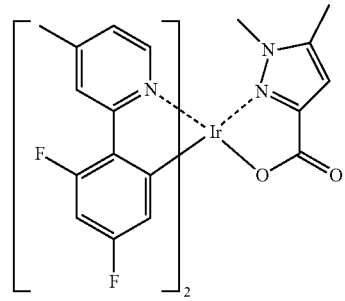 PD11
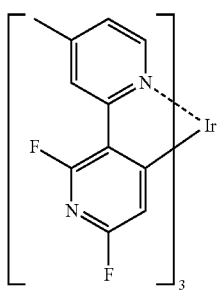
PD7 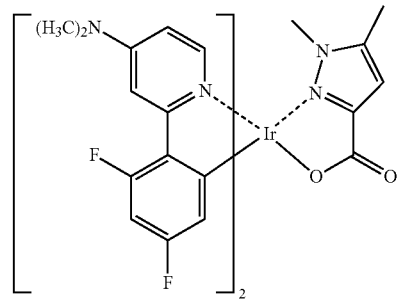 PD12
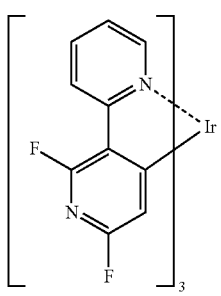
PD8 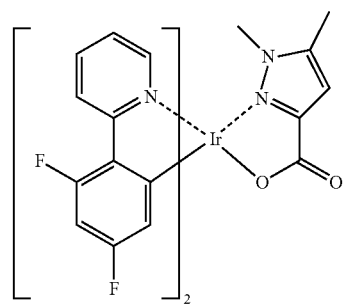 PD13
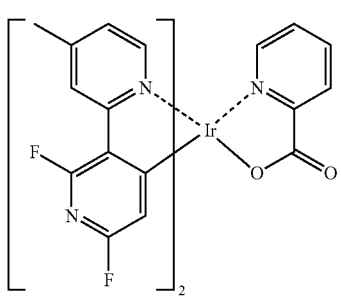

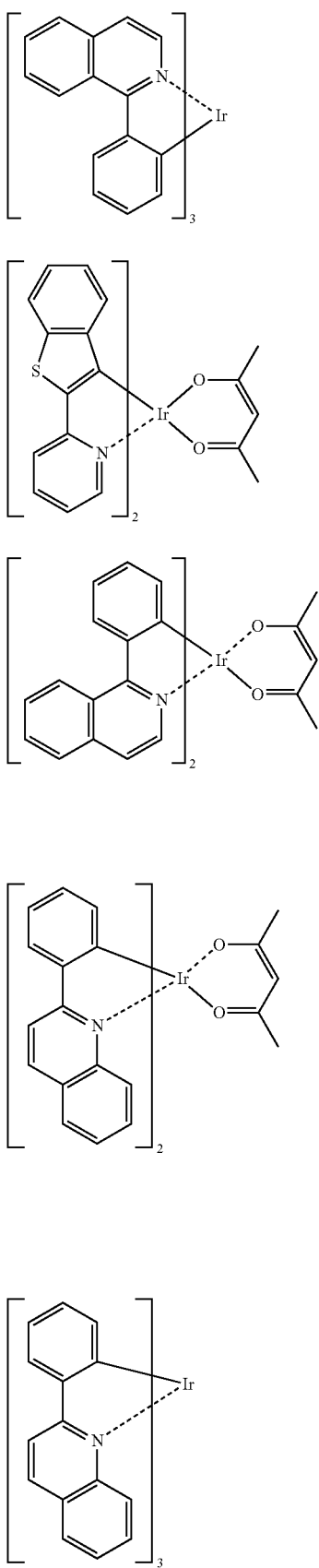
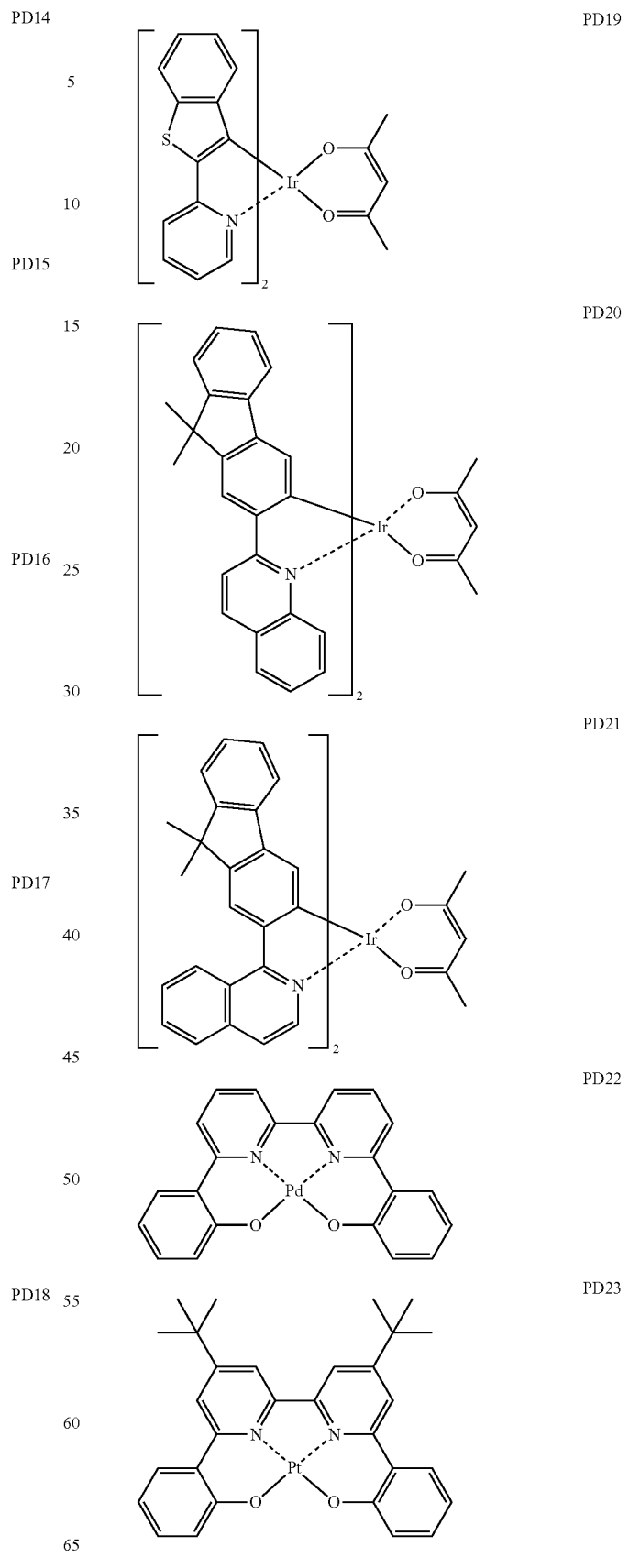

PD24 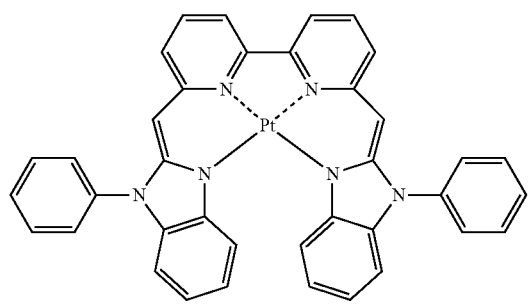
PD25 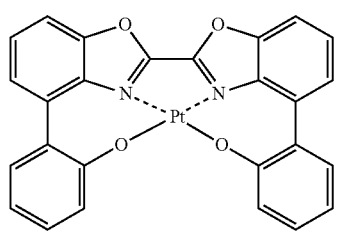
PD26 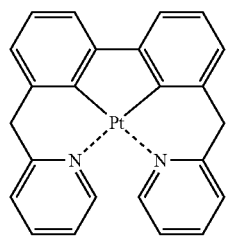
PD27 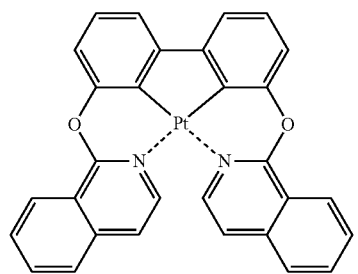
PD28 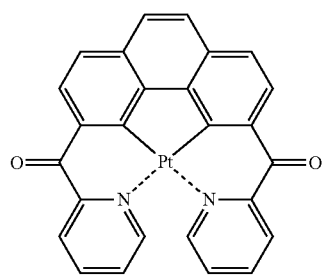
PD29 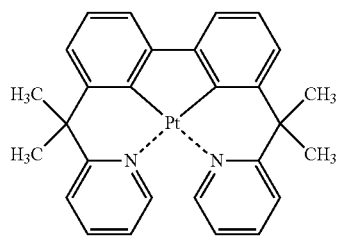
PD30 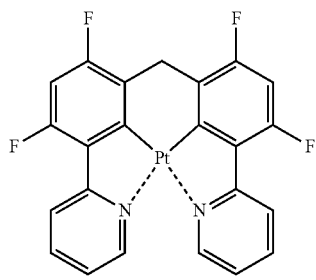
PD31 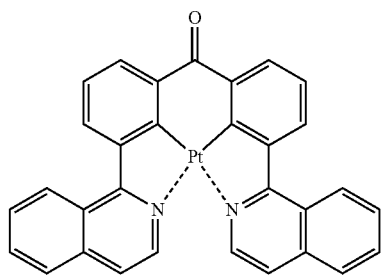
PD32 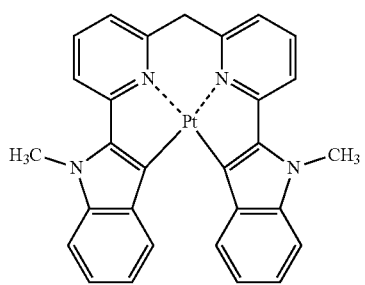
PD33 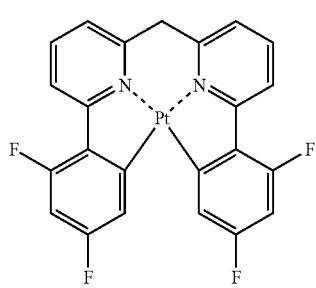
PD34 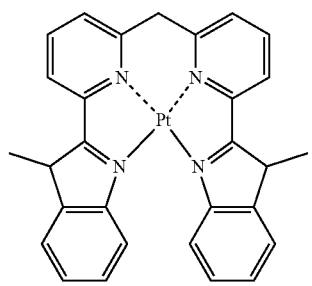

-continued
PD35 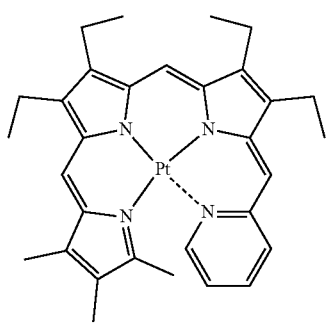
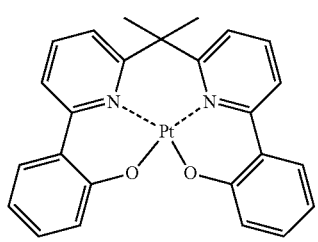
PD36
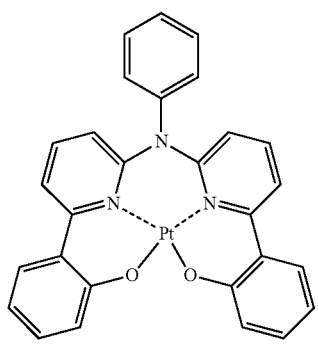
PD37
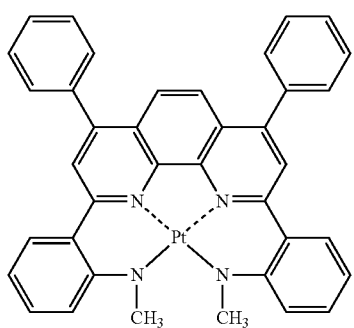
PD38
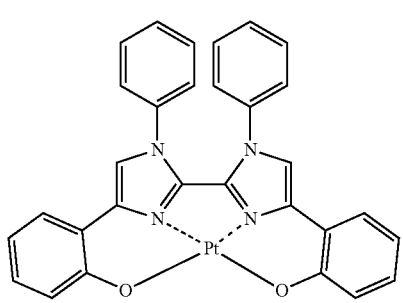
PD39
-continued
PD40 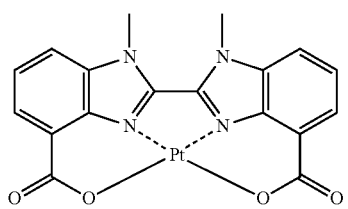
PD41 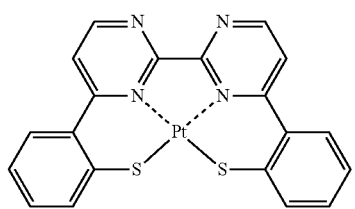
PD42 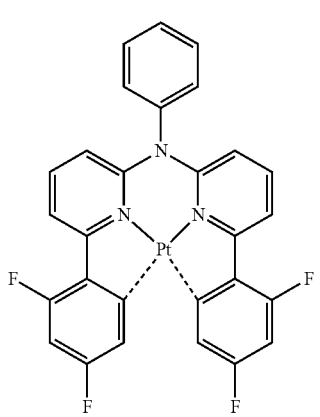
PD43 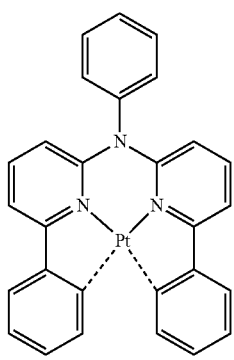
PD44 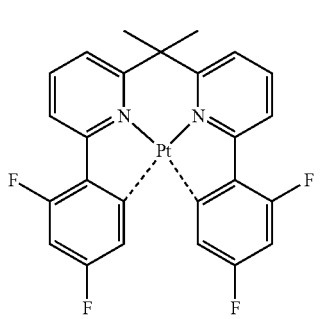

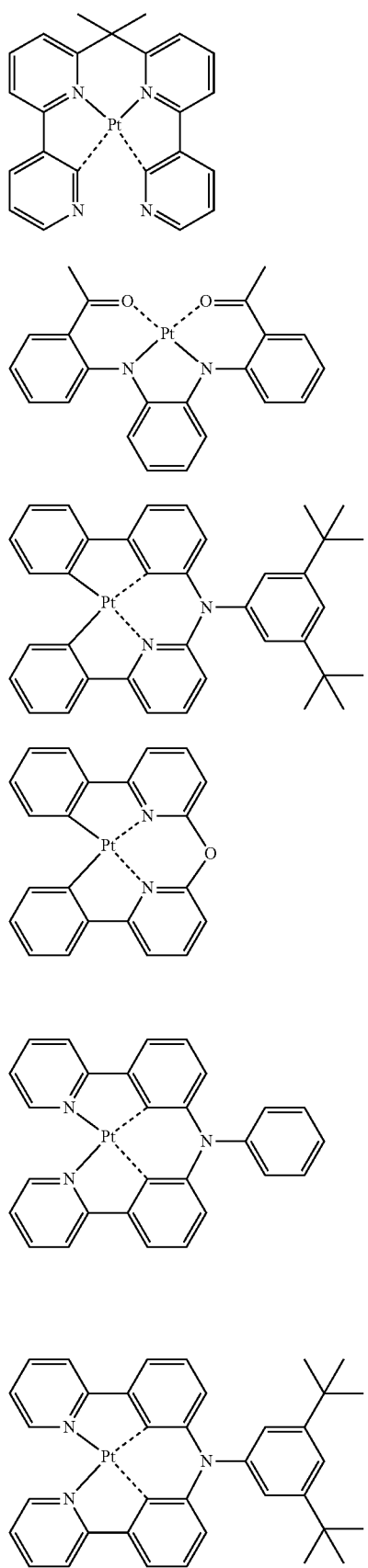
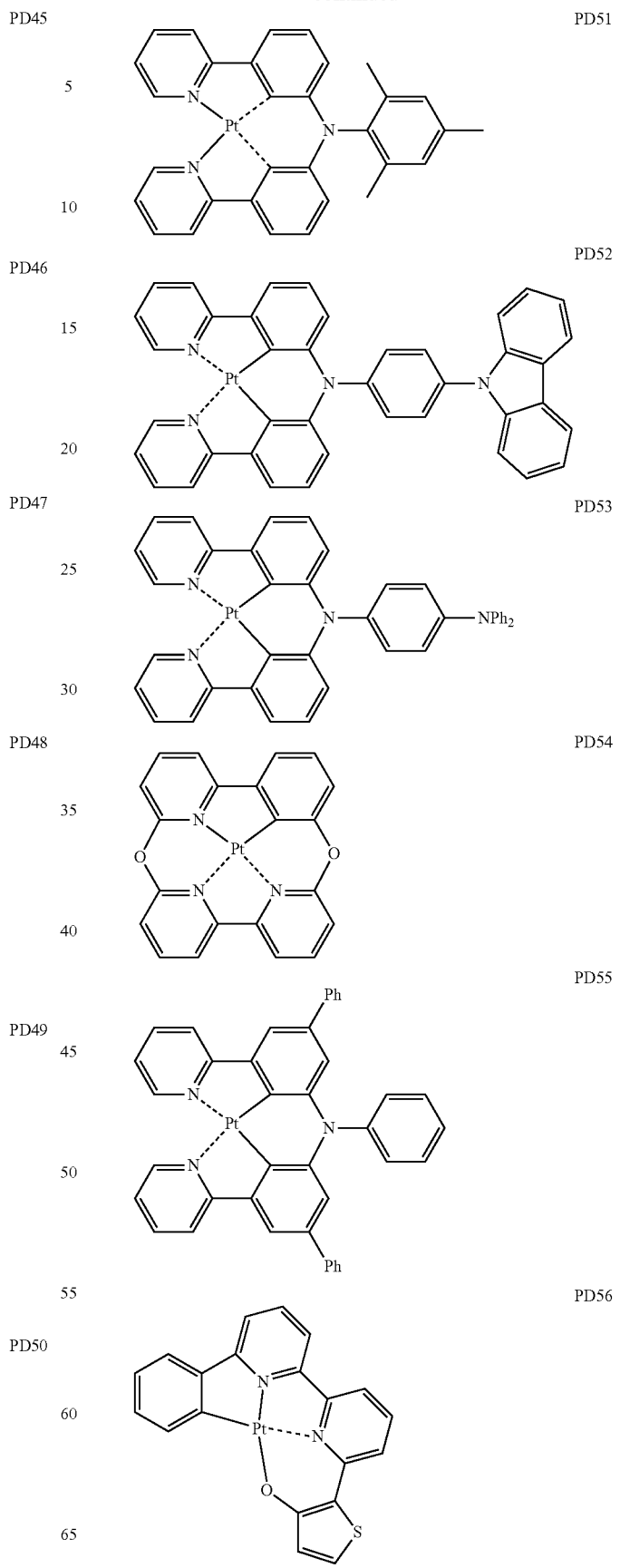

-continued
PD57
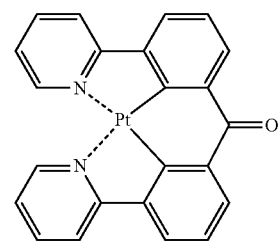
PD58
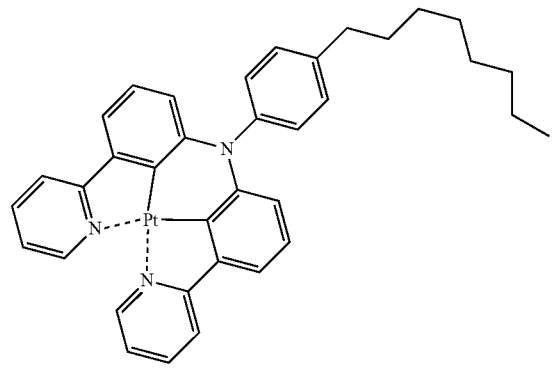
PD59
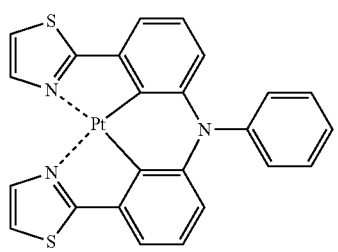
PD60
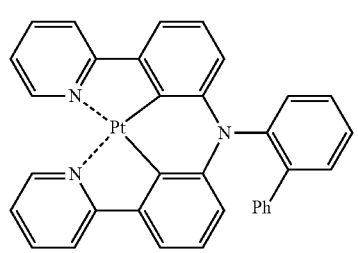
PD61
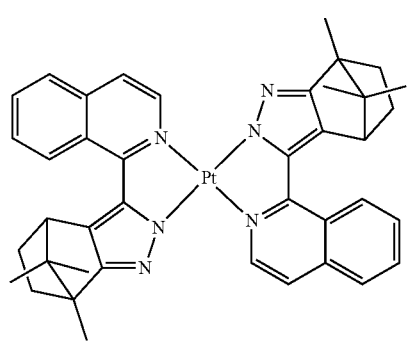
-continued
PD62
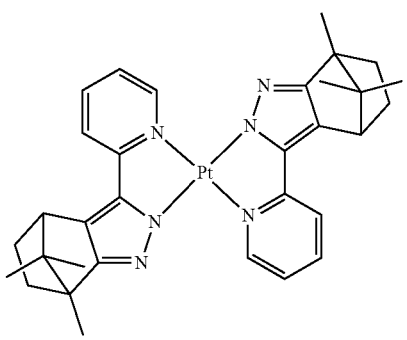
PD63
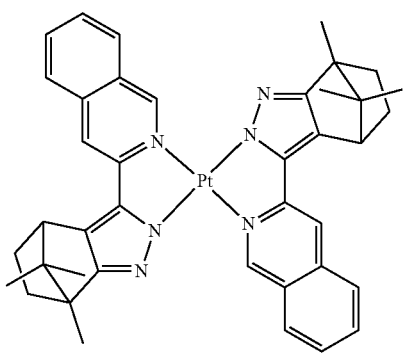
PD64
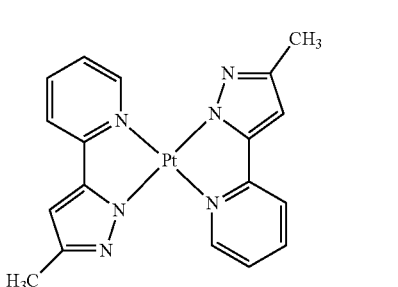
PD65
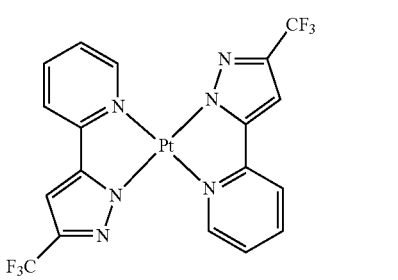
PD66
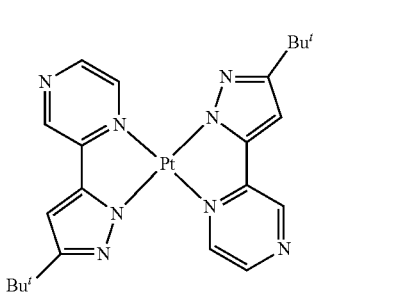

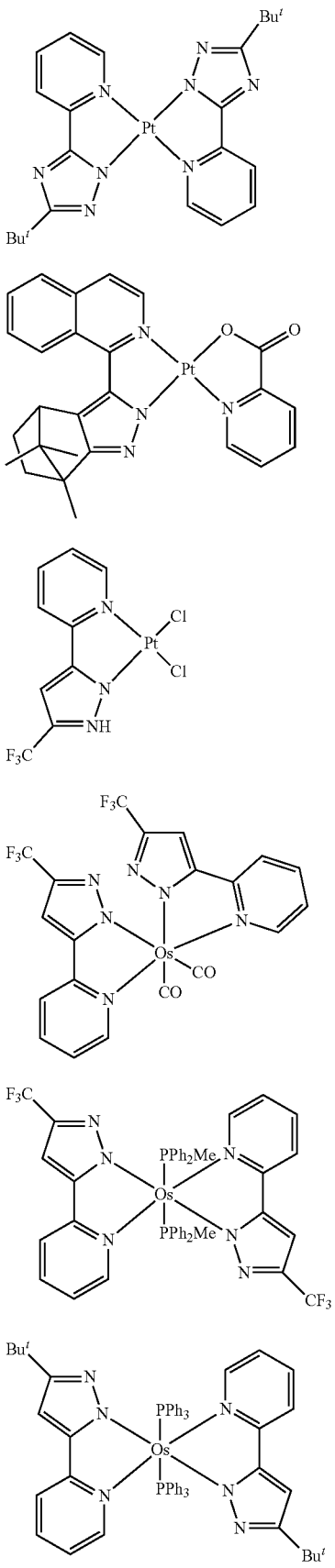

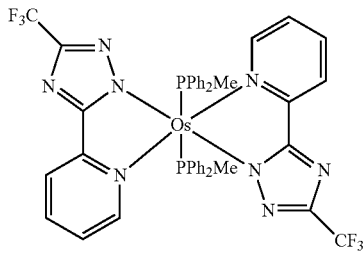

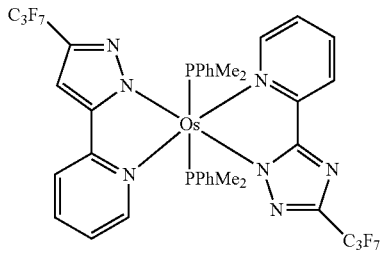

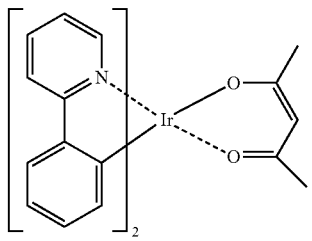

In addition, charge mobility may be controlled by adjusting a ratio of the second compound for the organic optoelectronic element and the first compound for the organic optoelectronic element. When the composition of the present invention is used as a host, a combination ratio thereof may vary according to types of used dopant or the propensity of the dopant, and the first compound for the organic optoelectronic element and the second compound for the organic optoelectronic element may be included in a weight ratio of 1:10 to 10:1. Specifically, they may be included in a weight ratio of 2:8 to 8:2, 9:1 to 5:5, 8:2 to 5:5, 7:3 to 5:5, and for specific examples, a mixing weight ratio of the first compound for the organic optoelectronic element and the second compound for the organic optoelectronic element may be 5:5.

Within the weight ratio range, bipolar characteristics may be more effectively implemented to improve efficiency and life-span simultaneously.

The composition may be formed by a dry film forming method such as chemical vapor deposition or a solution process.

Hereinafter, an organic optoelectronic element including the aforementioned composition for the organic optoelectronic element is described.

The organic optoelectronic element according to another embodiment may include an anode and a cathode facing each other, and at least one organic layer positioned between the anode and the cathode, and the organic layer may include the aforementioned composition for the organic optoelectronic element.

For example, the organic layer may include a light emitting layer, and the light emitting layer may include the composition for the organic optoelectronic element of the present invention.

Specifically, the composition for the organic optoelectronic element may be included as a host of the light emitting layer, for example, a green host.

In addition, the organic layer may include a light emitting layer; and at least one auxiliary layer selected from a hole injection layer, a hole transport layer, an electron blocking layer, an electron transport layer, an electron injection layer, and a hole blocking layer, and the auxiliary layer may include the composition for the organic optoelectronic element.

The organic optoelectronic element may be any element to convert electrical energy into photoenergy and vice versa without particular limitation and may be for example an organic photoelectric diode, an organic light emitting diode, an organic solar cell, an organic photo conductor drum, and the like.

Herein, an organic light emitting diode as an example of the organic optoelectronic element is described with reference to the drawings.

FIGS. 1 and 2 are cross-sectional views showing organic light emitting diodes according to embodiments.

Referring to FIG. 1, an organic light emitting diode 100 according to an embodiment includes an anode 120 and a cathode 110 facing each other and an organic layer 105 disposed between the anode 120 and the cathode 110.

The anode 120 may be made of a conductor having a large work function to help hole injection, and may be for example a metal, a metal oxide, and/or a conductive polymer. The anode 120 may be, for example a metal such as nickel, platinum, vanadium, chromium, copper, zinc, gold, and the like or an alloy thereof; metal oxide such as zinc oxide, indium oxide, indium tin oxide (ITO), indium zinc oxide (IZO), and the like; a combination of metal and oxide such as ZnO and Al or $SnO_2$ and Sb; a conductive polymer such as poly(3-methylthiophene), poly(3,4-(ethylene-1,2-dioxy)thiophene) (PEDT), polypyrrole, and polyaniline, but is not limited thereto.

The cathode 110 may be made of a conductor having a small work function to help electron injection, and may be for example a metal, a metal oxide, and/or a conductive polymer. The cathode 110 may be for example a metal such as magnesium, calcium, sodium, potassium, titanium, indium, yttrium, lithium, gadolinium, aluminum silver, tin, lead, cesium, barium, and the like or an alloy thereof; a multi-layer structure material such as LiF/Al, $LiO_2$/Al, LiF/Ca, LiF/Al, and $BaF_2$/Ca, but is not limited thereto.

The organic layer 105 includes a light emitting layer 130 including the aforementioned composition for the organic optoelectronic element.

FIG. 2 is a cross-sectional view illustrating an organic light emitting diode according to another embodiment.

Referring to FIG. 2, an organic light emitting diode 200 further includes a hole auxiliary layer 140 in addition to the light emitting layer 130. The hole auxiliary layer 140 further increases hole injection and/or hole mobility and blocks electrons between the anode 120 and the light emitting layer 130. The hole auxiliary layer 140 may be, for example, a hole transport layer, a hole injection layer, and/or an electron blocking layer, and may include at least one layer.

The organic layer 105 of FIG. 1 or 2 may further include an electron injection layer, an electron transport layer, an electron transport auxiliary layer, a hole transport layer, a hole transport auxiliary layer, a hole injection layer, or a combination thereof even if they are not shown. The composition for the organic optoelectronic element of the present invention may be included in these organic layers. The organic light emitting diodes 100 and 200 may be manufactured by forming an anode or a cathode on a substrate, forming an organic layer using a dry film formation method such as a vacuum deposition method (evaporation), sputtering, plasma plating, and ion plating or a wet coating method such as spin coating, dipping, and flow coating, and forming a cathode or an anode thereon.

The aforementioned organic light emitting diode may be applied to an organic light emitting diode display.

Hereinafter, the embodiments are illustrated in more detail with reference to examples. These examples, however, are not in any sense to be interpreted as limiting the scope of the invention.

Hereinafter, starting materials and reactants used in Examples and Synthesis Examples were purchased from Sigma-Aldrich Co., Ltd. or TCI Inc. as far as there in no particular comment or were synthesized by known methods.

(Preparation of Compound for Organic Optoelectronic Element)

The compound as specific examples of the present invention was synthesized through the following steps.

(First Compound for Organic Optoelectronic Element)

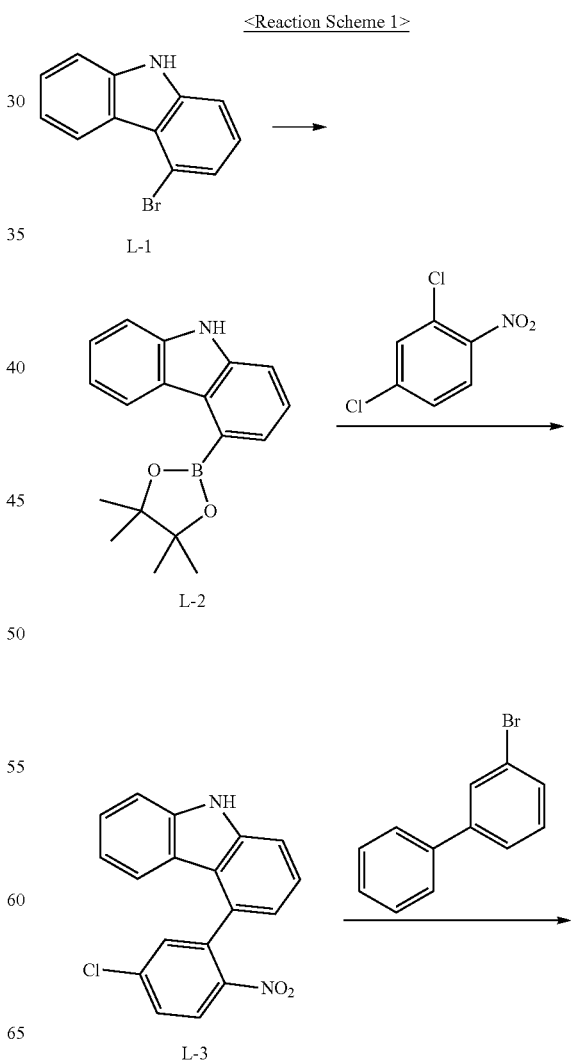

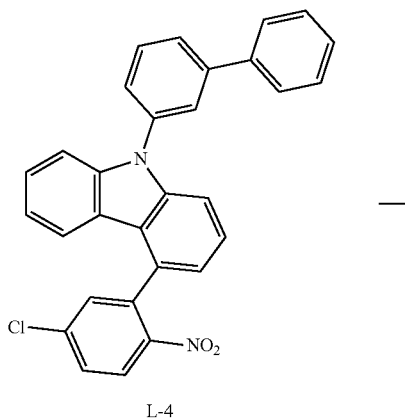

L-4

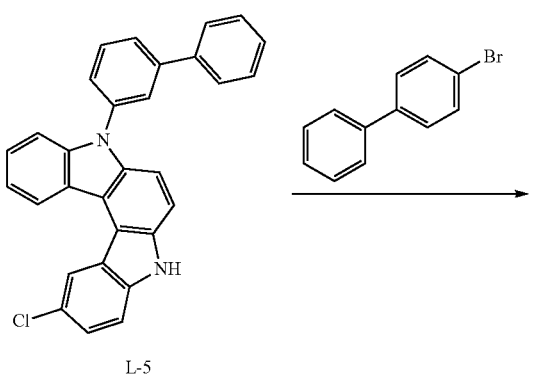

L-5

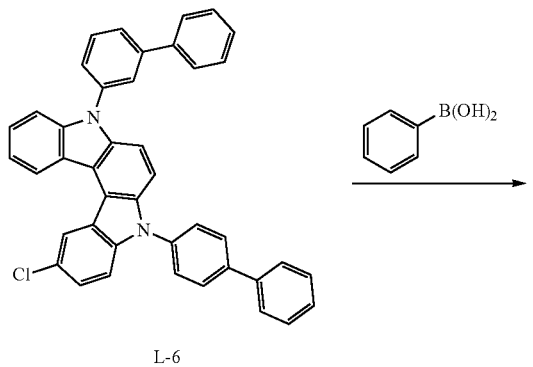

L-6

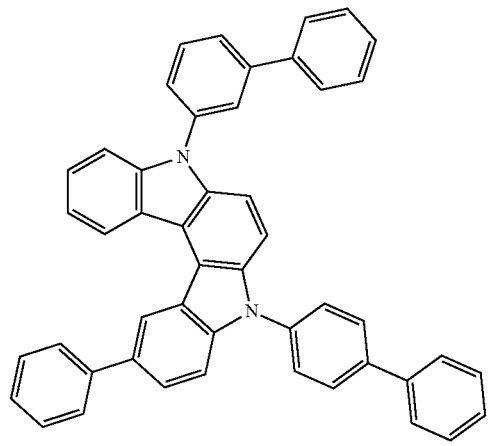

A-74

Synthesis Example 1: Synthesis of Intermediate L-2

30.0 g (121.90 mmol) of Intermediate L-1, 46.43 g (182.85 mmol) of boronester, 29.91 g (304.75 mmol) of potassium acetate, and 4.98 g (6.10 mmol) of Pd(dppf)Cl$_2$ were added to 400 mL of toluene in a 1000 ml flask and then, heated and refluxed under a nitrogen flow for 12 hours. The obtained mixture was added to 1500 mL of methanol, and solid crystallized therein were filtered, dissolved in dichloromethane, filtered with silica gel/Celite, and after removing an appropriate amount of the organic solvent, recrystallized with hexane to obtain Compound L-2 (27.1 g, a yield of 76%).

Synthesis Example 2: Synthesis of Intermediate L-3

20.0 g (68.22 mmol) of Intermediate L-2, 14.41 g (75.04 mmol) of 2,4-dichloronitrobenzene, 23.57 g (170.55 mmol) of potassium carbonate, and 3.94 g (3.41 mmol) of Pd(PPh$_3$)$_4$(tetrakis(triphenylphosphine) palladium (0)) were added to 170 mL of tetrahydrofuran and 80 mL of water in a 500 mL flask and then, heated under a nitrogen flow for 10 hours. The obtained mixture was added to 500 mL of methanol, and solids crystallized therein were filtered, dissolved in dichloromethane, filtered with silica gel/Celite, and after removing an appropriate amount of the organic solvent, recrystallized with hexane to obtain Compound L-3 (15.30 g, a yield of 69%).

Synthesis Example 3: Synthesis of Intermediate L-4

15 g (46.48 mmol) of Intermediate L-3, 11.38 g (48.80 mmol) of 3-bromobiphenyl, 11.17 g (116.19 mmol) of sodium t-butoxide, 1.34 g (2.32 mmol) of Pd(dba)$_2$, and 3.40 mL of tri t-butylphosphine (50% in toluene) in 150 ml of toluene were added to 170 mL of tetrahydrofuran and 80 mL of water in a 500 mL flask and then, heated under a nitrogen flow for 10 hours. After 15 hours, a reaction was completed, the obtained mixture therefrom was added to 700 mL of methanol, and solids crystallized therein were filtered, dissolved in toluene, filtered with silica gel/Celite, and after removing an appropriate amount of the organic solvent, recrystallized with hexane to obtain Intermediate L-4 (17.3 g, a yield of 78%).

Synthesis Example 4: Synthesis of Intermediate L-5

30 g (63.17 mmol) of Intermediate L-5 and 41.42 g (157.91 mmol) of triphenylphosphine were added to 150 ml of dichlorobenzene as a solvent in a 250 mL flask, stirred under a nitrogen flow and heated at 160° C. After 4 hours, a reaction was complete. The dichlorobenzene was condensed through a distiller, and Intermediate L-5 (17.1 g, a yield of 61%) was obtained through column purification (dichloromethane hexane=2:8).

Synthesis Example 5: Synthesis of Intermediate L-6

15 g (33.86 mmol) of Intermediate L-5, 8.29 g (35.56 mmol) of 4-bromobiphenyl, 8.14 g (84.66 mmol) of sodium t-butoxide, 0.97 g (1.69 mmol) of Pd(dba)$_2$, and 2.48 mL of tri t-butylphosphine (50% in toluene) in 110 ml of toluene were put in a 250 mL flask and then, heated and stirred and heated at 130° C. under a nitrogen flow. After 15 hours, a reaction was completed. The obtained mixture was added to 500 mL of methanol, and solids crystallized therein were filtered, dissolved in toluene, filtered with silica gel/Celite, and after removing an appropriate amount of the organic solvent, recrystallized with hexane to obtain Compound L-6 (12.7 g, a yield of 79%).

Synthesis Example 6: Synthesis of Chemical Formula A-74

20.0 g (33.61 mmol) of Intermediate L-6, 4.51 g (36.97 mmol) of phenyl boronic acid, 11.61 g (84.02 mmol) of potassium carbonate, 1.94 g (1.68 mmol) of Pd(PPh$_3$)$_4$ (tetrakis(triphenylphosphine) palladium (0)) were added to 170 mL of tetrahydrofuran and 80 mL of water in a 500 mL flask and then, heated under a nitrogen flow for 10 hours. The obtained mixture was added to 500 mL of methanol, and solids crystallized therein were filtered, heated and dissolved in toluene, filtered with silica gel/Celite, and after removing an appropriate amount of the organic solvent, recrystallized with hexane to obtain Compound A-74 (16.50 g, a yield of 77%).

Chemical Formulae A-70, A-72, A-166, A-77, and A-76 were synthesized according to the same method as described above.

In addition, Chemical Formulae A-89, A-95, A-93, and A-94 were synthesized by using 2,4-dichloronitrobenzene instead of the 1,4-dichloro-2-nitrobenzene in the aforementioned method.

Comparative Synthesis Example 1: Synthesis of Compound a

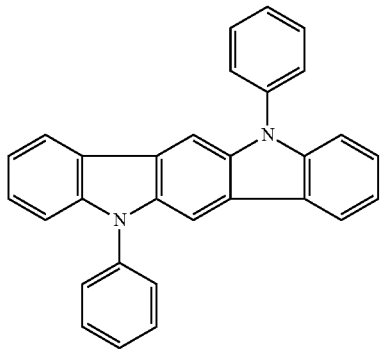

[Compound a]

Synthesis was performed with reference to the method described in U.S. Pat. No. 5,942,340.

Comparative Synthesis Examples 2 and 3: Synthesis of Compound b and Synthesis of Compound c

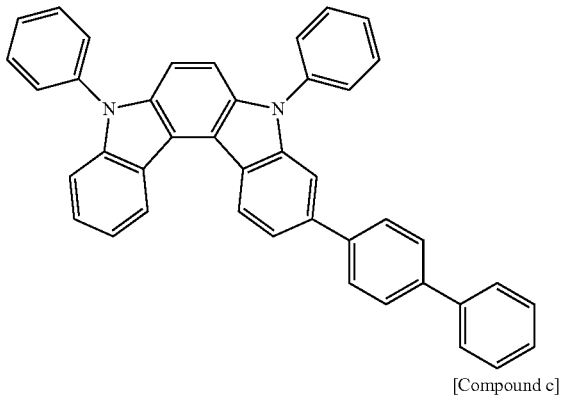

[Compound b]

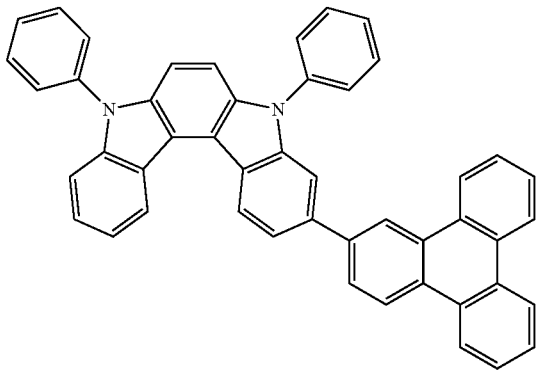

[Compound c]

Second Compound for Organic Optoelectronic Element

Synthesis Example 7: Synthesis of Compound B-1

[Reaction Scheme 2]

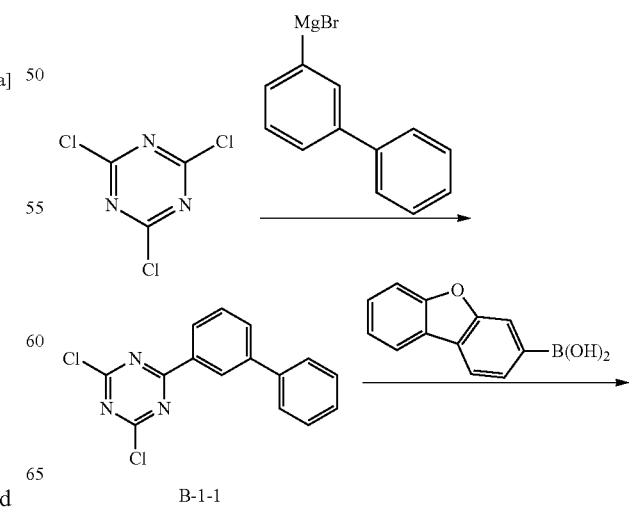

B-1-1

-continued

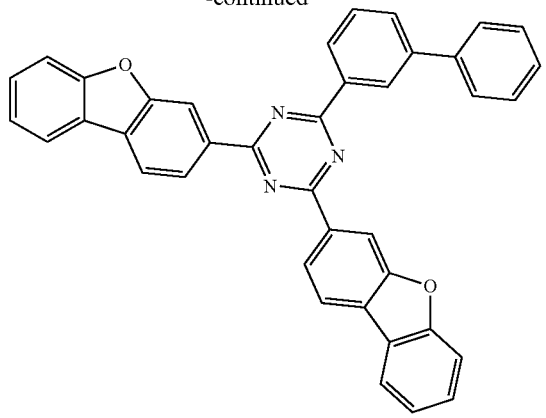

B-1 a) Synthesis of Intermediate B-1-1

15 g (81.34 mmol) of cyanuric chloride was dissolved in 200 mL of anhydrous tetrahydrofuran in a 500 mL round-bottomed flask, 1 equivalent of a 3-biphenyl magnesium bromide solution (0.5 M tetrahydrofuran) was added thereto in a dropwise fashion at 0° C. under a nitrogen atmosphere, and the temperature was slowly increased to room temperature. After stirred at room temperature for 1 hour, the reaction solution was added to 500 mL of ice water to separate layers. The organic layer was separated therefrom, treated with anhydrous magnesium sulfate, and then concentrated. The concentrated residue was recrystallized with tetrahydrofuran and methanol to obtain 17.2 g of Intermediate B-1-1.

b) Synthesis of Compound B-1

17.2 g (56.9 mmol) of Intermediate B-1-1 was added to 200 mL of tetrahydrofuran and 100 mL of distilled water in a 500 mL round-bottomed flask, and 2 equivalents of dibenzofuran-3-boronic acid (cas: 395087-89-5), 0.03 equivalents of tetrakistriphenylphosphine palladium, and 2 equivalents of potassium carbonate were added thereto and then, heated and refluxed under a nitrogen atmosphere. After 18 hours, the reaction solution was cooled down, and solid extracted therein were filtered and washed with 500 mL of water. The solids were recrystallized with 500 mL of monochlorobenzene to obtain 12.87 g of Compound B-1.

LC/MS calculated for: $C_{39}H_{23}N_3O_2$ Exact Mass: 565.1790 found for: 566.18 [M+H]

Synthesis Example 9: Synthesis of Compound B-3

[Reaction Scheme 3]

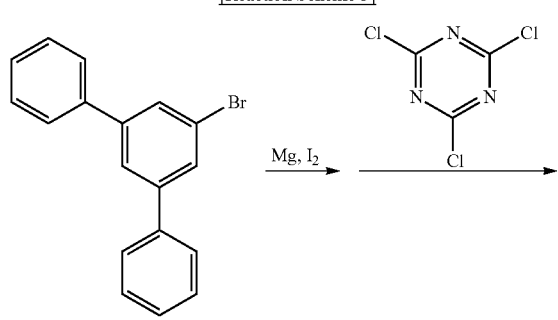

-continued

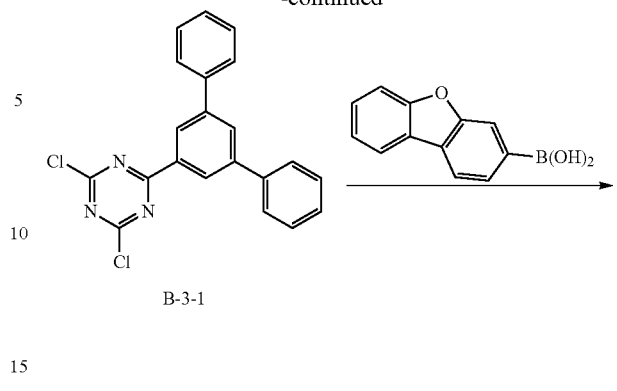

B-3-1

B-3 a) Synthesis of Intermediate B-3-1

Magnesium (7.86 g, 323 mmol) and iodine (1.64 g, 6.46 mmol) were added to 0.1 L of tetrahydrofuran (THF) under a nitrogen environment and then, stirred for 30 minutes, and 1-bromo-3,5-diphenylbenzene (100 g, 323 mmol) dissolved in 0.3 L of THE was slowly added thereto in a dropwise fashion at 0° C. for 30 minutes. This mixed solution was slowly added in a dropwise fashion to 64.5 g (350 mmol) of a cyanuric chloride solution dissolved in 0.5 L of THE at 0° C. for 30 minutes. When a reaction was complete, water was added to the reaction solution, dichloromethane (DCM) was used for an extraction, anhydrous $MgSO_4$ was used to remove moisture, and a product therefrom was filtered and concentrated under a reduced pressure. This obtained residue was separated and purified through flash column chromatography to obtain Intermediate B-3-1 (79.4 g, 65%).

b) Synthesis of Compound B-3

Intermediate B-3-1 was used according to the same method as the b) of Synthesis Example 7 to synthesize Compound B-3.

LC/MS calculated for: $C_{45}H_{27}N_3O_2$ Exact Mass: 641.2103 found for 642.21 [M+H]

Synthesis Example 10: Synthesis of Compound B-17

[Reaction Scheme 4]

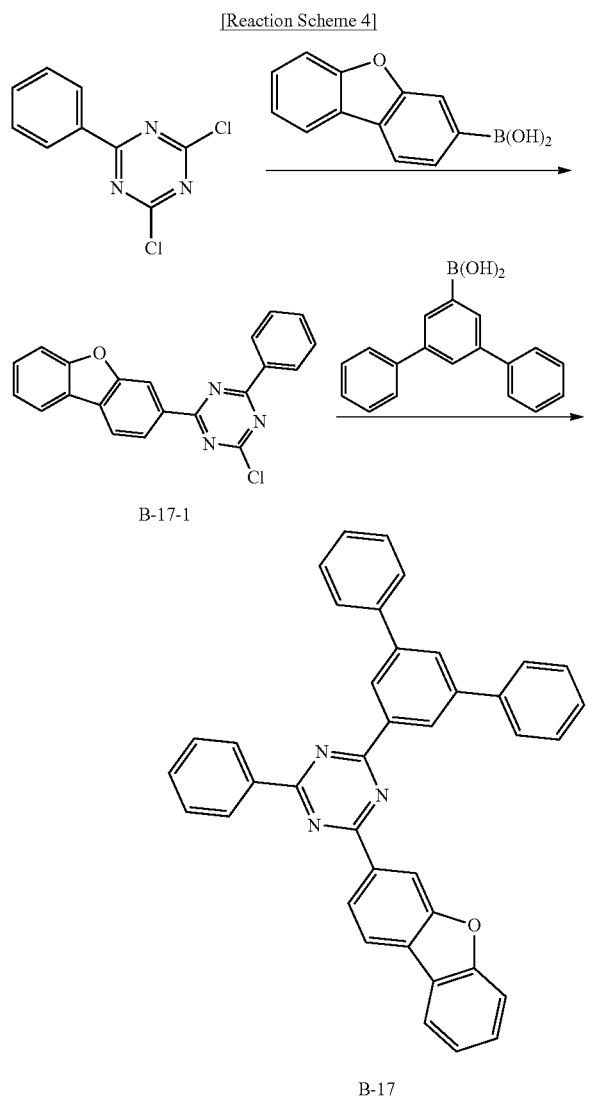

a) Synthesis of Intermediate B-17-1

22.6 g (100 mmol) of 2,4-dichloro-6-phenyltriazine was added to 100 mL of tetrahydrofuran, 100 mL of toluene, and 100 mL of distilled water in a 500 mL round-bottomed flask, and 0.9 equivalents of dibenzofuran-3-boronic acid (CAS No.: 395087-89-5), 0.03 equivalents of tetrakistriphenylphosphine palladium, and 2 equivalents of potassium carbonate were added thereto and then, heated and refluxed under a nitrogen atmosphere. After 6 hours, the reaction solution was cooled down, and after removing an aqueous layer, an organic layer was dried under a reduced pressure. The obtained solids were washed with water and hexane and recrystallized with 200 mL of toluene to obtain 21.4 g (a yield of 60%) of Intermediate B-17-1.

b) Synthesis of Compound B-17

Intermediate B-17-1 (56.9 mmol) was added to 200 mL of tetrahydrofuran and 100 mL of distilled water in a 500 mL round-bottomed flask, 1.1 equivalents of 3,5-diphenylbenzeneboronic acid (CAS No.: 128388-54-5), 0.03 equivalents of tetrakistriphenylphosphine palladium, and 2 equivalents of potassium carbonate were added thereto and then, heated and refluxed under a nitrogen atmosphere. After 18 hours, the reaction solution was cooled down, and solid extracted therein were filtered and washed with 500 mL of water. The solids were recrystallized with 500 mL of monochlorobenzene to obtain Compound B-17.

LC/MS calculated for: $C_{39}H_{25}N_3O$ Exact Mass: 555.1998 found for 556.21 [M+H]

Synthesis Example 11: Synthesis of Compound B-124

[Reaction Scheme 5]

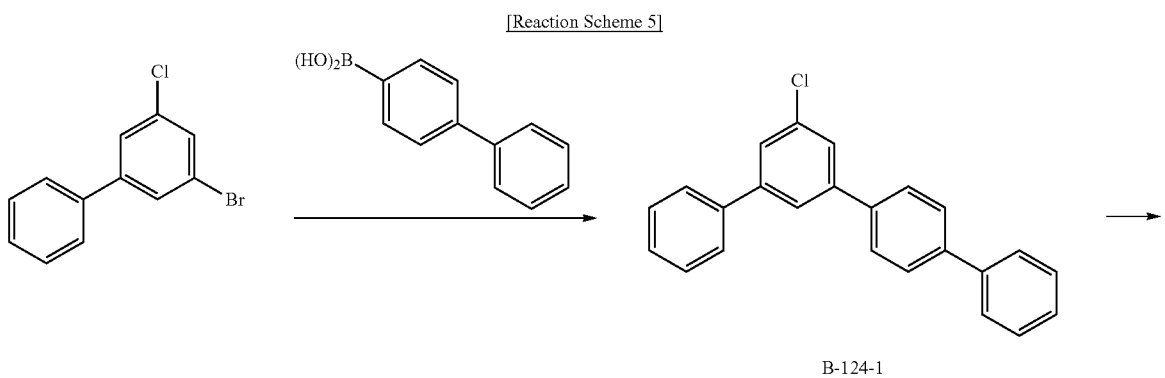

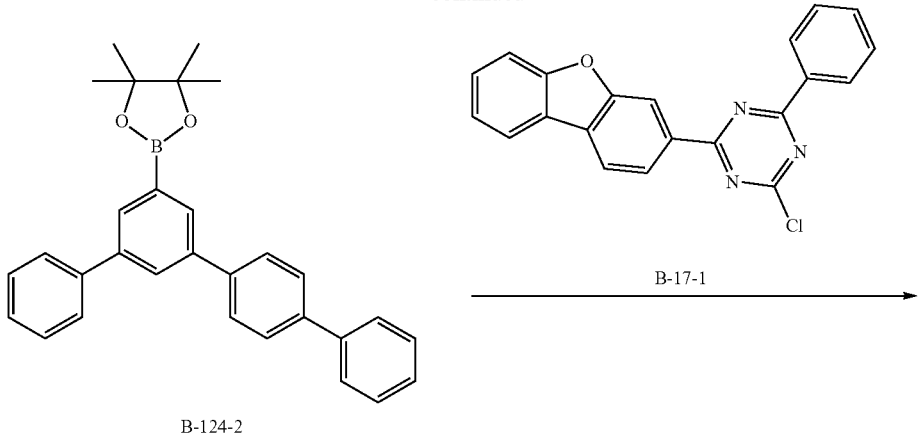

B-124-2

B-17-1

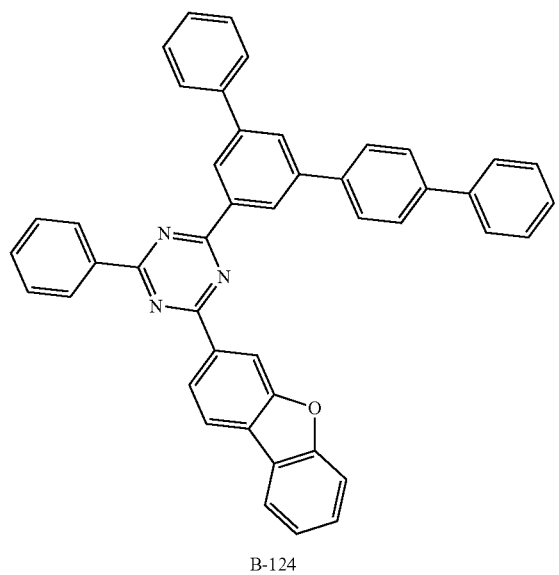

B-124 a) Synthesis of Intermediate B-124-1

Intermediate B-124-1 was synthesized according to the same method as the b) of Synthesis Example 7 by using 1-bromo-3-chloro-5-phenylbenzene and 1.1 equivalents of biphenyl-4-boronic acid. Herein, a product therefrom was purified through flash column instead of the recrystallization.

b) Synthesis of Intermediate B-124-2

30 g (88.02 mmol) of Intermediate B-124-1 was added to 250 mL of DMF in a 500 mL round-bottomed flask, and 0.05 equivalents of dichlorodiphenylphosphinoferrocene palladium, 1.2 equivalents of bispinacolado diboron, and 2 equivalents of potassium acetate were added thereto and then, heated and refluxed under a nitrogen atmosphere for 18 hours. The reaction solution was cooled down and then, added in a dropwise fashion to 1 L of water to obtain solids. The solids were dissolved in boiling toluene, treated with activated carbon, and filtered with silica gel, and the filtered solution was concentrated. The concentrated solids were stirred with a small amount of hexane and filtered to obtain 28.5 g (a yield=70%) of Intermediate B-124-2.

c) Synthesis of Compound B-124

Compound B-124 was synthesized according to the same method as the b) of Synthesis Example 10 by using Intermediate B-124-2 and Intermediate B-17-1 respectively by 1.0 equivalent.

LC/MS calculated for: $C_{45}H_{29}N_3O$ Exact Mass: 627.2311 found for 628.22 [M+H]

Synthesis Example 12: Synthesis of Compound B-23
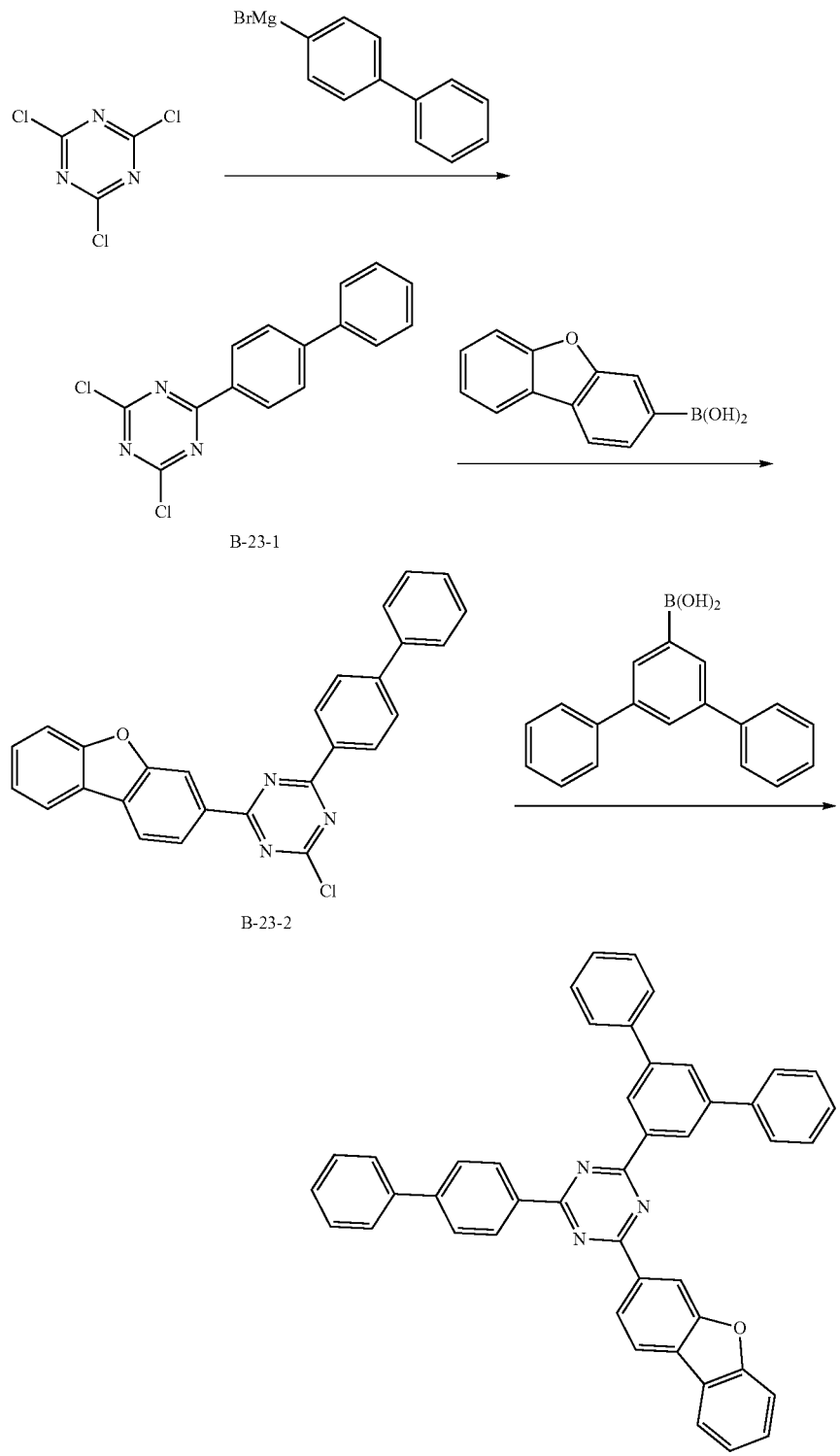

a) Synthesis of Intermediate B-23-1

15 g (81.34 mmol) of cyanuric chloride was dissolved in 200 mL of anhydrous tetrahydrofuran in a 500 mL round-bottomed flask, 1 equivalent of a 4-biphenyl magnesium bromide solution (0.5 M tetrahydrofuran) was added thereto in a dropwise fashion under a nitrogen atmosphere at 0° C., and the temperature was slowly increased up to room temperature. The reaction solution was stirred at room temperature for 1 hour, and 500 mL of ice water was added thereto to separate layers. The organic layer was separated therefrom, treated with anhydrous magnesium sulfate, and then concentrated. The concentrated residue was recrystallized with tetrahydrofuran and methanol to obtain 17.2 g of Intermediate B-23-1.

b) Synthesis of Intermediate B-23-2

Intermediate B-23-1 was used according to the same method as the a) of Synthesis Example 10 to synthesize Intermediate B-23-2.

c) Synthesis of Compound B-23

Compound B-23 was synthesized according to the same method as the b) of Synthesis Example 10 by using Intermediate B-23-2 and 1.1 equivalents of 3,5-diphenylbenzeneboronic acid.

LC/MS calculated for: $C45H_{29}N_3O$ Exact Mass: 627.2311 found for 628.24 [M+H]

Synthesis Example 13: Synthesis of Compound B-24

[Reaction Scheme 7]

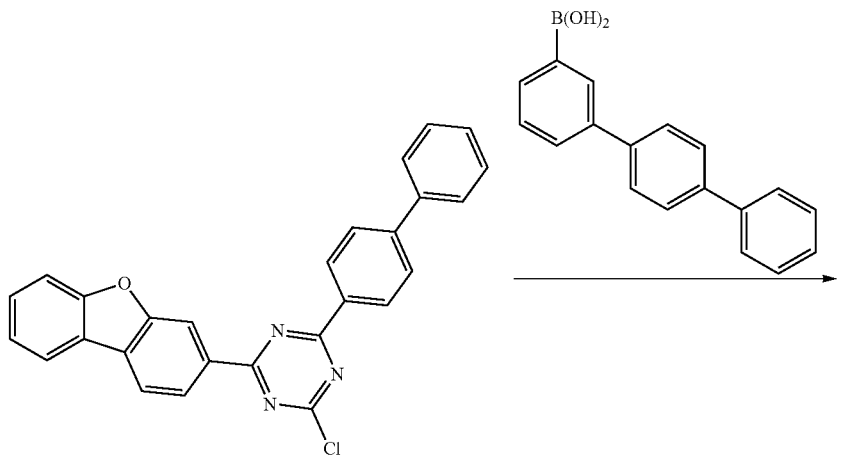

B-23-2

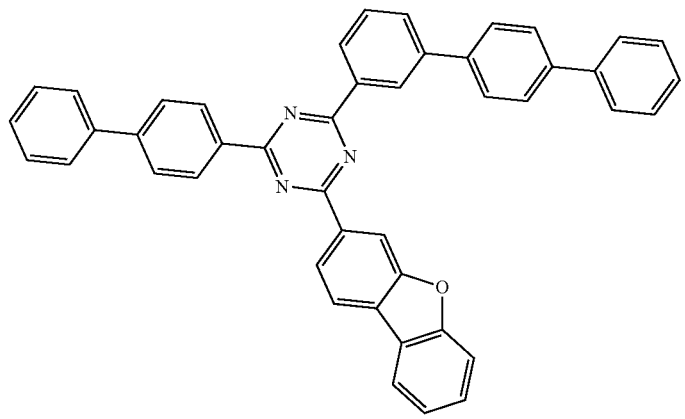

B-24

Intermediate B-23-2 and 1.1 equivalents of B-[1,1':4',1"-terphenyl]-3-yl boronic acid were used according to the same method as the b) of Synthesis Example C to synthesize Compound B-24.

LC/MS calculated for: $C_{45}H_{29}N_3O$ Exact Mass: 627.2311 found for 628.24 [M+H]

Synthesis Example 14: Synthesis of Compound B-20

[Reaction Scheme 8]

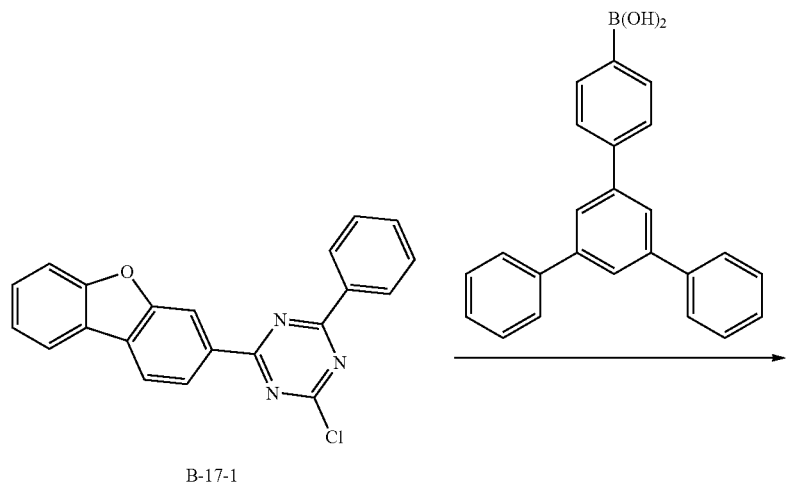

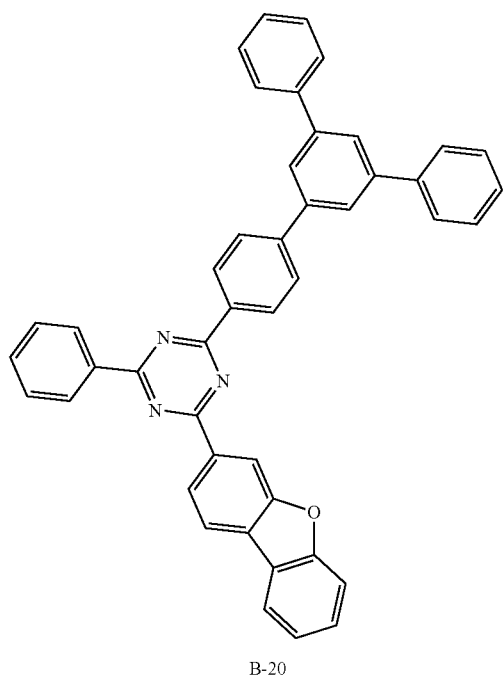

Intermediate B-17-1 and 1.1 equivalents of (5'-phenyl[1,1':3',1"-terphenyl]-4-yl)-boronic acid (CAS No.: 491612-72-7) were used according to the same method as the b) of Synthesis Example C to synthesize Compound B-20.

LC/MS calculated for: $C45H_{29}N_3O$ Exact Mass: 627.2311 found for 628.24 [M+H]

Synthesis Example 15: Synthesis of Compound B-71

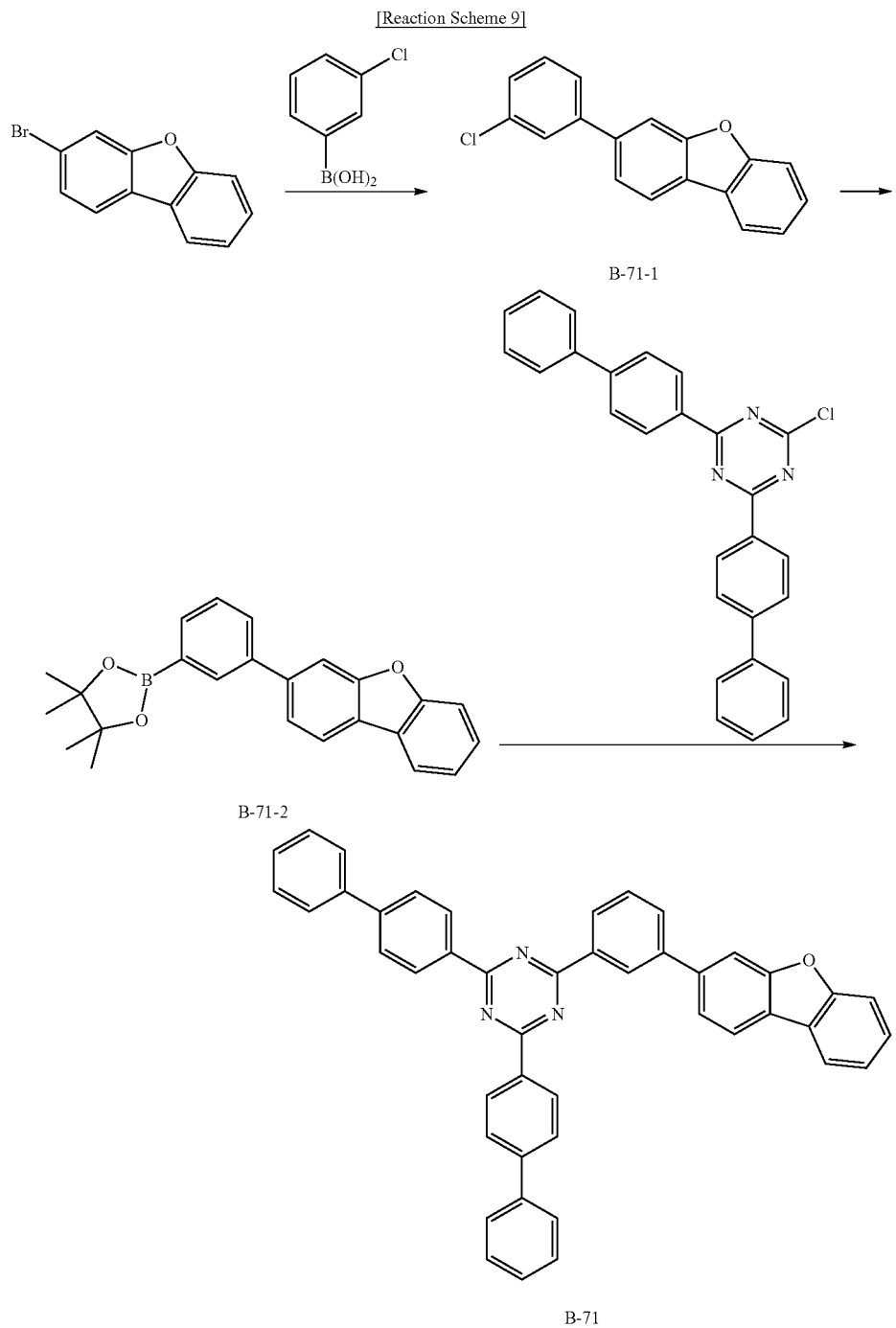

a) Synthesis of Intermediate B-71-1

14.06 g (56.90 mmol) of 3-bromo-dibenzofuran, 200 mL of tetrahydrofuran, and 100 mL of distilled water were put in a 500 mL round-bottomed flask, and 1 equivalent of 3'-chloro-phenylboronic acid, 0.03 equivalents of tetrakis-triphenylphosphine palladium, and 2 equivalents of potassium carbonate were added thereto and then, heated and refluxed under a nitrogen atmosphere. After 18 hours, the reaction solution was cooled down, and solid extracted therein were filtered and washed with 500 mL of water. The solids were recrystallized with 500 mL of monochlorobenzene to obtain 12.05 g of Intermediate B-71-1. (A yield of 76%)

b) Synthesis of Intermediate B-71-2

24.53 g (88.02 mmol) of Intermediate B-71-1 was added to 250 mL of DMF in a 500 mL round-bottomed flask, and 0.05 equivalents of dichlorodiphenyl phosphinoferrocene palladium, 1.2 equivalents of bispinacolato diboron, and 2 equivalents of potassium acetate were added thereto and then, heated and refluxed under a nitrogen atmosphere for 18 hours. The reaction solution was cooled down and then, added in a dropwise fashion to 1 L of water to obtain solids. The obtained solids were dissolved in boiling toluene, treated with activated carbon, and filtered with silica gel, and the filtered solution was concentrated. The concentrated solids were stirred with a small amount of hexane and filtered to obtain agitate 22.81 g of Intermediate B-71-2. (A yield=70%)

c) Synthesis of Compound B-71

Compound B-71 was synthesized according to the same method as Synthesis Example a) by using Intermediate B-71-2 and 2,4-bis ([1,1'-biphenyl]-4-yl)-6-chloro-1,3,5-triazine in each amount of 1.0 equivalent.

LC/MS calculated for: $C45H_{29}N_3O$ Exact Mass: 627.2311 found for 628.25 [M+H]

Manufacture of Organic Light Emitting Diode

Example 1

A glass substrate coated with ITO (indium tin oxide) to have a thin-film thickness of 1500 Å was washed with distilled water ultrasonic waves. After washing with the distilled water, the glass substrate was ultrasonic wave-washed with a solvent such as isopropyl alcohol, acetone, methanol, and the like and dried and then, moved to a plasma cleaner, cleaned by using oxygen plasma for 10 minutes, and moved to a vacuum depositor. This obtained ITO transparent electrode was used as an anode, Compound A was vacuum-deposited on the ITO substrate to form a 700 Å-thick hole injection layer, Compound B was deposited to be 50 Å thick on the injection layer, and Compound C was deposited to be 1020 Å thick to form a hole transport layer. Compound B-23 and Compound A-70 were simultaneously used as a host on the hole transport layer and doped with 7 wt % of $Ir(ppy)_3$ to form a 400 Å-thick light emitting layer by vacuum deposition. Herein Compound B-23 and Compound A-74 were used in a weight ratio of 5:5, and each ratio is described separately for the following examples. Subsequently, a vacuum deposition of Compound D and Liq at a ratio of 1:1 at the same time was performed on the light emitting layer to form a 300 Å-thick electron transport layer and Liq 15 Å and Al 1200 Å were sequentially vacuum-deposited on the electron transport layer to form a cathode, manufacturing an organic light emitting diode.

The organic light emitting diode has a structure having five organic thin film layers, specifically as follows.

A structure of ITO/Compound A (700 Å)/Compound B (50 Å)/Compound C (1020 Å)/EML [Compound B-23: Compound A-70:$Ir(ppy)_3$ (7 wt %)] (400 Å)/Compound D:Liq (300 Å)/Liq (15 Å)/Al (1200 Å).

Compound A: N4,N4'-diphenyl-N4,N4'-bis (9-phenyl-9H-carbazol-3-yl)biphenyl-4,4'-diamine Compound B: 1,4,5,8,9,11-hexaazatriphenylene-hexacarbonitrile (HAT-CN), Compound C: N-(biphenyl-4-yl)-9,9-dimethyl-N-(4-(9-phenyl-9H-carbazol-3-yl)phenyl)-9H-fluoren-2-amine Compound D: 8-(4-(4,6-di(naphthalen-2-yl)-1,3,5-triazin-2-yl)phenyl)quinolone Examples 2 to 6 and Comparative Examples 1 to 6

Organic light emitting diodes of Examples 2 to 6 and Comparative Examples 1 to 6 were manufactured according to the same method as Example 1 using the first host and the second host as shown in Table 1.

Evaluation

Effects of the organic light emitting diodes according to Examples 1 to 6 and Comparative Examples 1 to 6 were evaluated as follows. The specific measuring method is as follows.

(1) Measurement of Driving Voltage

A driving voltage of each diode was measured using a current-voltage meter (Keithley 2400) at 15 $mA/cm^2$ to obtain the results.

(2) Measurement of Current Density Change Depending on Voltage Change

The obtained organic light emitting diodes were measured regarding a current value flowing in the unit diode, while increasing the voltage from 0 V to 10 V using a current-voltage meter (Keithley 2400), and the measured current value was divided by area to provide the results.

(3) Measurement of Luminance Change Depending on Voltage Change

Luminance was measured by using a luminance meter (Minolta Cs-1000A), while the voltage of the organic light emitting diodes was increased from 0 V to 10 V.

(4) Measurement of Life-Span

T90 life-spans of the organic light emitting diodes were measured as a time when their luminance decreased to 90% relative to the initial luminance ($cd/m^2$) after emitting light with 24000 $cd/m^2$ as the initial luminance ($cd/m^2$) and measuring their luminance decrease depending on a time with a Polanonix life-span measurement system. (in the case of using the same ET host, relative percentages are described based on 100% of the life-span when using Compound c)

TABLE 1

| | Second host | First host | First host: Second host (weight ratio) | Driving voltage (V) | Life-span (T90) |
|---|---|---|---|---|---|
| Example 1 | B-23 | A-70 | 5:5 | 3.74 | 142% |
| Example 2 | B-23 | A-95 | 5:5 | 3.49 | 183% |
| Comparative Example 1 | B-23 | Compound a | 5:5 | 4.16 | 52% |
| Comparative Example 2 | B-23 | Compound c | 5:5 | 4.25 | 100% |
| Example 3 | B-20 | A-70 | 5:5 | 3.88 | 131% |
| Example 4 | B-20 | A-95 | 5:5 | 3.54 | 172% |
| Comparative Example 3 | B-20 | Compound a | 5:5 | 4.10 | 73% |
| Comparative Example 4 | B-20 | Compound c | 5:5 | 4.29 | 100% |
| Example 5 | B-124 | A-70 | 5:5 | 3.79 | 150% |
| Example 6 | B-124 | A-95 | 5:5 | 3.54 | 190% |
| Comparative Example 5 | B-124 | Compound a | 5:5 | 4.21 | 61% |
| Comparative Example 6 | B-124 | Compound c | 5:5 | 4.30 | 100% |

Referring to Table 1, when the first host was combined with the second host, the compounds having a phenyl substituent at the side were not crystallized due to asymmetry and dipole moment increases, compared with symmetric Compound a, but formed a more uniform film and thus had a positive influence on a life-span, but when the side substituent was phenyl, a HOMO electron cloud was not distributed and did not play a role of transporting holes. However, when this substituent became too bulky, the substituent increased an inter-molecular hole-hopping distance during the hole movement and thus hinder the hole movement, and accordingly, a driving might be delayed.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

DESCRIPTION OF SYMBOLS 100, 200: organic light emitting diode
105: organic layer
110: cathode
120: anode
130: light emitting layer
140: hole auxiliary layer

The invention claimed is:
1. A composition for an organic optoelectronic element, the composition comprising:
a first compound represented by a combination of Chemical Formula 1 and Chemical Formula 2; and
a second compound represented by Chemical Formula 3:

[Chemical Formula 1]

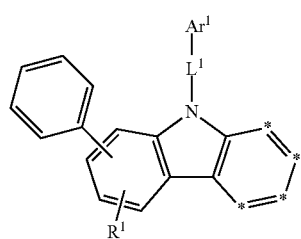

[Chemical Formula 2]

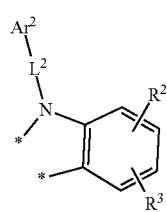

[Chemical Formula 3]

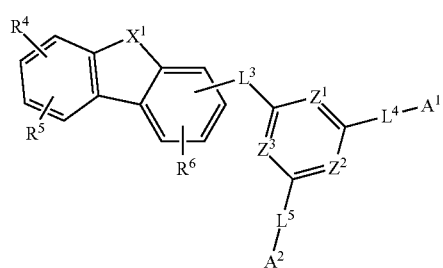

wherein, in Chemical Formula 1 to Chemical Formula 3,
Ar$^1$ and Ar$^2$ are independently a substituted or unsubstituted C6 to C30 aryl group,
R$^1$ to R$^3$ are independently hydrogen, deuterium, or a cyano group,
adjacent two *'s of Chemical Formula 1 are linked with *'s of Chemical Formula 2,
*'s in Chemical Formula 1 which are not linked with *'s of Chemical Formula 2 are independently CR$^a$,
Z$^1$ to Z$^3$ are independently N or CR$^b$,
at least two of Z$^1$ to Z$^3$ are N,
R$^a$, R$^b$, and R$^4$ to R$^6$ are independently hydrogen, deuterium, a cyano group, a substituted or unsubstituted C1 to C10 alkyl group, a substituted or unsubstituted C6 to C20 aryl group, or a substituted or unsubstituted C2 to C30 heterocyclic group,
L$^1$ to L$^5$ are independently a single bond or a substituted or unsubstituted C6 to C30 arylene group,
X$^1$ is O or S, and
A$^1$ and A$^2$ are independently a substituted or unsubstituted C6 to C20 aryl group, or a substituted or unsubstituted C2 to C30 heterocyclic group.

2. The composition of claim 1, wherein the first compound is represented by Chemical Formula 1C:

[Chemical Formula 1C]

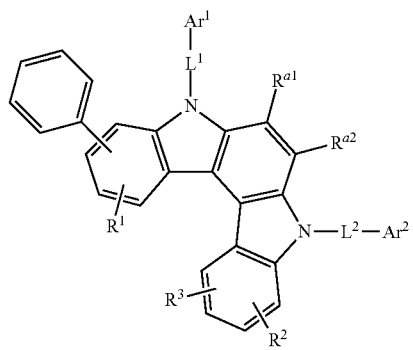

wherein, in Chemical Formula 1C,
Ar$^1$ and Ar$^2$ are independently a substituted or unsubstituted C6 to C30 aryl group,
R$^1$ to R$^3$ are independently hydrogen, deuterium, or a cyano group,
R$^{a1}$ and R$^{a2}$ are independently hydrogen, deuterium, a cyano group, a substituted or unsubstituted C1 to C10 alkyl group, a substituted or unsubstituted C6 to C20 aryl group, or a substituted or unsubstituted C2 to C30 heterocyclic group, and
L$^1$ and L$^2$ are independently a single bond or a substituted or unsubstituted C6 to C30 arylene group.

3. The composition of claim 2, wherein Chemical Formula 1C is represented by Chemical Formula 1C-2 or Chemical Formula 1C-3:

[Chemical Formula 1C-2]

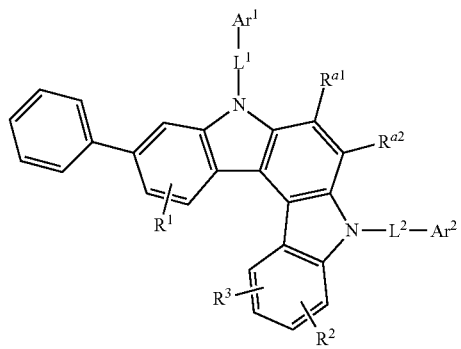

-continued

[Chemical Formula 1C-3]

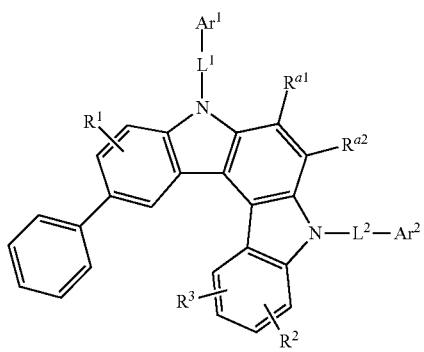

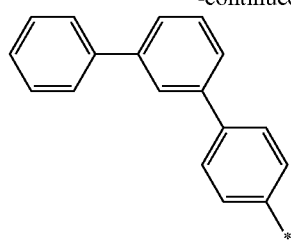

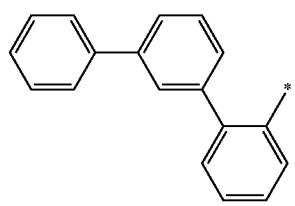

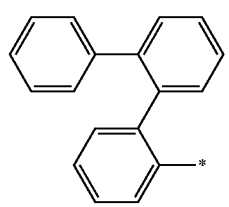 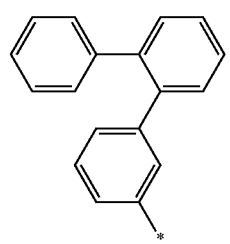

wherein, in Chemical Formula 1C-2 and Chemical Formula 1C-3, $Ar^1$ and $Ar^2$ are independently a substituted or unsubstituted C6 to C30 aryl group, $R^1$ to $R^3$ are independently hydrogen, deuterium, or a cyano group, $R^{a1}$ and $R^{a2}$ are independently hydrogen, deuterium, a cyano group, a substituted or unsubstituted C1 to C10 alkyl group, a substituted or unsubstituted C6 to C20 aryl group, or a substituted or unsubstituted C2 to C30 heterocyclic group, and $L^1$ and $L^2$ are independently a single bond or a substituted or unsubstituted C6 to C30 arylene group.

4. The composition of claim 1, wherein $Ar^1$ and $Ar^2$ are independently a substituted or unsubstituted phenyl group, a substituted or unsubstituted biphenyl group, a substituted or unsubstituted terphenyl group, or a substituted or unsubstituted naphthyl group.

5. The composition of claim 4, wherein $Ar^1$ and $Ar^2$ are independently, selected from substituents of Group I:

[Group I]

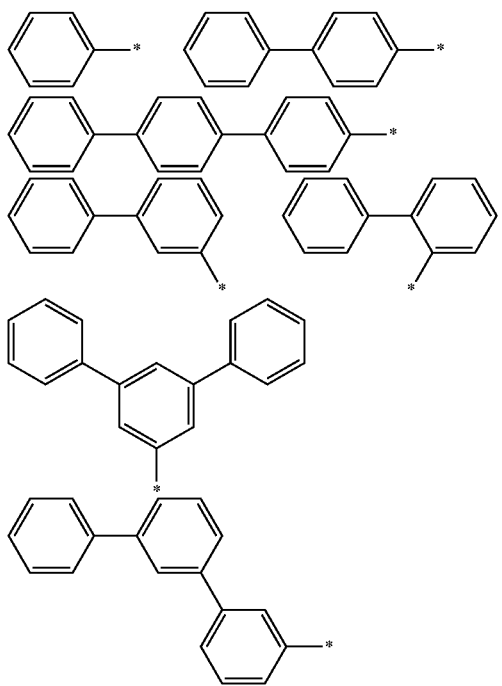

wherein, in Group I, * is linking points with $L^1$ and $L^2$, respectively.

6. The composition of claim 1, wherein the second compound is represented by one of Chemical Formula 3-a to Chemical Formula 3-d:

[Chemical Formula 3-a]

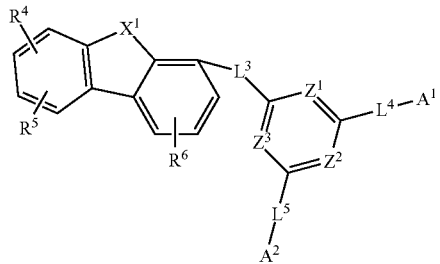

-continued

[Chemical Formula 3-b]

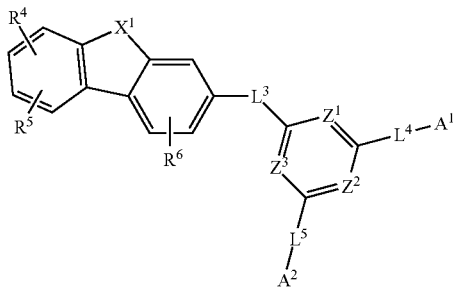

[Chemical Formula 3-c]

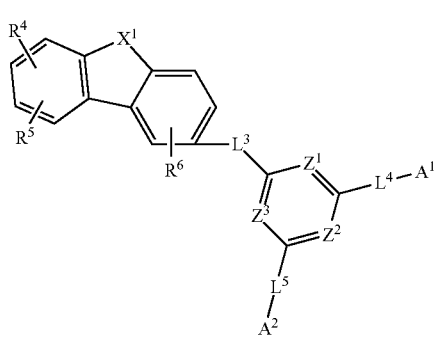

[Chemical Formula 3-d]

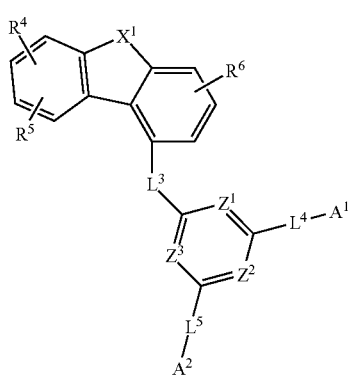

wherein, in Chemical Formula 3-a to Chemical Formula 3-d, $Z^1$ to $Z^3$ are independently N or $CR^b$, at least two of $Z^1$ to $Z^3$ are N, $R^b$ and $R^4$ to $R^6$ are independently hydrogen, deuterium, a cyano group, a substituted or unsubstituted C1 to C10 alkyl group, a substituted or unsubstituted C6 to C20 aryl group, or a substituted or unsubstituted C2 to C30 heterocyclic group, $L^3$ to $L^5$ are independently a single bond or a substituted or unsubstituted C6 to C30 arylene group, $X^1$ is O or S, and $A^1$ and $A^2$ are independently a substituted or unsubstituted C6 to C20 aryl group, or a substituted or unsubstituted C2 to C30 heterocyclic group.

7. The composition of claim 1, wherein the second compound is represented by Chemical Formula 3-I:

[Chemical Formula 3-I]

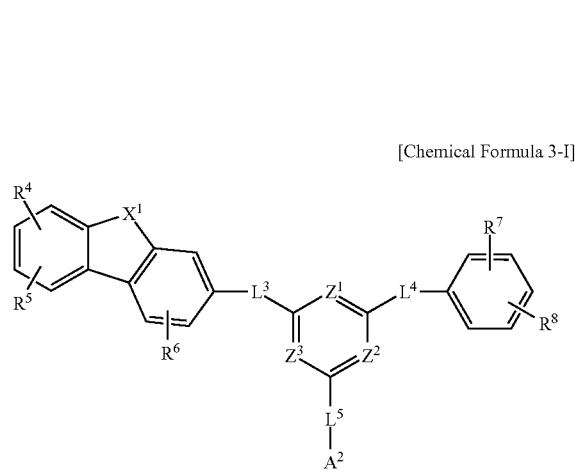

wherein, in Chemical Formula 3-I, $Z^1$ to $Z^3$ are independently N or $CR^b$, at least two of $Z^1$ to $Z^3$ are N, $R^b$ and $R^4$ to $R^8$ are independently hydrogen, deuterium, a cyano group, a substituted or unsubstituted C1 to C10 alkyl group, a substituted or unsubstituted C6 to C20 aryl group, or a substituted or unsubstituted C2 to C30 heterocyclic group, $L^3$ to $L^5$ are independently a single bond or a substituted or unsubstituted C6 to C30 arylene group, $X^1$ is O or S, and $A^2$ is a substituted or unsubstituted C6 to C20 aryl group, or a substituted or unsubstituted C2 to C30 heterocyclic group.

8. The composition of claim 7, wherein Chemical Formula 3-I is represented by one of Chemical Formula 3-I-1 to Chemical Formula 3-I-3:

[Chemical Formula 3-I-1]

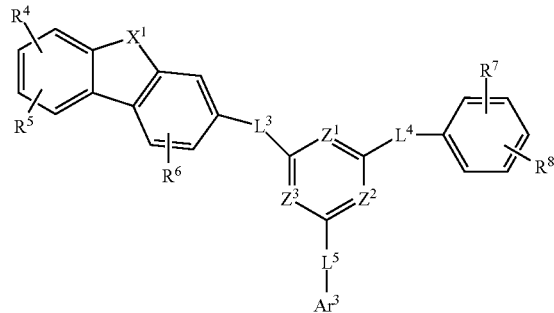

[Chemical Formula 3-I-2]

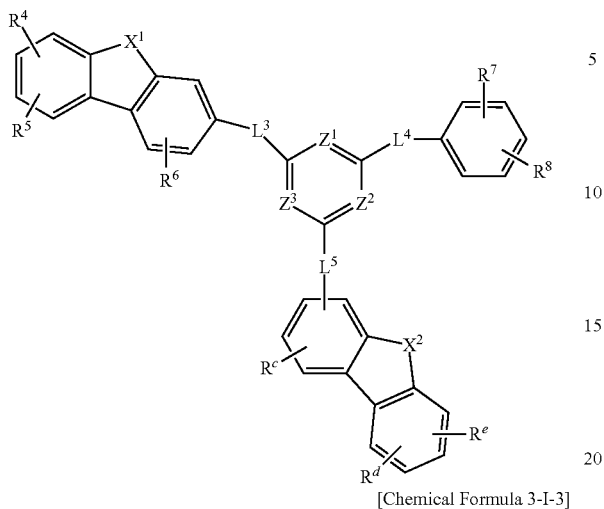

[Chemical Formula 3-I-3]

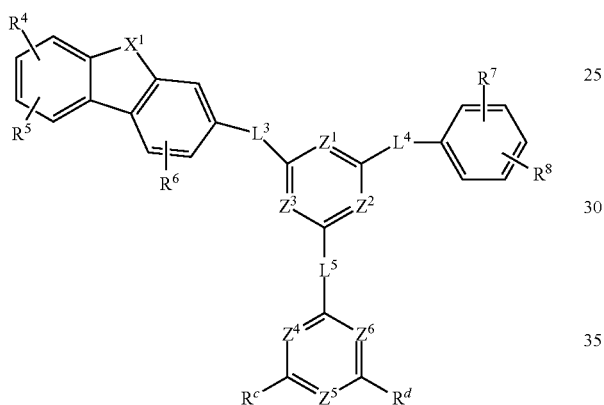

wherein, in Chemical Formula 3-I-1 to Chemical Formula 3-I-3, $Ar^3$ is a substituted or unsubstituted C6 to C20 aryl group, $Z^1$ to $Z^6$ are independently N or $CR^b$, at least two of $Z^1$ to $Z^3$ are N, at least two of $Z^4$ to $Z^6$ are N, $R^b$ $R^c$, $R^d$, $R^e$, and $R^4$ to $R^8$ are independently hydrogen, deuterium, a cyano group, a substituted or unsubstituted C to C10 alkyl group, a substituted or unsubstituted C6 to C20 aryl group, or a substituted or unsubstituted C2 to C30 heterocyclic group, $L^3$ to $L^5$ are independently a single bond or a substituted or unsubstituted C6 to C30 arylene group, and $X^1$ and $X^2$ are independently O or S.

9. The composition of claim 1, wherein $A^1$ of Chemical Formula 3 is a substituted or unsubstituted C6 to C20 aryl group, and $A^2$ of Chemical Formula 3 is a substituted or unsubstituted phenyl group, a substituted or unsubstituted biphenyl group, a substituted or unsubstituted naphthyl group, a substituted or unsubstituted terphenyl group, a substituted or unsubstituted quaterphenyl group, a substituted or unsubstituted dibenzofuranyl group, a substituted or unsubstituted dibenzothiophenyl group, a substituted or unsubstituted pyrimidinyl group, or a substituted or unsubstituted triazinyl group.

10. The composition of claim 9, wherein $A^1$ of Chemical Formula 3 is selected from substituents of Group II, and $A^2$ of Chemical Formula 3 is selected from substituents of Group III:

[Group II]

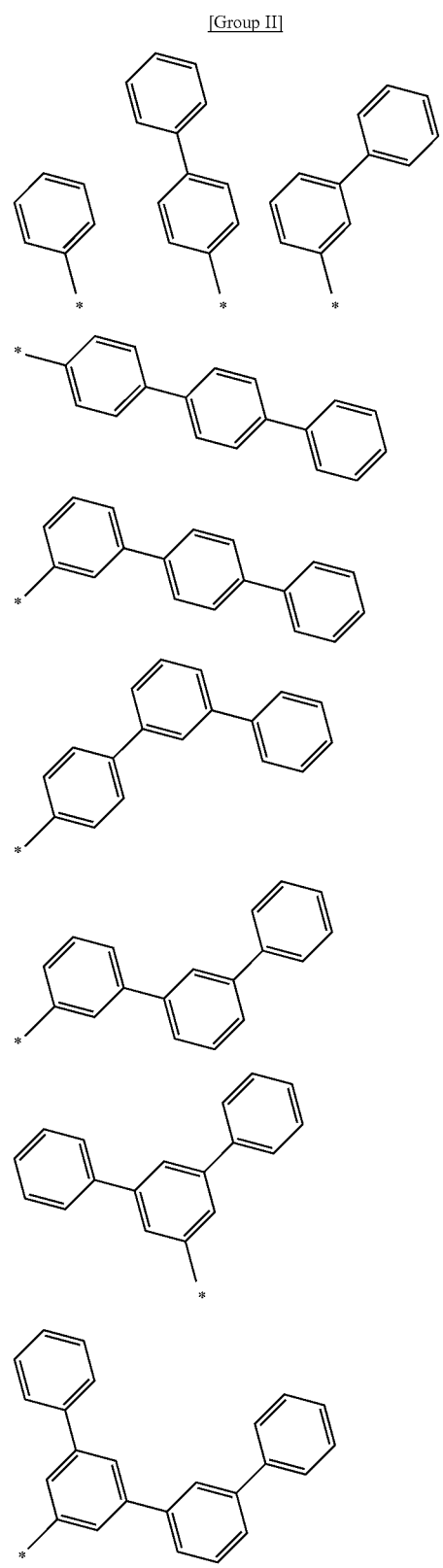

205
-continued
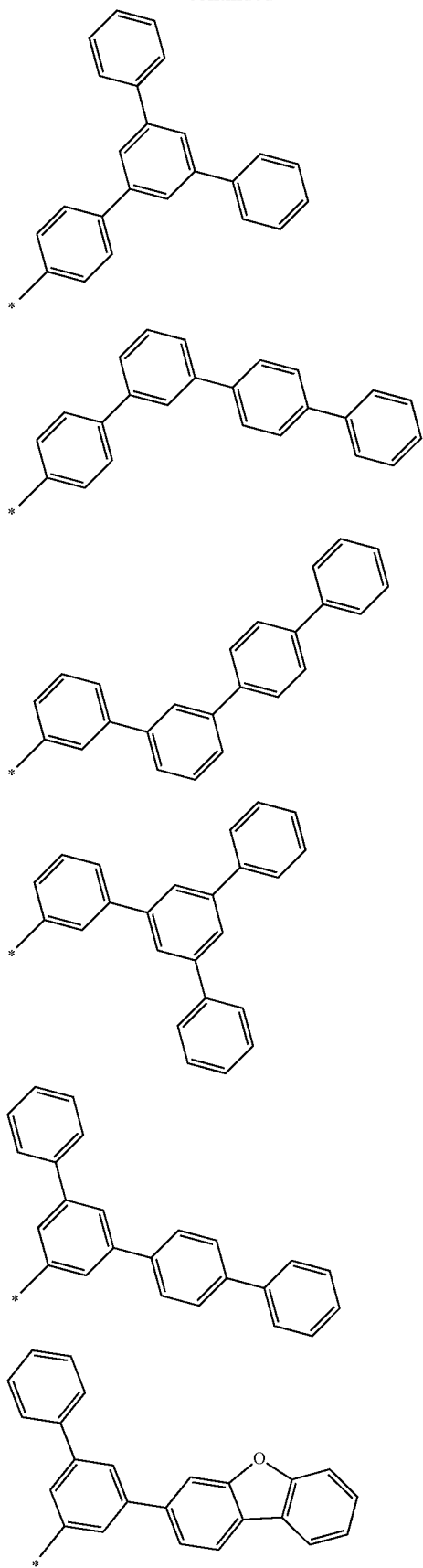
206
-continued
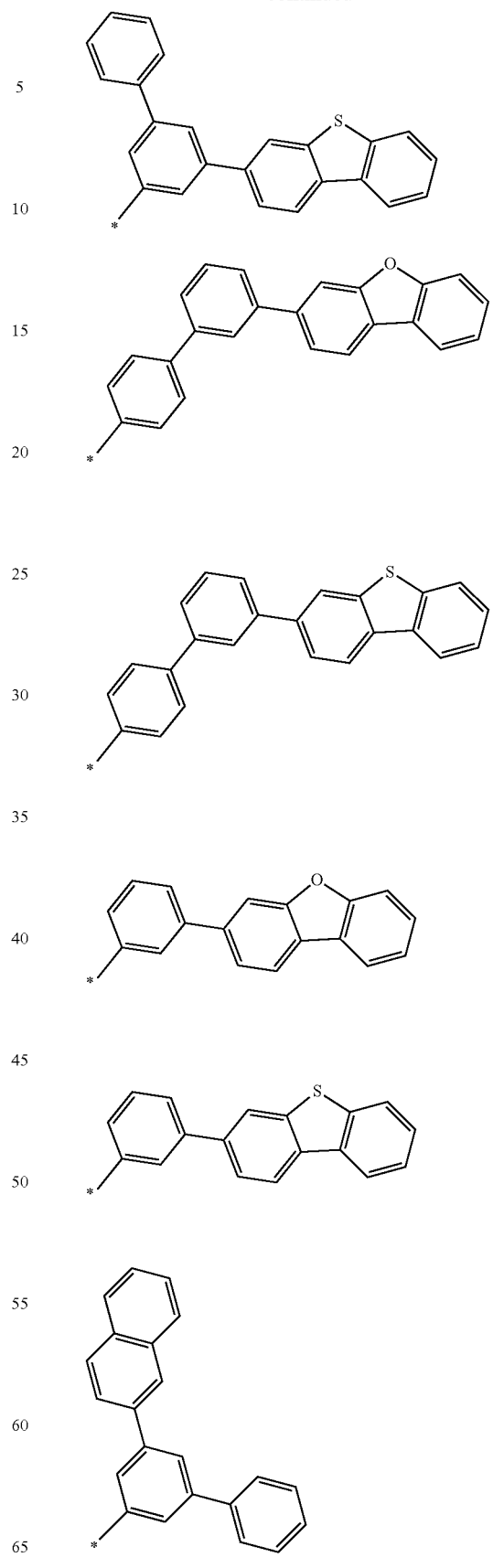

207
-continued
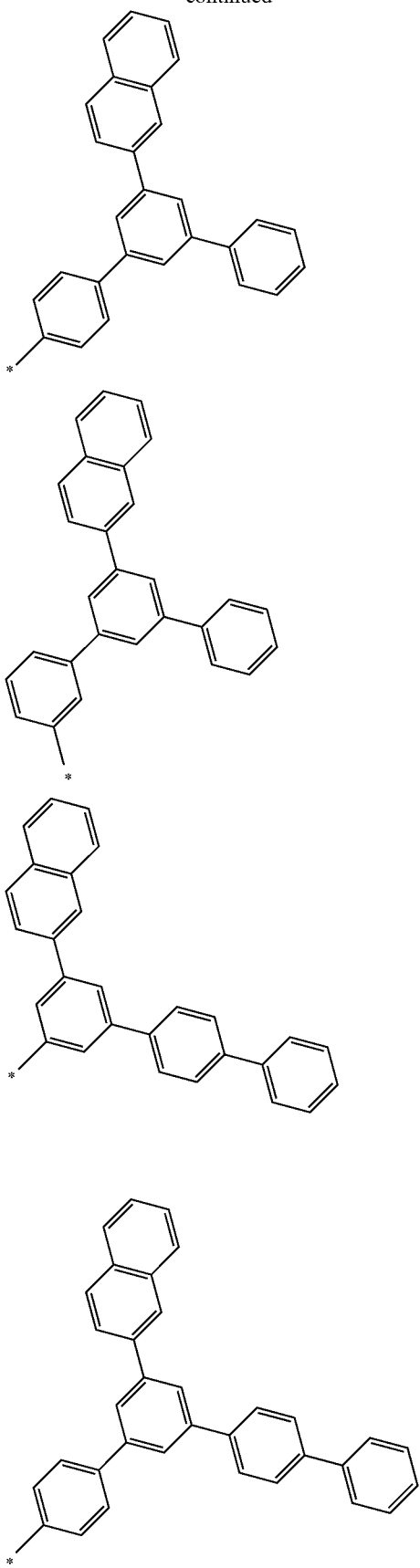
208
-continued
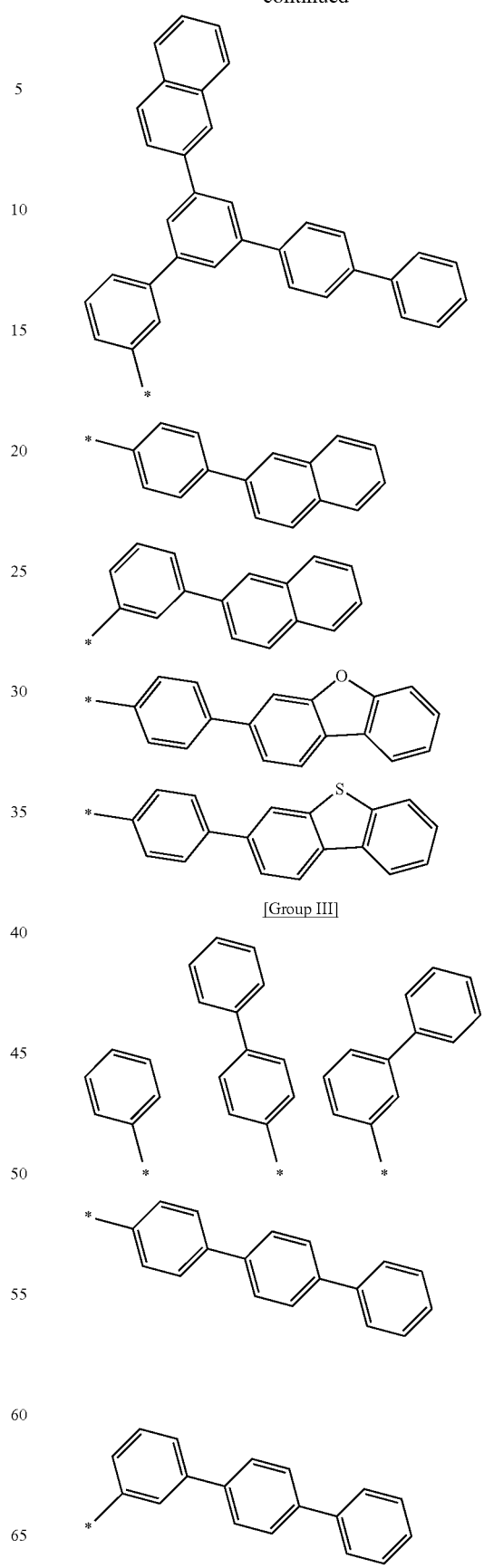
[Group III]

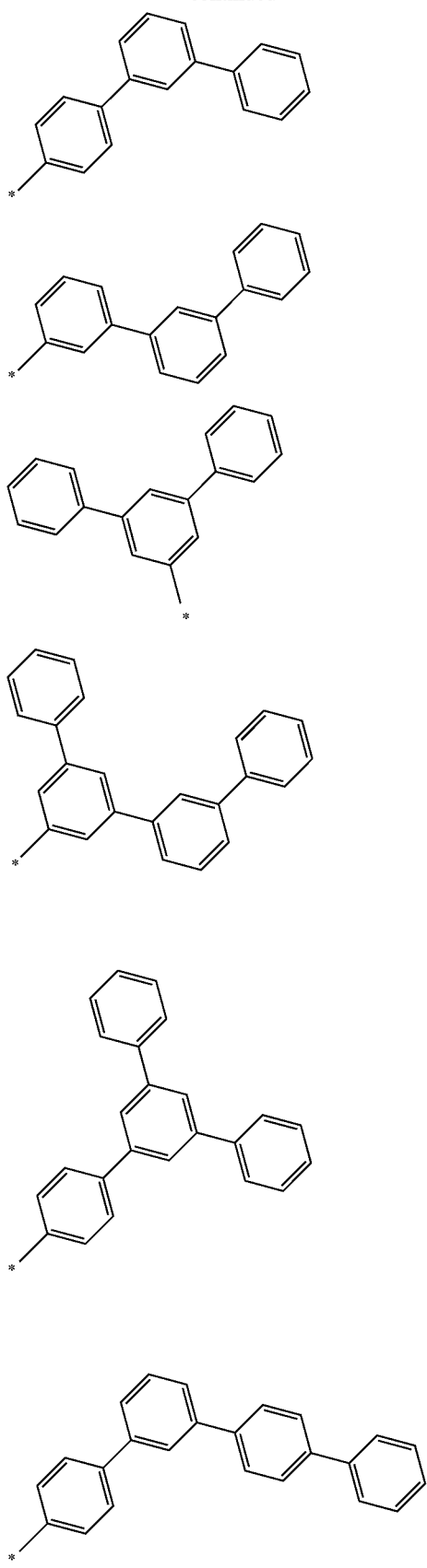
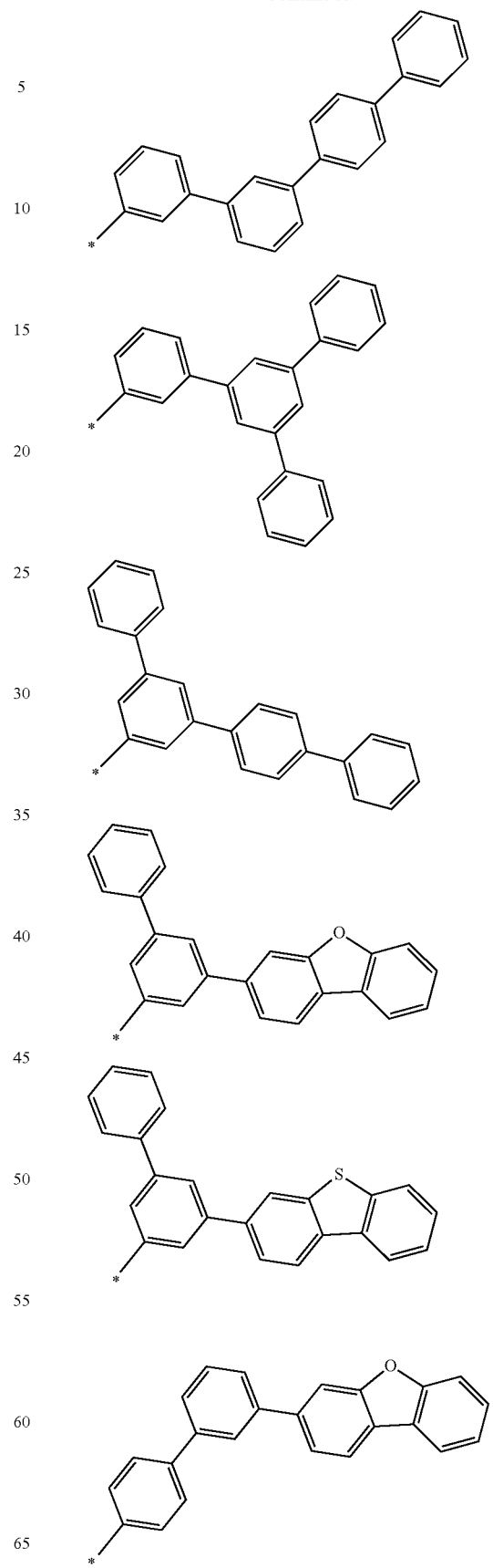

211
-continued
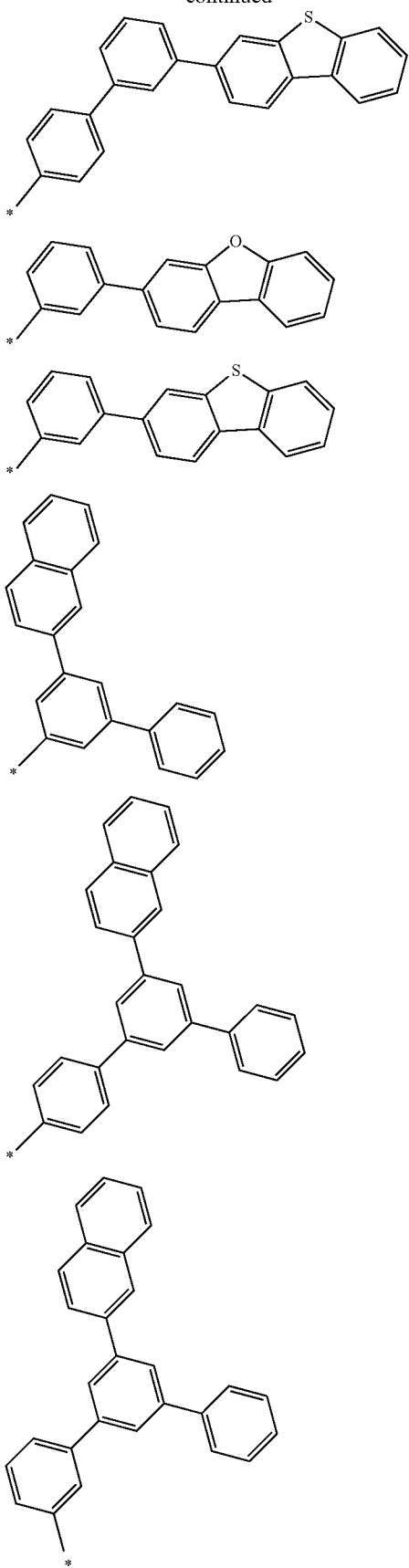
212
-continued
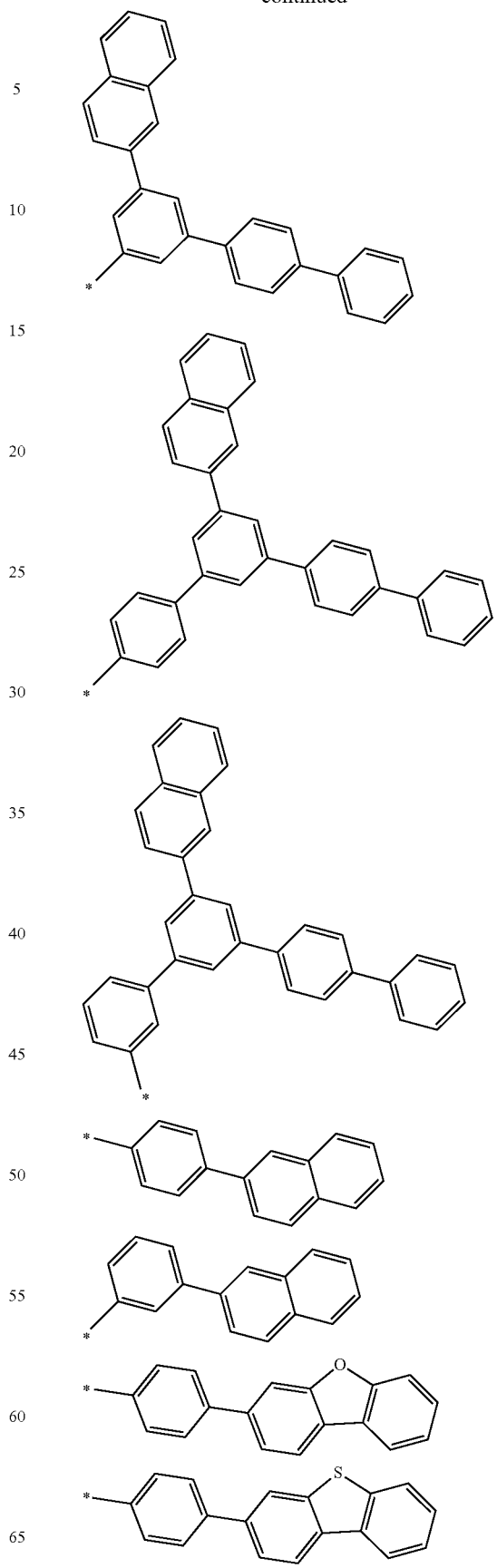

213
-continued
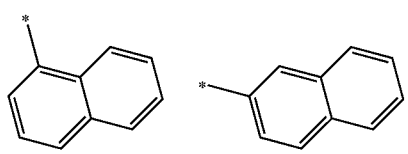
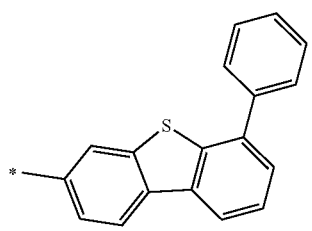
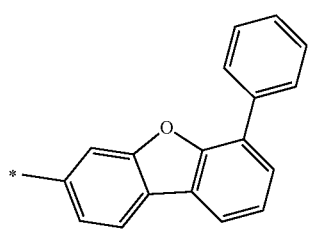
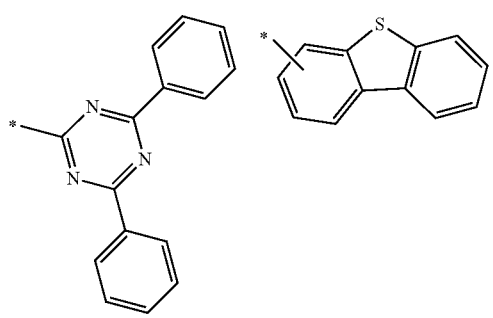
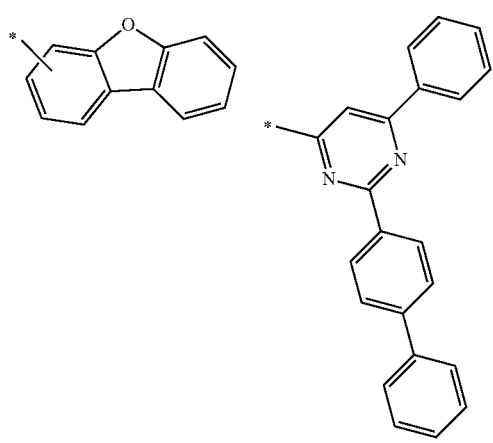
214
-continued
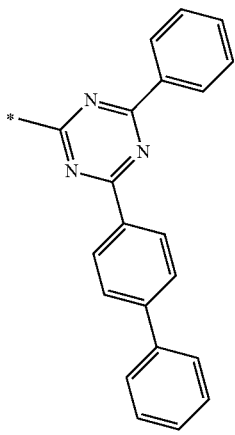
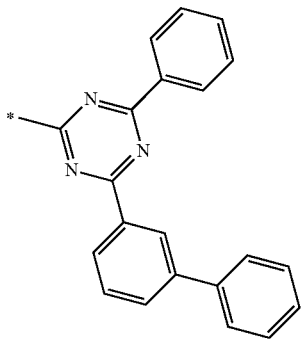
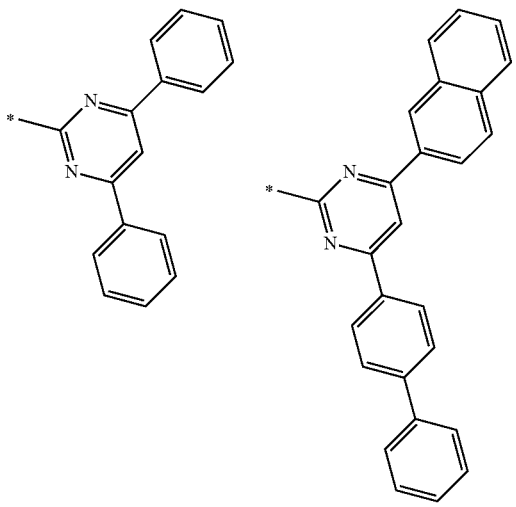
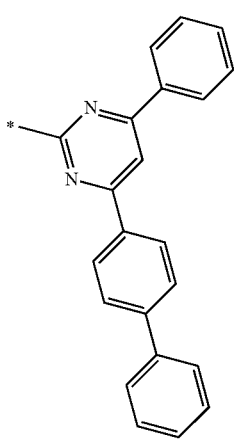

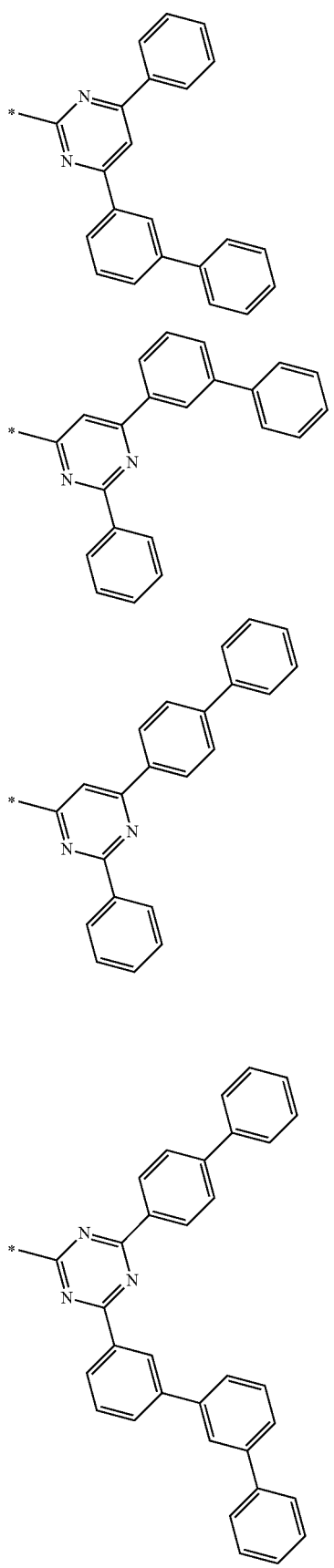
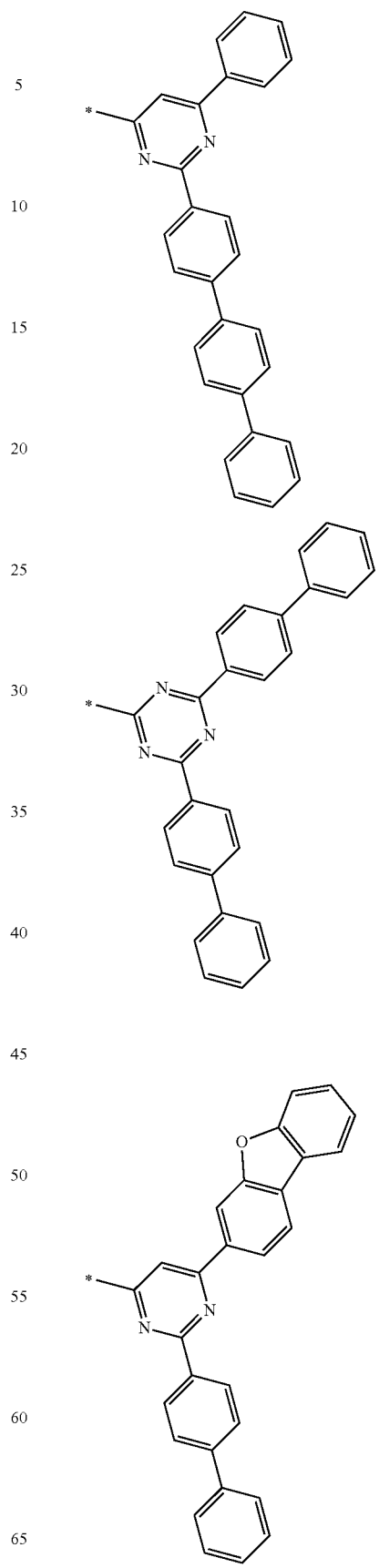

217
-continued
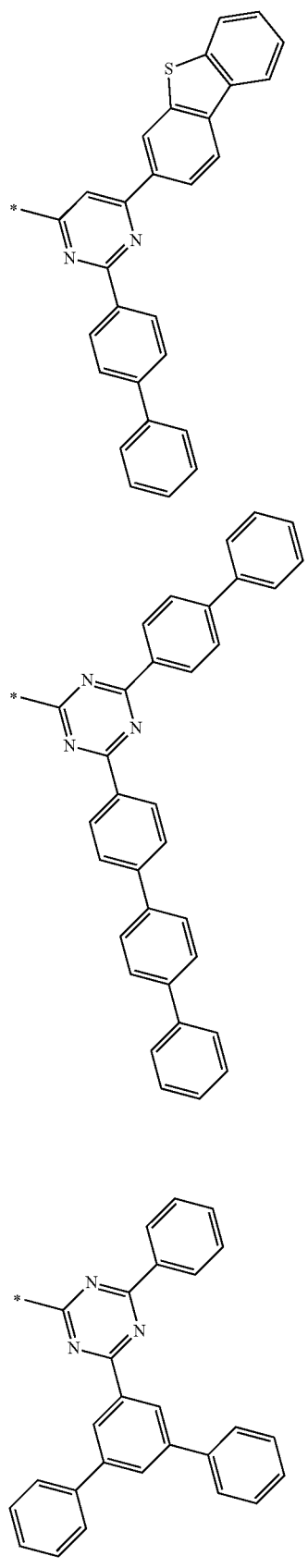
218
-continued
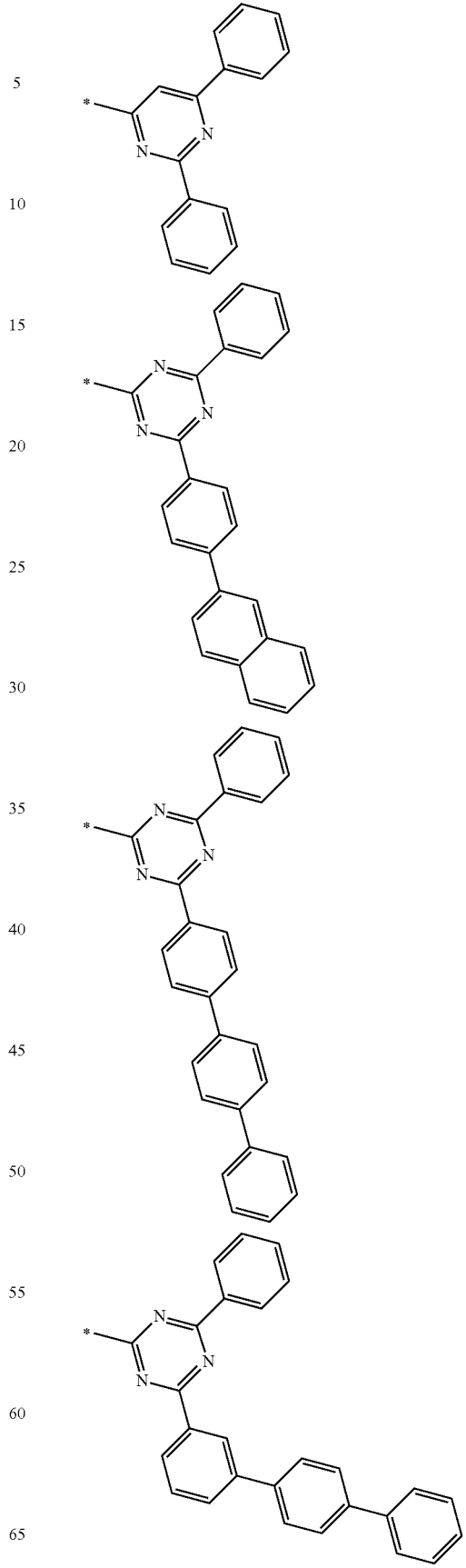

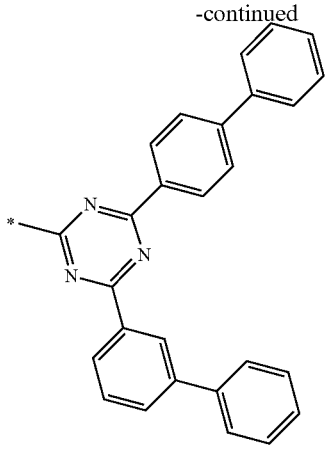

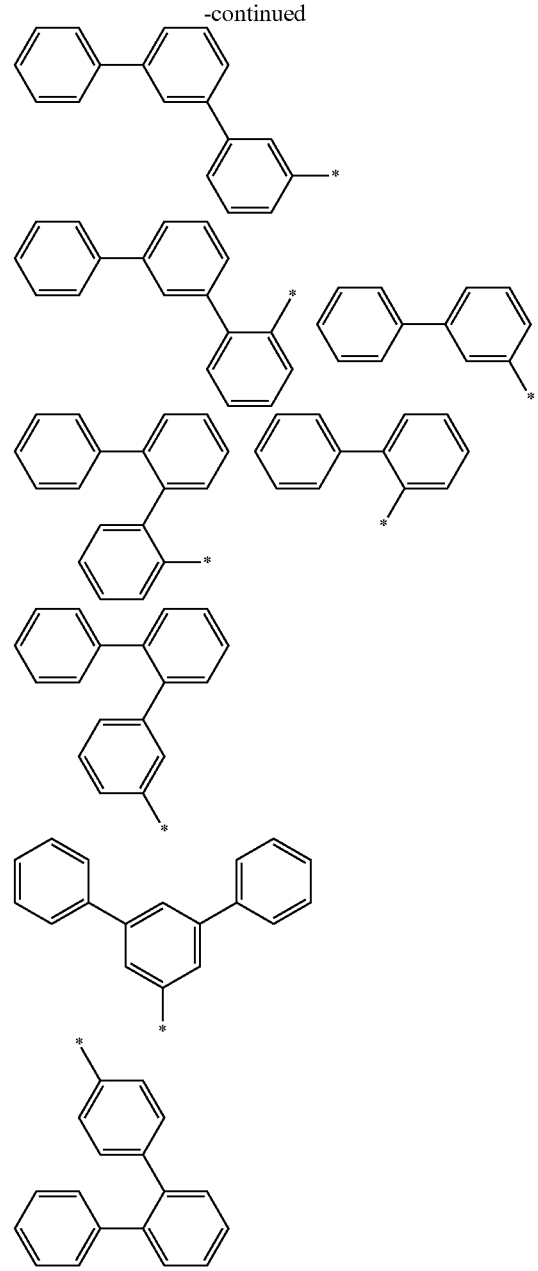

wherein, in Group II, * is a linking point with $L^4$, and in Group III, * is a linking point with $L^5$.

11. The composition of claim 1, wherein the first compound and the second compound are included in a weight ratio of 3:7 to 6:4.

12. The composition of claim 11, wherein the first compound and the second compound are included in a weight ratio of 5:5.

13. An organic optoelectronic element, comprising
an anode and a cathode facing each other, and
at least one organic layer disposed between the anode and the cathode,
wherein the organic layer includes the composition for the organic optoelectronic element of claim 1.

14. The organic optoelectronic element of claim 13, wherein
the organic layer comprises a light emitting layer, and
the composition for the organic optoelectronic element is included in the light emitting layer as a host.

15. A display device comprising the organic optoelectronic element of claim 13.

16. The composition of claim 1, wherein $L^3$ is a single bond or an unsubstituted phenylene group.

17. The composition of claim 1, wherein:
Ar¹ and Ar² are independently selected from substituents of Group I':

[Group I']

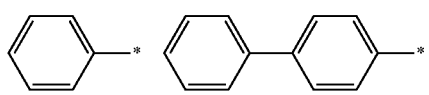

in Group I', * is linking points with $L^1$ and $L^2$, respectively.

* * * * *